(12) United States Patent
Rogers et al.

(10) Patent No.: US 9,613,911 B2
(45) Date of Patent: Apr. 4, 2017

(54) SELF-SIMILAR AND FRACTAL DESIGN FOR STRETCHABLE ELECTRONICS

(71) Applicants: THE BOARD OF TRUSTEES OF THE UNIVERSITY OF ILLINOIS, Urbana, IL (US); NORTHWESTERN UNIVERSITY, Evanston, IL (US)

(72) Inventors: John A. Rogers, Champaign, IL (US); Jonathan Fan, Columbus, OH (US); Woon-Hong Yeo, Richmond, VA (US); Yewang Su, Evanston, IL (US); Yonggang Huang, Glencoe, IL (US); Yihui Zhang, Evanston, IL (US)

(73) Assignees: The Board of Trustees of the University of Illinois, Urbana, IL (US); Northwestern University, Evanston, IL (US)

( * ) Notice: Subject to any disclaimer, the term of this patent is extended or adjusted under 35 U.S.C. 154(b) by 0 days.

(21) Appl. No.: 14/766,333

(22) PCT Filed: Feb. 5, 2014

(86) PCT No.: PCT/US2014/014932
§ 371 (c)(1),
(2) Date: Aug. 6, 2015

(87) PCT Pub. No.: WO2014/124044
PCT Pub. Date: Aug. 14, 2014

(65) Prior Publication Data
US 2015/0380355 A1     Dec. 31, 2015

Related U.S. Application Data

(63) Continuation-in-part of application No. 13/835,284, filed on Mar. 15, 2013.
(Continued)

(51) Int. Cl.
*H01L 23/538* (2006.01)
*H05K 1/02* (2006.01)
(Continued)

(52) U.S. Cl.
CPC ........ *H01L 23/5387* (2013.01); *H01L 23/538* (2013.01); *H01L 23/5386* (2013.01);
(Continued)

(58) Field of Classification Search
CPC .............. H01L 23/538; H01L 23/5386; H01L 23/5387; H01L 23/5389; H01L 23/552; H01L 24/97; H05K 1/0283
See application file for complete search history.

(56) References Cited

U.S. PATENT DOCUMENTS 5,171,482 A   12/1992 Asai
5,477,067 A   12/1995 Isomura et al.
(Continued)

FOREIGN PATENT DOCUMENTS

BE  WO 2010086034 A1 *  8/2010  ....... H01L 23/49838
WO  PCT/US2015/044573      8/2015
(Continued)

OTHER PUBLICATIONS

Ahn et al. (2009) "Omnidirectional Printing of Flexible, Stretchable, and Spanning Silver Microelectrodes," Science. 323:1590-1593.
(Continued)

*Primary Examiner* — Allan R Wilson
(74) *Attorney, Agent, or Firm* — Lathrop & Gage LLP

(57) ABSTRACT

The present invention provides electronic circuits, devices and device components including one or more stretchable components, such as stretchable electrical interconnects, electrodes and/or semiconductor components. Stretchability of some of the present systems is achieved via a materials
(Continued)

level integration of stretchable metallic or semiconducting structures with soft, elastomeric materials in a configuration allowing for elastic deformations to occur in a repeatable and well-defined way. The stretchable device geometries and hard-soft materials integration approaches of the invention provide a combination of advance electronic function and compliant mechanics supporting a broad range of device applications including sensing, actuation, power storage and communications.

61 Claims, 74 Drawing Sheets

Related U.S. Application Data

(60) Provisional application No. 61/761,412, filed on Feb. 6, 2013, provisional application No. 61/930,732, filed on Jan. 23, 2014.

(51) Int. Cl.
  *H01L 23/00* (2006.01)
  *H01L 23/552* (2006.01)

(52) U.S. Cl.
  CPC ........ *H01L 23/5389* (2013.01); *H01L 23/552* (2013.01); *H01L 23/564* (2013.01); *H01L 24/97* (2013.01); *H05K 1/0283* (2013.01); *H01L 2224/16225* (2013.01); *H01L 2924/12032* (2013.01); *H01L 2924/12041* (2013.01); *H01L 2924/12042* (2013.01); *H01L 2924/12043* (2013.01)

(56) References Cited

U.S. PATENT DOCUMENTS

| | | |
|---|---|---|
| 5,663,106 A | 9/1997 | Karavakis et al. |
| 5,739,463 A | 4/1998 | Diaz et al. |
| 5,967,986 A | 10/1999 | Cimochowski et al. |
| 6,020,219 A | 2/2000 | Dudderar et al. |
| 6,489,669 B2 | 12/2002 | Shimada et al. |
| 6,614,108 B1 | 9/2003 | Sanftleben et al. |
| 6,617,683 B2 | 9/2003 | Lebonheur et al. |
| 6,993,392 B2 | 1/2006 | Nicolelis et al. |
| 7,195,733 B2 | 3/2007 | Rogers et al. |
| 7,491,892 B2 * | 2/2009 | Wagner ................ H05K 1/0283 174/254 |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyne et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 8,934,965 B2 | 1/2015 | Rogers et al. |
| 8,946,683 B2 | 2/2015 | Rogers et al. |
| 9,057,994 B2 | 6/2015 | Rogers et al. |
| 9,061,494 B2 | 6/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 2002/0109219 A1 | 8/2002 | Yang |
| 2005/0253273 A1* | 11/2005 | Tai ........................ B81C 1/0023 257/774 |
| 2006/0071349 A1* | 4/2006 | Tokushige .......... H01L 23/5387 257/784 |
| 2008/0055581 A1 | 3/2008 | Rogers et al. |
| 2008/0157095 A1 | 7/2008 | Son et al. |
| 2008/0193855 A1 | 8/2008 | McDonald |
| 2010/0116526 A1* | 5/2010 | Arora ..................... H01L 23/528 174/254 |
| 2010/0157804 A1 | 6/2010 | Bugenhagen |
| 2010/0178722 A1* | 7/2010 | de Graff ............ H01L 27/14618 438/65 |
| 2011/0316120 A1 | 12/2011 | Rogers et al. |
| 2012/0038027 A1 | 2/2012 | Broekaart |
| 2012/0051005 A1* | 3/2012 | Vanfleteren ........... H01L 21/565 361/749 |
| 2012/0052268 A1* | 3/2012 | Axisa ................. H01L 23/49838 428/212 |
| 2012/0121963 A1 | 5/2012 | Kwon et al. |
| 2012/0157804 A1 | 6/2012 | Rogers et al. |
| 2012/0165759 A1 | 6/2012 | Rogers et al. |
| 2012/0261551 A1 | 10/2012 | Rogers et al. |
| 2012/0320581 A1 | 12/2012 | Rogers et al. |
| 2013/0036928 A1 | 2/2013 | Rogers et al. |
| 2013/0041235 A1 | 2/2013 | Rogers et al. |
| 2013/0140649 A1 | 6/2013 | Rogers et al. |
| 2013/0313713 A1* | 11/2013 | Arora ..................... H01L 23/528 257/773 |
| 2013/0333094 A1 | 12/2013 | Rogers et al. |
| 2014/0163390 A1 | 6/2014 | Rogers et al. |
| 2014/0191236 A1 | 7/2014 | Nuzzo et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0361409 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |
| 2015/0132873 A1 | 5/2015 | Rogers et al. |
| 2015/0141767 A1 | 5/2015 | Rogers et al. |
| 2015/0181700 A1 | 6/2015 | Rogers et al. |
| 2015/0207012 A1 | 7/2015 | Rogers et al. |
| 2015/0237711 A1 | 8/2015 | Rogers et al. |
| 2015/0290938 A1 | 10/2015 | Rogers et al. |
| 2015/0373831 A1 | 12/2015 | Rogers et al. |
| 2015/0380355 A1 | 12/2015 | Rogers et al. |
| 2016/0005700 A1 | 1/2016 | Rogers et al. |
| 2016/0027737 A1 | 1/2016 | Rogers et al. |

FOREIGN PATENT DOCUMENTS

| | | |
|---|---|---|
| WO | PCT/US2015/044588 | 8/2015 |
| WO | PCT/US2015/044638 | 8/2015 |
| WO | PCT/US2015/053452 | 10/2015 |

OTHER PUBLICATIONS

Bowden et al. (May 14, 1998) "Spontaneous Formation of Ordered Structures in Thin Films of Metals Supported on an Elastomeric Polymer," Nature. 393:146-149.

Brosteaux et al. (2007) "Design and fabrication of elastic interconnections for stretchable electronic circuits," IEEE Electron Device Lett. 28:552-554.

Carlson et al. (Aug. 31, 2012) "Transfer printing techniques for materials assembly and micro/nanodevice fabrication," Adv. Mater. 24:5284-5318.

(56) References Cited

OTHER PUBLICATIONS

Chasiotis et al. (2002) "A new microtensile tester for the study of MEMS materials with the aid of atomic force microscopy," Experimental Mechanics. 42:51-57.
Chasiotis et al. (2007) "Strain rate effects on the mechanical behavior of nanocrystalline Au films," Thin Solid Films. 515:3183-3189.
Chen et al. (1993) "Control of Strength and Toughness of Ceramic-Metal Laminates Using Interface Design," Journal of Materials Research. 8:2362-2369.
Cohen (1995) "Fractal Antennas: Part 1," Communications Quarterly: The Journal of Communications Technology. pp. 7-22.
Connor et al. (1998) "Broadband ac conductivity of conductor-polymer composites," Physical Review B. 57:2286-2294.
Cotton, D. P. J., Graz, I. M., and Lacour, S. P., 2009. A Multifunctional Capacitive Sensor for Stretchable Electronic Skins. IEEE Sensors Journal 9, 2008-2009.
Digikey (publication date unknown) "Datasheet for BAT 62-02LS E6327," Accessible on the Internet at URL: http://www.digikey.com/product-detail/en/BAT%2062-02LS%20E6327/BAT%2062-02LS%20E6327CT-ND/2410146. [Last Accessed Oct. 24, 2013].
Duan et al. (Dec. 16, 2013) "Non-wrinkled, highly stretchable piezoelectric devices by electrohydrodynamic direct-writing," Nanoscale. 6:3289-3295.
Duan et al. (Oct. 1, 2013) "Transfer printing and patterning of stretchable electrospun film," Thin Solid Films. 544:152-156.
Espinosa et al. (2004) "Plasticity size effects in free-standing submicron polycrystalline FCC films subjected to pure tension," Journal of the Mechanics and Physics of Solids. 52:667-689.
Fairbanks et al. (2011) "Fractal electronic devices: simulation and implementation," Nanotechnology. 22(36):365304.
Fan et al. (Feb. 7, 2014) "Fractal Design Concepts for Stretchable Electronics," Nat Commun. 5:3266.
Ferg et al. (1994) "Spinel Anodes for Lithium-Ion Batteries," J. Electrochem. Soc. 141:L147-L150.
Gaikwad et al. (Jul. 3, 2012) "Highly Stretchable Alkaline Batteries Based on an Embedded Conductive Fabric," Adv. Mater. 24:5071-5076.
Gao et al. (2005) "Mechanics of hierarchical adhesion structures of geckos," Mechanics of Materials. 37:275-285.
Garnier et al. (1994) "All-Polymer Field-Effect Transistor Realized by Printing Techniques," Science. 265:1684-1686.
Gianvittorio et al. (2002) "Y. Fractal antennas: A novel antenna miniaturization technique, and applications," IEEE Antennas and Propagation Magazine. 44:20-36.
Goldberger et al. (1987) "Fractals in Physiology and Medicine," Yale Journal of Biology and Medicine. 60:421-435.
Golestanirad et al. (Jul. 12, 2013) "Analysis of fractal electrodes for efficient neural stimulation," Frontiers in Neuroengineering. 6:3.
Gonzalez et al. (2008) "Design and performance of metal conductors for stretchable electronic circuits," Circuit World. 35:22-29.
Gonzalez et al. (2008) "Design of metal interconnects for stretchable electronic circuits," Microelectronics Reliability. 48:825-832.
Gowda et al. (Dec. 6, 2010) "Conformal Coating of Thin Polymer Electrolyte Layer on Nanostructured Electrode Materials for Three-Dimensional Battery Applications," Nano Lett. 11:101-106.
Graudejus et al. (Dec. 8, 2011) Encapsulating Elastically Stretchable Neural Interfaces: Yield, Resolution, and Recording/Stimulation of Neural Activity, Advanced Functional Materials. 22:640-651.
Gray et al. (2004) "High-Conductivity Elastomeric Electronics," Adv. Mater. 16:393-397.
Hajji et al. (1999) "Synthesis, structure, and morphology of polymer-silica hybrid nanocomposites based on hydroxyethyl methacrylate," Journal of Polymer Science Part B—Polymer Physics. 37:3172-3187.
Hao et al. (Mar. 8, 2013) "A Transforming Metal Nanocomposite with Large Elastic Strain, Low Modulus, and High Strength," Science. 339:1191-1194.

Harris et al. (2011) "Elastically Stretchable Insulation and Bilevel Metallization and Its Application in a Stretchable RLC Circuit," J. Eletron. Mater. 40:1335-1344.
Hsu et al. (2009) "In situ observations on deformation behavior and stretching-induced failure of fine pitch stretchable interconnect," J. Mater. Res. 24:3573-3582.
Hsu et al. (2010) "The effect of pitch on deformation behavior and the stretching-induced failure of a polymer-encapsulated stretchable circuit," J. Micromech. Microeng. 20:075036.
Hsu et al. (Aug. 2011) "Polyimide-Enhanced Stretchable Interconnects: Design, Fabrication, and Characterization," IEEE Trans. Electron. Dev. 58:2680-2688.
Hu et al. (2009) "Highly conductive paper for energy-storage devices," Proc. Natl. Acad. Sci. USA. 106:21490-21494.
Hu et al. (2010) "Stretchable, Porous, and Conductive Energy Textiles," Nano Lett. 10:708-714.
Hu et al. (2010) "Thin, Flexible Secondary Li-Ion Paper Batteries," ACS Nano. 4:5843-5848.
Hu et al. (2011) "Stretchable Inorganic-Semiconductor Electronic Systems," Adv. Mater. 23(26):2933-2936.
Huang et al. (Jul. 9, 2012) "Controllable self-organization of colloid microarrays based on finite length effects of electrospun ribbons," Soft Matter. 8:8302-8311.
Huck et al. (2000) "Ordering of Spontaneously Formed Buckles on Planar Surfaces," Langmuir. 16:3497-3501.
International Search Report with Written Opinion corresponding to International Patent Application No. PCT/US2014/014944, mailed Dec. 18, 2014.
International Search Report with Written Opinion corresponding to International Patent Application No. PCT/US2014/014932, mailed May 14, 2014.
Jeong et al. (Sep. 25, 2013) "Materials and Optimized Designs for Human-Machine Interfaces via Epidermal Electronics," Adv. Mater. 25(47):6839-6846.
Jiang et al. (2007) "Finite deformation mechanics in buckled thin films on compliant supports," Proc. Natl. Acad. Sci. USA. 104:15607-15612.
Jiang et al. (2008) "Finite width effect of thin-films buckling on compliant substrate: Experimental and theoretical studies," Journal of the Mechanics and Physics of Solids 56:2585-2598.
Jones et al. (2004) "Stretchable Wavy Metal Interconnects," J. Vac. Sci. Technol. A. 22(4):1723-1725.
Kaltenbrunner et al. (2010) "Arrays of Ultracompliant Electrochemical Dry Gel Cells for Stretchable Electronics," Adv. Mater. 22:2065-2067.
Kaltenbrunner et al. (Jul. 24, 2013) "An ultra-lightweight design for imperceptible plastic electronics," Nature. 499:458-463.
Khang et al. (2006) "A stretchable form of single-crystal silicon for high-performance electronics on rubber substrates," Science. 311:208-212.
Kim et al. (2008) "Materials and noncoplanar mesh designs for integrated circuits with linear elastic responses to extreme mechanical deformations," Proc. Natl. Acad. Sci. USA. 105:18675-18680.
Kim et al. (2008) "Stretchable and Foldable Silicon Integrated Circuits," Science 320:507-511.
Kim et al. (2009) "Optimized Structural Designs for Stretchable Silicon Integrated Circuits," Small. 5:2841-2847.
Kim et al. (2010) "Stretchable, Curvilinear Electronics Based on Inorganic Materials," Adv. Mater. 22:2108-2124.
Kim et al. (2010) "Waterproof AlInGaP optoelectronics on stretchable substrates with applications in biomedicine and robotics," Nature Materials. 9:929-937.
Kim et al. (Aug. 14, 2012) "Thin, Flexible Sensors and Actuators as 'Instrumented' Surgical Sutures for Targeted Wound Monitoring and Therapy," Small 8:3263-3268.
Kim et al. (Aug. 2012) "Flexible and Stretchable Electronics for Biointegrated Devices," Annual Review of Biomedical Engineering. 14:113-128.
Kim et al. (Aug. 12, 2011) "Epidermal Electronics," Science. 333:838-843.
Kim et al. (Jul. 17, 2013) "Stretchable nanoparticle conductors with self-organized conductive pathways," Nature. 500:59-63.

(56) References Cited

OTHER PUBLICATIONS

Kim et al. (Jun. 29, 2012) "Materials and Designs for Wirelessly Powered Implantable Light-Emitting Systems," Small 8:2812-2818.
Kim et al. (Mar. 6, 2011) "Materials for multifunctional balloon catheters with capabilities in cardiac electrophysiological mapping and ablation therapy," Nature Mater. 10:316-323.
Kim et al. (Nov. 12, 2012) "Electronic sensor and actuator webs for large-area complex geometry cardiac mapping and therapy," Proc. Natl. Acad. Sci. USA. 109:19910-19915.
Ko et al. (2008) "A hemispherical electronic eye camera based on compressible silicon optoelectronics," Nature. 454:748-753.
Krieger (Aug. 8, 2012) "Extreme mechanics: Buckling down," Nature. 488:146-147.
Kubo et al. (2010) "Stretchable Microfluidic Radiofrequency Antennas," Adv. Mater. 22:2749-2752.
Lacour et al. (2003) "Stretchable Gold Conductors on Elastomeric Substrates," Appl. Phys. Lett. 82(15):2404.
Lacour et al. (2004) "An Elastically Stretchable TFT Circuit," IEEE Electron Dev. Lett. 25(12):792-794.
Lacour et al. (2005) "Stretchable Interconnects for Elastic Electronic Surfaces," Proc. IEEE. 93:1459-1467.
Lacour et al. (2006) "Stiff subcircuit islands of diamondlike carbon for stretchable electronics," J. Appl. Phys. 100:014913.
Lee et al. (2011) "Flexible Inorganic Nanostructure Light-Emitting Diodes Fabricated on Graphene Films," Advanced Materials. 23:4614-4619.
Lee et al. (Feb. 22, 2011) "Stretchable GaAs Photovoltaics with Designs That Enable High Areal Coverage," Adv. Mater. 23:986-991.
Lee et al. (Mar. 29, 2012) "Stretchable Semiconductor Technologies with High Areal Coverages and Strain-Limiting Behavior: Demonstration in High-Efficiency Dual-Junction GaInP/GaAs Photovoltaics," Small. 8:1851-1856.
Li et al. (2005) "Compliant thin film patterns of stiff materials as platforms for stretchable electronics," Journal of Materials Research. 20:3274-3277.
Li et al. (Apr. 2013) "A generalized mechanical model for suture interfaces of arbitrary geometry," Journal of the Mechanics and Physics of Solids. 61:1144-1167.
Li et al. (Mar. 1, 2012) "Bioinspired, mechanical, deterministic fractal model for hierarchical suture joints," Physical Review E. 85(3):031901.
Lipomi et al. (Feb. 25, 2011) "Stretchable Organic Solar Cells," Advanced Materials. 23:1771-1775.
Lu et al. (2007) "Metal films on polymer substrates stretched beyond 50%," Applied Physics Letters. 91(3): 221909.
Lu et al. (Jul. 12, 2012) "Highly Sensitive Skin-Mountable Strain Gauges Based Entirely on Elastomers," Advanced Functional Materials. 22:4044-4050.
Mandlik et al. (Aug. 2006) "Fully Elastic Interconnects on Nanopatterned Elastomeric Substrates," IEEE Electron Dev. Lett. 27(8):650-652.
Mannsfeld et al. (Sep. 12, 2010) "Highly sensitive flexible pressure sensors with microstructured rubber dielectric layers," Nature Mater. 9:859-864.
Masters (2004) "Fractal analysis of the vascular tree in the human retina," Annual Review of Biomedical Engineering. 6:427-452.
Meitl et al. (2006) "Transfer printing by kinetic control of adhesion to an elastomeric stamp," Nat. Mater. 5:33-38.
Nelson et al. (2011) "Epitaxial growth of three-dimensionally architectured optoelectronic devices," Nature Materials 10:676-681.
Nishide et al. (2008) "Toward flexible batteries," Science. 319:737-738.
Ouyang et al. (2000) "Conversion of some siloxane polymers to silicon oxide by UV/ozone photochemical processes," Chem. Mater. 12:1591-1596.
Owen (1997) "Rechargeable lithium batteries," Chem. Soc. Rev. 26:259-267.
Pelrine et al. (2000) "High-speed electrically actuated elastomers with strain greater than 100%," Science. 287:836-839.
Puente et al. (1998) "Small but long Koch fractal monopole," Electronics Letters. 34:9-10.
Pushparaj et al. (2007) "Flexible energy storage devices based on nanocomposite paper," Proc. Natl. Acad. Sci. USA. 104:13574-13577.
Ramuz et al. (May 29, 2012) "Transparent, Optical, Pressure-Sensitive Artificial Skin for Large-Area Stretchable Electronics," Advanced Materials 24:3223-3227.
Robinson et al. (Jul. 1, 2011) "Microstructured Silicone Substrate for Printable and Stretchable Metallic Films," Langmuir. 27:4279-4284.
Rogers et al. (2010) "Materials and Mechanics for Stretchable Electronics," Science. 327:1603-1607.
Saeidpourazar et al. (Jul. 5, 2012) "Laser-Driven Micro Transfer Placement of Prefabricated Microstructures," J. Microelectromech. Syst. 21:1049-1058.
Sato et al. (1998) "Tensile testing of silicon film having different crystallographic orientations carried out on a silicon chip," Sensors and Actuators A-Physical. 70:148-152.
Schwartz et al. (May 14, 2013) "Flexible polymer transistors with high pressure sensitivity for application in electronic skin and health monitoring," Nature Communications 4:1859.
Scrosati (2007) "Nanomaterials—Paper powers battery breakthrough," Nature Nanotechnol. 2:598-599.
Scrosati et al. (2010) "Lithium batteries: Status, prospects and future," J. Power Sources. 195:2419-2430.
Sekitani et al. (2008) "A rubberlike stretchable active matrix using elastic conductors," Science. 321:1468-1472.
Sekitani et al. (2009) "Stretchable active-matrix organic light-emitting diode display using printable elastic conductors," Nature Materials. 8:494-499.
Sekitani et al. (Mar. 2012) "Stretchable organic integrated circuits for large-area electronic skin surfaces," MRS Bull. 37:236-245.
Someya et al. (2004) "A large-area, flexible pressure sensor matrix with organic field-effect transistors for artificial skin application," Proc. Natl. Acad. Sci. USA. 101:9966-9970.
Song et al. (2008) "Buckling of a stiff thin film on a compliant substrate in large deformation," International Journal of Solids and Structures. 45:3107-3121.
Song et al. (2009) "Mechanics of noncoplanar mesh design for stretchable electronic circuits," Journal of Applied Physics. 105:123516.
Song et al. (May 2, 2013) "Digital cameras with designs inspired by the arthropod eye," Nature. 497:95-99.
Su et al. (2012) "Postbuckling analysis and its application to stretchable electronics," J. Mech. Phys. Solids. 60:487-508.
Sun et al. (2006) "Controlled buckling of semiconductor nanoribbons for stretchable electronics," Nature Nanotechnol. 1:201-207.
Suo (Mar. 2012) "Mechanics of stretchable electronics and soft machines," MRS Bull. 37:218-225.
Takei et al. (2010) "Nanowire active-matrix circuitry for low-voltage macroscale artificial skin," Nature Mater. 9:821-826.
Tarascon et al. (2001) "Issues and challenges facing rechargeable lithium batteries," Nature. 414:359-367.
Taylor (2011) "Vision of beauty," Physics World. 24:22-27.
Thanawala et al. (2000) "Surface modification of silicone elastomer using perfluorinated ether," Langmuir. 16:1256-1260.
Tian et al. (Aug. 26, 2012) "Macroporous nanowire nanoelectronic scaffolds for synthetic tissues," Nat. Mater. 11:986-994.
van der Sluis et al. (Dec. 22, 2010) "Stretching-induced interconnect delamination in stretchable electronic circuits," J. Phys. D—Appl. Phys. 44:034008.
Vanfleteren et al. (Mar. 14, 2012) "Printed circuit board technology inspired stretchable circuits," MRS Bull. 37:254-260.
Viventi et al. (2010) "A Conformal, Bio-Interfaced Class of Silicon Electronics for Mapping Cardiac Electrophysiology," Science Translational Medicine. 2:24ra22.
Wagner et al. (2004) "Electronic skin: architecture and components," Physica E Low Dimens. Syst. Nanostruct. 25:326-334.
Wagner et al. (Mar. 2012) "Materials for stretchable electronics," MRS Bull. 37:207-217.

(56) References Cited

OTHER PUBLICATIONS

Webb et al. (Sep. 15, 2013) "Ultrathin conformal devices for precise and continuous thermal characterization of human skin," Nat. Mater. 12:938-944.
Wu et al. (May 19, 2013) "A transparent electrode based on a metal nanotrough network," Nat. Nanotechnol. 8:421-425.
Xu et al. (Feb. 26, 2013) "Stretchable batteries with self-similar serpentine interconnects and integrated wireless recharging systems," Nature Communications. 4:1543.
Yang et al. (Jul. 5, 2013) "Gauge Factor and Stretchability of Silicon-on-Polymer Strain Gauges," Sensors. 13:8577-8594.
Yao et al. (2006) "Mechanics of robust and releasable adhesion in biology: Bottom-up designed hierarchical structures of gecko," Journal of the Mechanics and Physics of Solids. 54:1120-1146.
Yao et al. (2007) "Multi-scale cohesive laws in hierarchical materials," International Journal of Solids and Structures. 44:8177-8193.
Yeo et al. (Feb. 26, 2013) "Multifunctional Epidermal Electronics Printed Directly Onto the Skin," Advanced Materials. 25:2773-2778.
Ying et al. (Aug. 10, 2012) "Silicon nanomembranes for fingertip electronics," Nanotechnology. 23:344004.
Yoon et al. (2008) "Ultrathin silicon solar microcells for semitransparent, mechanically flexible and microconcentrator module designs," Nature Mater. 7:907-915.
Yoshima et al. (Jun. 15, 2012) "Fabrication of micro lithium-ion battery with 3D anode and 3D cathode by using polymer wall," J. Power Sources. 208:404-408.
Yu et al. (2009) "Monitoring Hippocampus Electrical Activity In Vitro on an Elastically Deformable Microelectrode Array," Journal of Neurotrauma. 26:1135-1145.
Yu et al. (2009) "Stretchable supercapacitors based on buckled single-walled carbon nanotube macrofilms," Adv. Mater. 21:4793-4797.
Zhang et al. (Dec. 16, 2011) "Strain-Controlled Switching of Hierarchically Wrinkled Surfaces between Superhydrophobicity and Superhydrophilicity," Langmuir. 28:2753-2760.
Zhang et al. (Dec. 2013) "Mechanics of ultra-stretchable self-similar serpentine interconnects," Acta Materialia. 61:7816-7827.
Zhang et al. (Feb. 1997) "On the wear debris of polyetheretherketone: Fractal dimensions in relation to wear mechanisms," Tribology International 30:87-102.
Zhang et al. (Jun. 27, 2013) "Buckling in serpentine microstructures and applications in elastomer-supported ultra-stretchable electronics with high areal coverage," Soft Matter. 9:8062-8070.
Zhang et al. (Nov. 26, 2013) "Experimental and Theoretical Studies of Serpentine Microstructures Bonded to Prestrained Elastomers for Stretchable Electronics," Advanced Functional Materials. 24(14):2028-2037.
Zhang et al. (Sep. 1, 2010) "On optimal hierarchy of load-bearing biological materials," Proceedings of the Royal Society B—Biological Sciences. 278:519-525.
U.S. Appl. No. 11/465,317, filed Aug. 17, 2006.
U.S. Appl. No. 12/372,605, filed Feb. 17, 2009.
U.S. Appl. No. 13/095,502, filed Apr. 27, 2011.
U.S. Appl. No. 14/800,363, filed Jul. 15, 2015.
U.S. Appl. No. 14/818,109, filed Aug. 4, 2015.
U.S. Appl. No. 14/766,926, filed Aug. 10, 2015.
U.S. Appl. No. 14/772,312, filed Sep. 2, 2015.
U.S. Appl. No. 14/944,039, filed Nov. 17, 2015.

* cited by examiner

111

112

113

114

— Electrode (recording, ground, and reference)
— Temperature sensor/heater

Recording   Ground   Reference

| Config. | All-Horizontal | Mostly-Horizontal | Half-and-Half | Mostly-Vertical | All-Vertical |
|---|---|---|---|---|---|
| x-axis | 31% | 16% | 16% | 11% | 9% |
| y-axis | 9% | 12% | 13% | 14% | 33% |

Figure 18

| Serpentine Patterns | Arc Angle | Elastic Stretchability |
|---|---|---|
| | 270° | 61% |
| | 235° | 60% |
| | 180° | 36% |
| | 135° | 18% |
| | 90° | 6% |

Figure 19

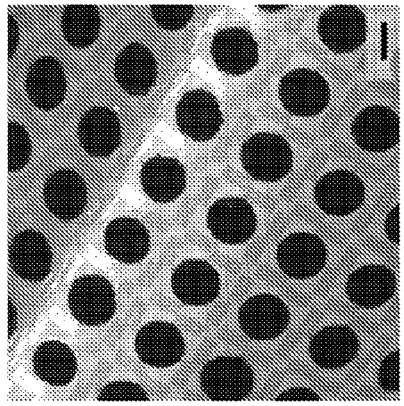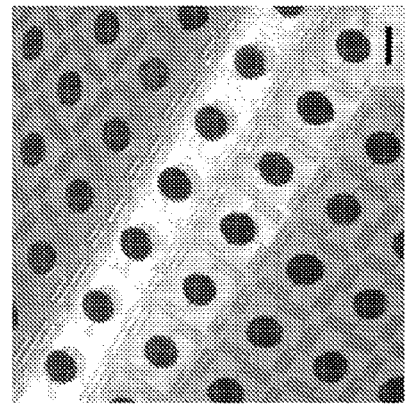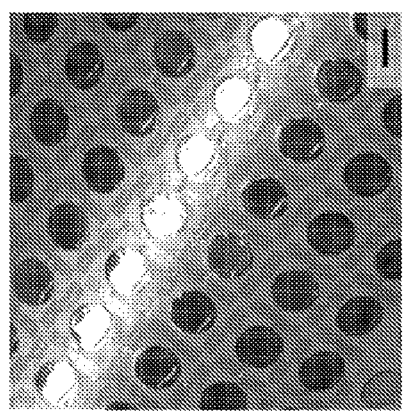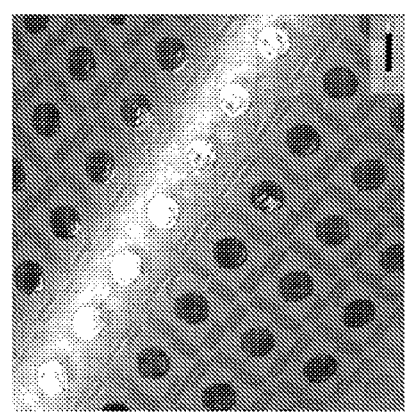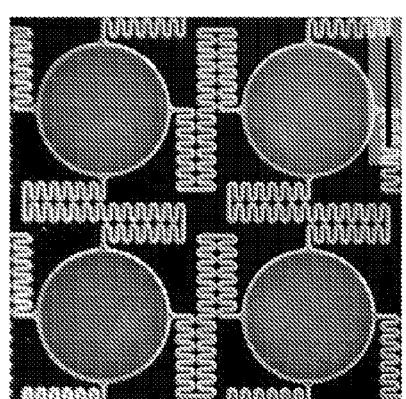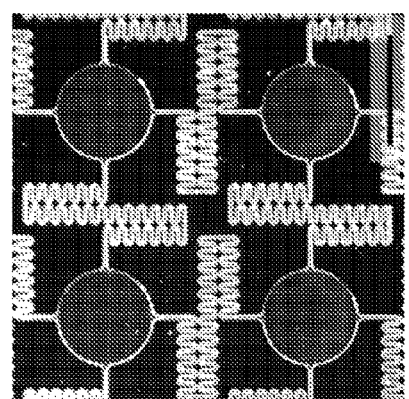
Figure 21D　　　　　　　　Figure 21E a. Stage I: Unravel 2nd order interconnect (i) Equivalent structure of straight beams for a 2nd order fractal interconnect (ii) Deformation pattern during stage I (iii) End of stage I:

b. Stage II: Unravel each 1st order interconnect (i) Extract the 1st order interconnect from the fully unraveled 2nd order one (ii) Deformation pattern during stage II (iii) End of stage II:

a. Maximum strain in the interconnect b. Evolution of configuration a. Maximum strain in the interconnect b. Evolution of configuration (a)

| | Analytic | | | | FEA-Infinitesimal deformation | | | | FEA-Finite deformation | | | |
|---|---|---|---|---|---|---|---|---|---|---|---|---|
| | $\eta^{(f)}=1$ | $\eta^{(f)}=2$ | $\eta^{(f)}=4$ | $\eta^{(f)}=6$ | $\eta^{(f)}=1$ | $\eta^{(f)}=2$ | $\eta^{(f)}=4$ | $\eta^{(f)}=6$ | $\eta^{(f)}=1$ | $\eta^{(f)}=2$ | $\eta^{(f)}=4$ | $\eta^{(f)}=6$ |
| $m^{(f)}=1$ | 0.55 | 1.66 | 5.20 | 10.41 | 0.70 | 1.79 | 5.23 | 10.37 | 0.69 | 1.79 | 5.20 | 10.40 |
| $m^{(f)}=2$ | 0.60 | 1.81 | 5.84 | 11.94 | 0.69 | 1.87 | 5.84 | 11.88 | 0.68 | 1.87 | 5.87 | 11.87 |
| $m^{(f)}=4$ | 0.66 | 1.99 | 6.39 | 13.94 | 0.73 | 2.02 | 6.37 | 13.01 | 0.73 | 2.02 | 6.4 | 13.07 |
| $m^{(f)}=10$ | 0.72 | 2.17 | 6.93 | 14.22 | 0.80 | 2.20 | 6.91 | 14.09 | 0.8 | 2.19 | 6.9 | 14 |

(b)

| | Analytic | | | | FEA-Infinitesimal deformation | | | | FEA-Finite deformation | | | |
|---|---|---|---|---|---|---|---|---|---|---|---|---|
| | $\eta^{(f)}=1$ | $\eta^{(f)}=2$ | $\eta^{(f)}=4$ | $\eta^{(f)}=6$ | $\eta^{(f)}=1$ | $\eta^{(f)}=2$ | $\eta^{(f)}=4$ | $\eta^{(f)}=6$ | $\eta^{(f)}=1$ | $\eta^{(f)}=2$ | $\eta^{(f)}=4$ | $\eta^{(f)}=6$ |
| $m^{(f)}=1$ | 1.01 | 3.04 | 9.91 | 20.65 | 1.02 | 3.11 | 10.23 | 21.38 | 0.99 | 3.00 | 9.83 | 20.50 |
| $m^{(f)}=2$ | 1.30 | 3.88 | 12.70 | 26.32 | 1.30 | 3.99 | 12.87 | 26.81 | 1.30 | 3.92 | 12.67 | 24.92 |
| $m^{(f)}=4$ | 1.52 | 4.51 | 14.79 | 30.77 | 1.51 | 4.59 | 14.85 | 30.94 | 1.48 | 4.45 | 14.33 | 28.00 |
| $m^{(f)}=10$ | 1.70 | 5.01 | 15.43 | 32.23 | 1.69 | 5.00 | 16.37 | 34.27 | 1.57 | 4.70 | 15.00 | 29.58 |

(c)

| | Analytic | | | FEA-Infinitesimal deformation | | | FEA-Finite deformation | | |
|---|---|---|---|---|---|---|---|---|---|
| | $m^{(f)}=2$ | $m^{(f)}=4$ | $m^{(f)}=6$ | $m^{(f)}=2$ | $m^{(f)}=4$ | $m^{(f)}=6$ | $m^{(f)}=2$ | $m^{(f)}=4$ | $m^{(f)}=6$ |
| $\eta^{(f)}=1$ | 2.16 | 2.21 | 2.23 | 2.39 | 2.31 | 2.31 | 2.40 | 2.30 | 2.31 |
| $\eta^{(f)}=1.5$ | 2.59 | 2.59 | 2.63 | 2.83 | 2.70 | 2.67 | 2.80 | 2.67 | 2.67 |
| $\eta^{(f)}=1.8$ | 2.87 | 2.81 | 2.86 | 3.11 | 2.93 | 2.93 | 3.07 | 2.90 | 2.91 |
| $\eta^{(f)}=2$ | / | 2.96 | 3.01 | / | 3.08 | 3.09 | / | 3.03 | 3.04 |
| $\eta^{(f)}=2.5$ | / | 3.34 | 3.37 | / | 3.47 | 3.44 | / | 3.40 | 3.40 |
| $\eta^{(f)}=3$ | / | 3.72 | 3.73 | / | 3.83 | 3.82 | / | 3.77 | 3.75 |
| $\eta^{(f)}=4$ | / | / | 4.46 | / | / | 4.56 | / | / | 4.44 |
| $\eta^{(f)}=5$ | / | / | 5.21 | / | / | 5.31 | / | / | 5.11 |

Figure 67

SELF-SIMILAR AND FRACTAL DESIGN FOR STRETCHABLE ELECTRONICS

CROSS-REFERENCE TO RELATED APPLICATIONS

This application is a U.S. National Stage Application under 35 U.S.C. §371 of International Application No. PCT/US2014/014932, filed Feb. 5, 2014, which claims the benefit of and is a continuation-in-part of priority to U.S. patent application Ser. No. 13/835,284, filed on Mar. 15, 2013, U.S. Provisional Patent Application 61/761,412, filed on Feb. 6, 2013, and U.S. Provisional Patent Application 61/930,732, filed on Jan. 23, 2014, each of which is hereby incorporated by reference in its entirety.

STATEMENT REGARDING FEDERALLY SPONSORED RESEARCH OR DEVELOPMENT

This invention was made with government support under contract number DE-F002-07ER46471 awarded by the US Department of Energy. The government has certain rights in the invention.

BACKGROUND

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors for flexible plastic electronic devices. Progress in the field of flexible electronics, however, is not only driven by the development of new solution processable materials but also by new device component geometries, efficient device and device component processing methods and high resolution patterning techniques applicable to flexible electronic systems. It is expected that such materials, device configurations and fabrication methods will play an essential role in the rapidly emerging new class of flexible integrated electronic devices, systems and circuits.

Interest in the field of flexible electronics arises out of several important advantages provided by this technology. For example, the inherent flexibility of substrate materials allows them to be integrated into many shapes providing for a large number of useful device configurations not possible with brittle conventional silicon based electronic devices. In addition, the combination of solution processable component materials and flexible substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well-developed methods of making conventional silicon based electronic devices are incompatible with most flexible materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Further, although many amorphous silicon, organic or hybrid organic-inorganic semiconductors are compatible with incorporation into flexible substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Flexible electronic circuitry is an active area of research in a number of fields including flexible displays, electroactive surfaces of arbitrary shapes such as electronic textiles and electronic skin. These circuits often are unable to sufficiently conform to their surroundings because of an inability of the conducting components to stretch in response to conformation changes. Accordingly, those flexible circuits are prone to damage and electronic degradation and can be unreliable under rigorous and/or repeated conformation change. Flexible circuits require stretchable and bendable interconnects that remain intact while cycling through stretching and relaxation.

Conductors that are capable of both bending and elasticity are generally made by embedding metal particles in an elastomer such as silicone. Those conductive rubbers are both mechanically elastic and electrically conductive. The drawbacks of a conductive rubber include high electrical resistivity and significant resistance changes under stretching, thereby resulting in overall poor interconnect performance and reliability.

Gray et al. discuss constructing elastomeric electronics using microfabricated tortuous wires encased in a silicone elastomer capable of linear strains up to 54% while maintaining conductivity. In that study, the wires are formed as a helical spring-shape. In contrast to straight-line wires that fractured at low strains (e.g., 2.4%), tortuous wires remained conductive at significantly higher strains (e.g., 27.2%). Such a wire geometry relies on the ability of wires to elongate by bending rather than stretching. That system suffers limitations in the ability to controllably and precisely pattern in different shapes and in additional planes, thereby limiting the ability to tailor systems to different strain and bending regimes.

Studies suggest that elastically stretchable metal interconnects experience an increase in resistance with mechanical strain. (Mandlik et al. 2006). Mandlik et al. attempt to minimize this resistance change by depositing metal film on pyramidal nanopatterned surfaces. That study, however, relies on the relief feature to generate microcracks that impart stretchability to thin metal lines. The microcracks facilitate metal elastic deformation by out of plane twisting and deformation. Those metal cracks, however, are not compatible with thick metal films, and instead are compatible with a rather narrow range of thin metal films (e.g., on the order of less than 30 nm) that are deposited on top of patterned elastomers.

One manner of imparting stretchability to metal interconnects is by prestraining (e.g., 15%-25%) the substrate during conductor (e.g., metal) application, followed by spontaneous relief of the prestrain, thereby inducing a waviness to the metal conductor interconnects. (see, e.g., Lacour et al.

(2003); (2005); (2004), Jones et al. (2004); Huck et al. (2000); Bowden et al. (1998)). Lacour et al. (2003) report by initially compressing gold stripes to generate spontaneously wrinkled gold stripes, electrical continuity is maintained under strains of up to 22% (compared to fracture strains of gold films on elastic substrates of a few percent). That study, however, used comparatively thin layers of metal films (e.g., about 105 nm) and is relatively limited in that the system could potentially make electrical conductors that could be stretched by about 10%.

U.S. Pat. Nos. 7,557,367, 7,521,292, and 8,217,381 and US Patent Publication Nos. 2010/0002402, 2012/0157804, and 2011/0230747 describe flexible and/or stretchable electronic systems accessed by microfabrication pathways including printing-based techniques. The stretchable systems of these references include devices having distributed electronic device components interconnected via deformable electronic interconnects, optionally capable of elastic responses to large strain deformation. The systems of these references include electronic devices for applications including tissue mounted biomedical devices, solar energy and large area macroelectronic systems.

From the forgoing, it is apparent there is a need for electronic devices such as interconnects and other electronic components having improved stretchability, electrical properties and related processes for rapid and reliable manufacture of stretchable interconnects in a variety of different configurations. Progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in folded, stretched and/or contracted conformations.

SUMMARY

The present invention provides electronic circuits, devices and device components including one or more stretchable components, such as stretchable electrical interconnects, electrodes and/or semiconductor components. Stretchability of some of the present systems is achieved via a materials level integration of stretchable metallic or semiconducting structures with soft, elastomeric materials in a configuration allowing for elastic deformations to occur in a repeatable and well-defined way. The stretchable device geometries and hard-soft materials integration approaches of the invention provide a combination of advance electronic function and compliant mechanics supporting a broad range of device applications including sensing, actuation, power storage and communications. Specific classes of devices benefiting from the enhanced mechanical properties of the present systems include stretchable batteries, radio frequency antennas, tissue mounted electronics and sensors compatible with magnetic resonance imaging.

In some aspects, the invention provides a new class of stretchable systems having specific geometries which achieve enhancements over conventional flexible and stretchable devices for accommodating elastic strain. In embodiments, for example, stretchable metallic or semiconducting structures of the invention are characterized by a two dimensional geometry characterized by a plurality of spatial frequencies, for example, via a spring-in-a-spring overall geometry capable of supporting a wide range of deformation modes without failure or significant degradation of performance. Specific device architectures of the present invention include stretchable metallic or semiconducting structures having self-similar geometries and/or fractal-like geometries capable of supporting a range of biaxial and/or radial deformation modes, thereby, providing a versatile device platform for a range of stretchable electronic and/or optical systems.

In an aspect, the present invention provides electronic circuits exhibiting stretchability. In an embodiment, for example, an electronic circuit comprises: an elastic substrate; and a stretchable metallic or semiconducting device component supported by the elastic substrate; the stretchable metallic or semiconducting device component comprising a plurality of electrically conductive elements each having a primary unit cell shape, the electrically conductive elements connected in a sequence having a secondary shape providing an overall two-dimensional spatial geometry characterized by a plurality of spatial frequencies; wherein the two-dimensional spatial geometry of the metallic or semiconducting device component allows for accommodation of elastic strain along one or more in-plane or out of plane dimensions (or directions), thereby providing stretchability of the electronic circuit. In some embodiments, for example, at least a portion of the stretchable metallic or semiconducting device component is in physical contact with the elastic substrate or an intermediate structure provided between the substrate and the stretchable metallic or semiconducting device component. In an embodiment, the electronic circuit of the invention comprises a stretchable electronic device, semiconductor device, device array or component thereof, for example, comprising a plurality of metallic or semiconducting device component supported by the elastomeric substrate.

In embodiments, the two-dimensional spatial geometry of the metallic or semiconducting device component(s) allows for significant deformation without substantial degradation of electronic performance or failure, for example, via compression, expansion, twisting and/or bending deformations. In an embodiment, for example, the two-dimensional spatial geometry allows the metallic or semiconducting device component to undergo elastic deformation. In an embodiment, for example, the two-dimensional spatial geometry allows the metallic or semiconducting device component to undergo biaxial deformation, radial deformation or both. In an embodiment, for example, the two-dimensional spatial geometry allows the metallic or semiconducting device component to undergo in-plane deformation, out-of-plane deformation or both.

Systems of the invention include metallic or semiconducting device component(s) having a broad range of two-dimensional spatial geometries providing enhanced stretchability. Aspects of the two-dimensional spatial geometry for some embodiments exhibit a self-similar characteristic, such as a spatial geometry exhibiting an iterative pattern or pattern of patterns, for example, provided in a spring-within-a-spring type configuration. Metallic or semiconducting device component(s) of the present systems having self-similar and/or fractal-based geometries provide a beneficial combination of high fill factors and useful mechanical stretchability, for example, so as to provide high area conformal coverage of surfaces having a complex topography, such as curved surfaces (e.g., radius of curvature greater than or equal to 0.01 mm, optionally 0.1 mm) and surfaces characterized by one or more relief or recessed features.

Some stretchable electronic circuits of the invention are capable of high area conformal coverage of the surface of a biological tissue, such as, for example, a tissue surface characterized by a complex morphology.

In exemplary embodiments, the two-dimensional spatial geometry of the metallic or semiconducting device component(s) is characterized by a first spatial frequency having a first length scale corresponding to the primary unit cell shape and a second spatial frequency having a second length scale corresponding to the secondary shape, for example, that is made up of a sequence of elements having the primary unit cell shape. In some embodiments, the first length scale is substantially different than the second length scale. For example, in the embodiment in FIG. 1C, the first length scale ($L_1$) is approximately 27% that of the second length scale ($L_2$); further, the first length scale ($L_1$) is approximately 8% that of the third length scale. More generally in this example, the ratio $L_N/L_{N+1}$ falls between 0.27 and 0.34, where N is the $N^{th}$ length scale. This ratio $L_N/L_{N-1}$ can be generally tailored; FIG. 1B elements 111 and 112 show two examples of a self-similar serpentine horseshoe pattern in which $L_N/L_{N+1}$ is approximately 0.26 and 0.18, respectively.

For example, in one embodiment, first length scale of the first spatial frequency is at least 2 times smaller than the second length scale of the second spatial frequency, and optionally for some embodiments the first spatial frequency is at least 5 times smaller than the second length scale of the second spatial frequency, the first spatial frequency is at least 10 times smaller than the second length scale of the second spatial frequency. For example, in an embodiment, the first length scale of the first spatial frequency is 2 to 10 times smaller than the second length scale of the second spatial frequency and optionally for some embodiments, the first length scale of the first spatial frequency is 3 to 5 times smaller than the second length scale of the second spatial frequency. In a specific embodiment, the first length scale of the first spatial frequency is selected from the range of 100 nm to 1 mm and the second length scale of the second spatial frequency is selected over the range of 1 micron to 10 mm. In exemplary embodiments, the plurality of spatial frequencies are further characterized by a plurality of length scales (e.g., first, second, third, etc.) characterized by a power series.

In some embodiments, the two-dimensional spatial geometry of the stretchable metallic or semiconducting device component is characterized by more than two spatial frequencies, for example, having third, fourth, fifth, etc. spatial frequencies. For example, in one embodiment, the sequence of electrically conductive elements is further characterized by a tertiary shape comprising a repeating series of the electrically conductive elements comprising the secondary shape. In embodiments, the two-dimensional spatial geometry is characterized by 2 to 5 spatial frequencies. Use of a two-dimensional spatial geometry characterized by more than two spatial frequencies is beneficial in some embodiments for providing enhance areal coverage, stretchability and/or electrical resistance, for example, for antenna and radio frequency device applications.

In embodiments, the two-dimensional spatial geometry is an iterative two-dimensional geometry, such as a spatial geometry comprising a repeating pattern of elements having the same or similar shape (e.g., characterized by the unit cell shape). In an embodiment, for example, sequence of electrically conductive elements has a serial configuration or a branched configuration. Two-dimensional spatial geometries useful in the present systems may have a deterministic two-dimensional shape or a random two-dimensional shape.

Optionally, for some embodiments, the two-dimensional spatial geometry has a spring-within-a-spring geometry. For example, in embodiments, the spring-within-in-spring geometry comprises a series of primary spring structures each independently having the primary unit cell shape connected in a serial or a branched configuration to form one or more secondary spring structures each independently having the secondary shape. Optionally, the primary spring structures, the secondary spring structures or both comprise a compression spring structure or coiled spring structure. In some embodiments, the spring-in-a-spring geometry is characterized by two-dimensional geometry comprising at least two spring configurations, wherein upon deformation a first spring configuration undergoes stretching to some degree prior to stretching of a second spring configuration.

In some embodiments, the two-dimensional spatial geometry is a self-similar two-dimensional geometry. For example, in embodiments, the self-similar two-dimensional geometry is characterized by the secondary shape being similar to the primary unit cell shape but having a different length scale. In some embodiments, the self-similar two-dimensional geometry is characterized by a length scale of the secondary shape at least 2 times larger than a length scale of the primary unit cell shape, optionally at least 3 times larger than a length scale of the primary unit cell shape. For example, in embodiments, a length scale of the secondary shape is larger than a length scale of the primary unit cell shape by a factor selected over the range of 2 to 20, and optionally selected over the range of 3 to 10. In an embodiment, a self-similar geometry is characterized by a primary unit cell having a unit cell shape and one or more higher order patterns made up of the primary unit cell and having a similar overall spatial configuration as the primary unit cell shape but with a different length scale. In some embodiments, for example, the length scale of the unit cell shape and the length scales of high order patterns are multiples of each other (e.g., related by a constant), thereby giving rise to an overall two-dimensional geometry characterized by a plurality of spatial frequencies.

In some embodiments, the self-similar two-dimensional geometry is characterized by a first spatial frequency having a first length scale corresponding to the primary unit cell shape, a second spatial frequency having a second length scale corresponding to the secondary shape and a third spatial frequency having a third length scale corresponding to a tertiary shape. Optionally, the tertiary shape is similar to the primary unit cell shape and the secondary shape but having a different length scale. For example, in an embodiment, the first length scale of the first spatial frequency is 3 to 50 times smaller than the third length scale of the third spatial frequency and optionally for some embodiments, and the second length scale of the second spatial frequency is 2 to 10 times smaller than the third length scale of the third spatial frequency. In a specific embodiment, the first length scale of the first spatial frequency is selected from the range of 100 nm to 1 mm and the second length scale of the second spatial frequency is selected over the range of 1 micron to 10 mm, and the third length scale of the third spatial frequency is selected over the range of 10 micron to 100 mm. In exemplary embodiments, the plurality of spatial frequencies are further characterized by a plurality of length scales (e.g., first, second, third, etc.) characterized by a power series. The systems of the invention also include self-similar two-dimensional geometries characterized by even high orders of self-similar shape (e.g., 4, 5, 6, etc. orders).

In some embodiments, for example, the two-dimensional spatial geometry is a fractal-based two-dimensional geometry, for example, characterized by a fractal dimension greater than or equal to 1, optionally for some applications greater than or equal to 1.3, optionally for some applications greater than or equal to 1.5. In some embodiments, the two-dimensional spatial geometry is a fractal-based two-dimensional geometry characterized by a fractal dimension selected from the range of 1 to 2. Use of a self-similar and/or a fractal-based two-dimensional geometries for stretchable metallic or semiconducting device components is beneficial for providing systems capable of undergoing larger elastic strains relative to convention serpentine systems.

In some embodiments, the two-dimensional spatial geometry of the stretchable metallic or semiconducting device component does not have a serpentine or mesh geometry characterized by only a single spatial frequency. In some embodiments, the two-dimensional spatial geometry of the stretchable metallic or semiconducting device component does not have serpentine or mesh geometry characterized by a rectangular or square secondary shape.

In some embodiments, the two-dimensional spatial geometry of the stretchable metallic or semiconducting device component provides a high fill factor between first and second device components or over an active area of the electronic circuit, for example, a fill factor greater than or equal to 25%, optionally for some applications greater than or equal to 50%, and optionally for some applications greater than or equal to 70% For example, in some embodiments, the two-dimensional spatial geometry of the stretchable metallic or semiconducting device component provides a fill factor between first and second device components or provided over an active area of the electronic circuit selected from the range of 25% to 90%, optionally for some applications 50% to 90%

Embodiments of the invention utilize one or multiple structures provided in electrical communication with one another. For example, in one embodiment, multiple components are provided in a serial configuration or a branched configuration to provide electrical communication between two or more components of an electronic circuit, device or device component. For some embodiments, electrical communication is provided by one or more conductive or semiconductive elements, each independently having a two dimensional geometry characterized by a plurality of spatial frequencies. In some embodiments, the flexibility, fabrication and reliability of electronic circuits of the invention are enhanced by use of a single continuous structure, such as a unitary structure, or a plurality of discrete continuous structures, such as individual unitary structures. Use of multiple structures optionally provides flexibility and fabrication enhancements for other embodiments. For example, in some embodiments, a single unit-cell type geometry is fabricated in a large quantity and later assembled in a series or sequence to provide an electronic circuit secondary shape. In other embodiments, multiple distinct unit-cell geometries are assembled to create a larger electrical circuit characterized by a secondary shape.

In embodiments, for example, the electrically conductive elements of the metallic or semiconducting device component comprise a continuous structure. For example, in an embodiment, the electrically conductive elements of the metallic or semiconducting device component comprise a single unitary structure, such as a monolithic structure comprising a metallic or semiconducting material. In an embodiment, for example, the electrically conductive elements of the metallic or semiconducting device component comprise one or more thin film structures, for example, thin film structures generated by deposition (physical vapor deposition, chemical vapor deposition, atomic layer deposition, etc.), epitaxial growth and/or printing-based assembly techniques. In an embodiment, for example, the electrically conductive elements of the metallic or semiconducting device component comprise a continuous and monolithic thin film structure.

In some embodiments, the electrically conductive elements are one or more of: free standing structures at least partially supported by the elastic substrate; tethered structures at least partially connected to the elastic substrate; bound structures at least partially bound to the elastic substrate; embedded structures at least partially embedded in the elastic substrate or in an embedding layer supported by the substrate; or structures within a containment structure and in physical contact with a containment fluid or a containment solid. In some embodiment, only a portion (e.g., less than or equal to 10%) of the electrically conductive element is bonded to the elastic substrate or an intermediate structure provided between the stretchable metallic or semiconducting device component and the elastic substrate. In some embodiments, at least a portion of the electrically conductive elements of the metallic or semiconducting device component are provide within a containment structure, for example, a containment structure having a containment liquid or containment solid material having a low Young's modulus (e.g., a Young's modulus less than or equal to 1 MPa, or less than or equal to 0.5 MPa, or less than or equal to 200 KPa). Containment structures of the invention include those formed by a substrate and a superstrate arranged so as to accommodating a containment fluid or a containment solid. In some embodiments, the devices and device components of the invention further comprise a low modulus intermediate layer (e.g., a Young's modulus less than or equal to 1 MPa, or less than or equal to 0.5 MPa, or less than or equal to 200 KPa) provided between the substrate and the metallic or semiconducting device component, and optionally at least partially in physical contact with, or bonded to, the metallic or semiconducting device component. In an embodiment of this aspect, the low modulus intermediate layer has a thickness less than or equal to 1000 µm, or less than or equal to 500 µm, or less than or equal to 250 µm, or less than or equal to 100 µm.

Electrically conductive elements comprising a wide range of materials and having a wide range of physical properties are useful in the present invention. In certain embodiments, each of the electrically conductive elements independently has a thickness selected from the range of 10 nm to 1 mm, optionally for some applications selected from the range of 10 nm to 100 µm, and optionally for some applications selected from the range of 10 nm to 10 µm In some embodiments, each of the electrically conductive elements independently has a thickness less than or equal to 1 micron, optionally for some applications less than or equal to 500 nm. Optionally, each unit cell shape of the electrically conductive elements is independently characterized by lateral dimensions (e.g., length, width, radius, etc.) selected from the range of 100 nm to 10 mm.

In some embodiments, the stretchable metallic or semiconducting device components of systems of the invention are characterized by pathlengths between first and second ends independently selected from the range of 0.1 µm to 100 cm, optionally for some embodiments pathlengths selected from the range of 1 µm to 1 mm. As used herein, pathlength refers to the minimum distance between first and second ends along the path of the stretchable metallic or semiconducting device component tracing the two dimensional geometry, for example, along the circuitous path of a stretchable interconnect from first and second interconnected device components or along the along the circuitous path from first and second ends of a stretchable electrode. In an embodiment, for example, the one or more electrical interconnects provide for electrical connection between two connection points separated by a straight line distance selected from the range of 0.1 µm to 100 cm. In an embodiment, the stretchable metallic or semiconducting device component provides for electrical connection between first and second connection points and independently has pathlengths at least 2 times larger than the shortest straight line distance between the first and second connection points, and optionally at least 4 times larger than the shortest straight line distance between the first and second connection points. In an embodiment, the stretchable metallic or semiconducting device component provides for electrical connection between first and second connection points and independently has pathlengths 2 to 6 times larger than the shortest straight line distance between the first and second connection points.

In exemplary embodiments, the electrically conductive elements comprise a wire, a ribbon or nanomembrane. In some embodiments, the electrically conductive elements independently comprise a metal, an alloy, a single crystalline inorganic semiconductor or an amorphous inorganic semiconductor. Use of single crystalline materials, doped materials and/or high purity materials (e.g., purity great than or equal to 99.9%, optionally 99.99% and optionally 99.999% pure) for electrically conductive elements is useful for certain device embodiments. In a specific embodiment, the primary unit cell shape of the electrically conductive elements comprises a spring, a fold, a loop, a mesh or any combinations of these.

In some embodiments, for example, the primary unit cell shape comprises a plurality of the spatially offset features, such as opposing segments, adjacent segments or a combination of opposition and adjacent segments. For example, in one embodiment, the spatially offset features of the primary unit cell shape comprise a plurality of convex segments, concave segments, circular segments, ellipsoidal segments, triangular segments, rectangular segments, square segments, or any combination of these. Optionally, the convex segments, concave segments, circular segments, ellipsoidal segments, triangular segments, rectangular segments or square segments of the unit cell shape are separated by one or more straight line segments. Spatially offset features of the primary unit cell may be provided in an overall in-plane geometry wherein the features provide a spatially variance within a plane parallel to a supporting surface of the substrate. Alternatively, spatially offset features of the primary unit cell may be provided in an overall out-plane geometry wherein the features provide spatial variance within a plane orthogonal to a supporting surface of the substrate. In exemplary embodiments, the primary unit cell shape of the electrically conductive elements is selected from the group consisting of one or more of a von Koch curve, a Peano curve, a Hilbert curve, a Moore curve, a Vicsek fractal, a Greek cross, or any combination of these.

In specific embodiments, for example, the stretchable metallic or semiconducting device component has a curved configuration characterized by a plurality of curved features, optionally provided within a plane parallel to a supporting surface, for example, provided in a periodic, serpentine, branched of mesh geometry. In specific embodiments, for example, the stretchable metallic or semiconducting device component has a bent, buckled or wrinkled configuration characterized by a plurality of curved features, optionally provided within a plane orthogonal to a supporting surface, for example, provided in a periodic geometry.

In specific embodiments, for example, the stretchable metallic or semiconducting device component comprises an electrode or an electrode array. In one embodiment, the electrode or the electrode array is a component of sensor, actuator, or a radio frequency device. In an embodiment, for example, the electrode or the electrode array provides a fill factor over an active area of the electronic circuit selected from the range of 25% to 90%, optionally for some applications 50% to 90% and optionally for some applications 70% to 90%.

Aspects of some electronic circuit embodiments of the invention are useful for providing electrical communication between other electronic circuits and/or circuit components. For example, in embodiments, the stretchable metallic or semiconducting device component comprises one or more electrical interconnects. Use of the electronic circuits of embodiments of the invention as electrical interconnects gives the ability to provide stretchability to conventional or rigid circuits by contributing the beneficial stretchability aspects of the electronic circuits of embodiments of the invention as interconnection points between conventional or rigid circuit components. For example, in some embodiments, an electronic circuit further comprises one or more rigid island structures, wherein at least a portion of the one or more electrical interconnects is in electrical contact with the one or more rigid island structures. In one embodiment, for example, the rigid island structures comprise inorganic semiconductor devices or device components. In embodiments, an electronic circuit further comprises a plurality of the stretchable metallic or semiconducting device component in electrical contact with each of the rigid island structures. For example, in embodiments, the inorganic semiconductor devices or device components comprise a transistor, a diode, an amplifier, a multiplexer, a light emitting diode, a laser, a photodiode, an integrated circuit, a sensor, a temperature sensor, a thermistor, a heater, a resistive heater, an actuator or any combination of these.

Various elastic substrates are useful with embodiments of the invention to provide support and stretchability for the electronic circuit components of the system. In certain embodiments, the elastic substrate has an average thickness selected from the range of 0.25 µm to 10,000 µm, optionally for some applications an average thickness selected from the range of 10 µm to 1,000 µm For example, in one embodiment, the elastic substrate has an average thickness less than or equal to 1000 µm. Optionally, the elastic substrate is a prestrained elastic substrate. Useful elastic substrates include those having a Young's modulus selected from the range of 0.5 KPa to 100 GPa, optionally for some applications selected from the range of 10 KPa to 100 MPa, optionally for some applications selected from the range of 50 KPa to 10 MPa. Useful elastic substrates include those having a Young's modulus less than or equal to 1 MPa, or less than or equal to 0.5 MPa, or less than or equal to 200 KPa. Useful elastic substrates include those having a net bending stiffness selected from the range of $0.1 \times 10^4$ GPa µm$^4$ to $1 \times 10^9$ GPa µm$^4$. In specific embodiments, the elastic substrate comprises a material selected from the group consisting of: a polymer, an inorganic polymer, an organic polymer, a plastic, an elastomer, a biopolymer, a thermoset, a rubber silk and any combination of these. In an embodiment, the elastic substrate comprises an organosilicon compound, such as silicone. In an embodiment, the elastic substrate comprises PDMS (polydimethylsiloxane).

The invention provides systems and components for a range of device applications, including optical, electronic, thermal, mechanical and chemical sensing and/or actuation. For example, in various embodiments, electronic circuits of this aspect comprise one or more of an energy storage device, a photonic device, an optical sensor, a strain sensor, an electrical sensor, a temperature sensor, a chemical sensor, an actuator, a communication device, a micro- or nano-fluidic device, an integrated circuit or any component thereof. In a specific embodiment, an electronic circuit comprises a tissue mounted electronic device, a radio frequency antenna or a sensor compatible with magnetic resonance imaging.

Appropriately geometrically designed and/or configured circuit embodiments of the invention provide the ability to use the electrical circuits of the invention in unconventional situations and or for where electronic devices are typically unwanted, incompatible and/or inoperable. For example, electronic circuits of certain embodiments of the invention exhibit properties compatible with magnetic resonance imaging. Such embodiments provide the ability to measure and/or control properties of materials, such as a tissue, interfacing with an electronic circuit embodiment of the invention while magnetic resonance imaging measurements are being prepared and/or made. In one aspect, for example, the invention provides an electronic sensor compatible with magnetic resonance imaging. A specific embodiment of this aspect comprises: an elastic substrate; and a stretchable electrode array supported by the elastic substrate; the electrode array comprising a plurality of electrically conductive elements each having a primary unit cell shape, the electrically conductive elements connected in a sequence having a secondary shape providing an overall two-dimensional spatial geometry characterized by a plurality of spatial frequencies; wherein the stretchable electrode array is substantially transparent (e.g., absorption less than 0.1, optionally for some applications less than 0.05 and further optionally for some applications less than 0.01) to radio frequency electromagnetic radiation having frequencies selected from the range of 1 MHz-100 GHz, and wherein the two-dimensional spatial geometry of the stretchable electrode array allows for accommodation of elastic strain along one or more in-plane or out of plane dimensions, thereby providing stretchability of the electronic sensor. In some embodiments, for example, the stretchable electrode array does not include any closed loop structures over an active area of the electronic sensor, such as no closed loops within the electrode pad. In certain embodiments, the stretchable electrode array does not result in observable distortion or shadowing when using in combination with magnetic resonance imaging. In embodiments, for example, the magnetic resonance imaging includes exposure of the electronic sensor to RF pulses having the frequencies selected from the range of 100-300 MHz.

The invention includes stretchable circuits comprising a plurality of electronic devices or device components provided in an array, such as multiple individually addressable and optionally electronically isolated circuit components or electronic devices. Use of array configurations provide the electronic circuits of the invention, in embodiments, with the ability to interface with large areas or a surface, such as individual distinct areas of the surface of a sample or tissue. In an aspect, the invention provides electrode arrays useful for interfacing with a plurality of locations across an object or tissue. In a specific embodiment, an electrode array comprises: a plurality of stretchable metallic or semiconducting device components supported by the elastic substrate, wherein each of the stretchable metallic or semiconducting device components independently comprises a plurality of electrically conductive elements each having a primary unit cell shape, wherein the electrically conductive elements of each stretchable metallic or semiconducting device component are independently connected in a sequence having a secondary shape providing an overall two-dimensional spatial geometry characterized by a plurality of spatial frequencies; wherein the plurality of stretchable metallic or semiconducting device components provide a fill factor greater than or equal to 50% for an active area of the electrode array; and wherein the two-dimensional spatial geometries of the metallic or semiconducting device components allows for accommodation of elastic strain along one or more in-plane or out of plane dimensions, thereby providing stretchability of the electrode array.

Embodiments of the invention also provide stretchable electronic devices, such as devices incorporating electronic circuit embodiments of the invention. For example, incorporating electronic circuits comprising a self-similar geometry and/or a two-dimensional spatial frequency into a larger electronic device optionally results in providing the electronic devices with beneficial features, such as enhanced stretchability. In embodiments, stretchable devices incorporate both rigid and/or conventional circuits or circuit components and flexible/stretchable components in a configuration providing beneficial stretchability aspects to the overall configuration of the device. For example, in embodiments, the invention provides stretchable electronic devices, such as electronic devices incorporating electronic circuits and devices disclosed herein.

In an aspect, a stretchable electronic device comprises: a plurality of rigid island structures supported by an elastic substrate; wherein each of the rigid island structures independently comprises an inorganic semiconductor device or device component; a plurality of stretchable metallic or semiconducting device components electrically interconnecting at least a portion of the rigid island structures, wherein each of the stretchable metallic or semiconducting device components independently comprises a plurality of electrically conductive elements each having a primary unit cell shape, wherein the electrically conductive elements of each stretchable metallic or semiconducting device component are independently connected in a sequence having a secondary shape providing an overall two-dimensional spatial geometry characterized by a plurality of spatial frequencies; wherein the two-dimensional spatial geometries of the metallic or semiconducting device components allows for accommodation of elastic strain along one or more in-plane or out of plane dimensions, thereby providing stretchability of the stretchable electronic device.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 4a and FIG. 4d depict optical images of metal wires patterned with second and third order half-and-half Peano layouts. The samples connect to a stretchable set of four wires used for four point probing. FIG. 4b and FIG. 4e provide plots of differential resistances measured at increasing levels of maximum applied strain. The onset of plastic deformation corresponds to the strain at which the differential resistance is non-zero. FIG. 4c and FIG. 4f illustrate a comparison between experimental optical images and FEM-constructed images of the second and third order structures for different levels of strain.

FIG. 5a provides a schematic image of a multifunctional device based on a Greek cross fractal design. FIG. 5b provides a corresponding image of the device on a wafer, and FIG. 5c provides an image of the device mounted on skin. FIG. 5d depicts the device used in a Joule heating operation mode by driving currents through the insulated heater wires, FIG. 5e provides data for from device used for temperature sensing via four point probing, and FIG. 5f provides data from the device used for ECG measurements.

FIG. 6a provides data illustrating return loss parameters of a box fractal antenna under different amounts of tensile strain. The inset in FIG. 6a shows an optical image of an unstrained antenna fully bonded onto an elastomer. FIG. 6b provides an optical image of a box fractal antenna under 30% tensile strain and a corresponding FEM-constructed image of the same structure. FIG. 6c provides far-field profiles of the antenna under no strain and 30% strain. FIG. 6d depicts a cross sectional MRI image of different copper samples (labeled 1-7) attached to a bottle of water. The solid and mesh samples display shadowing in the MRI image while the fractal-based samples display no such shadowing. The sample layouts all are 1×1 inches and are: (1) solid square, (2) thick mesh, (3) thin mesh, (4) horizontal and vertical stripes separated by a spacer, (5) Peano curve, (6) Hilbert curve, (7) Serpentine Greek cross.

FIG. 18 provides an overview of elastic mechanics of five different Peano-based wire structures. Calculated stretchability of metal wires mounted on an elastomer in five different second order Peano layouts, given a maximum principal strain criterion of 0.3% in any section of the wires. The layouts range from "all-horizontal" (subunits are all oriented along the x-axis) to "all-vertical" (subunits are all oriented along the y-axis). The strain criterion defines the transition from elastic to plastic deformation in the wires.

FIG. 19 provides an overview of simulated uniaxial elastic stretchability for serpentine wires as a function of arc solid angle. The inset of the middle column defines the arc solid angle. The cross-sectional geometries and materials match those from FIG. 3, and all structures have R=620 µm and w=70 µm (defined in Figure S2). These simulations clearly display that elastic stretchability increases as a function of arc angle in these primitive serpentine geometries. As such, deterministically defining the arc section geometries in wire-type structures can help optimize the mechanics.

FIGS. 21A-21E provide an overview of aspects in battery layout and design. FIG. 21A provides a schematic illustration of a completed device, in a state of stretching and bending. FIG. 21B provides an exploded view layout of the various layers in the battery structure. FIG. 21C provides an illustration of 'self-similar' serpentine geometries used for the interconnects (black: $1^{st}$ level serpentine; yellow: $2^{nd}$ level serpentine). FIG. 21D shows optical images of the Al electrode pads and self-similar interconnects on Si wafer (left panel; top down view; ~4 unit cells), after transfer printing on a sheet of silicone (middle panel; top down view, in a bent geometry), and with moulded slurries of $LiCoO_2$ (right panel; top down view, in a bent geometry). FIG. 21E shows optical images of the Cu electrode pads and self-similar interconnects on Si wafer (left panel; top down view; ~4 unit cells), after transfer printing on a sheet of silicone (middle panel; top down view, in a bent geometry), and with moulded slurries of $Li_4Ti_5O_{12}$ (right panel; top down view, in a bent geometry). Scale bars in FIG. 21D and FIG. 21E are 2 mm.

FIG. 23A provides results of Galvanostatic charging and discharging of the battery electrodes without (black) and with 300% uniaxial strain (red). FIG. 23B provides results showing capacity retention (black square) and coulombic efficiency (red circle) over 20 cycles with a cutoff voltage of 2.5-1.6 V. FIG. 23C provides data showing output power as a function of applied biaxial strain. FIG. 23D shows an image of operation of a battery connected to a red LED while FIGS. 23E-23H show an image of a device biaxially stretched to 300% (FIG. 23E), folded (FIG. 23F), twisted (FIG. 23G), and compliant when mounted on the human elbow (FIG. 23H).

FIG. 24A provides a circuit diagram. FIG. 24B shows an image of the integrated system with different components labeled. FIG. 24C provides data showing characterization of the wireless coil with an alternating voltage input at a frequency of 44.5 MHz (black) and the resulting direct voltage output (red), as indicated in FIG. 24A. FIG. 24D provides data showing charging voltage (top) and current (bottom) curves as a stretchable battery is charged with 3 V output from the wireless circuit. The scale bar in FIG. 24B is 1 cm.

FIG. 67. The non-dimensional stretchabilities of various geometric parameters, as calculated by analytic model, FEA based on infinitesimal deformation and FEA based on finite deformation: (a) 1st order serpentine interconnect; (b) 2nd order serpentine interconnect, with m(1)=8 and η(1)=2; (c) 2nd order serpentine interconnect, with m(2)=1 and η(2)=2. In the FEA of both 1st and 2nd order structures, the width is fixed as a typical value of w=0.4l(1).

DETAILED DESCRIPTION

Figure 1A:
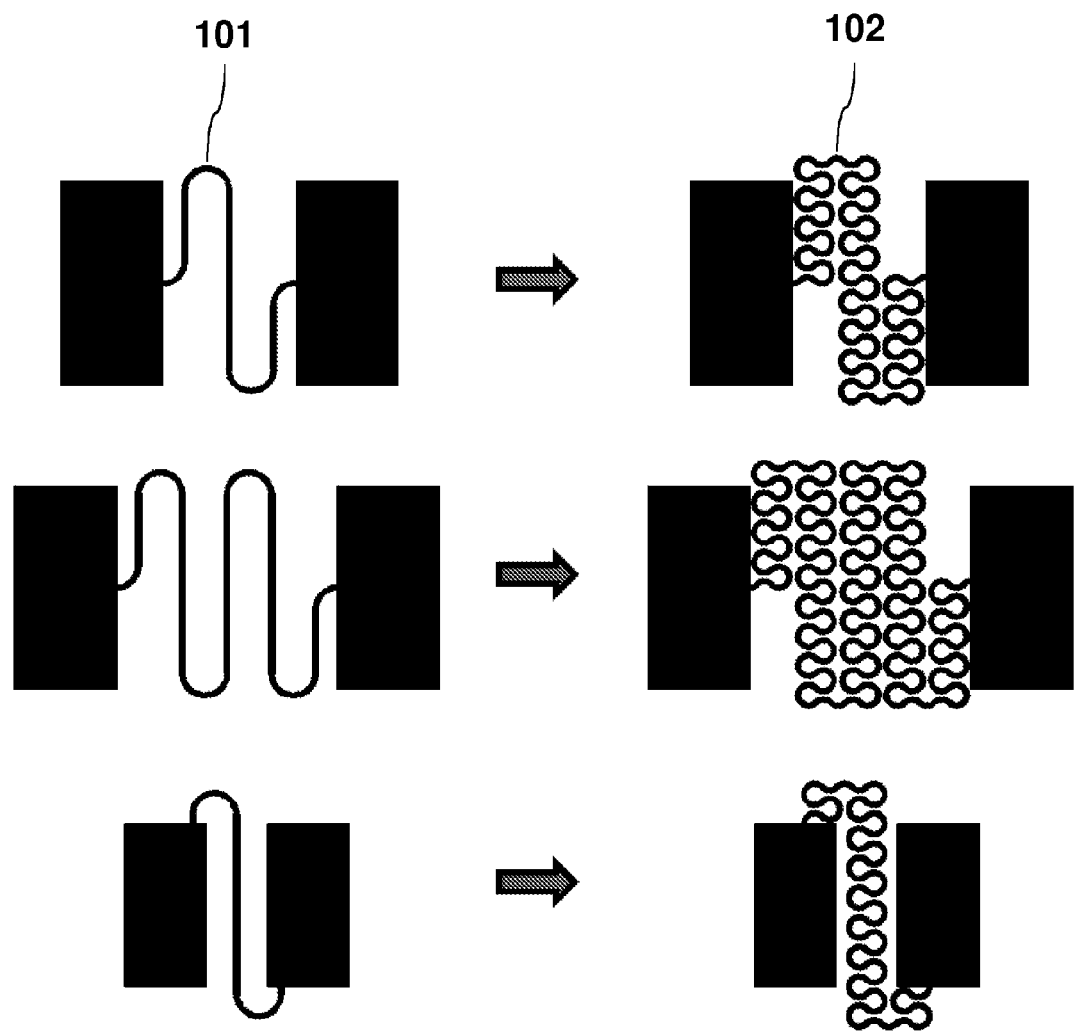
FIGS. 1A, 1B and 1C provide examples of two-dimensional spatial geometries useful with aspects of the invention.

In general, the terms and phrases used herein have their art-recognized meaning, which can be found by reference to standard texts, journal references and contexts known to those skilled in the art. The following definitions are provided to clarify their specific use in the context of the invention.

"Two-dimensional spatial geometry" refers to an arrangement of materials, structures or components in space such that they are distributed along two independent axes, such as two axes defining a plane, or across a surface of an object or substrate. In embodiments, an object possessing a two-dimensional spatial geometry includes materials, structures or components traversing, at least in part, along lengths of each of two dimensions, such as in an x-y plane. As used herein "two-dimensional spatial geometry" is distinguished from a one-dimensional geometry, such as the geometry corresponding to a line or a thin film of a material extending directly between two points in space. In embodiments, a two-dimensional spatial geometry comprises an arrangement of materials, structures or components in a conformal manner across a surface, for example, a planar or non-planar surface.

A "two-dimensional spatial geometry characterized by a plurality of spatial frequencies" refers to an arrangement of materials, structures or components in space such that they are distributed along two independent axes and where the materials, structures or components themselves are characterized by periodic or repeating spatial configurations characterized by at least two different length scales. In embodiments, the plurality of spatial frequencies are characterized by a plurality of length scales, such as a first order, unit-cell or short range length scale, a second order, secondary shape or longer range length scale, a third order, tertiary shape or long range length scale, etc. For some embodiments, the plurality of spatial frequencies of a two-dimensional spatial geometry can be characterized by a frequency analysis of the spatial distribution of materials arranged in the two-dimensional spatial geometry, such as a Fourier transform analysis, yielding two or more maxima characterizing the spatial distribution of materials. In embodiments, two-dimensional spatial geometries characterized by a plurality of spatial frequencies include, but are not limited to, self-similar geometries, fractal like geometries, geometries having a fractal dimension of between 1 and 2, optionally for some applications a fractal dimension of between 1.3 and 2. In embodiments, two-dimensional spatial geometries characterized by a plurality of spatial frequencies include, but are not limited to, spring-within-a-spring type geometries.

"Fractal-based two-dimensional geometry" refers to a two-dimensional geometry of the stretchable metallic or semiconducting device component that is based-on or otherwise derived from one or more deterministic fractal patterns. Useful fractal patterns for fractal-based geometries of the invention include, but are not limited to, Peano, Vicsek, Greek Cross, and Hilbert fractals. The spatial layouts of fractal-based geometries incorporate features of one or more fractal patterns, for example, using the lines, perimeters or shapes (in part or in whole), as a layout design rule(s). Fractal-based geometries may optionally incorporate modifications of a fractal pattern to enhance overall mechanical or other physical properties, such as stretchability and/or fill factor, for example, by replacing sharp corners in fractal patterns with loops or straight lines in fractal patterns with serpentine geometries. In an embodiment, fractal-based geometries useful in the present invention are characterized by an approximate fractal dimension selected from the range of 1.2 to 2. In an embodiment, fractal-based geometries useful in the present invention have spatial properties defined by precise or approximate iterative rules, which characterize higher order fractal-like patterns by multiple length scales. For example, if the Nth iterative pattern has a length scale L_N and the N−1th iterative pattern has a length sale L_N−1, then average ratio L_N/L_N−1 for all N's is A, and the ratio L_N/L_N−1 for a given N falls ±30% of A. Fractal-based geometries for some embodiments combine two or more basic fractal-like patterns into lines or meshes to create larger fractal-like pattern (see, e.g., FIG. 3C).

"Fill factor" refers to the percentage of an area between two elements, such as first and second electrical contact points, device islands or contact pads, that supports and/or is occupied by a material, element and/or device component. In an embodiment, for example, fill factor refers to the percentage of a region of a surface, such as a surface of an elastic substrate or layer provided thereon, that supports (and optionally is in physical contact with) one or more stretchable metallic or semiconducting device components. In an embodiment, for example, fill factor refers to the percentage of a region of an active area of a device that supports (and optionally is in physical contact with) one or more stretchable metallic or semiconducting device components. In an embodiment, for example, fill factor refers to the percentage of a surface extending between two device islands, such as semiconductor device components or devices, that supports (and optionally is in physical contact with) one or more stretchable metallic or semiconducting device components. In an embodiment, for example, fill factor refers to the percentage of the area of the portion of a surface extending between two elements, such as first and second electrical contact points or contact pads, that supports one or more stretchable metallic or semiconducting device components.

"Functional layer" refers to a layer that imparts some functionality to the device. For example, the functional layer may contain semiconductor components. Alternatively, the functional layer may comprise multiple layers, such as multiple semiconductor layers separated by support layers. The functional layer may comprise a plurality of patterned elements, such as interconnects running between or below electrodes or islands. The functional layer may be homogeneous or may have one or more properties or materials that are inhomogeneous. "Inhomogeneous property" refers to a physical parameter that can spatially vary, thereby effecting the position of the neutral mechanical plane within a multilayer device.

"Structural layer" refers to a layer that imparts structural functionality, for example by supporting and/or encapsulating and/or partitioning device components.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of microelectronics and electronic devices. Useful semiconductors include those comprising elemental semiconductors, such as silicon, germanium and diamond, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductors such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInP, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

A "semiconductor component" broadly refers to any semiconductor material, composition or structure, and expressly includes high quality single crystalline and polycrystalline semiconductors, semiconductor materials fabricated via high temperature processing, doped semiconductor materials, inorganic semiconductors, and composite semiconductor materials. In some embodiments, for example, a semiconductor component is a semiconductor device or component thereof.

A "component" is used broadly to refer to an individual part of a device. An "interconnect" is one example of a component, and refers to an electrically conducting structure capable of establishing an electrical connection with another component or between components. In particular, an interconnect may establish electrical contact between components that are separate. Depending on the desired device specifications, operation, and application, an interconnect is made from a suitable material. Suitable conductive materials include semiconductors. In some embodiments, for example, a component is a component of a semiconductor device.

Other components include, but are not limited to, thin film transistors (TFTs), transistors, electrodes, integrated circuits, circuit elements, control elements, microprocessors, transducers, islands, bridges and combinations thereof. Components may be connected to one or more contact pads as known in the art, such as by metal evaporation, wire bonding, and application of solids or conductive pastes, for example.

"Neutral mechanical plane" (NMP) refers to an imaginary plane existing in the lateral, b, and longitudinal, l, directions of a device. The NMP is less susceptible to bending stress than other planes of the device that lie at more extreme positions along the vertical, h, axis of the device and/or within more bendable layers of the device. Thus, the position of the NMP is determined by both the thickness of the device and the materials forming the layer(s) of the device.

"Coincident" refers to the relative position of two or more objects, planes or surfaces, for example a surface such as a neutral mechanical plane that is positioned within or is adjacent to a layer, such as a functional layer, substrate layer, or other layer. In an embodiment, a neutral mechanical plane is positioned to correspond to the most strain-sensitive layer or material within the layer.

"Proximate" refers to the relative position of two or more objects, planes or surfaces, for example a neutral mechanical plane that closely follows the position of a layer, such as a functional layer, substrate layer, or other layer while still providing desired conformability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A neutral mechanical plane that is proximate to a layer need not be constrained within that layer, but may be positioned proximate or sufficiently near to provide a functional benefit of reducing the strain on the strain-sensitive device element.

"Unitary" refers to an object formed as a single piece or undivided whole.

The terms "direct and indirect" describe the actions or physical positions of one component relative to another component, or one device relative to another device. For example, a component that "directly" acts upon or touches another component does so without intervention from an intermediary. Contrarily, a component that "indirectly" acts upon or touches another component does so through an intermediary (e.g., a third component).

"Electronic device" generally refers to a device incorporating a plurality of components, and includes large area electronics, printed wire boards, integrated circuits, component arrays, electrophysiological and/or biological and/or chemical sensors, and physical sensors (e.g., temperature, acceleration, etc.).

"Sensing" refers to detecting the presence, absence, amount, magnitude or intensity of a physical and/or chemical property. Useful electronic device components for sensing include, but are not limited to electrode elements, chemical or biological sensor elements, pH sensors, accelerometers, temperature sensors and capacitive sensors.

"Island" refers to a relatively rigid component of an electronic device comprising a plurality of semiconductor components. "Bridge" refers to structures interconnecting two or more islands or one island to another component. The invention includes electronic devices having bridge structures comprising electrical interconnects, such as stretchable electrical interconnects provided between and in electrical contact with semiconductor device components.

"Encapsulate" refers to the orientation of one structure such that it is at least partially, and in some cases completely, surrounded by one or more other structures. "Partially encapsulated" refers to the orientation of one structure such that it is partially surrounded by one or more other structures, for example, wherein 30%, or optionally 50% or optionally 90%, of the external surfaces of the structure is surrounded by one or more structures. "Completely encapsulated" refers to the orientation of one structure such that it is completely surrounded by one or more other structures.

"Contiguous" refers to materials or layers that are touching or connected throughout in an unbroken sequence. In one embodiment, a contiguous layer of a device has not been manipulated to remove a substantial portion (e.g., 10% or more) of the originally provided material or layer.

"Active circuit" and "active circuitry" refer to one or more components configured for performing a specific function. Useful active circuits include, but are not limited to, amplifier circuits, multiplexing circuits, current limiting circuits, integrated circuits, impedance matching circuits, wireless power harvesting circuits, wireless data transmission circuits, transistors and transistor arrays.

"Substrate" refers to a material, layer or other structure having a surface, such as a receiving surface or supporting surface, that is capable of supporting one or more components or electronic devices. A component that is "bonded" to the substrate refers to a component that is in physical contact with the substrate and unable to substantially move relative to the substrate surface to which it is bonded. Unbonded components or portions of a component, in contrast, are capable of substantial movement relative to the substrate. In an embodiment, the invention includes electronic devices having one or more free standing semiconductor device components supported by a substrate, optionally in physical contact with the substrate or in physical contact with one or more intermediate structures supported by the substrate. In an embodiment, the invention includes electronic devices having one or more tethered semiconductor device components supported by, or optionally bonded to, one or more structures, such as a pedestal or array of pedestals, independently connecting the semiconductor device components to the substrate.

"Free standing" refers to a configuration wherein a device or device component is supported by, but not bonded to, a substrate or intermediate structure provided between the device or device component and the substrate. In an embodiment, for example, a substrate is able to move relative to a free standing device or component supported by the substrate. In an embodiment, for example, a free standing device or component is able to move relative to a substrate supporting the free standing device or component. In some embodiments, for example, a free standing configuration of a device or device component decouples movement and/or deformation of the substrate from the device or device component. In some embodiments, for example, a free standing configuration of a device or device component decouples forces generated by elongation, compression or deformation of the substrate from the device or device component. In some embodiments, a free standing device or component is characterized by undergoing an associative interaction with a substrate surface or intermediate structure provided thereon, such as a Van der Waals interaction, dipole-dipole interaction or other non-covalent associative interaction. In an embodiment, a free standing device or component is not covalently bonded to the supporting surface of a substrate.

"Tethered" refers to a configuration wherein a device or component is connected to a substrate via one or more tethering structures, such as a pedestal or array of pedestals. In an embodiment, for example, a substrate is able to move relative to a tethered device or component supported by the substrate. In an embodiment, for example, a tethered device or component is able to move relative to a substrate supporting the tethered device or component. In some embodiments, for example, a tethered configuration of a device or device component decouples movement and/or deformation of the substrate from the device or device component. In some embodiments, for example, a tethered configuration of a device or device component decouples forces generated by elongation, compression or deformation of the substrate from the device or device component. In some embodiments, less than 20%, optionally less than 5%, and optionally less than 1%, of the area of a bottom surface of a device or component is covalently bonded to the tethering structure connected to the substrate.

"Nanostructured surface" and "microstructured surface" refer to device surfaces having nanometer-sized and micrometer-sized relief features, respectively. The relief features extend a length, x, from a substantially contiguous plane of the device surface. Quantitative descriptors of a structured surface include surface roughness parameters, such as $R_{max}$, $R_a$, and normalized roughness ($R_a/R_{max}$), all of which may be measured by atomic force microscopy (AFM). $R_{max}$ is the maximum height between a highest peak to a lowest valley. $R_a$ is the center-line-mean roughness, which is the average of an absolute value of a deviation from a center line of a roughness curve to the roughness curve. The surface of a substrate or layer is "substantially smooth", for the purposes of this disclosure, if the surface has an $R_a$ value of 100 nm or less. If the surface has an $R_a$ value greater than 100 nm, the surface is considered to be a "structured surface" for purposes of this disclosure.

"Dielectric" refers to a non-conducting or insulating material. In an embodiment, an inorganic dielectric comprises a dielectric material substantially free of carbon. Specific examples of inorganic dielectric materials include, but are not limited to, silicon nitride, silicon dioxide and non-conjugated polymers.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, grafted, tapered and other copolymers. Useful polymers include organic polymers or inorganic polymers that may be in amorphous, semi-amorphous, crystalline or partially crystalline states. Crosslinked polymers having linked monomer chains are particularly useful for some applications. Polymers useable in the methods, devices and components include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone-based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

"Elastomeric stamp" and "elastomeric transfer device" are used interchangeably and refer to an elastomeric material having a surface that can receive as well as transfer a material. Exemplary elastomeric transfer devices include stamps, molds and masks. The transfer device affects and/or facilitates material transfer from a donor material to a receiver material.

"Elastomer" refers to a polymeric material which can be stretched or deformed and returned to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers include, but are not limited to, thermoplastic elastomers, styrenic materials, olefinic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly (phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a polymer is an elastomer.

"Conformable" refers to a device, material or substrate which has a bending stiffness that is sufficiently low to allow the device, material or substrate to adopt any desired contour profile, for example a contour profile allowing for conformal contact with a surface having a pattern of relief features.

"Conformal contact" refers to contact established between a device and a receiving surface. In one aspect, conformal contact involves a macroscopic adaptation of one or more surfaces (e.g., contact surfaces) of a device to the overall shape of a surface. In another aspect, conformal contact involves a microscopic adaptation of one or more surfaces (e.g., contact surfaces) of a device to a surface resulting in an intimate contact substantially free of voids. In an embodiment, conformal contact involves adaptation of a contact surface(s) of the device to a receiving surface(s) such that intimate contact is achieved, for example, wherein less than 20% of the surface area of a contact surface of the device does not physically contact the receiving surface, or optionally less than 10% of a contact surface of the device does not physically contact the receiving surface, or optionally less than 5% of a contact surface of the device does not physically contact the receiving surface.

"Young's modulus" is a mechanical property of a material, device or layer which refers to the ratio of stress to strain for a given substance. Young's modulus may be provided by the expression:

$$E = \frac{(\text{stress})}{(\text{strain})} = \left(\frac{L_0}{\Delta L}\right)\left(\frac{F}{A}\right),\tag{I}$$

where E is Young's modulus, $L_0$ is the equilibrium length, $\Delta L$ is the length change under the applied stress, F is the force applied, and A is the area over which the force is applied. Young's modulus may also be expressed in terms of Lame constants via the equation:

$$E = \frac{\mu(3\lambda + 2\mu)}{\lambda + \mu},\tag{II}$$

where $\lambda$ and $\mu$ are Lame constants. High Young's modulus (or "high modulus") and low Young's modulus (or "low modulus") are relative descriptors of the magnitude of Young's modulus in a given material, layer or device. In some embodiments, a high Young's modulus is larger than a low Young's modulus, preferably about 10 times larger for some applications, more preferably about 100 times larger for other applications, and even more preferably about 1000 times larger for yet other applications. In an embodiment, a low modulus layer has a Young's modulus less than 100 MPa, optionally less than 10 MPa, and optionally a Young's modulus selected from the range of 0.1 MPa to 50 MPa. In an embodiment, a high modulus layer has a Young's modulus greater than 100 MPa, optionally greater than 10 GPa, and optionally a Young's modulus selected from the range of 1 GPa to 100 GPa.

"Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire material.

Low modulus" refers to materials having a Young's modulus less than or equal to 1 MPa, less than or equal to 0.5 MPa, or less than or equal to 200 KPa. A low modulus material may have a Young's modulus selected from the range of 1 MPa to 1 KPa, or 0.5 MPa to 1 KPa, or 200 KPa to 1 KPa, 100 KPa to 1 KPa, or 50 KPa to 1 KPa.

"Bending stiffness" is a mechanical property of a material, device or layer describing the resistance of the material, device or layer to an applied bending moment. Generally, bending stiffness is defined as the product of the modulus and area moment of inertia of the material, device or layer. A material having an inhomogeneous bending stiffness may optionally be described in terms of a "bulk" or "average" bending stiffness for the entire layer of material.

"Spatially offset" refers to an arrangement of features of a unit cell in a configuration where they do not completely overlap. For example, in one embodiment, features of a unit cell that are spatially offset unit cells are rotated with respect to one another. For example, in embodiments, features of a unit cell that are spatially offset unit cells are translated with respect to one another. For example, in one embodiment, features of a unit cell that are spatially offset unit cells are rotated and translated with respect to one another. In an embodiment, features of a unit cell that are spatially offset are positioned in a plane or at a height different from one another. In an embodiment, features of a unit cell that are spatially offset possess a different inter-cell spacing length that that of other adjacent unit cells. In embodiments, spatially offset features of a unit cell are arranged such that the overall arrangement of all unit cells is not a straight line.

Figure 1B:
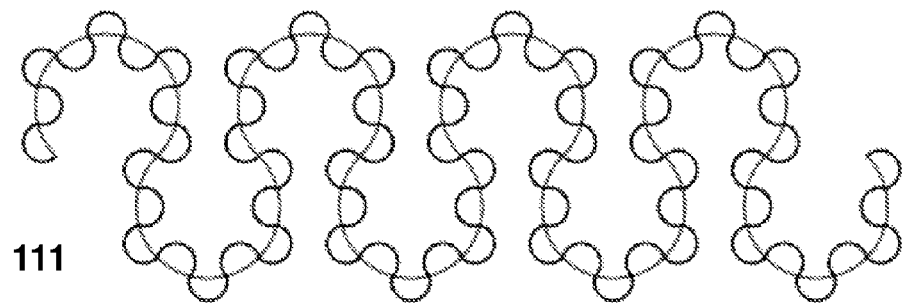
Figure 1B:
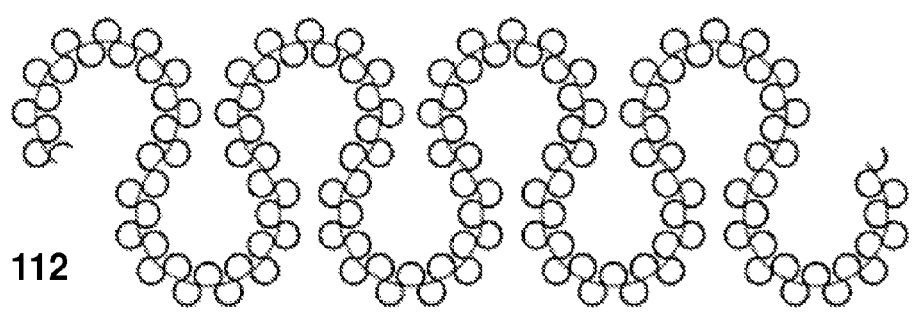
Figure 1B:
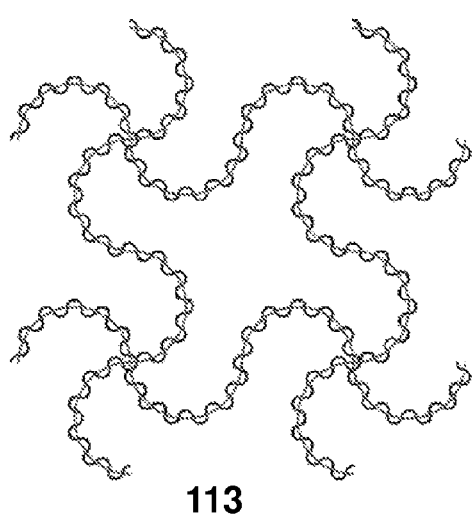
Figure 1B:
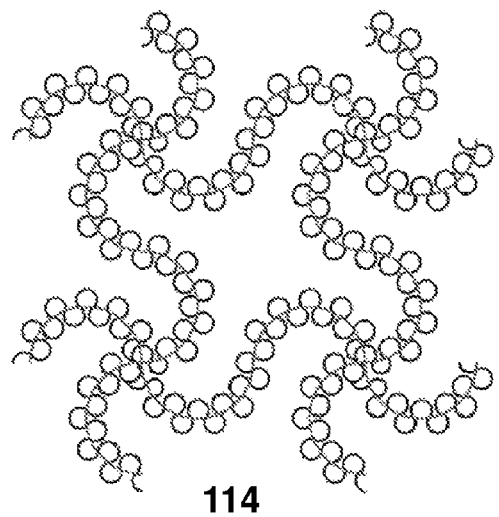
Figure 1C:
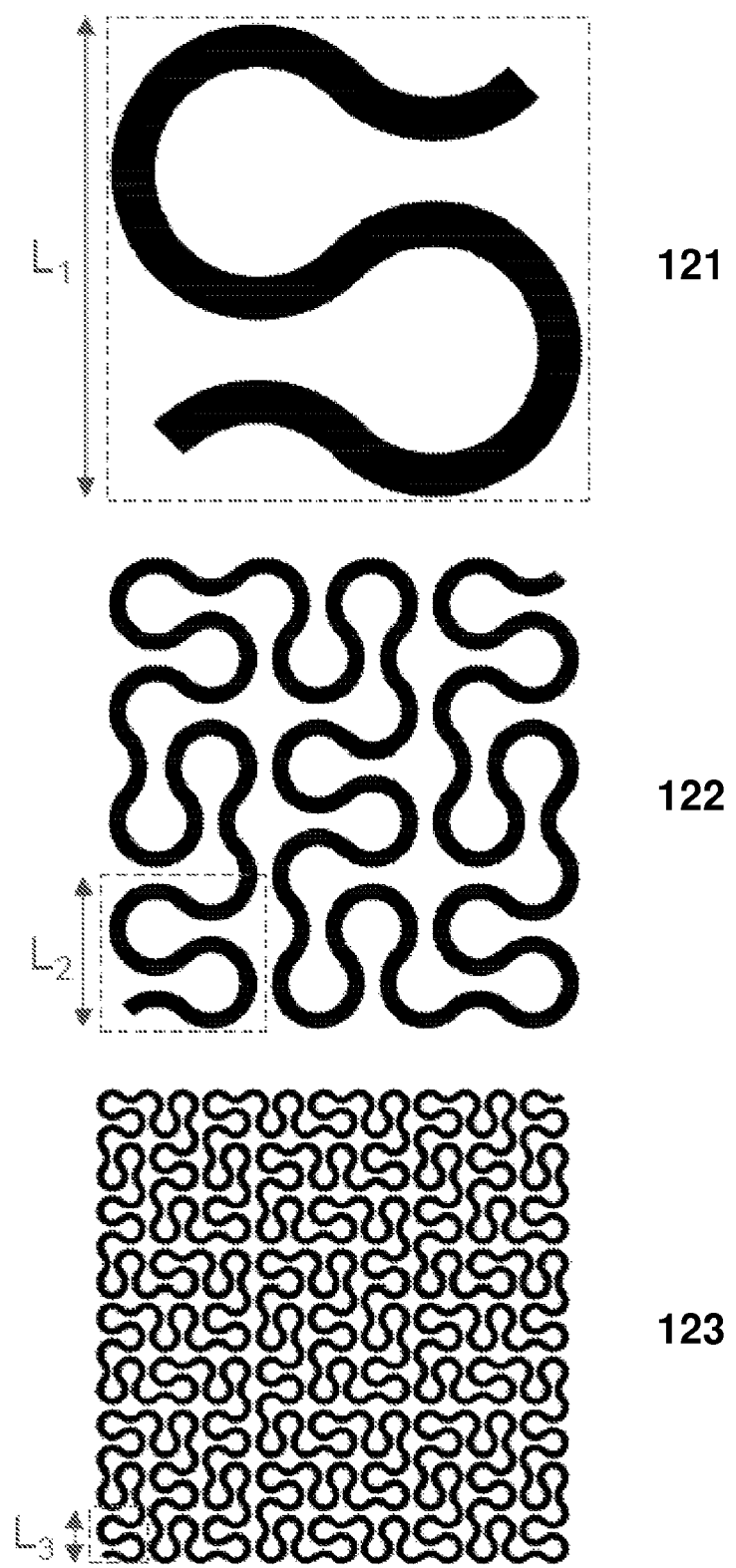

FIGS. 1A, 1B and 1C provide examples of two-dimensional spatial geometries useful for circuits, devices and device components of the invention. FIG. 1A illustrates three embodiments where electrical interconnects or electrodes (fully bonded, selectively bonded, or free standing) 101 are replaced by electrical interconnects or electrodes having spring-within-a-spring geometries 102 comprising arc-shaped serpentine segments. These embodiments illustrate the utility of aspects of the invention for providing a geometry where multiple first-order unit cells are arranged in a specific configuration to create a secondary geometry. The interconnects having the spring-with-a-spring geometry 102, in embodiments, adopt a space-filling or pseudo space filling configuration.

FIG. 1B further illustrates the concept of self-similar geometries integrated in one-dimensional serpentine horseshoe lines and two-dimensional serpentine horseshoe meshes. Curve 111 comprises a self-similar geometry, where the first order curved configuration, comprising a plurality of arc-shaped and spatially offset segments in a serial configuration arranged to form a second order curved configuration, resulting in the formation of a spring-within-a-spring geometry. Curve 112 shows an embodiment where the arc angle of the first order configuration is increased, resulting in an increase in the space-filling by the curve and an increase in overall path length and enhancement in stretchable mechanics, while still maintaining the second order curved configuration and spring-within-a-spring geometry. Curves 113 and 114 illustrate overlapping arrangements of multiple spring-within-a-spring geometries, to create a stretchable 2D mesh geometry. The arc angle of the first order curvature of curve 114 is increased as compared to curve 113, resulting in an overall greater amount of space filling and enhanced stretchability by curve 114. These 1D lines and 2D meshes demonstrated in FIG. 1B are specific examples of stretchable 1D and 2D constructs, and it will be apparent to one of skill in the art that the geometries of the present invention are general to a range of 1D and 2D structures.

FIG. 1C provides a schematic illustration of an iterative geometry showing self-similarity at three different size scales for a Peano type curve. In the top panel, the curve is characterized by a size dimension $L_1$, corresponding to the side of a first order unit cell 121. The first order unit cell includes a folded geometry with arc-shaped segments arranged in a spatially offset configuration to provide an overall connection between the lower left and the upper right of the unit cell, and including a pathlength longer than the straight line distance between lower left and upper right of the unit cell. In the middle panel, the size of the unit cell is shrunk by about ⅓ to provide a characteristic size dimension $L_2$, with 9 unit cells arranged in a serial configuration to provide a second order geometry 122 having a similar configuration to the geometry of the individual unit cell 121, providing an overall connection between the lower left and the upper right of the second order geometry and increased pathlength as compared to the pathlength of the first order unit cell and the point to point straight line distance from lower left to upper right. In the bottom panel, the size of the unit cell is shrunk by about another ⅓ to provide a characteristic size dimension $L_3$, with 9 second order unit cells (or 81 first order unit cells) arranged in a serial configuration to provide a third order geometry 123 having a similar configuration to the second order geometry 122 and first order geometry 121, and again providing an overall connection between lower left and upper right and significantly increased pathlength as compared to the pathlength of the first order unit cell and the point to point straight line distance from lower left to upper right. Here, the higher order geometries increase the space filling by the curve as compared with lower order geometries. For this unit cell and curve configuration, additional iterations of the geometries are contemplated. For example, as we iterate this particular fractal, we have the option of placing the individual N−1th subunit cells in either the x- or y-axis orientations, which leads to many Peano variations. In an embodiment, for example, the characteristic size dimension of the unit cell shrinking by about ⅓ for each successive iteration and the number of first-order unit cells making up each successive order geometry increasing by a factor of 9, accompanied by an approximately 9× increase in pathlength.

The invention may be further understood by the following non-limiting examples.

Example 1

Fractal Design Concepts for Stretchable Electronics

Stretchable electronics provide a foundation for applications that exceed the scope of conventional wafer and circuit board technologies due to their unique capacity to integrate with soft materials and curvilinear surfaces. The ultimate scope of possibilities is predicated on the development of device architectures that simultaneously offer advanced electronic function and compliant mechanics. This example shows that thin films of hard electronic materials patterned in deterministic fractal motifs and bonded to elastomers enable unusual mechanics with important implications in stretchable device design. In particular, this example demonstrates the utility of Peano, Greek cross, Vicsek, and other fractal constructs to yield space-filling structures of metals, polymers, and semiconductors, including monocrystalline silicon, for electrophysiological sensors, precision monitors and actuators, and radio frequency antennas. These devices support conformal mounting on the skin and have properties relevant to biomedicine, such as invisibility under magnetic resonance imaging. The results suggest that fractal-based layouts can be broadly developed as design strategies for hard-soft materials integration.

The field of stretchable electronics is of growing interest, motivated both by fundamental considerations in materials science and by application spaces in areas such as biomedicine. A core challenge is in achieving high performance electronic functionality with systems that offer low modulus, elastic responses to large strain deformations. Two of the most successful approaches to this problem exploit advanced composites, in a generalized sense. The first involves dispersing conducting or semiconducting nanomaterials (i.e. nanowires, nanotubes or graphene) into elastomeric matrices. Here, three-dimensional (3D) structures, including distributed networks of contacts, form spontaneously, but with limited direct control over key variables other than the overall loading fraction. The second exploits alternative classes of composites, created deterministically by using thin layers of electronic materials lithographically defined into two-dimensional (2D) filamentary mesh layouts. Advantages of this approach include the ability to co-integrate multiple high-performance material platforms with high spatial resolution and engineering control, in ways that also allow proper electrical contacts, both internal and external to the system. An essential aim of both 3D random and 2D deterministic composites in stretchable electronics is to combine high loading of a hard component, for use in active devices, with overall mechanics that is dominated by a soft matrix, for stretchable response. This goal is opposite to that associated with traditional composites engineering, and therefore demands alternative approaches.

Figure 2:
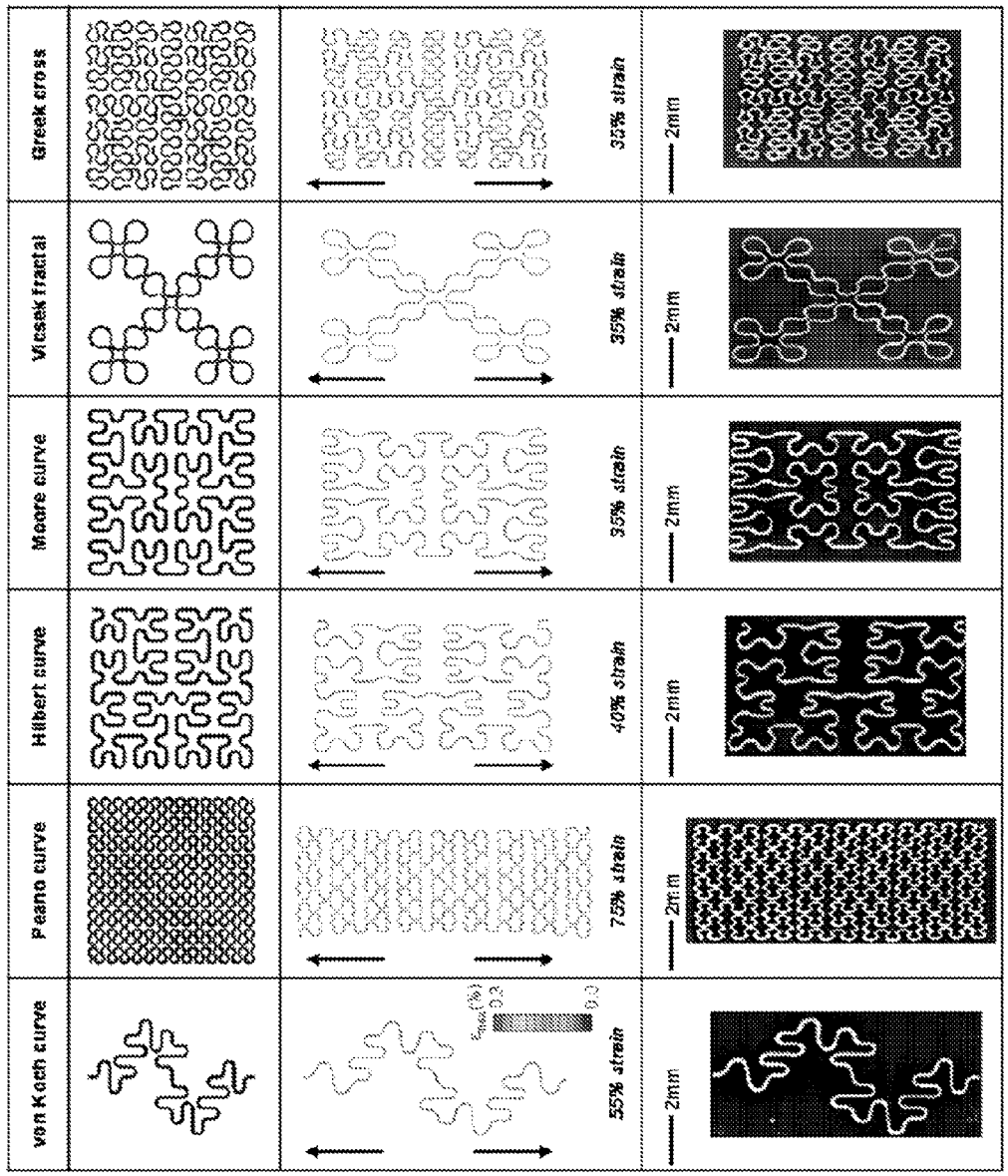
FIG. 2 provides an overview of representative fractal-inspired layouts for hard-soft materials integration. Six different patterns of metal wires fully bonded to elastomer substrates demonstrate the application of deterministic fractal designs as general layouts for stretchable electronics. These patterns include line, loop, and branch-like geometries, and they are applicable to a broad range of active and passive electronic components. In all cases, arc sections replace the sharp corners from the mathematically-defined fractal layouts to improve the elastic mechanics (top row). FEM images of each structure under elastic tensile strain (middle row) and their corresponding experimental MicroXCT images (bottom row) demonstrate the elastic mechanics. The wires consist of layers of gold (300 nm) sandwiched by polyimide (1.2 μm) and mounted on an elastomeric substrate (0.5 mm).

This example shows that concepts in fractal geometry, which are known to determine behaviors in traditional 3D networks and which are pervasive in biological systems including the human body, can be successfully exploited in 2D deterministic systems, with important functional consequences in advanced stretchable electronics. Fractal-based structures can be described by self-similarity: subdivision into small sections yields pieces with geometries that resemble the whole. Compared to previously explored networks of periodic serpentine shapes, fractal designs can be engineered to accommodate enhanced elastic strain along a selected dimension, and to support biaxial, radial, and other deformation modes. Additionally, the choices of topologies span a rich range, from lines to loops, capable of tailoring to specific electronic applications through integration and interdigitation of multiple structures. FIG. 2 presents six representative examples, from lines (Koch, Peano, Hilbert) to loops (Moore, Vicsek) and branch-like meshes (Greek cross). The results illustrate the diversity of possibilities, through both the finite element method (FEM) and experimental demonstration. The approximate fractal dimensions in these finite-iterative curves range from 1.5 to 2. The elastic tensile strains achieved with these structures indicate they are suitable for use in various stretchable devices, including the epidermal electronic platform, with key advantages over previously described layouts.

Figure 7:
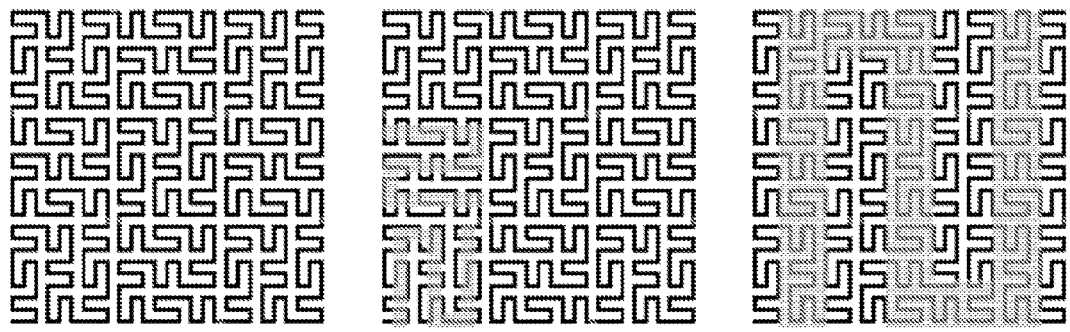
FIG. 7 provides an overview of the third order Peano curve, as depicted in FIG. 1a, contains spring-like motifs at small (left), medium (middle, green highlight), and large (right, green highlight) length scales. Additionally, the spring-like motifs can orient along the x- or y-axes, as illustrated by the two medium springs in the middle plot.

The Peano curve provides a model system for examining the detailed mechanics of fractal-based motifs. Layouts using these or other designs follow an iterative approach: to create the Nth Peano curve, nine copies of the (N−1)th curve are linked together into a single line. An illustration of the first three iterations of a Peano curve appears in FIG. 3 Panel (a). A physical interpretation that captures the underlying mechanics follows by considering the first iterative curve geometry as a section of a one dimensional spring. Due to self-similarity, higher order Peano curves contain spring-like motifs at multiple length scales (FIG. 7). Furthermore, each of these motifs can be oriented vertically (y-axis) or horizontally (x-axis). As such, the Peano geometry provides a design metric for systematically "folding" a straight line into a compact and stretchable layout. To further enhance the mechanics of these wires, arc sections replace the sharp corners in the mathematically-defined Peano curves (FIG. 3 Panel (b)). Generally, the elastic mechanics of horseshoe serpentine structures improve with increasing arc section angle (FIG. 19). Although the Peano curves featured in FIG.

3 Panel (a) fill square areas, those of different iterative orders can be linked together to fill spaces of arbitrary shape. As a demonstration, FIG. 3 Panels (c)-(f) show the word "ILLINOIS" formed with space filling wires, in which each letter consists of a combination of first and second order Peano curves. The figure includes a detailed view of a section of the "N". Electrodes can be constructed in this manner to match, for example, particular features on the body.

Figure 3:
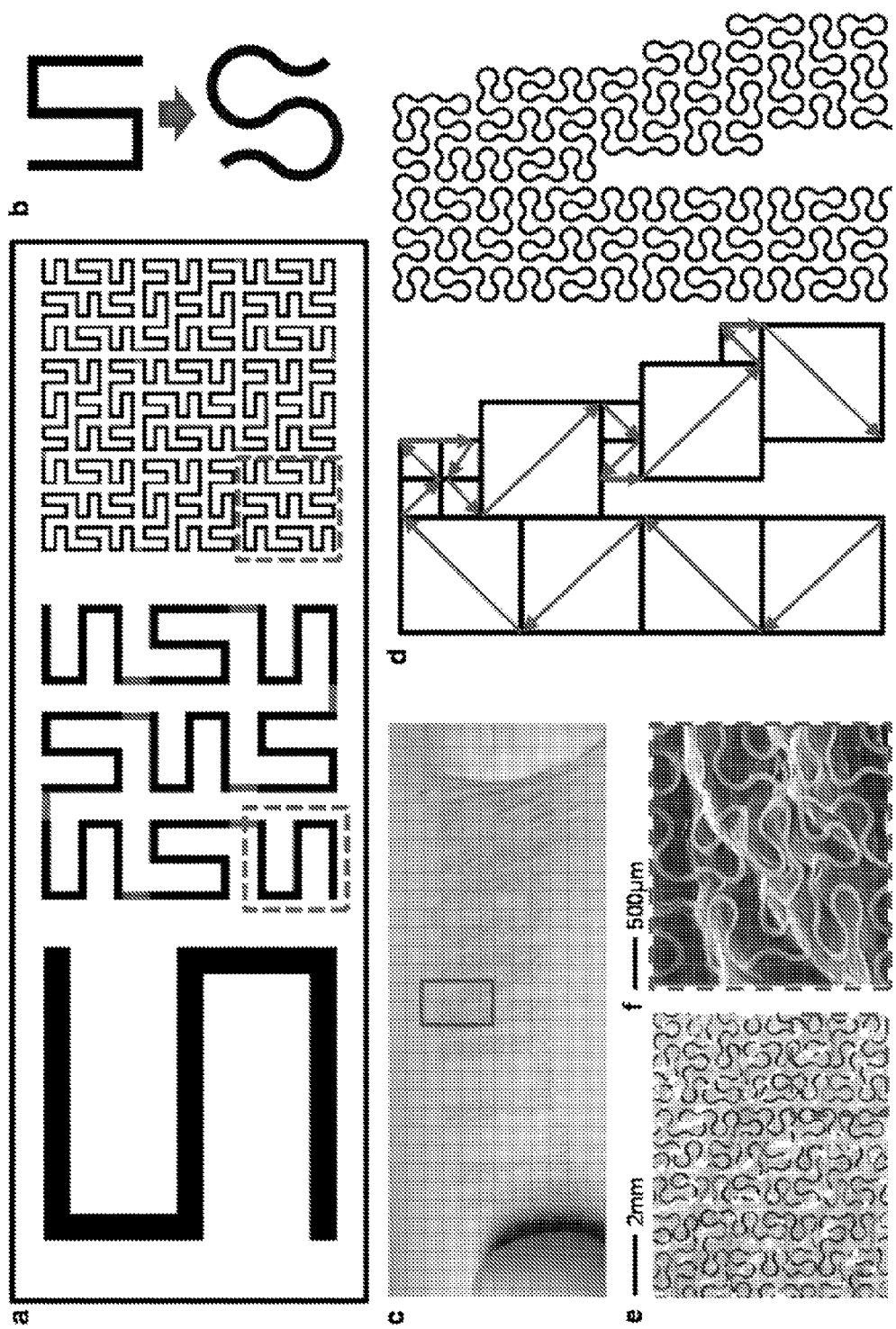
FIG. 3 provides an overview of an implementation of Peano curves for stretchable electrodes with fractal designs. Panel (a) provides an illustration of three iterations of a two-dimensional Peano curve. Nine versions of the (N−1)th curve (dotted red box) connect together with the solid red lines to construct the Nth curve. Panel (b) depicts arc sections replace the sharp bends to enhance the mechanics. Panel (c) provides an image of metal wires with Peano layouts, with an overall geometry that spell out the characters in "ILLINOIS", mounted on skin. Here, each letter consists of a series of first and second order Peano curves. Panel (d) provides a detailed section of the N (solid red box) from panel (c) in block diagram form (small blocks are first order curves, large blocks are second order curves) and as wires. Panel (e) provides an optical image and panel (f) provides a scanning electron microscopy image of third order Peano-based wires on skin and a skin-replica (colorized metal wires), respectively, showing the conformal contact of the wires on the substrate. The experimental dimensions are as follows: the $2^{nd}$ order gold wires have R=620 μm and w=70 μm; the $3^{rd}$ order gold wires have R=190 μm and w=70 μm; and the silicon nanomembranes (Si NMs) have R=190 μm and w=70 μm.
Figure 8:
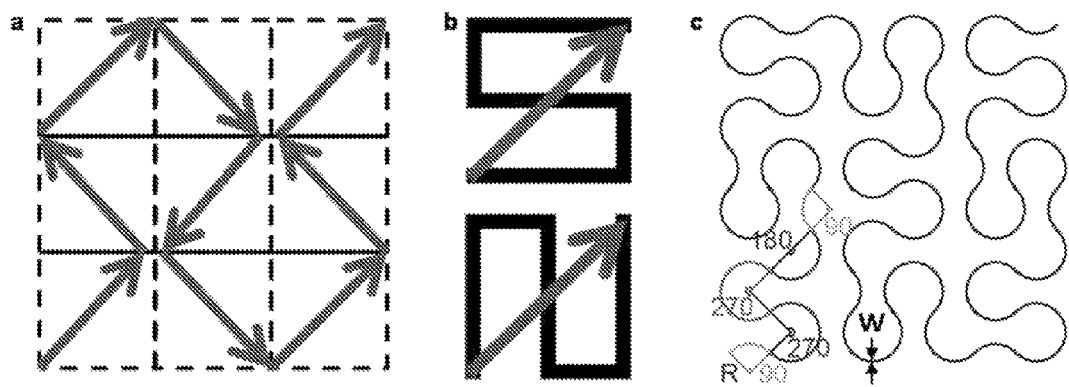
FIG. 8 provides an overview of iteration processes. Panel (a) illustrates nine versions of the (N−1)th sub-unit cell link together into a continuous line to construct the Nth iteration is constructed by linking together. The arrows denote the starting and ending point of each of the sub-unit cells. Each of these nine subunits can orient either vertically or horizontally without changing its starting and ending point, as demonstrated with the first order iterative subunit (Panel (b)). As such, there exist many variations of the Peano curve (272 different second order Peano curves alone). Panel (c) shows the simulated and experimental structures consist of a series of arc sections with solid angles of 90, 180, and 270 degrees. The intersection points between arc sections coincide with the mathematically-defined Peano curve, which constrains their position. As such, the radii of curvature (R), wire width (w), and wire thickness (t) define the absolute geometry for a given layout type and fractal dimension.
Figure 9:
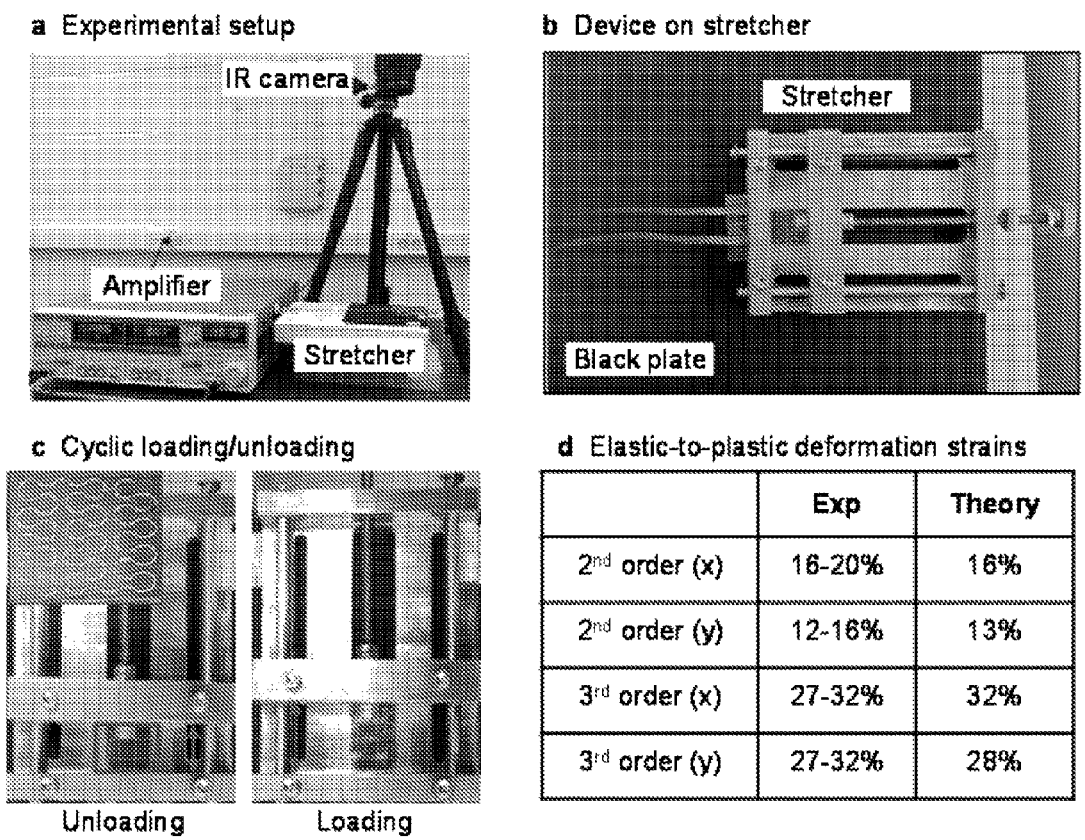
FIG. 9 provides an overview of the experimental system and results. Panel (a) shows the experimental setup for device calibration and testing. To measure the device resistance via four point probe, we supply 1 mA of constant current to the device with one pair of wires and measure the voltage drop in the device with the second pair of wires using a lock-in amplifier. Panel (b) provides a detailed picture of the fractal-based sample bonded to ACF cables and mounted on the uniaxial stretcher. Panel (c) provides a detailed picture of the prestrained fractal sample during mechanical loading and unloading. Panel (d) provides a summary of the calculated and experimentally-measured stretchabilities for half-and-half samples along the x- and y-axes, delineating the transition point from elastic to plastic deformation.
Figure 20:
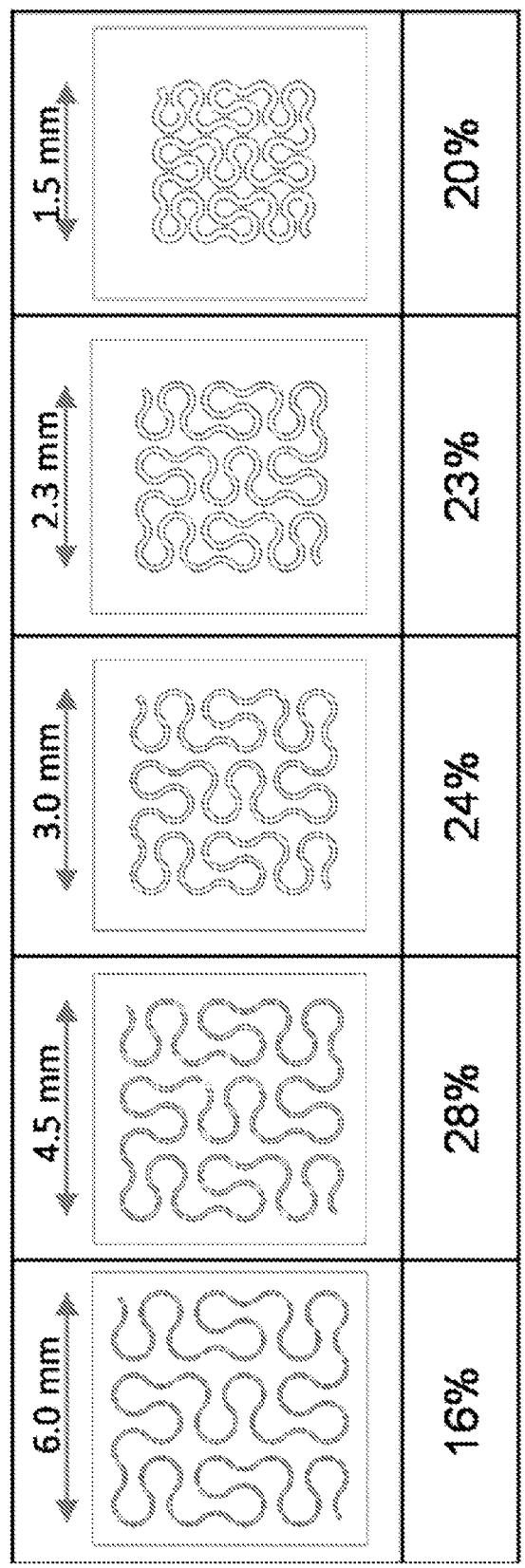
FIG. 20 provides an overview of simulated biaxial stretchability as a function of unit cell size for half-and-half Peano structures. The cross-sectional geometries and materials match those from FIGS. 4a-4h, and all structures have w=70 µm (defined in FIG. 8). The structures with unit cell sizes between 1.5 mm and 4.5 mm display biaxial stretchabilities greater than 20% and are compatible with the elastic properties of skin.

The Peano curves in FIG. 3 Panel (a) represent only one set of variations; there exist many others, because the (N−1)th unit cells of any Nth order curve can be oriented either vertically or horizontally (FIG. 8). The second order curve has 272 unique layouts alone, each with distinct mechanical properties. Numerical simulations of five different second order layouts consisting of gold wires bonded on an elastomer probe the relationship between mechanics and layout. The layouts contain unit cells with orientations ranging from all vertical to all horizontal (FIG. 18). The maximum principal strain criterion defines the maximum elastic stretchability as the onset of plastic yield, consistent with established parameters of the constituent materials. FIG. 18 summarizes this quantity, calculated for uniaxial deformation along the x- and y-axes. The results indicate that Peano layouts with unit cells all oriented in the same way maximize the uniaxial stretchability along the unit cell direction. The "half-and-half" Peano layout, which contains unit cells with alternating orientations, balances the maximum strain supported along the x- and y-axis at 16% and 13%, respectively. Such properties are well suited for devices that stretch along both axes. Adjustments to the total unit cell size can enhance the mechanics of these structures (FIG. 20). The third order half-and-half layouts yield stretchabilities along the x- and y-axis of 32% and 28%, respectively (FIG. 9). This improvement with iteration order is due to the combined effects of geometric scaling of the arc sections, increase in the length of the wire, and addition of higher order spring-like motifs. The stretchability here is well above 20%, which is the general upper limit for the elastic mechanics of skin.

Experimental structures consisting of second and third order half-and-half Peano layouts of metallic wires that are clad with polyimide and fully bonded to an elastomeric membrane compare well with the numerical analysis (See Methods for details). The polyimide cladding retards strain localization in the metal, thereby enhancing sample yield and consistency in mechanical testing. Three samples are tested for each fractal dimension and axis of stretching. Mechanical characterization involves measurements of resistance changes to a precision of ~0.01 ohms with a four point probe technique performed during uniaxial tensile stretching. In the elastic regime, the wire resistance before and after cycling between states of no strain and increasing levels of maximum strain (the difference defined as the "differential resistance") does not change. At the onset of plastic deformation, the wire undergoes a resistance-dependent geometric change, leading to a small but measurable differential resistance. Traditional approaches to characterizing plasticity based on measurements of stress-strain response with a tensometer are not suitable because the mechanics of the elastomeric substrates in these systems dominate the response, by design.

FIG. 4a-4f and FIG. 9 summarize the results of these studies. The differential resistances measured from individual representative devices appear together in each plot. The error bars in the second and third order Peano structures have magnitudes of 3.7e-5 and 3.3e-5, respectively; the Supplementary Section below discusses the sources of these errors. Simultaneous measurements of the local temperature account for and calibrate out changes in resistance due to background temperature fluctuations (see Supplementary Section below). The measurements show that for the second order Peano structures stretched along the x- and y-axis, the transition from elastic to plastic deformation occurs in the range of 16-20% and 12-16%, respectively. The third order Peano structures undergo an elastic-to-plastic transition in the range of 27-32% for stretching along both x- and y-axes. These values of uniaxial stretchability are consistent with the numerical analysis. FEM strain maps (FIG. 4c and FIG. 4d) identify the positions of the mechanical "hot spots" in the samples, where strains are particularly large and where failure occurs. Further enhancements in device mechanics are possible by optimizing the detailed geometry of these hot spots.

Fractal-based structures bonded to pre-strained elastomers enable higher levels of elastic deformation. A second order all-vertical Peano structure fully bonded onto an elastomeric substrate with 40% pre-strain demonstrates the concept. The differential resistances for different levels of maximum applied strain appear in FIG. 10. Here, the transition from elastic to plastic deformation occurs when the substrate is strained in the range of 60-70%, which is significantly higher than that in samples prepared without pre-strain. Schemes that use pre-strain can be extended to biaxial, radial, or other types of deformation.

Figure 4A:
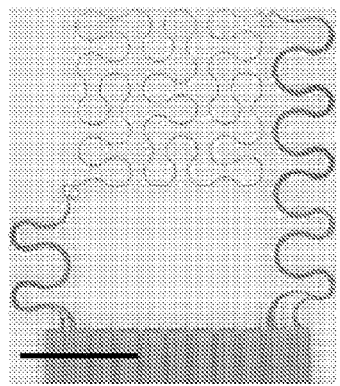
FIGS. 4a-4c provide an overview of mechanical characterization of fractal-based structures of metals and semiconductors.
Figure 4B:
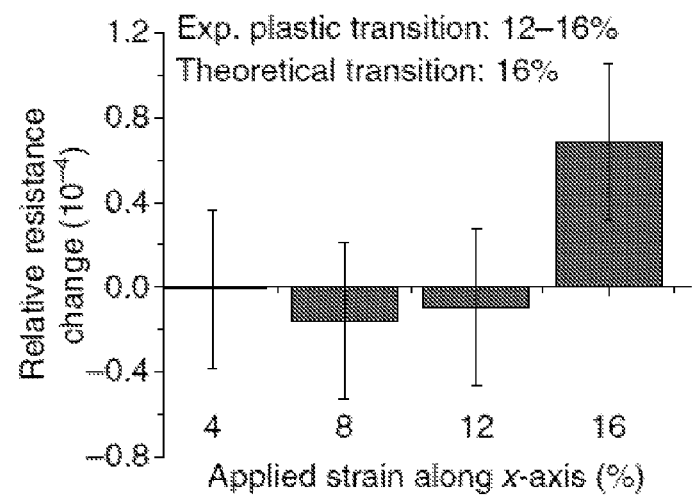
Figure 4C:
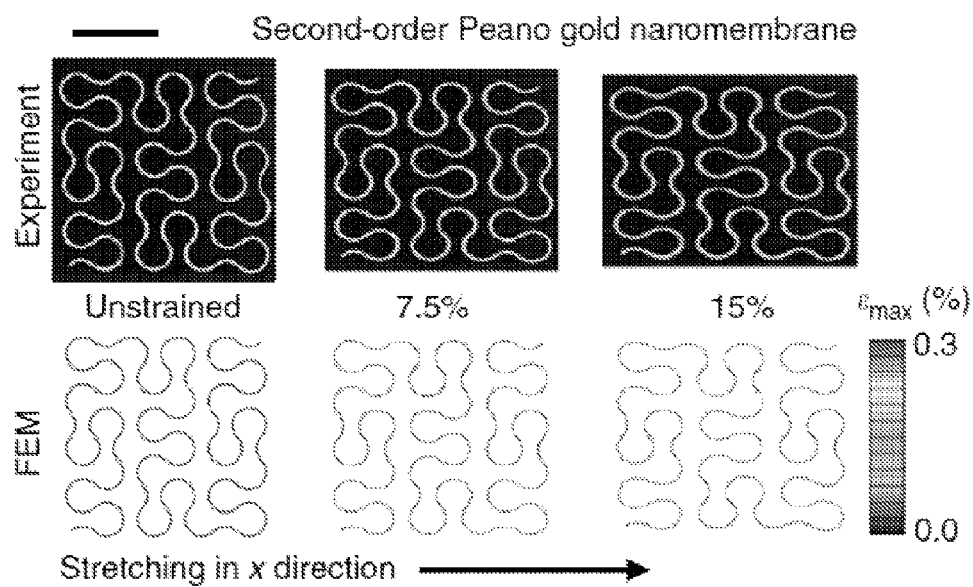
Figure 4D:
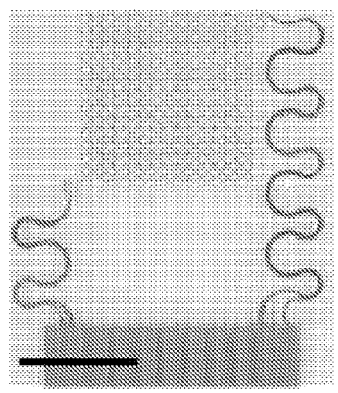
Figure 4E:
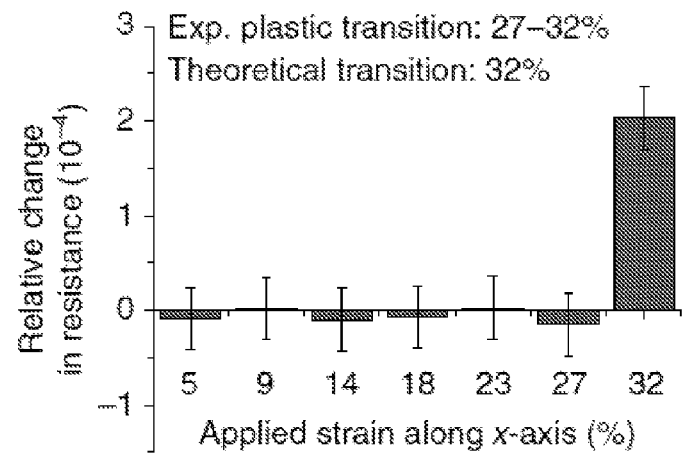
Figure 4F:
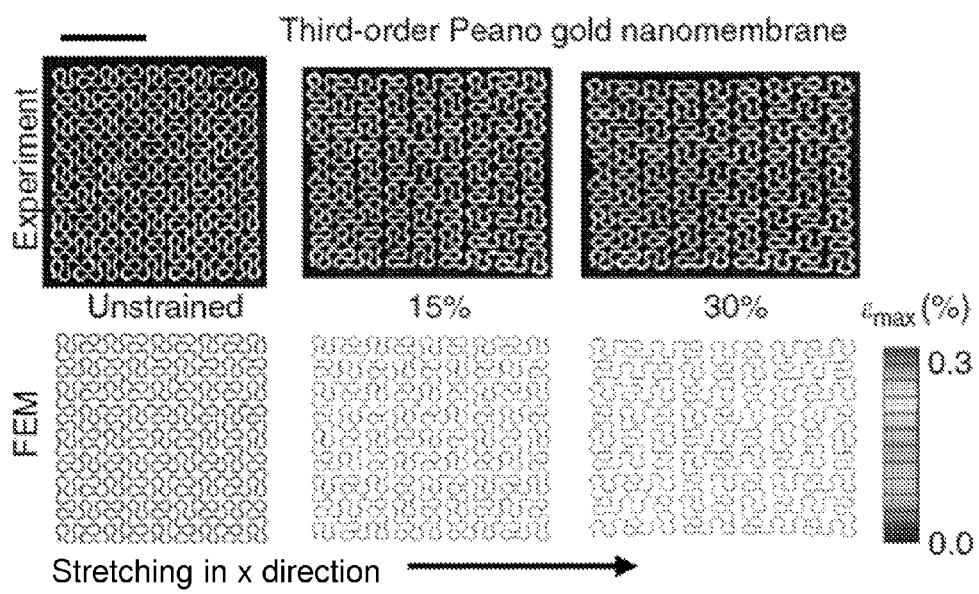
Figure 4G:
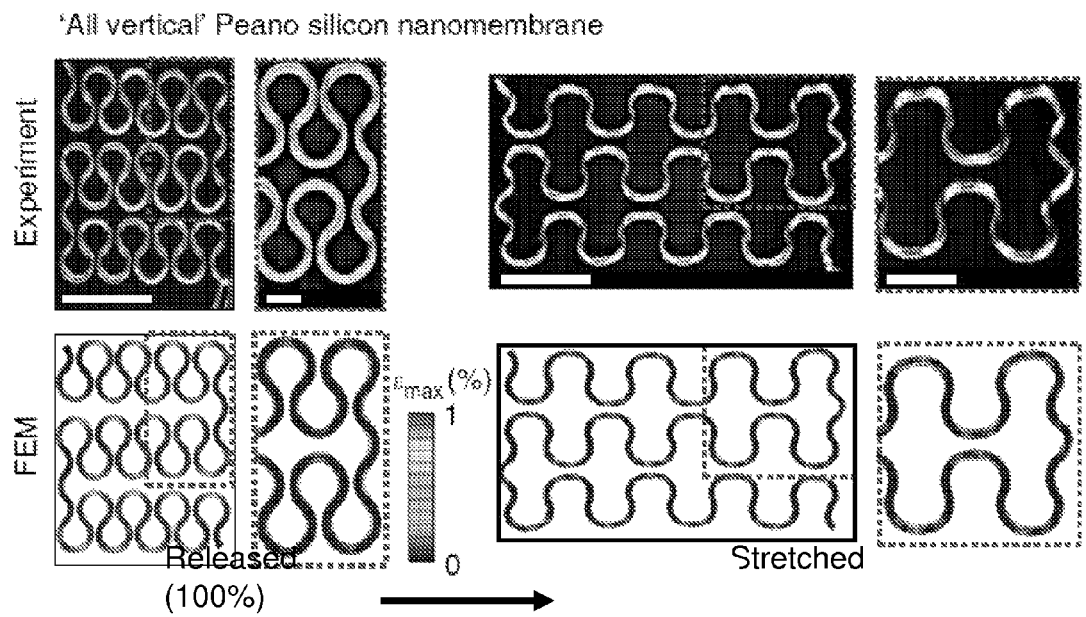
FIG. 4g and FIG. 4h provide MicroXCT and FEM images of Si NMs patterned into Peano layouts and fully bonded to a 40% pre-strained elastomeric substrate. Upon release and uniaxial stretching, both structures dissipate the mechanical stress via microscale buckles, which is indicative of a mechanical regime well suited for high levels of elastic deformation.
Figure 4H:
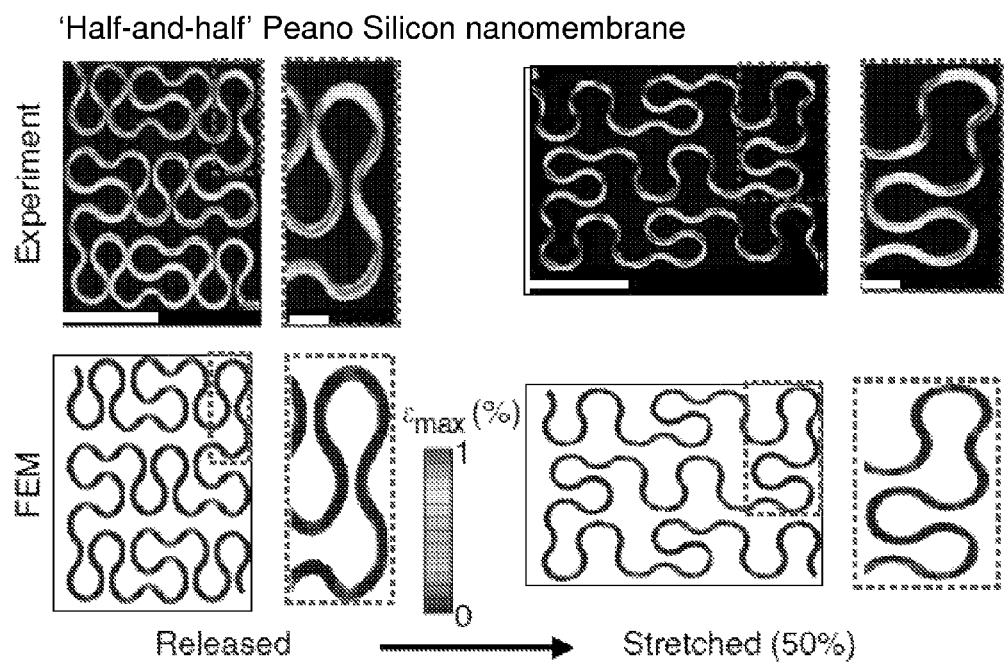
Figure 11:
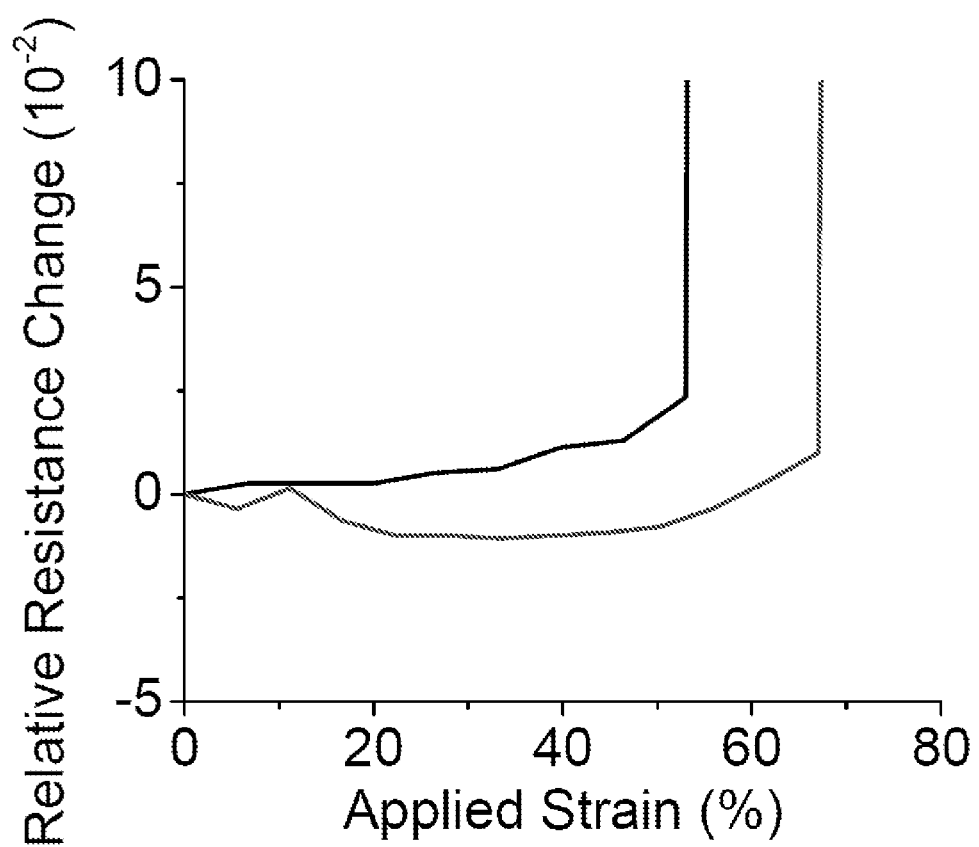
FIG. 11 provides a plot of silicon nanomembrane resistance as a function of tensile strain for two different halfand-half samples (black and red lines). Failure is clearly defined when the membranes crack and the resistance dramatically increases. The maximum elastic strains here are consistent with the simulated FEM strain of 63%.
Figure 12A:
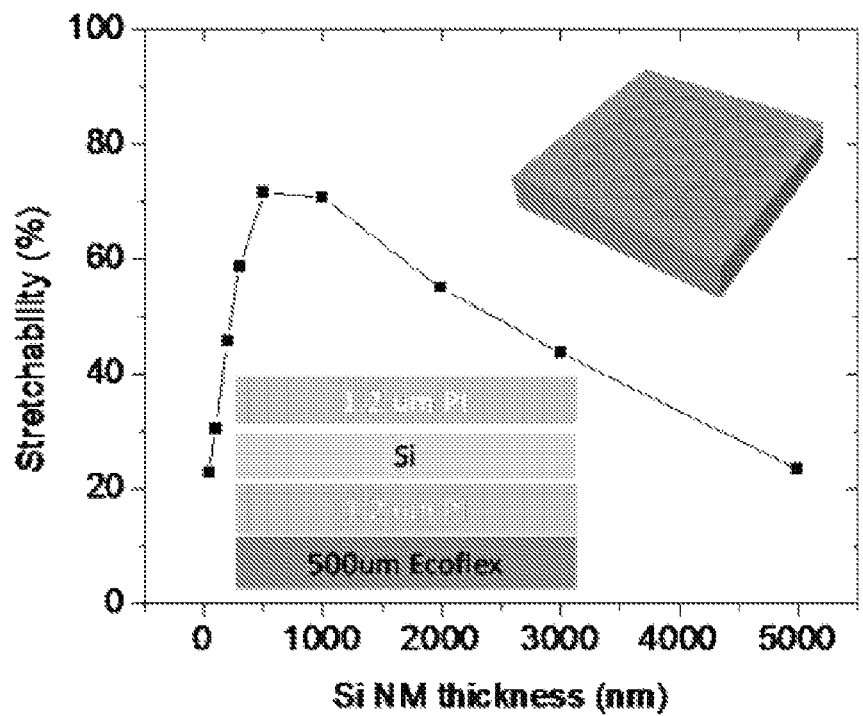
FIG. 12a provides data showing calculated stretchability of an all-vertical Peano silicon nanomembrane strained along the y-axis for different membrane thicknesses. The planar geometry is identical to that presented in FIG. 3.
Figure 12B:
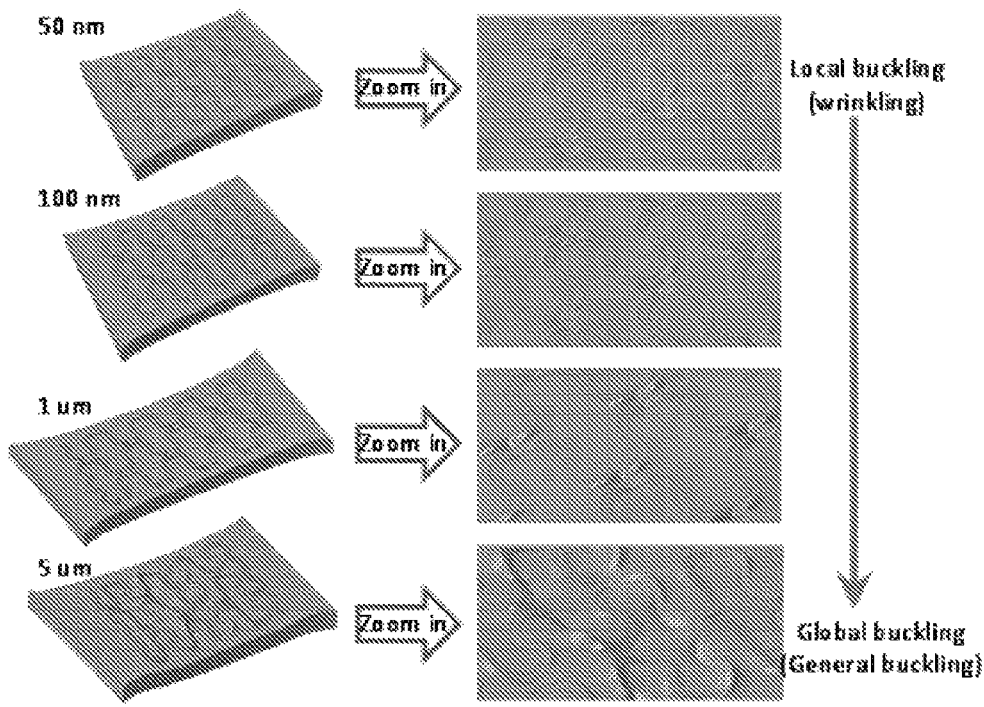
FIG. 12b provides a schematic illustration showing that as the membrane thickness increases, the strained membranes experience mechanical regimes spanning wrinkling, micro-buckling, and global buckling. The maximum device stretchability coincides with the micro-buckle regime, indicating that micro-buckles are particularly well suited for dissipating stress in the mechanically hard silicon membranes mounted on a soft substrate.

This concept of enhancing mechanics through the use of pre-strain is general to a broad range of materials, including semiconductors. Thin films of single crystalline silicon nanomembranes (Si NM) with two different second order Peano layouts and bonded onto 40% pre-strained elastomeric substrates provide a proof of concept. In the pre-strained state, the calculated compressive stresses in the membrane are well within the regime of elastic deformation for silicon. FIG. 4g and FIG. 4h show microscale X-ray coherent tomography (microXCT) images of the samples, along with corresponding FEM results. The findings indicate that the all-vertical and half-and-half structures can be elastically strained by 105% and 63%, respectively, given a maximum principal strain of 1% in the silicon. The fracture points measured electrically from half-and-half structures (FIG. 11) are consistent with the FEM results. Both the microXCT and FEM images reveal microscale buckling; this type of deformation mode improves the ability of the Si NMs to dissipate stress. Such behavior persists only for a limited range of NM thicknesses. FEM simulations show that with increasing membrane thickness, the NMs transition from a regime of wrinkling to microscale buckling and finally to global buckling; furthermore, the microscale buckling regime yields maximal elastic mechanics (FIG. 12a and FIG. 12b). As such, the optimization of the elastic properties of hard-soft systems requires careful attention to micromechanics.

Figure 5A:
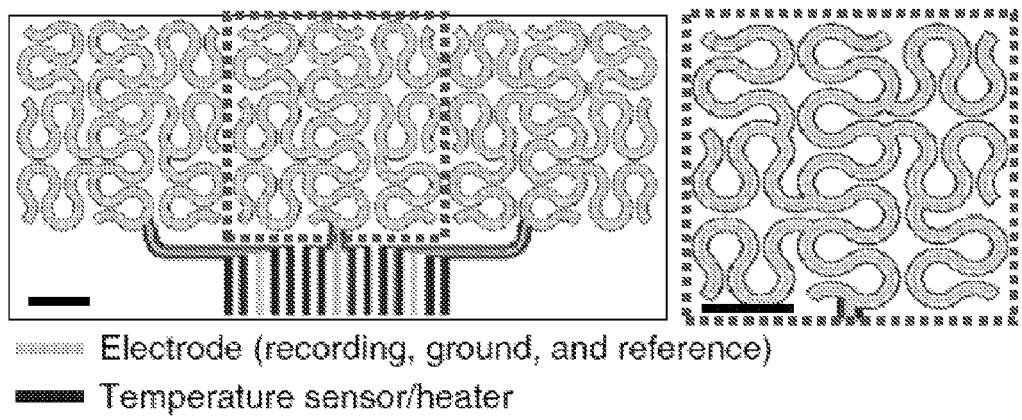
FIGS. 5a-5f provide an overview of fractal-based epidermal devices which illustrate how a patch type device integrates the recording, reference and ground electrodes.
Figure 5B:
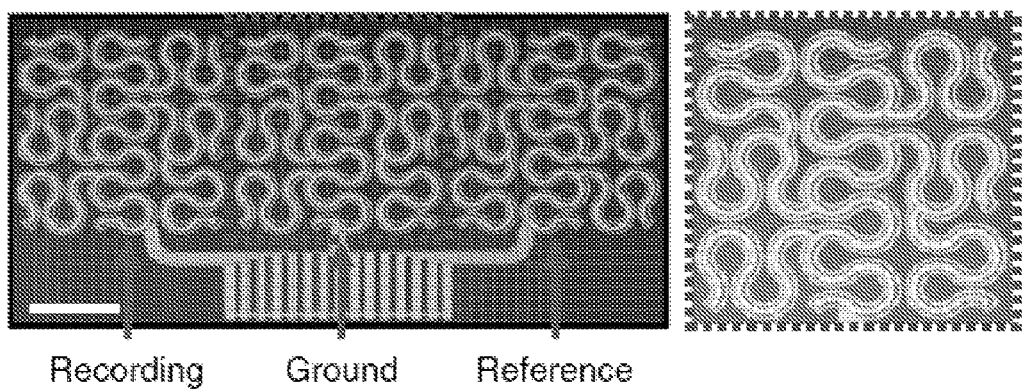
Figure 5C:
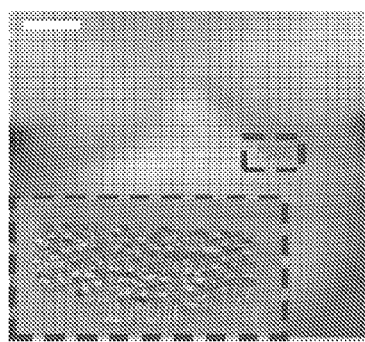
Figure 5E:
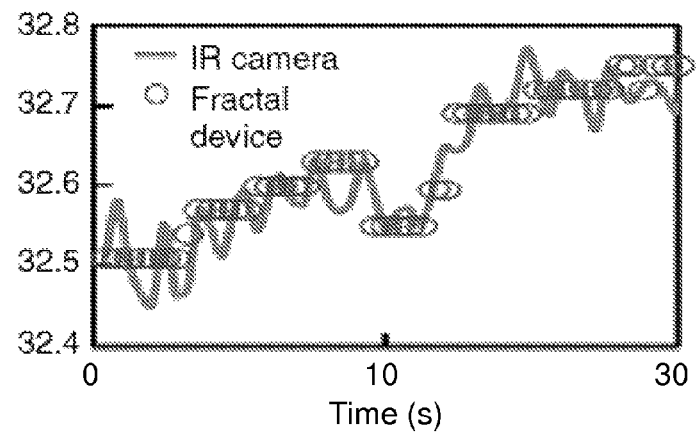
Figure 5D:
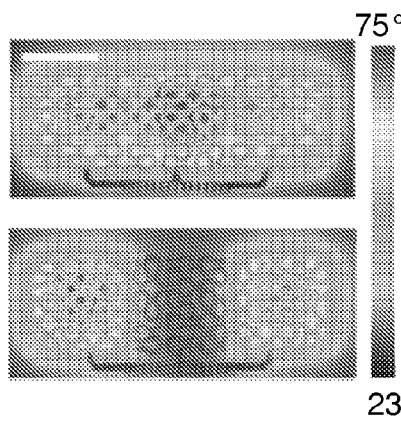
Figure 5F:
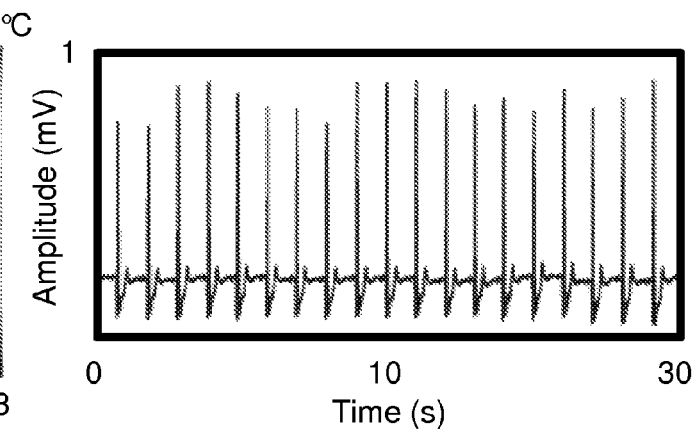
Figure 14:
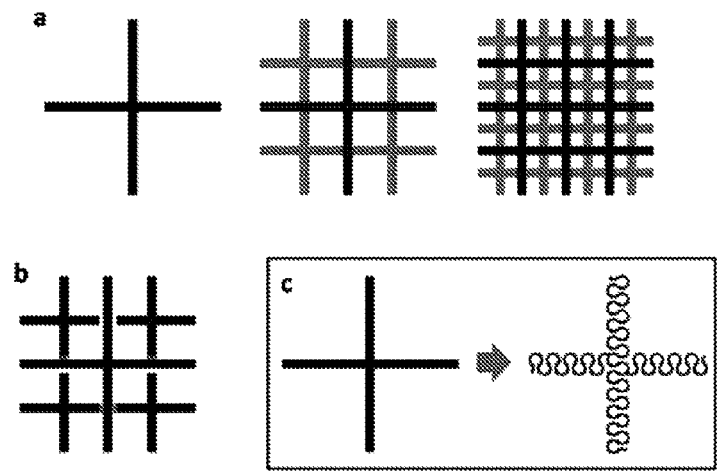
FIG. 14 shows space filling features of a cross. Panel (a) shows the first order structure is a cross. Higher order structures are iteratively constructed by adding crosses of exponentially smaller dimension, as shown. Panel (b) shows that, for the electrodes featured here, the connectivity between the structures (red lines) is defined such that there are no closed loops of wire in the network. Panel (c) depicts where the straight lines in the mathematical structure are replaced with serpentine layout to enable stretchability.
Figure 15:
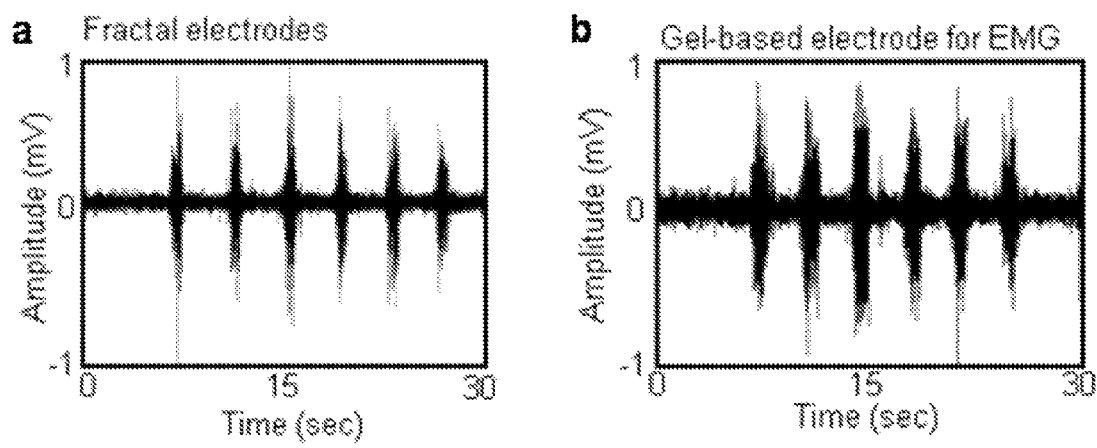
FIG. 15 provides data showing a comparison of EMG signals taken from fractal epidermal electrodes (Panel (a)) and gel-based electrodes (Panel (b)) mounted on the forearm show comparable signal-to-noise ratios. The peaks are due to the clenching of the fist.
Figure 16:
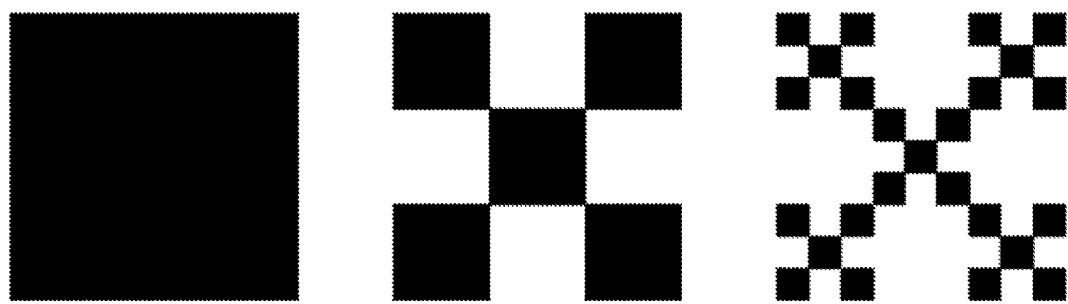
FIG. 16 provides an illustration of the first three iterations of the Vicsek fractal.

These and other fractal layouts have utility for various applications. One is in skin-mounted electrodes for measuring electrophysiological processes in the brain (electroencephalograms (EEGs)), heart (electrocardiograms (ECGs)), and muscle (electromyograms (EMGs)). To minimize impedance between the electrode and skin and to optimize the measured signal-to-noise, electrodes require both conformal skin contact and high areal coverage. Electrodes that interface directly with neurons additionally benefit from having large perimeters within an area. These needs can be addressed effectively using a variant of the Greek cross fractal, which consists of a hierarchy of cross structures that fills space in two dimensions (FIG. 14). This design embeds a high level of connectivity, which minimizes the resistance between any two points. Also, defects in the structure, such as line breaks, have a reduced probability for significantly affecting device performance, which is desirable for robust, long-term health monitoring in practice. These geometries can be further designed to eliminate closed loops (FIG. 14), such that the edges of the electrode wire layout form a single continuous line. A multifunctional device that incorporates a resistive temperature sensing/heating element with an integrated electrode (recording, ground and reference components together) exploits this feature (FIG. 5a). The temperature sensor consists of an insulated line of metal running along the edges of the Greek cross electrode. FIGS. 5b-5f show a representative device and its operation under different modes (heating, temperature sensing, ECG measurements). The impedances and signal-to-noise measured with these dry electrodes compare favorably to that of conventional gel-based electrodes, indicating that they are suitable for high quality, skin-mounted, electrophysiological measurements. The precision of the temperature measurement (~20 mK) compares well with that of an infrared camera.

Figure 6A:
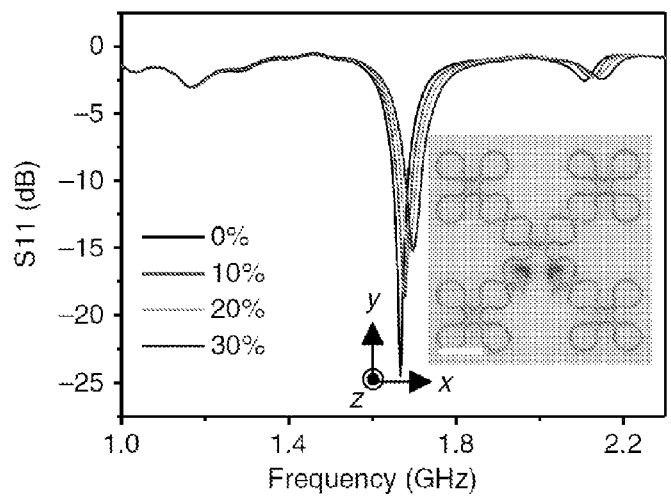
FIG. 6a-6d provides an overview of the RF properties of stretchable fractal structures.
Figure 6C:
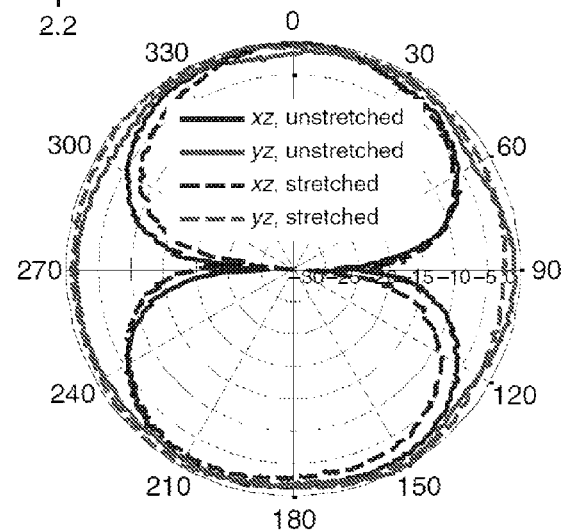
Figure 6B:
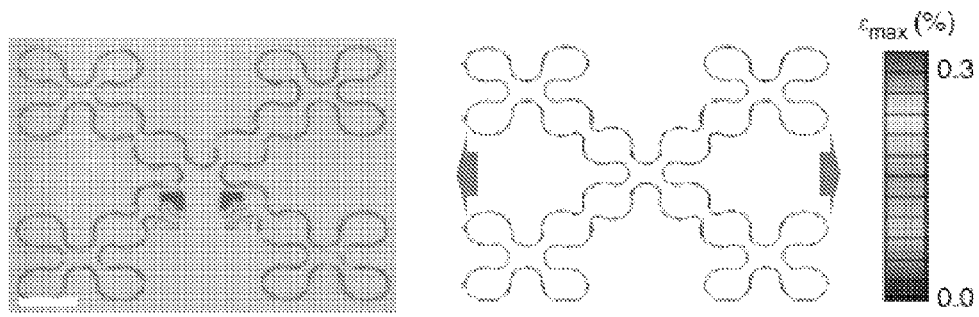
Figure 17A:
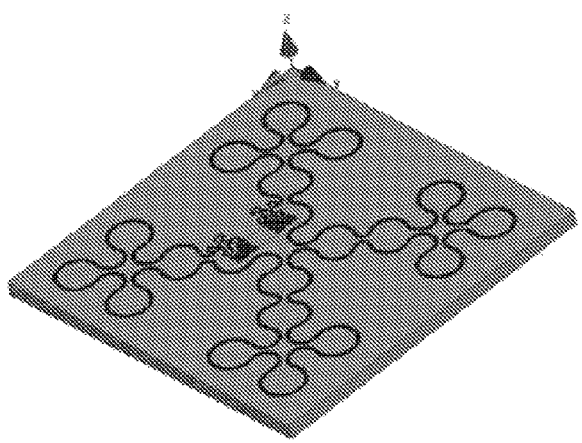
FIG. 17a depicts a box fractal antenna geometry. The feed point of the antenna is chosen so that the impedance of its fundamental mode sufficiently matches with the coaxial feed.
Figure 17C:
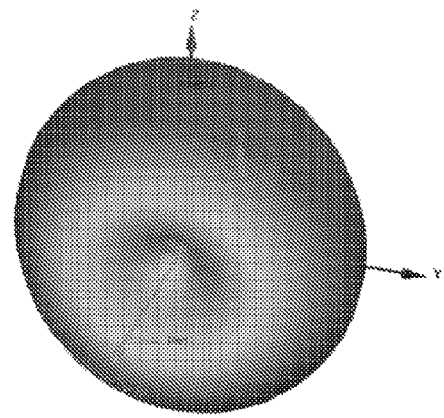
FIG. 17c illustrates a far field intensity profile of the unstretched antenna at resonance.
Figure 17B:
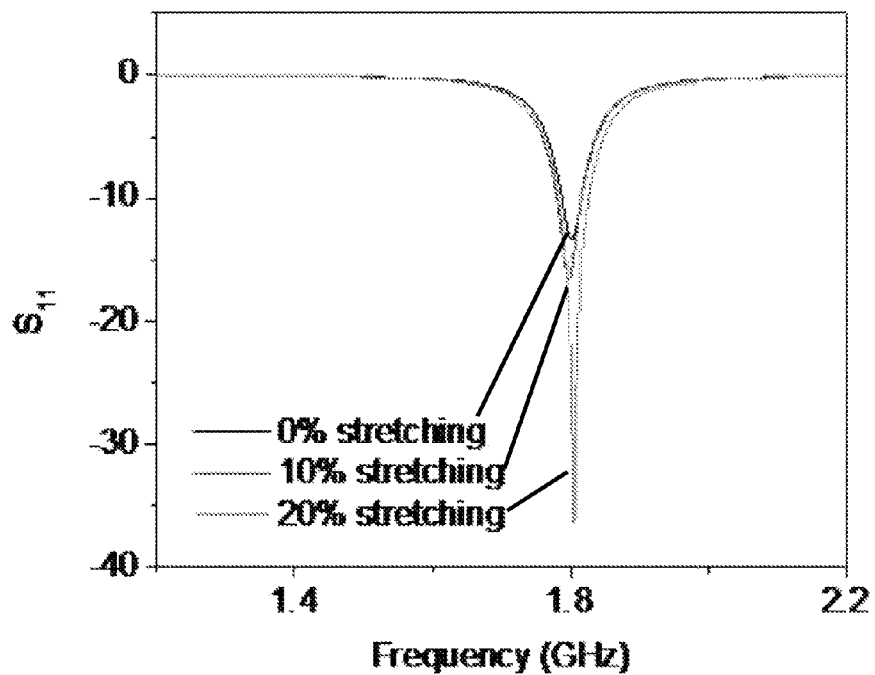
FIG. 17b provides data showing return loss spectra of the box fractal antenna for three different levels of stretching. It is noted that the bandwidth of the box fractal is very narrow, due to the large inductive load built into the antenna.

Stretchable radio frequency antennas are another class of devices that benefit from concepts in fractal design. Fractal antennas have been a topic of interest because they can support multiband operation in spatial scales that are compact relative to the resonant wavelength. Appropriate choices of fractals offer not only this characteristic but also attractive elastic mechanics when mounted on stretchable substrates. A Vicsek curve loop antenna, in which arc sections replace sharp bends, provides a model system. The antenna consists of copper traces (3 µm thick) laminated with polyimide, and bonded onto a 1 mm-thick elastomeric substrate. The copper thickness is comparable to the skin depth of copper (~2 µm) at gigahertz frequencies. The return loss spectrum for the unstrained antenna displays a fundamental mode near 1.7 GHz (FIG. 6a) with an impedance of 42 ohms at resonance. The total length of the antenna at resonance is approximately $\lambda_0/6$, where $\lambda_0$ is the free space wavelength, reflecting the compact nature of this particular fractal layout. As the device is strained, its fundamental frequency and input impedance slightly shift. Far-field measurements in an anechoic chamber provide additional information; data for the fundamental mode at 0% and 30% strain (FIG. 6c) display a clear dipole-like pattern. The realized gain for both the unstretched and stretched devices ranges from −2 to 0 dB, which is slightly less than that for an ideal dipole due to ohmic losses in the thin copper wires. Simulations of the return losses and far field profiles are consistent with the experiments (FIG. 17b).

Figure 6D:
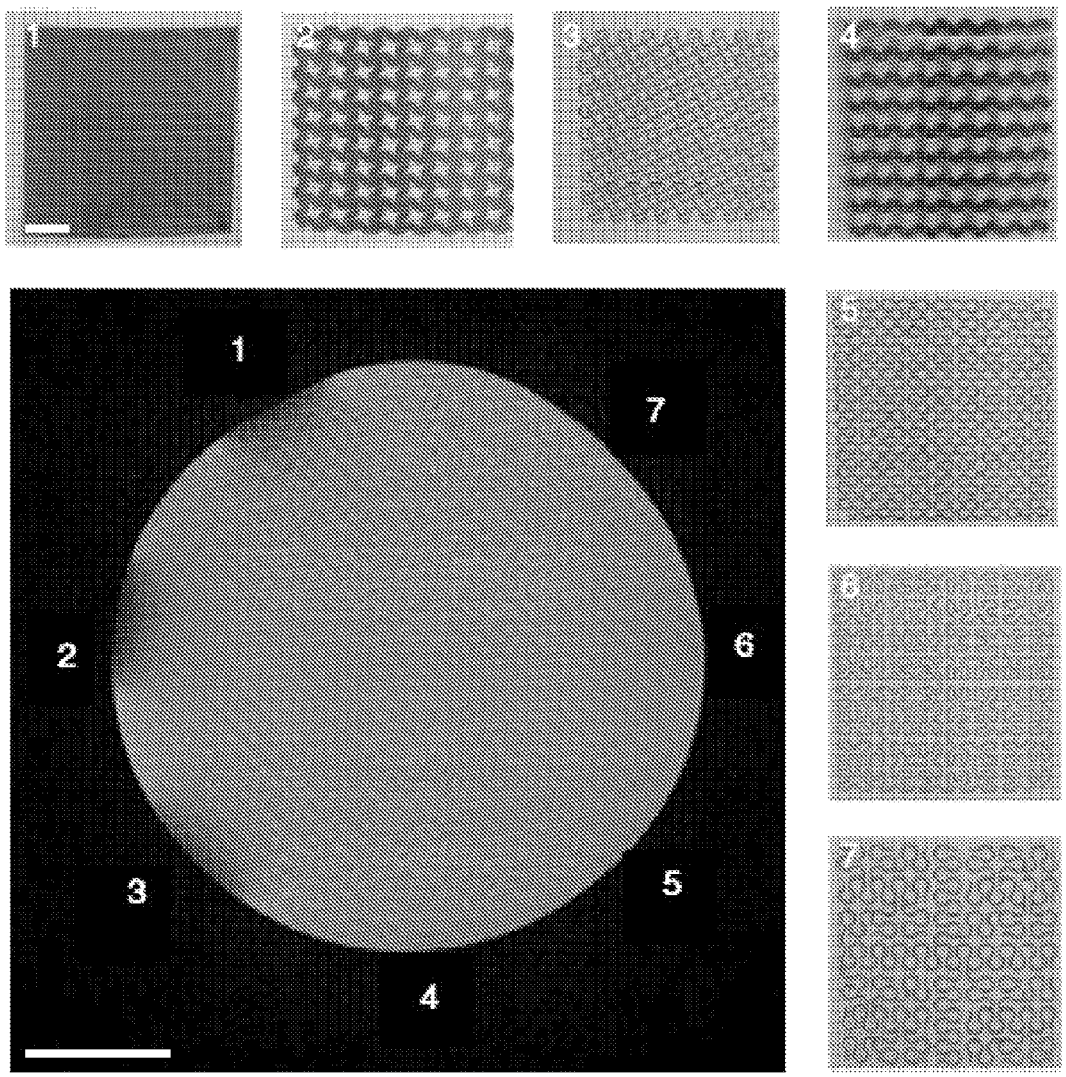

Another application that can benefit from the favorable RF properties and mechanics of fractal patterns is in electrode structures that are compatible with magnetic resonance imaging (MRI). Copper foil samples mounted onto a cylindrical phantom and scanned in a 3 Tesla Trio head scanner (Siemens Instruments) provide a demonstration. For purposes of comparison, the samples include three types of fractals, along with an unpatterned sheet, two variants of serpentine meshes, and superimposed vertical and horizontal lines. The fill fraction of the meshes and the fractal patterns are approximately the same (~25%). For the magnetic field strength used here, the resonant RF pulse frequencies are ~123 MHz. FIG. 6d displays an axial cross-sectional scan obtained using spin echo (parameters are in the Supplementary Section below). The water-based phantom appears white due to its high hydrogen concentration. The MRI image shows clear shadows in the vicinity of the unpatterned film and the mesh samples. Conversely, the fractal samples exhibit no noticeable distortion or shadowing. Magnetostatic coupling between RF radiation and the samples, which yields circulating currents and associated heat dissipation and signal loss, explain these differences. The meshes couple to RF radiation because they consist of highly interconnected closed loops of metal; the fractals, on the other hand, do not contain closed loops, do not couple to RF radiation, and are invisible in the MRI. This analysis suggests that fractal-based designs provide routes to MRI-compatible skin-mounted or implanted electronic devices.

In summary, fractal-based layouts create new design opportunities in stretchable electronics, including a broad range of devices suitable for biomedical systems. One of the challenges here is evaluating the mechanical properties of these composite materials and rigorously identifying their elastic and plastic mechanics. With the combination of high precision electro-mechanical measurements and three-dimensional FEM simulations, the fundamental mechanical responses and their dependence on geometry can be understood and exploited for specific deformation modes. This study suggests a general relationship between fractal layouts and mechanics that is broadly applicable to stretchable materials engineering.

Methods.

Epidermal Device Fabrication. Fabrication of metal-based devices, including the temperature sensors and heaters, involves first spin-coating and curing liquid polyimide (PI) on a UV-treated PDMS-coated Si wafer. Electron beam evaporation yields layers of chromium (4 nm) and gold (300 nm). Following metal patterning, etching, and the application of a second layer of polyimide, a photoresist mask and oxygen plasma etch define the polyimide-encapsulated device. All of the wires are 70 µm-wide and the polyimide layers are each 1.2 µm-thick. Water soluble tape (3M) retrieves the gold-polyimide structures, which covalently attach to an elastomer (0.5 mm-thick, Ecoflex or Solaris, Smooth-on Inc.) using an evaporated chromium-silica bonding layer. UV radiation pretreatment of the elastomer promotes covalent bonding between the silica and elastomer. An ACF cable (Elform, USA) attached to the bonding pads of the device enable accessible electrical addressing. The same process, with an additional polyimide etch step, applies to the open metal-based fractal electrodes for electrophysiological sensing.

An SOI wafer consisting of 260 nm-thick p-doped silicon on a 1 µm-thick silicon dioxide layer is the starting point for the Si NM samples. To detach the Si NMs from the handle wafer, an HF wet etch dissolves the underlying silicon dioxide through an array of 3 µm-wide holes defined in the membranes. A PDMS stamp transfers the membranes onto a polyimide film, and a photoresist mask and dry etching process define the membranes into various Peano layouts. Gold wires electrically address the devices, and the same transfer steps described above finalize the devices.

Antenna Fabrication. The starting material is copper foil (3 µm) on a copper carrier (35 µm; Olin Brass). Polyimide spun-cast and cured onto the foil yield foil-polyimide laminates, which mount onto a PDMS-coated substrate and enable copper carrier removal. A photoresist mask, wet copper etch, and oxygen plasma dry etch pattern the antenna.

Fractal-based Metal Wire Simulations (Presented in FIGS. 2, 4 and 18). FEM yields the theoretical deformation, elastic-to-plastic transition, and fracture of the structures. Elastomeric substrates employ an 8-node, hexahedral brick solid element C3D8R in the FEM program, and the thin wires of PI/Au/PI-layered geometry employ a quadrilateral shell element S4R with the section of composite layup. All of the wires are 70 µm-wide and consist of a 300 nm-thick gold layer sandwiched by 1.2 µm-thick polyimide layers on each side. The total pattern areas are 7 by 7 mm and fully bond to a 0.5 mm-thick elastomer with a modulus of 50 kPa. The solid elements bond together physically and therefore share nodes with its adhered shell elements. An ideal elastic-plastic constitutive relation with a Young's modulus of 78 GPa, Poisson's ratio of 0.44, yield strain of 0.3% and fracture strain of 5% describe the mechanical behavior of Au. The elastic-plastic transition is set when the maximum strain of half the width of one section is beyond the yield strain of 0.3%.

Electrode and Temperature Sensor Testing. The Greek cross electrodes record ECG signals from the torso. Scotch tape and an alcohol swab exfoliates the stratum corneum and removes dirt or particles to reduce effects of hydration and surface impedance. Here, the ground electrode, located between the measurement and reference electrodes (~7 mm apart at center-to-center distance), defines the common zero potential. Measured signals transmit wirelessly to a receiver, and commercial software using a 60 Hz notch filter and low-pass Butterworth filters (BioRadio 150, Cleveland Medical Devices, USA) completes the analysis. The fractal temperature sensors operate using the same four point probe technique described in the mechanical testing section. An IR camera and hot plate yields dV/dT used to calibrate the devices. The devices mount directly onto the skin with no elastomeric backing layer with a spray bandage technique.

FIG. 18. Elastic Mechanics of Five Different Peano-Based Wire Structures.

Calculated stretchability of metal wires mounted on an elastomer in five different second order Peano layouts, given a maximum principal strain criterion of 0.3% in any section of the wires. The layouts range from "all-horizontal" (sub-units are all oriented along the x-axis) to "all-vertical" (subunits are all oriented along the y-axis). The strain criterion defines the transition from elastic to plastic deformation in the wires.

FIG. 19.

Simulated uniaxial elastic stretchability for serpentine wires as a function of arc solid angle. The inset of the middle column defines the arc solid angle. The cross-sectional geometries and materials match those from FIG. 3, and all structures have R=620 µm and w=70 µm (defined in Figure S2). These simulations clearly display that elastic stretchability increases as a function of arc angle in these primitive serpentine geometries. As such, deterministically defining the arc section geometries in wire-type structures can help optimize the mechanics.

FIG. 20.

Simulated biaxial stretchability as a function of unit cell size for half-and-half Peano structures. The cross-sectional geometries and materials match those from FIGS. 4a-4h, and all structures have w=70 µm (defined in FIG. 8). The structures with unit cell sizes between 1.5 mm and 4.5 mm display biaxial stretchabilities greater than 20% and are compatible with the elastic properties of skin.

Supplemental Information.

Analysis of Fractal Geometries with MicroXCT. Micro X-ray tomography (MicroXCT 400, Xradia) enables the imaging of the spatial topology of the various fractal structures. Experimental images in FIGS. 2 and 4 demonstrate the structural details of fractal patterns from the MicroXCT system. Two magnifications, 0.5× and 4×, provide the whole views and magnified views of the structures, respectively. Additional imaging parameters include a 40 KeV X-ray source and 200 µA current, with 600 image frames recorded stepwise over 180 degrees. TXM Reconstructor software (Xradia) reconstruct the images, and the visualization software package (Amira 5.4.2, Visage Imaging) yields the "gray-scale" images in FIGS. 2 and 4.

Mechanical Testing. The resistance of metal wires bonded to an elastomer is a function of both temperature and mechanical strain. The contribution of temperature is subtracted out to purely monitor changes in the metal resistance due to mechanical strain. The first step is to measure the resistance of the unstrained fractal samples as a function of temperature to obtain dR/dT, using a hot plate and IR camera (FLIR SC7650). A linear fit using the least squares method with six resistance points in the range of 30° C. and 45° C. yields this calibration. During the mechanical measurement itself, the temperature-adjusted resistance (R) follows from the continuously measured temperature (T) as:

$$R = R_{device} - \frac{dR}{dT}(T - T_0)$$

Figure 10:
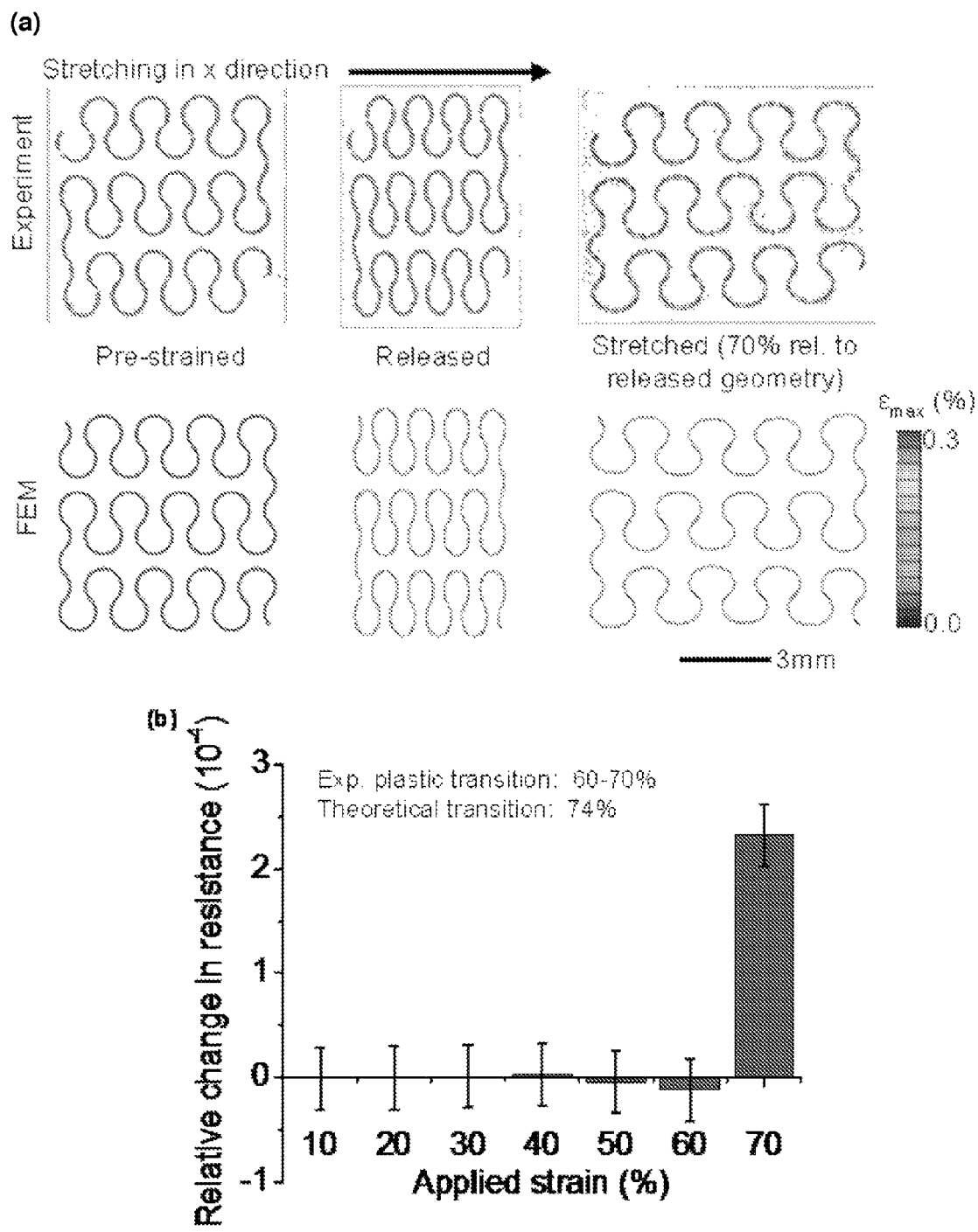
FIG. 10 provides an overview of stretched devices. Panel (a) illustrates a comparison between experimental optical images and FEM-constructed images of an all-vertical second order structure under no strain, pre-strain, and stretching. Panel (b) provides a plot of differential resistances measured in a sample for increasing amounts of maximum applied strain.

$R_{device}$ is the measured resistance of the device from the four point measurement and $T_0$ is a constant reference temperature set before the start of the experiment. FIG. 9 presents details of the experimental setup. FIG. 10 displays FEM images and the elastic-plastic transition point for a pre-strained all-vertical Peano structure.

Figure 13:
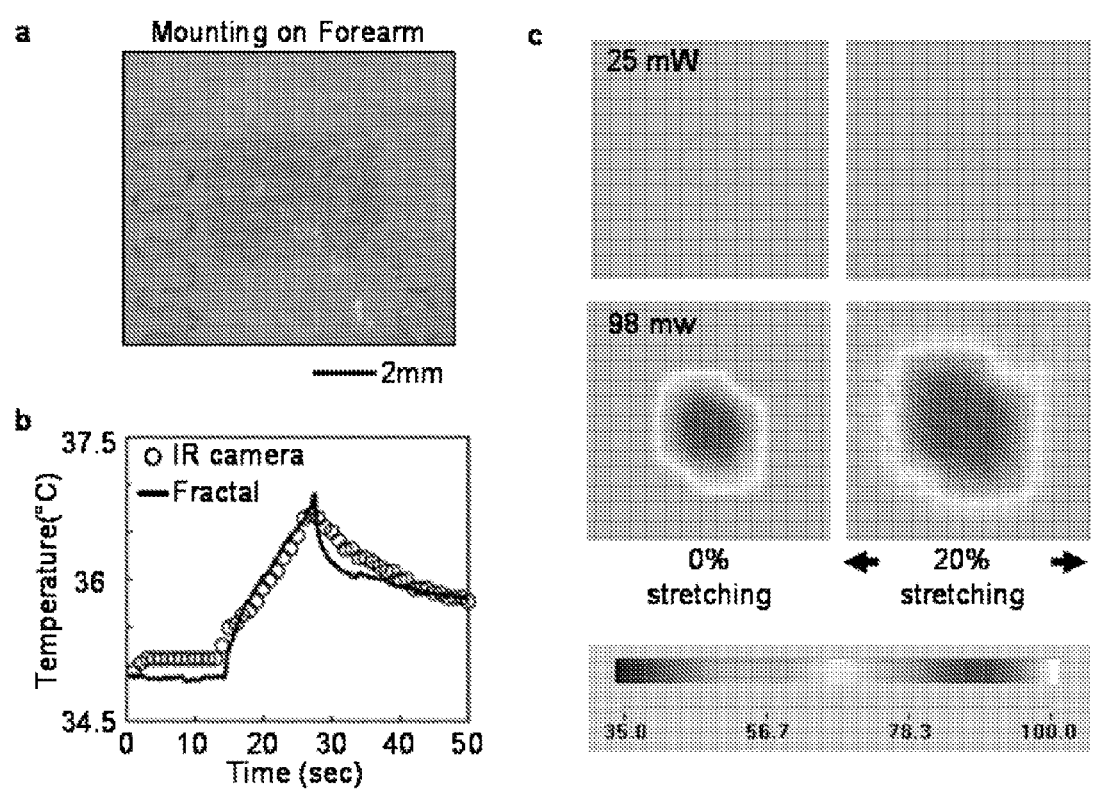
FIG. 13 shows an optical image of a skin-mounted third order Peano temperature sensor in Panel (a), with simultaneous measurements of temperature on skin with an infrared camera showing good agreement (Panel (b)). Panel (c) shows a third order Peano device functions as a heater by passing larger amounts of current (order of 10 mA) through the gold wires. The heat distribution within the device is uniform with and without stretching due to the space filling properties of the wire layout.

Temperature Sensor and Microheater Testing. Wires with Peano-based layouts have utility as the principal component in high-precision temperature sensors and heaters. Such sensors can be calibrated against an infrared (IR) camera (A655SC, FLIR, USA), as performed above for mechanical testing. The response of a third order half-and-half Peano sensor is plotted in FIG. 13. The noise of the analogue-digital (A/D) converter ($V_{A/D}$) and the electrical noise ($V_{noise}$) determine the precision of the fractal temperature sensor using the expressions:

$$T_{A/D} = \left(\frac{dV}{dT}\right)^{-1} V_{A/D}$$

$$T_{noise} = \left(\frac{dV}{dT}\right)^{-1} V_{noise}$$

where dV/dT is from the temperature calibration. The precision of the fractal temperature sensor is 0.022° C. Mounting a device on a forearm and recording the temperature simultaneously with the sensor and an IR camera illustrates applicability to measurements on the skin.

The same device can be used as a precision element for Joule heating. Infrared images of a device under 0% and 20% uniaxial strain show that the heating is uniform across the area of the device, which is indicative of the space-filling nature of the fractal construct (FIG. 13c). One application involves wound recovery, for which the delivery of a controlled amount of heat to the wound vicinity leads to increased local blood flow and vasodilatation and ultimately expedited recovery. The ability for these devices to function as both temperature sensors and heaters enables the measurement of other quantities, such as thermal conductivity.

Fractal Antenna Design and Simulations. The box fractal antenna layout utilizes the two-dimensional box fractal illustrated in FIG. 13. Here, five versions of the (N−1)th geometry scale down and connect together to construct the Nth iterative geometry. A wire tracing around the perimeter of the box fractal creates the antenna layout; the sharp corners are rounded to enhance the mechanics. The deformed antenna analysis with HFSS simulations requires three steps: the undeformed antenna geometries import into Abacus, they numerically stretch with a predetermined strain, and this resulting geometry imports into HFSS for simulation (FIG. 14). The frequencies and magnitudes of the calculated S11 parameters, and the dipolar far field profiles, are consistent with those measured experimentally.

MRI Imaging. The spin echo images use the following parameters:

TR 2000; TE 25; Averages 5; Slices 25; FOV 140×140 mm; Thickness: 3 mm; Flip angle: 60 deg; Resol: 256; Partial fourier: 5/8; Bandwidth: 130 Hz/Px.

Example 2

Stretchable Batteries with Self-Similar Serpentine Interconnects and Integrated Wireless Recharging Systems An important trend in electronics involves the development of materials, mechanical designs and manufacturing strategies that enable the use of unconventional substrates, such as polymer films, metal foils, paper sheets or rubber slabs. The last possibility is particularly challenging because the systems must accommodate not only bending but also stretching, sometimes to high levels of strain (>100%). Although several approaches are available for the electronics, a persistent difficulty is in energy storage devices and power supplies that have similar mechanical properties, to allow their co-integration with the electronics. This Example provides a set of materials and design concepts for a rechargeable lithium ion battery technology that exploits thin, low modulus, silicone elastomers as substrates, with a segmented design of the active materials, and unusual 'self-similar' interconnect structures. The result enables reversible levels of stretchability up to 300%, while maintaining capacity densities of ~1.1 mAh/cm$^2$. Stretchable wireless power transmission systems provide means to charge these types of batteries, without direct physical contact.

Development of classes of electronic and optoelectronic technologies that offer elastic responses to large strain (>>1%) deformations has accelerated in recent years. Combinations of materials, device layouts, mechanics designs and manufacturing approaches are now beginning to emerge for realistic applications in areas ranging from wearable photovoltaics to 'epidermal' health/wellness monitors, to sensitive robotic skins, to soft surgical tools and electronic 'eyeball' imaging devices. In many cases, stretchability represents a key, enabling characteristic. For many of these and other uses, a critical need lies in energy storage devices with similar physical properties, to allow for direct and natural integration with the electronics. Many important storage devices have been developed with flexible characteristics, including supercapacitors and batteries. Here, sufficiently thin geometrical forms lead to flexibility, by virtue of bending induced strains (typically to values of ~1% or less) that decrease linearly with thickness, for a given bend radius. Stretchability, on the other hand, represents a more challenging type of mechanics, in which the systems must accommodate large strain deformation (>>1%), typically of arbitrary form, including not only bending, but also twisting, stretching, compressing and others, and thickness is typically not a critical factor. Stretchable supercapacitors using buckled thin films of CNTs or CNT-soaked fibrous textiles, and stretchable non-rechargeable zinc carbon batteries based on conductive fabrics represent two examples. Although these technologies each have attractive features, none offers multiple capabilities in recharging with high storage capacity, stretching to large levels of deformation (>100%), or establishing wireless electrical interfaces to external power supplies. The materials and integration schemes provided in this example achieve these characteristics in a type of lithium ion battery that exploits segmented layouts and deformable electrical interconnects in specialized, 'self-similar' geometries. The resulting devices offer biaxial stretchability up to strains of 300%, with capacity densities of ~1.1 mAh/cm$^2$, and little loss in capacity for up to 20 cycles of recharging. The designs also allow integration of stretchable, inductive coils to enable charging through external supplies without the need for physical connections. This set of attributes satisfies requirements for many applications that are being contemplated for stretchable electronics.

Results.

Figure 21A:
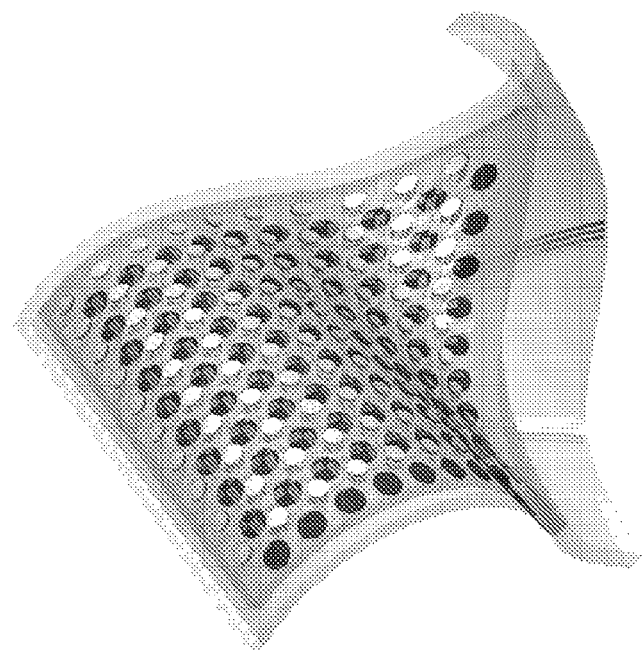
Figure 21B:
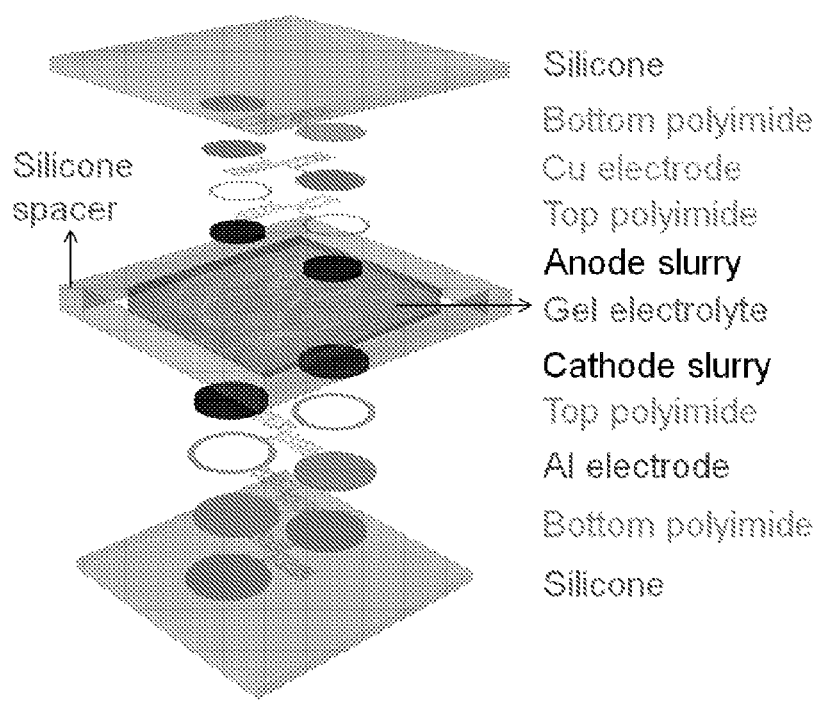
Figure 26:
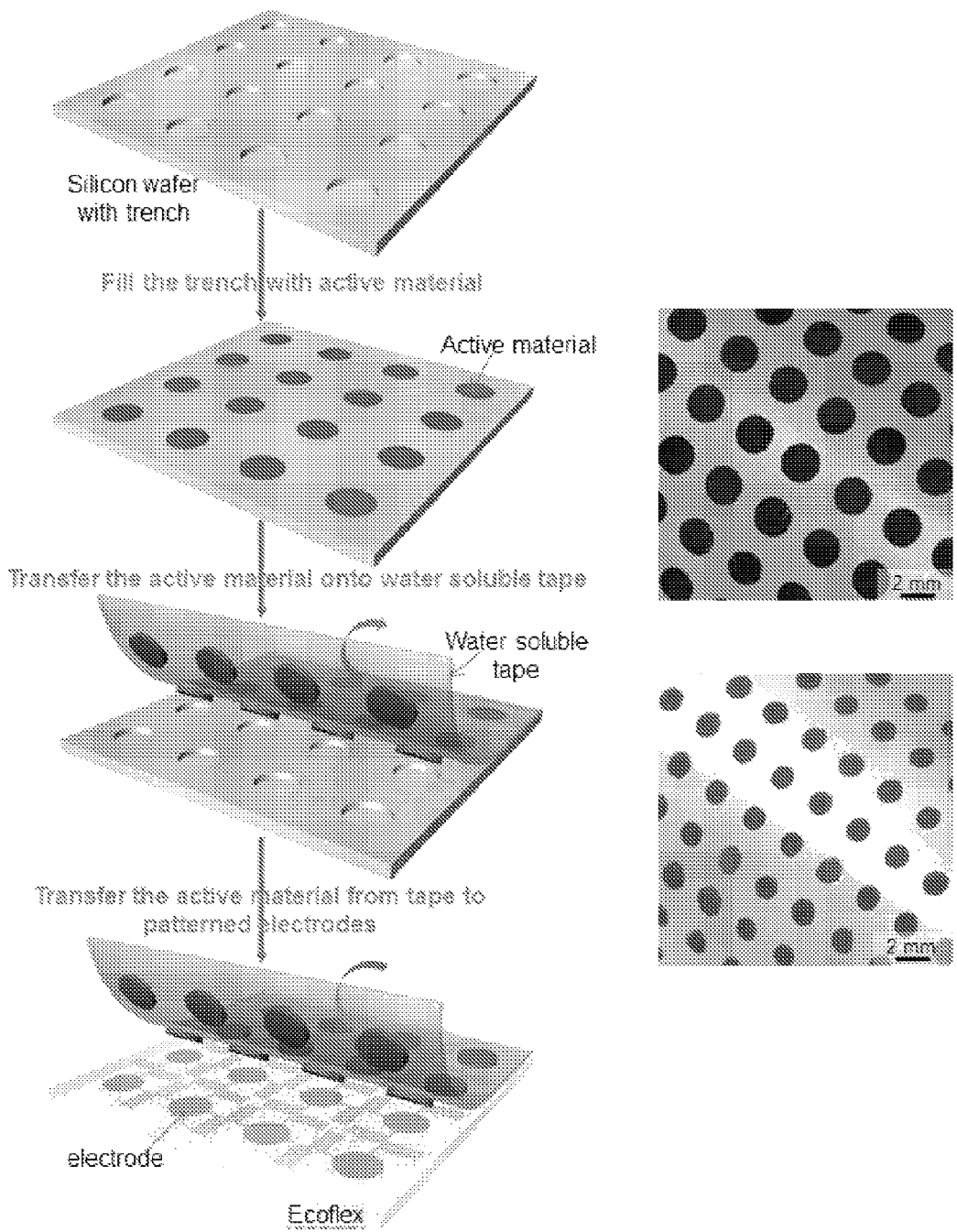
FIG. 26 provides a schematic illustration of the fabrication process, and images of the moulded cathode (top right) and anode slurry (bottom right) on water soluble tape.
Figure 27:
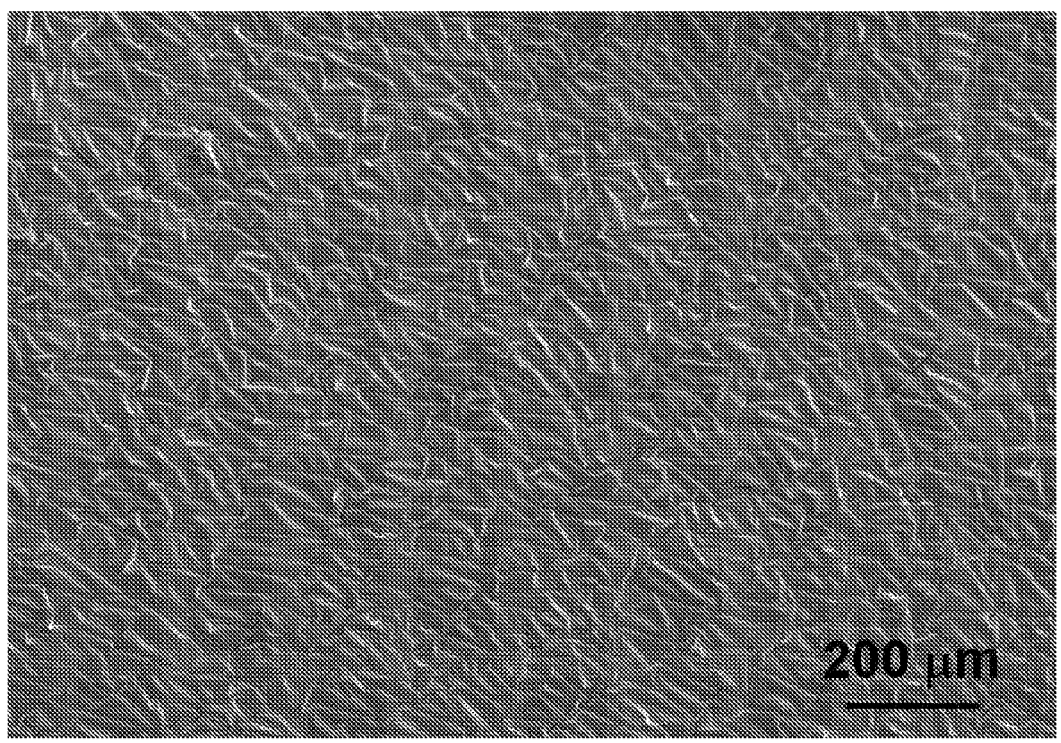
FIG. 27 provides an SEM image of a buckled Al foil (600 nm)/PI (1200 nm) bilayer on the surface of a sheet of ecoflex after releasing a prestrain of ~30%. This bilayer structure resembles the types of laminated Al/polymer packaging materials that are used in pouch cells, to block the permeation of water, air and solvent.

Battery design. The devices of this example exploit pouch cells in which arrays of small-scale storage components are connected by conducting frameworks with extraordinary stretchable characteristics. A schematic illustration of the system, an exploded view of the multilayer construction of a unit cell, and a representation of the 'self-similar' interconnect geometries appear in FIGS. 21A, 21B, 21C, and FIG. 25 below. The current collectors consist of photolithographically patterned circular disks of aluminum (600 nm) and copper (600 nm). Layers of polyimide (PI; 1.2 μm) encapsulate interconnecting traces between these disks in a way that places the metals close to the neutral mechanical plane (FIG. 21D and FIG. 21E, left panel). Thin (0.25 mm), low modulus (60 KPa) sheets of silicone elastomer form top and bottom substrates that support these structures (FIG. 21D and FIG. 21E, middle panel) and other components of the batteries. The overall construct consists of a square array of 100 electrode disks, electrically connected in parallel. Molded pads of slurries based on $LiCoO_2$ and $Li_4Ti_5O_{12}$ serve as active materials at the cathode and anode, respectively (FIG. 21E and FIG. 21E, right panel, and FIG. 26). The two sheets laminate together in a way that involves spatial offsets between the active materials to avoid electrical shortage between them and to eliminate the need for a separator. A spacer, made of the same silicone elastomer and applied around the periphery of the system, prevents direct contact of the top and bottom sheets. A gel electrolyte injected into the gap provides media for ionic transport. Thin encapsulating layers of an acryloxy perfluoropolyether elastomer bonded to the outer surfaces help to prevent moisture from diffusing into the battery and solvents in the gel from leaking out. Long term operation requires more sophisticated packages consisting, for example, of buckled bilayer sheets of aluminum/polyimide that bond to the outer surfaces of the battery (FIG. 27). The materials and fabrication details appear in the Methods section.

Figure 21C:
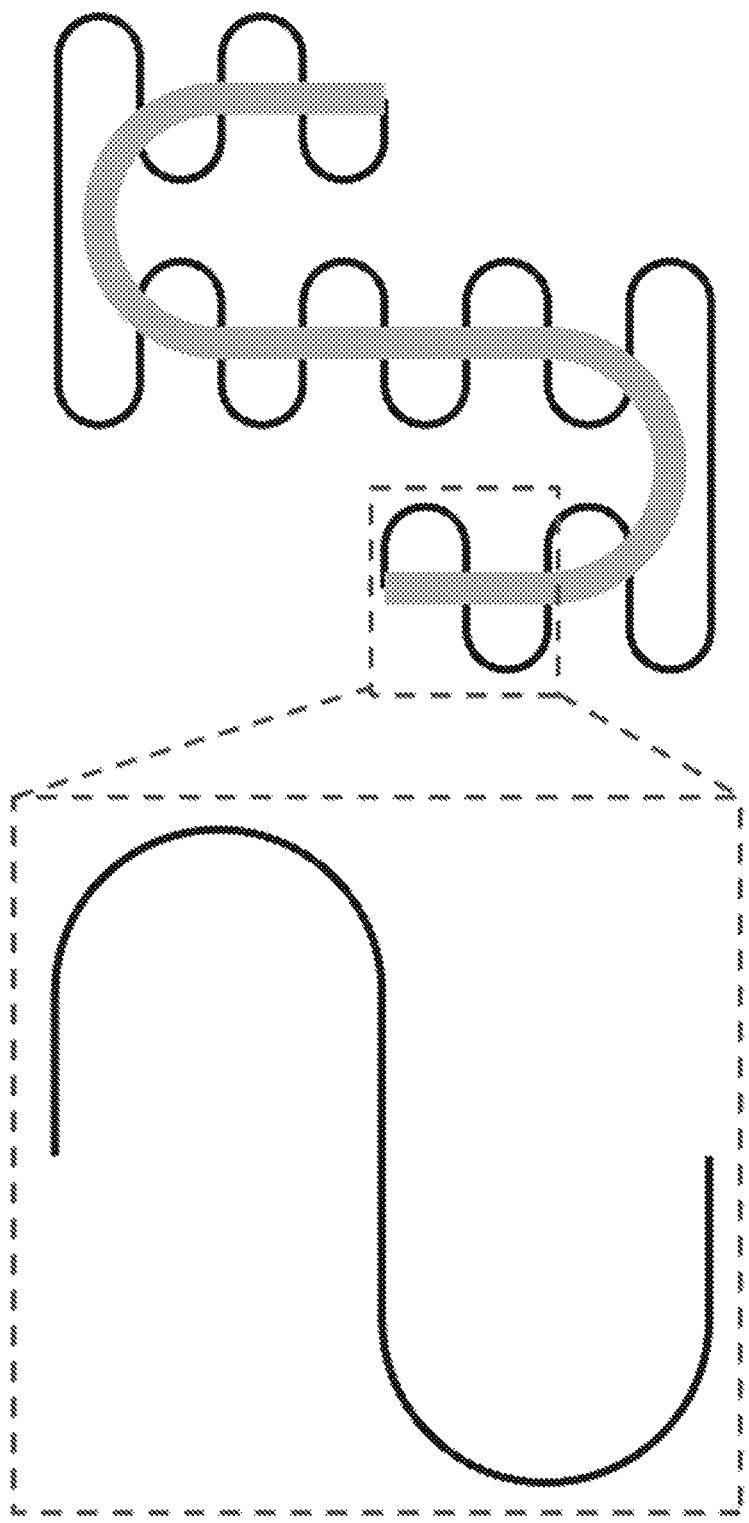

The devices must accommodate two competing design goals: (1) achieving high areal capacity, which requires large coverage of the active regions, and (2) affording high mechanical stretchability, which requires large distances between these regions. Strategic features of relief on the elastomer substrates provide a partial solution to this challenge, as demonstrated recently in photovoltaic modules. A disadvantage is that levels of stretchability beyond ~30% can be difficult to achieve without sacrificing coverage. Here, a different, but complementary, approach is taken in which the focus is on deformable interconnects with advanced designs. In particular, layouts are introduced that use 'self-similar' structures of wires in serpentine configurations to offer, simultaneously, high system-level stretchability, and low interconnect resistances. A conventional serpentine consists of circular arcs connected by straight lines. 'Self-similar' designs follow from iteratively applying this basic geometry, beginning with a unit cell as illustrated schematically in the red box of FIG. 21C. Here, reducing the scale of the cell, and then connecting multiple copies of it in a fashion that reproduces the layout of the original cell geometry corresponds to one iteration. The yellow line in FIG. 21C represents a 2nd order serpentine geometry, created in this fashion. Although higher orders can be designed and implemented easily, the 2nd order construct satisfies requirements for the applications considered here, as described in the detailed experimental and theoretical study below.

Mechanical Characteristics of the 'Self-Similar' Interconnects.

Figure 22:
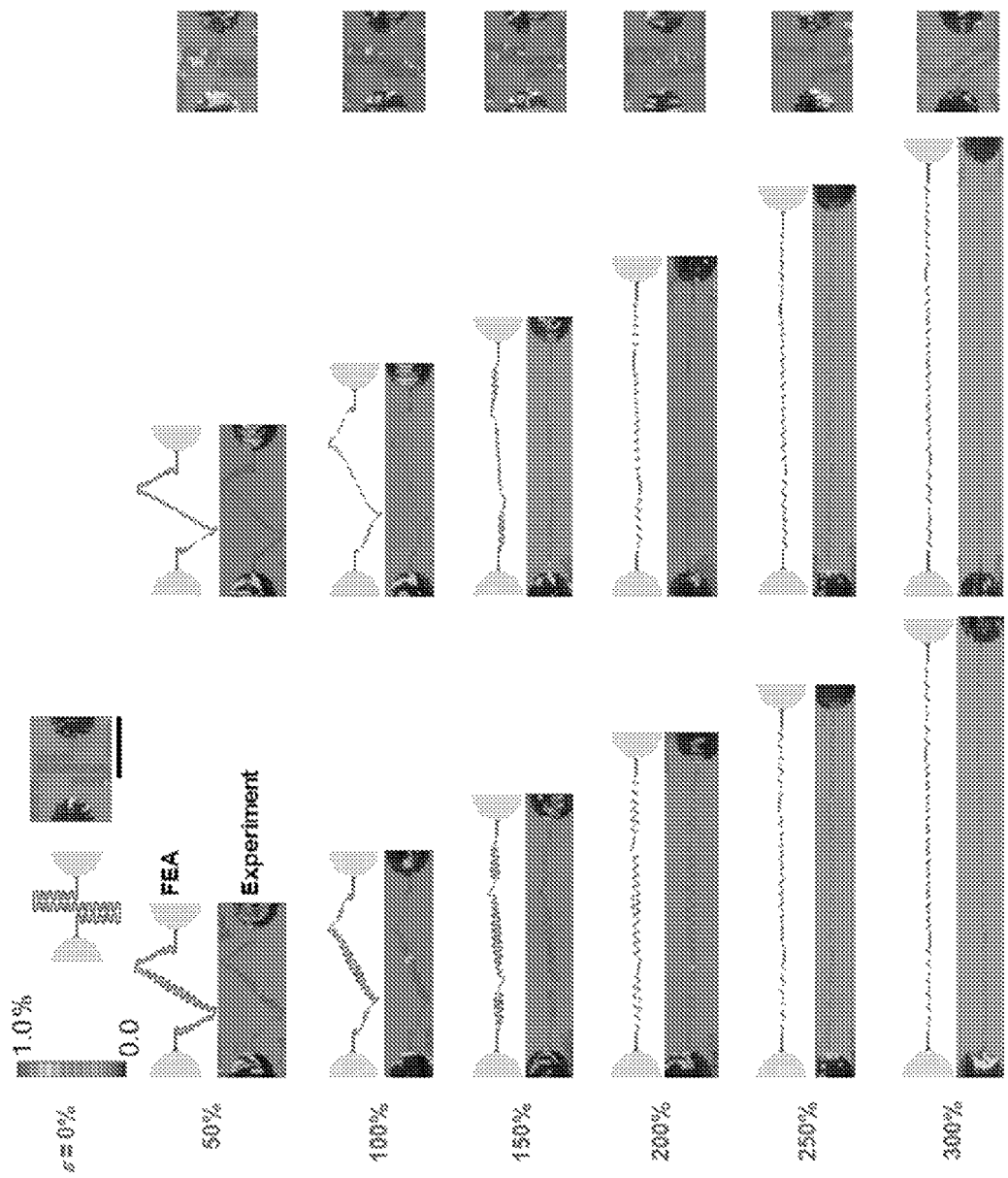
FIG. 22 provides an overview of experimental and computational studies of buckling physics in interconnects with self-similar serpentine layouts. Optical images and corresponding finite element analysis (FEA) of symmetric (left column) and anti-symmetric (middle column) deformation modes, for various levels of applied tensile strain ($\in$). The color in the FEA results represents the maximum principal strains of the metal layer. The scale bar is 2 mm. The right column shows the interconnect structures after releasing the applied strain.
Figure 28A:
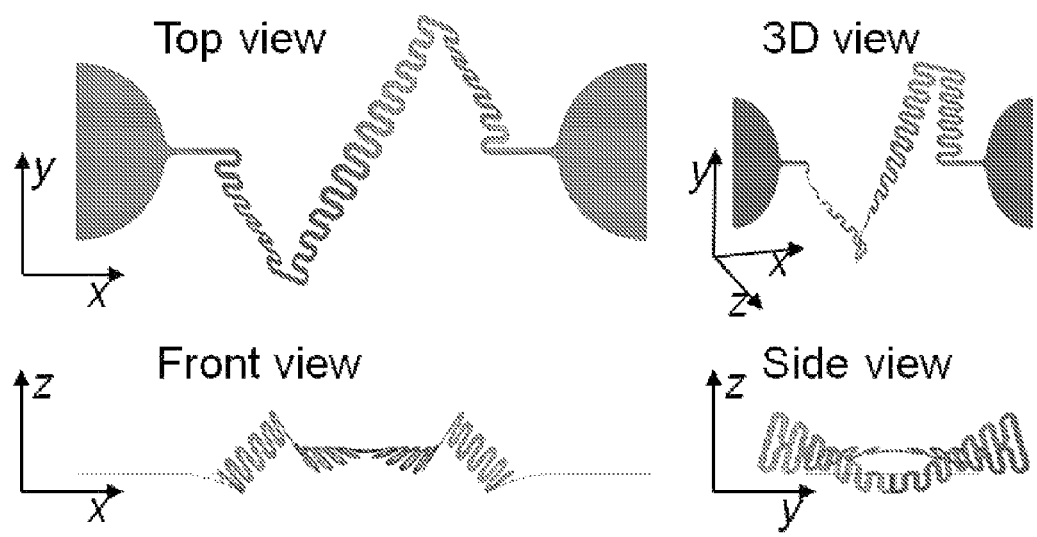
FIGS. 28A and 28B provide deformed configurations (FEA results) of the self-similar electrode for symmetric (FIG. 28A) and anti-symmetric (FIG. 28B) buckling modes under an applied strain of 50%, from different viewing angles (i.e., top, front, side, and three-dimensional (3D) views).
Figure 28B:
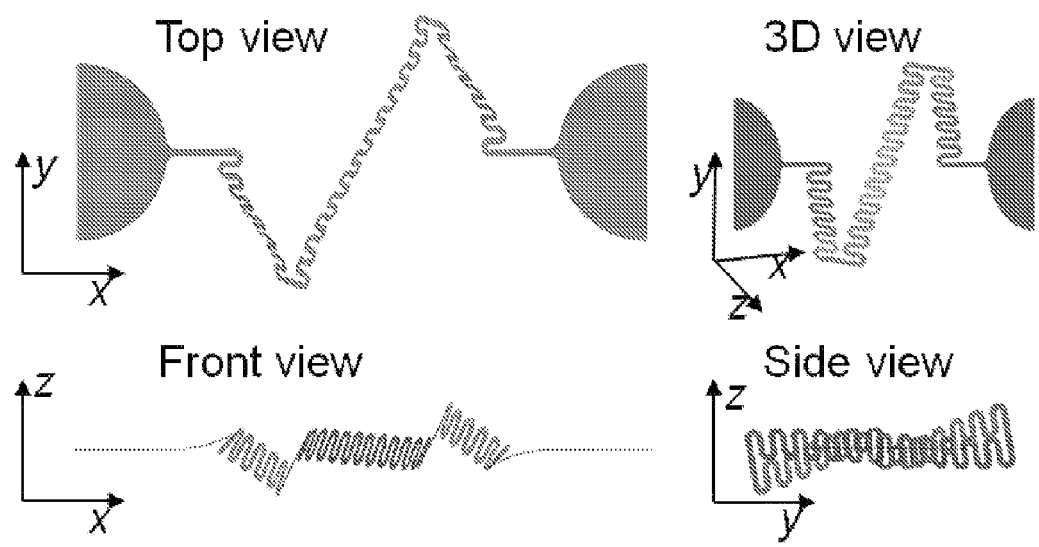

Three-dimensional (3D) finite element analysis (FEA) (details below) and experimental measurements illustrate the essential mechanics. Test samples fabricated for this purpose consist of free-standing, multilayer traces, with materials and multilayer stack designs (PI (1.2 µm)/Cu (0.6 µm)/PI (1.2 µm)) that match those used in the batteries, between circular pads that bond to posts molded onto underlying elastomer substrates. The self-similar geometry leads to hierarchical buckling physics that ensure ultra-low strains in the materials, even under extreme stretching. For the entire range of tensile strains examined, from 0% to 300%, the configurations predicted by FEA agree remarkably well with optical images collected during the experiments, as shown in FIG. 22. Both symmetric and anti-symmetric buckling modes exist (see FIGS. 28A and 28B for detailed illustrations of the two modes). The trace consists of three columns of serpentine wires connected by two horizontal straight lines. We refer to the construct that corresponds to the 'short' wavelength serpentine within each column as the 1st level; the 2nd level corresponds to the large-scale serpentine shape, with 'long' wavelength. For the symmetric buckling mode (FIG. 28A), the left and right columns undergo mainly an overall bending deformation along the vertical direction, resulting in the collective upward motion of the entire middle column of serpentine wires. In this sense, the out-of-plane displacement is symmetric with respect to the center line (x=0) in the "Front view" of FIG. 28A. For the anti-symmetric buckling mode (FIG. 28B), the serpentines in the left and right columns mainly undergo an overall twisting deformation along the vertical direction. Here, the two ends of the middle serpentine move in opposite directions (i.e. one moves up, and the other moves down). In this case, the out-of-plane displacement is anti-symmetric with respect to the center line (x=0) in the "Front view" of FIG. 28B. The critical buckling strains obtained by FEA for the symmetric (0.078%) and anti-symmetric (0.087%) modes are much lower than those (>0.172%) for all other buckling modes. This result is consistent with experimental observation of only these two modes. In both cases, the physics associated with stretching involves a mechanism of "ordered unraveling", which begins at the 2nd level, at a well-defined, critical buckling strain, ~0.08% for the example investigated here. Next, the 2nd level gradually "unravels" via bending and twisting as the applied strain increases from 0.08% to ~150%, during which there is essentially no further deformation in the 1st level. The motions in the 1st level start when the 2nd level is almost fully extended, corresponding to an applied strain of ~150% in this case. As the "unraveling" of the 1st level serpentine approaches its end, the strain in the materials begins to increase rapidly, thereby defining the practical limit in stretchability.

Figure 29:
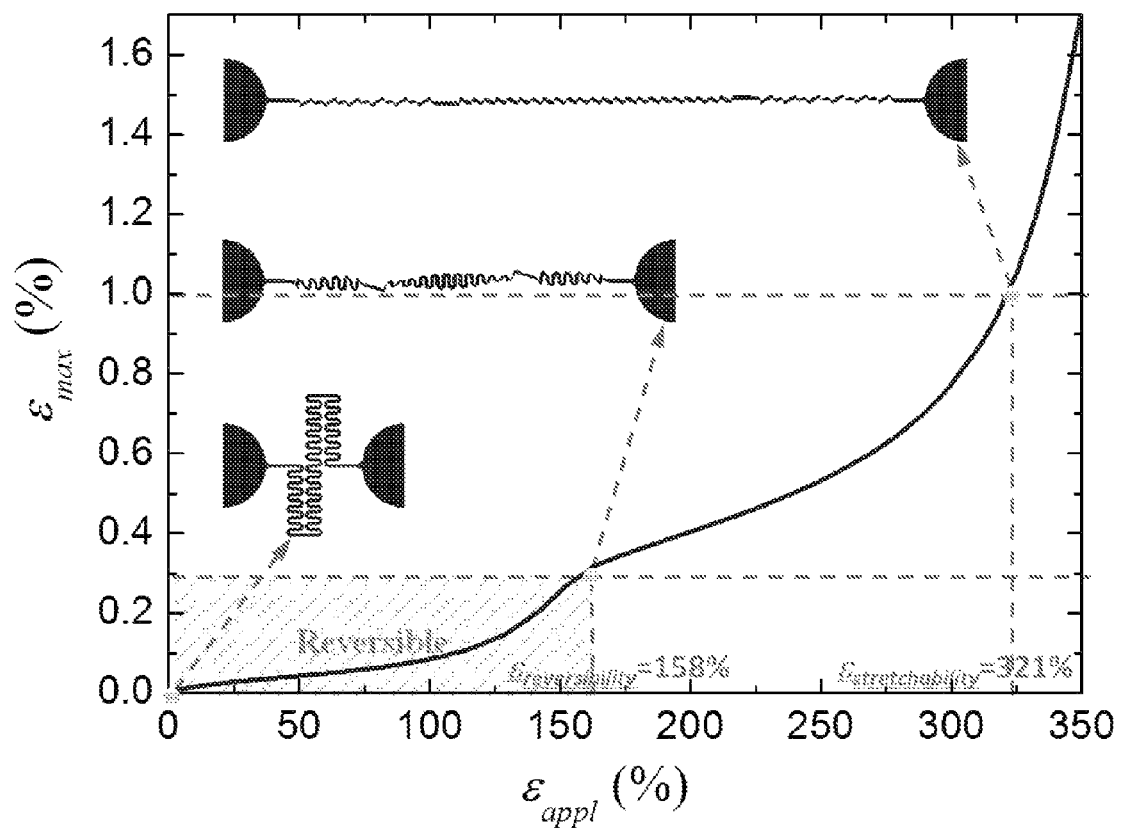
FIG. 29 illustrates the maximum value ($\in_{max}$) of the maximum principal strain in the metal layer of the self-similar interconnect as a function of the applied strain ($\in_{appl}$), together with the evolution of the deformations.

For applied strains below this limit, the deformation mechanisms of ordered unraveling processes ensure low levels of strain in the materials (FIG. 29). For a representative failure strain of 1% for copper, FEA predicts a stretchability of 321%, which is in good agreement with the experimental observations (300%<$\epsilon_{stretchability}$<350%). (Simulations suggest that the copper reaches its failure point before the PI.) For reversible behavior (i.e., the interconnects return to their initial configuration after release), the maximum material strain must be less than the yield strain. For a representative yield strain of 0.3% for copper, FEA suggests reversibility for applied strains up to ~168%. This value is lower than experimental observations, where reversibility occurs even for strains of between 200% and 250% (FIG. 22). The likely explanation for this discrepancy is that yield occurs first in only small portions of the interconnect (e.g., one element in the FEA). In this case, the effects on reversibility might not be easily observed in experiments.

Figure 30:
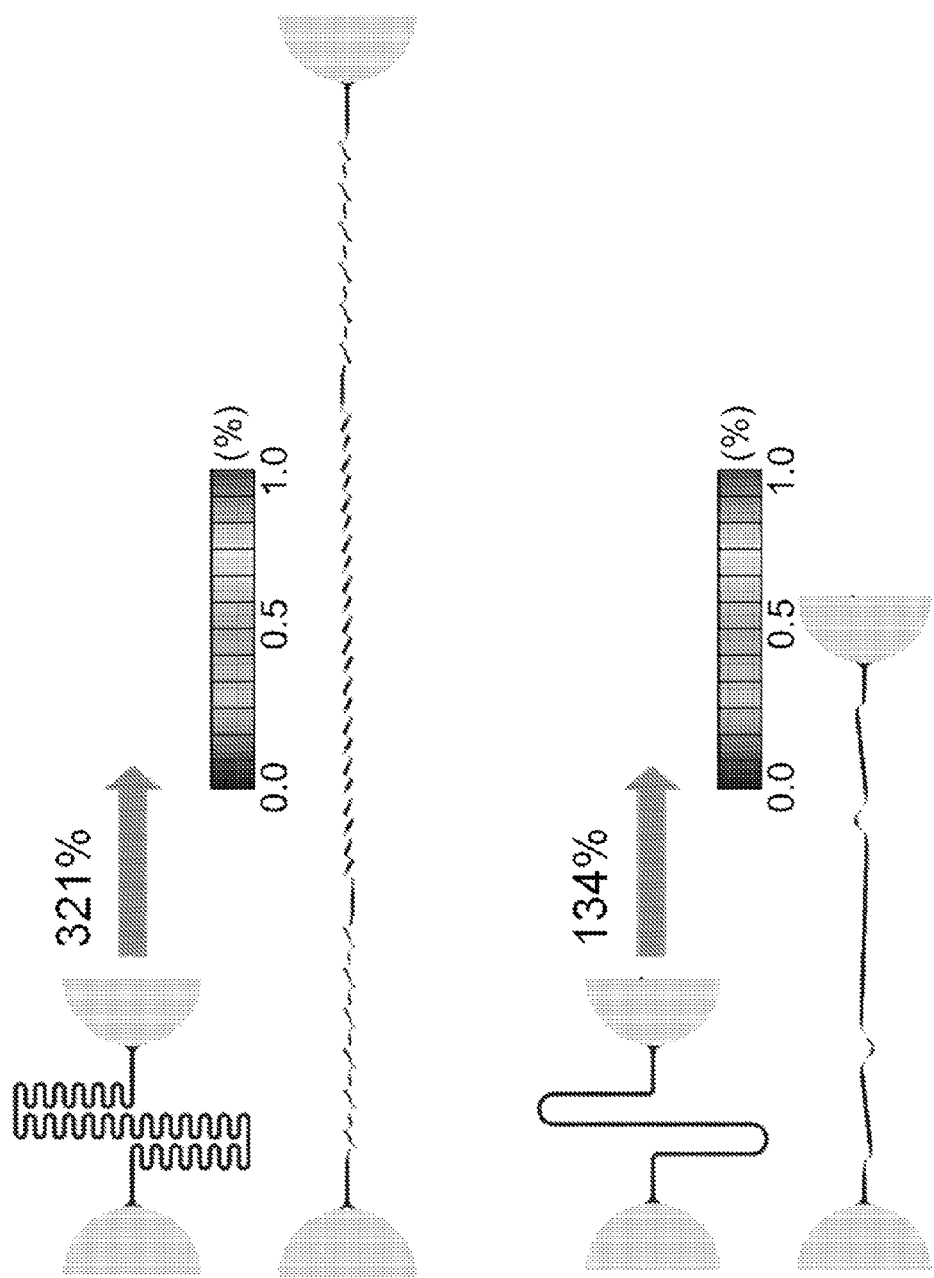
FIG. 30 illustrates the distribution of maximum principal strain in the metal layer when its maximum value reaches 1%: (top) the 2-order self-similar interconnect; and (bottom) the 1-order interconnect. The two structures have the same overall dimensions, and cross-sections.
Figure 31:
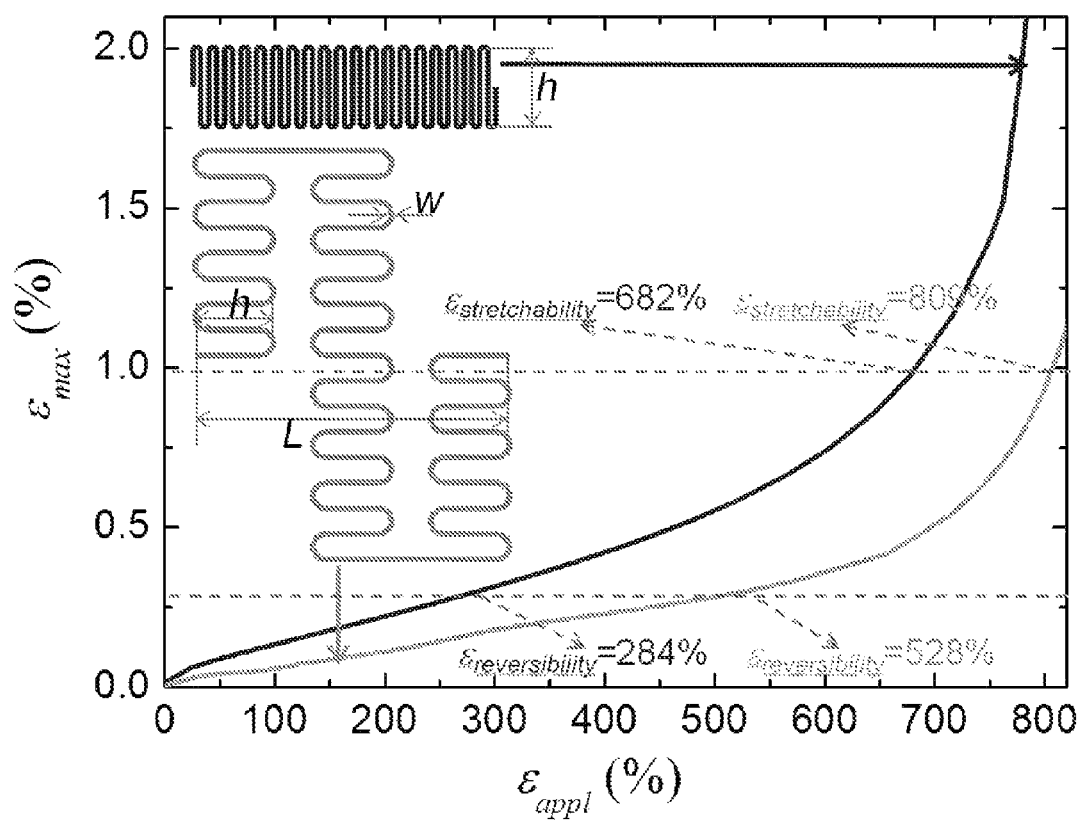
FIG. 31 provides a plot showing the maximum value ($\in_{max}$) of the maximum principal strain in the metal layer of the interconnect as a function of the applied strain ($\in_{appl}$), for the self-similar and simple serpentine designs. The two interconnects have the same total length ($l_{total}$), span (L), amplitude (h), width (w), and thickness (t).
Figure 32:
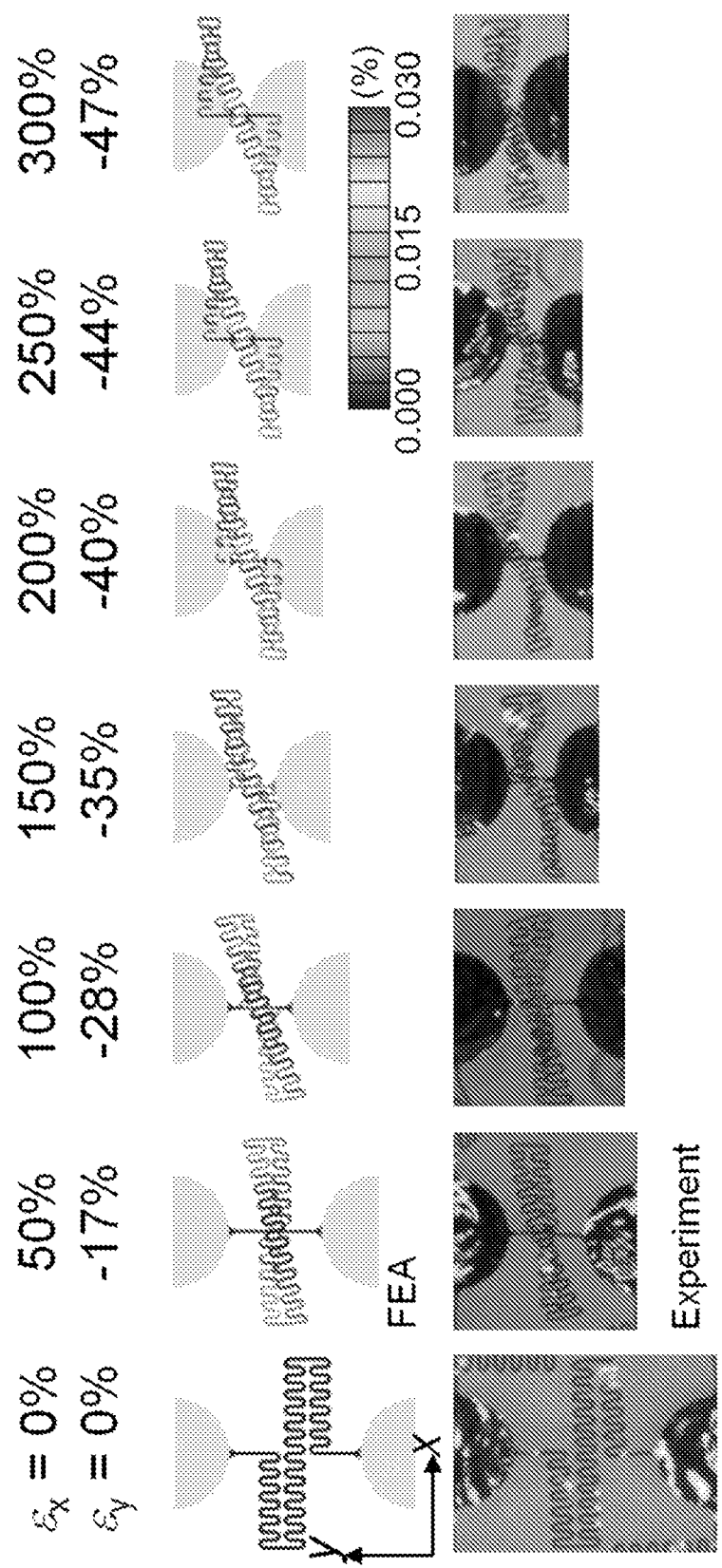
FIG. 32 provides the results of finite element analyses of the buckling profiles of a vertically aligned self-similar interconnect under compression, and its comparison with optical images from experiment. The color contours in the FEA results represent the distribution of maximum principal strain in the metal layer.

These levels of stretchability (>300%) and reversibility (>200%) significantly exceed those of previous reports in stretchable batteries and/or battery electrodes; they are also greater than those of any other reports of stretchable interconnects that use lithographically defined patterns of conventional metals. The importance of the self-similar designs can be assessed through comparisons of stretchability to otherwise similar, but conventional serpentine structures: the former exhibits a stretching range of 321%, while the latter is 134%, determined by FEA (FIG. 30). Furthermore, even for the same total length ($l_{total}$), span (L), amplitude (h), and cross section (width w and thickness t), the self-similar design again outperforms the conventional serpentine, both in stretchability (809% vs. 682%) and reversibility (528% vs. 284%) (FIG. 31). We note that in all cases of uniaxial stretching, the Poisson effect leads to compression in the orthogonal direction. The buckling profiles in these regions have behaviors that are consistent with FEA (FIG. 32).

Figure 33A:
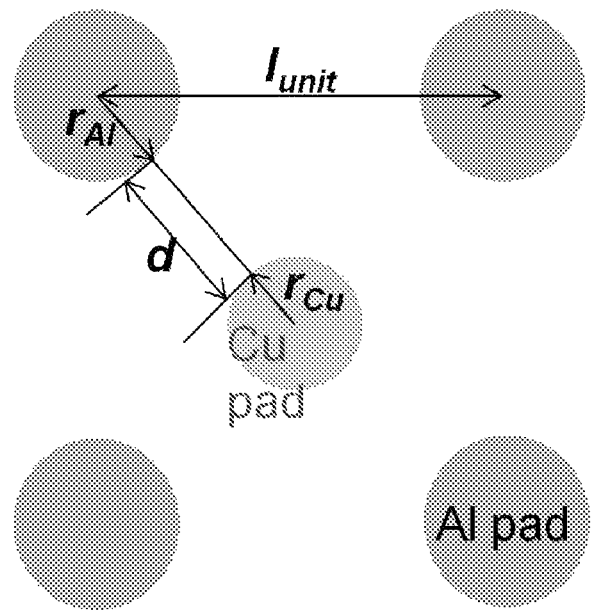
FIG. 33A shows the layout of Al and Cu pads.
Figure 33B:
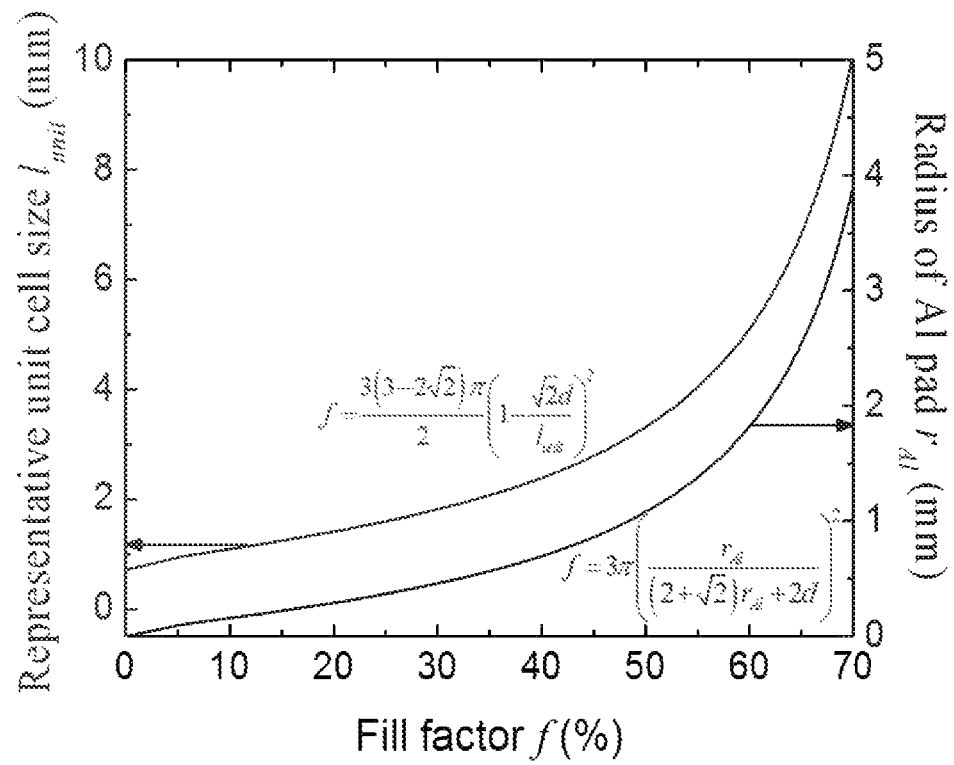
FIG. 33B illustrates the dependences of fill factor on the size of a representative unit cell and the radius of the Al pad. The offset distance (d) is set to be 0.5 mm in the model to avoid possible short circuits as the battery is stretched.

Electrochemical and mechanical behavior of the battery. After choosing a set of dimensions that offers excellent system level stretchability, with good areal capacity density, and modest interconnect resistance, the best electrical performance was observed for layouts in which the diameters of the disks for the cathode and anode are 2.20 mm and 1.58 mm, respectively, and the offset distances are 0.51 mm. This configuration corresponds to an areal coverage of 33% for the cathode, 17% for the anode, and 50% for the entire battery (in the undeformed configuration) (FIGS. 33A and 33B). The interconnects have thicknesses of 600 nm and widths of 50 µm. For these parameters, the resistance between adjacent disks is 24Ω, and that between the connection lead and the most distant disk is 45Ω. The leads for external connection are thin and narrow to avoid strain at the interface, and facilitate connection to flexible (but not stretchable) cables that connect to external characterization equipment. The gel electrolyte combines the flow properties of viscous liquids with the cohesive properties of a solid, thereby allowing it to accommodate large strains while maintaining ionic conduction pathways.

Figure 23A:
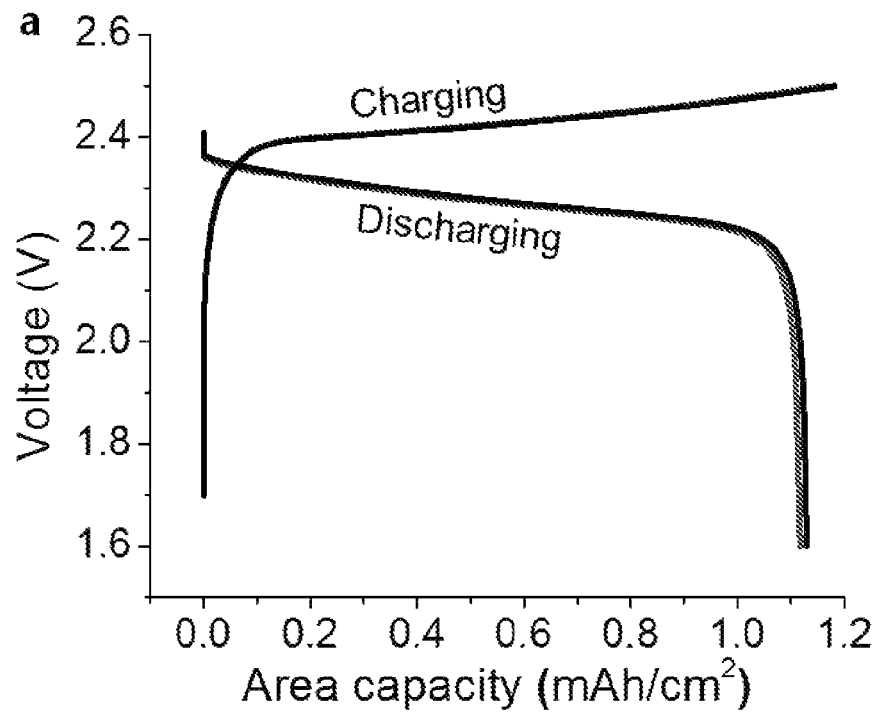
FIGS. 23A-23H provide an overview of electrochemical and mechanical properties of the battery.
Figure 23B:
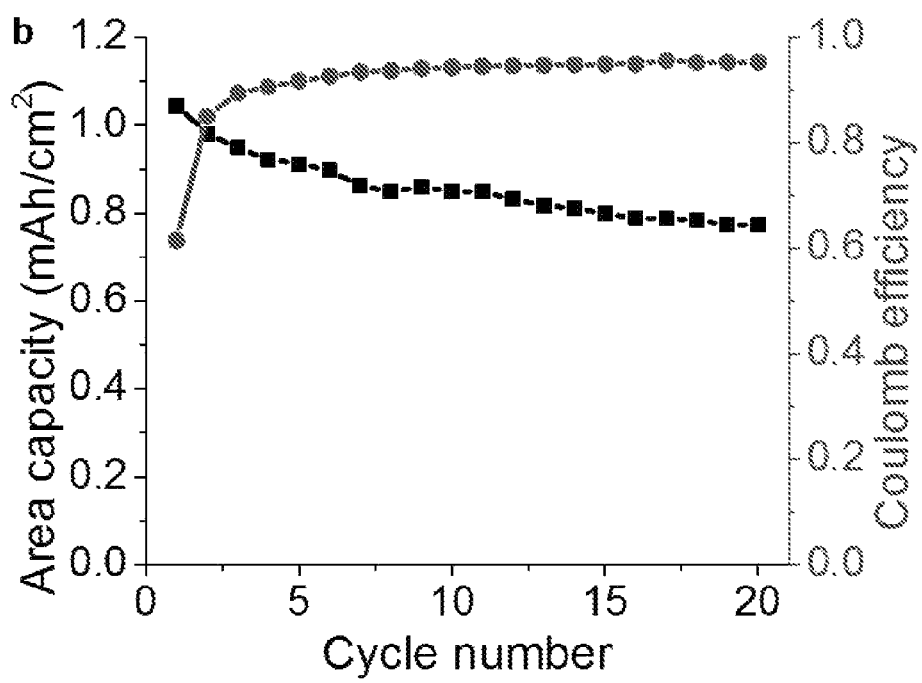
Figure 23C:
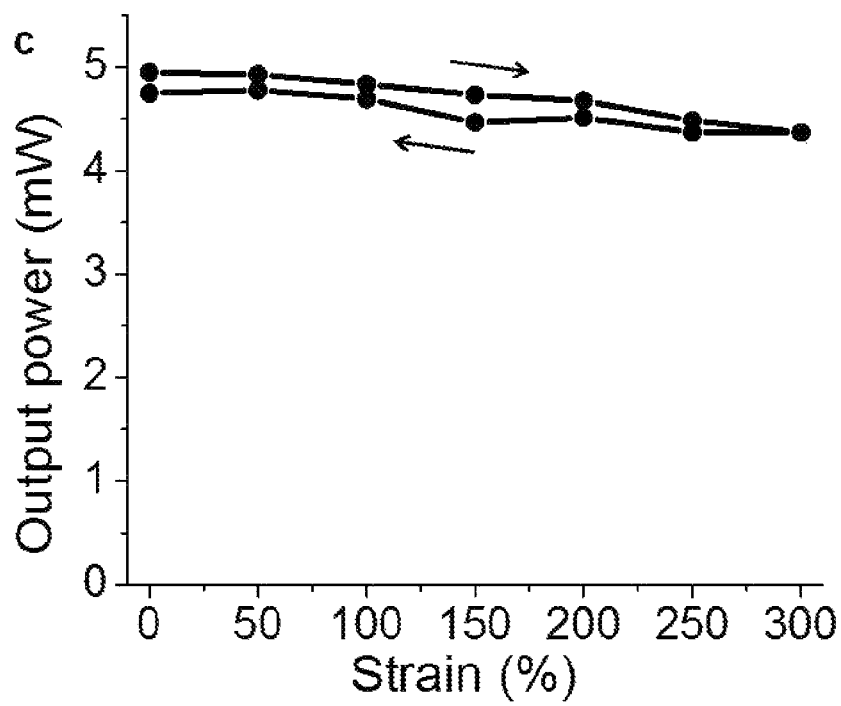
Figure 23D:
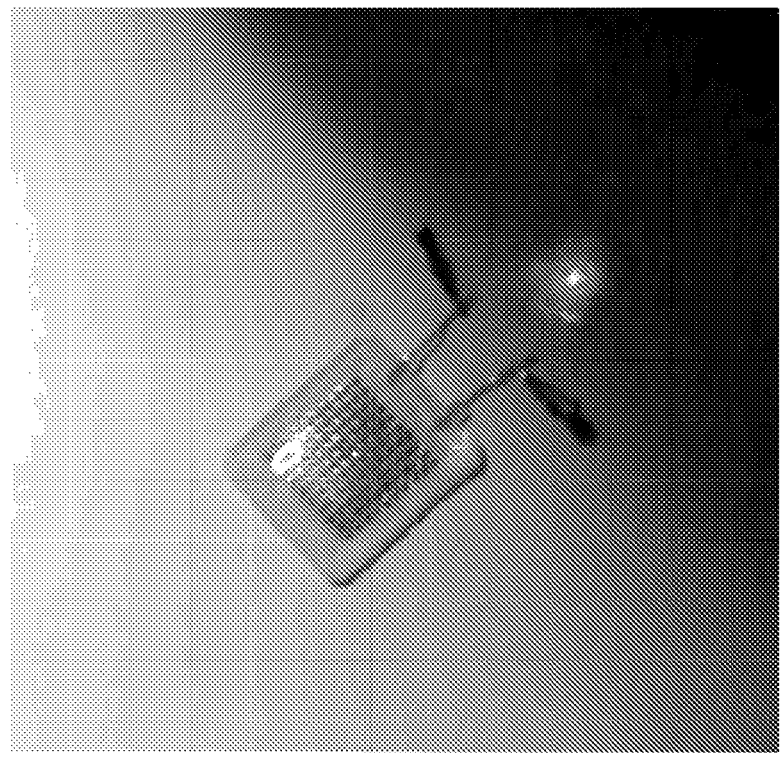
Figure 23E:
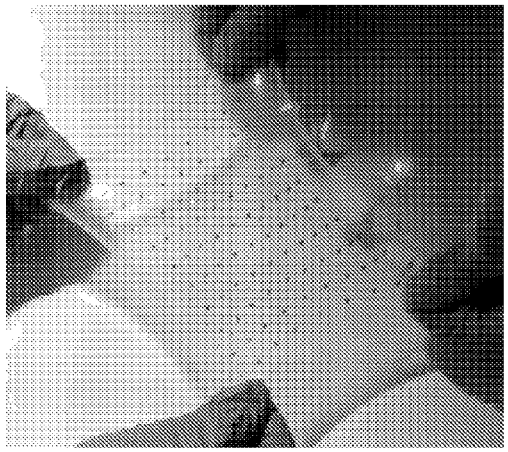
Figure 23F:
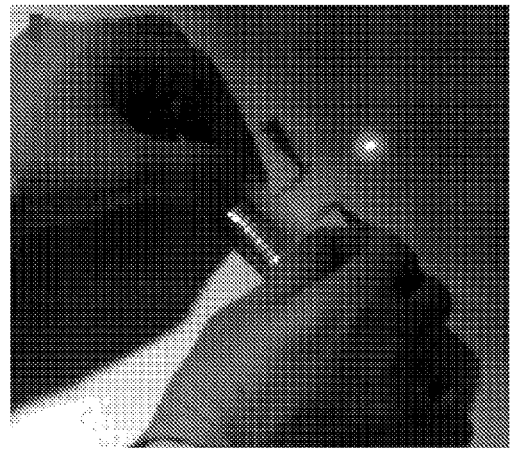
Figure 23G:
Figure 23H:
Figure 34:
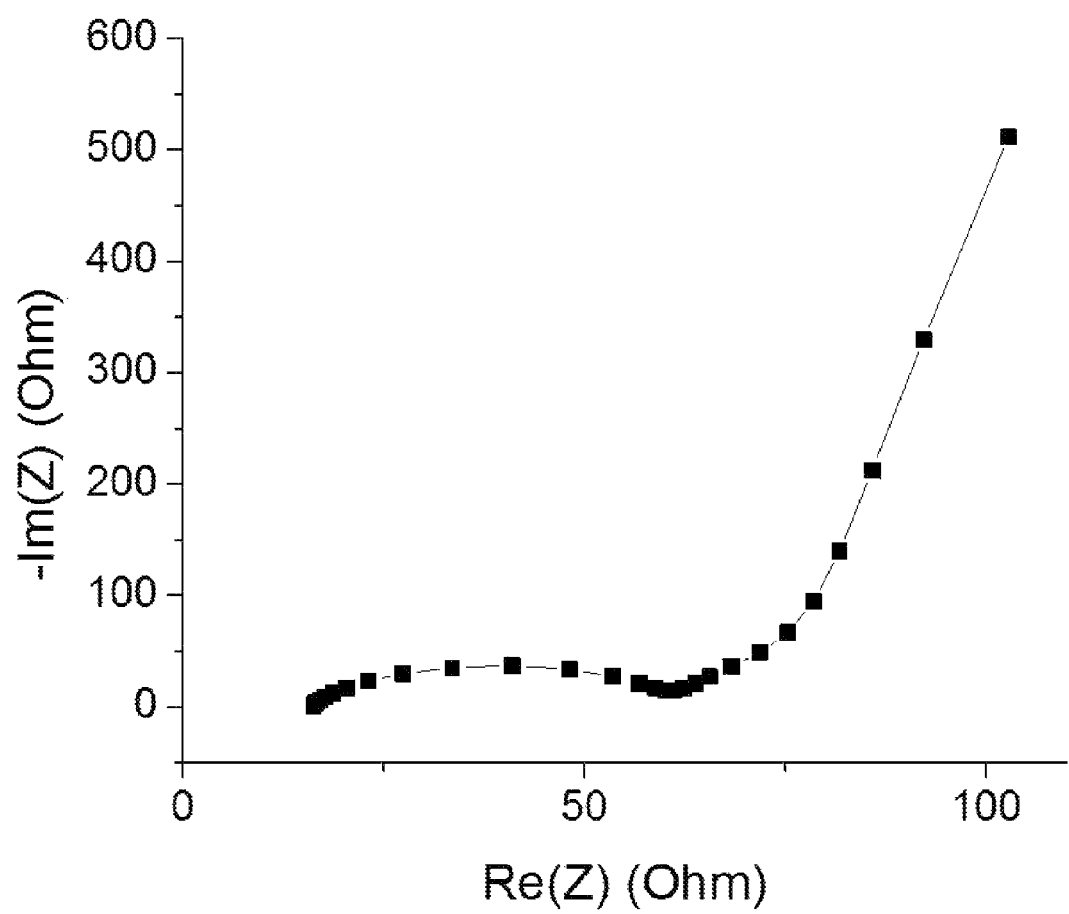
FIG. 34 provides a Nyquist impedance plot for the pouch type stretchable battery from 1 MHz to 10 mHz with an a.c. perturbation amplitude of 10 mV.
Figure 35:
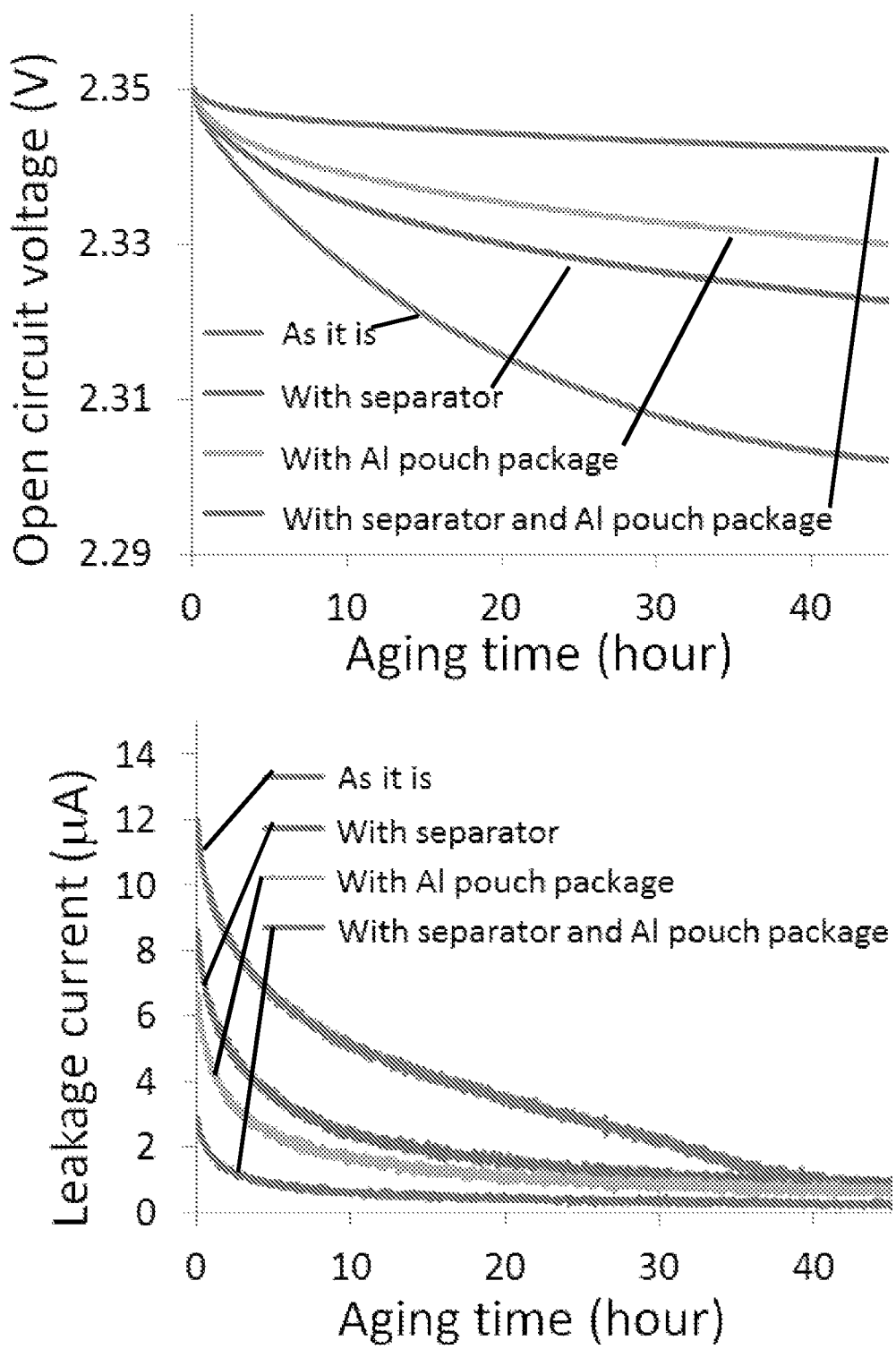
FIG. 35 provides data showing open circuit voltage decay curves (top) and leakage current curves (bottom) for batteries in various configurations, measured at room temperature.
Figure 36:
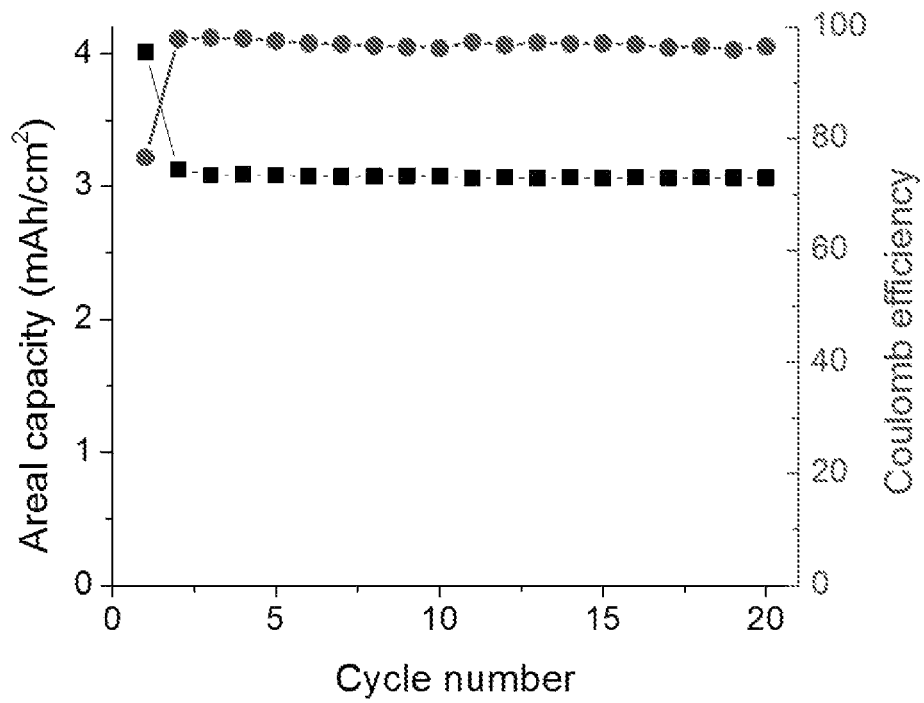
FIG. 36 illustrates capacity retention (black squares) and coulombic efficiency (red circles) over 20 cycles with a cutoff voltage of 2.5-1.6 V for coin cell geometries with exactly the same slurries and the capacitance matched cathode and anode geometries.
Figure 37:
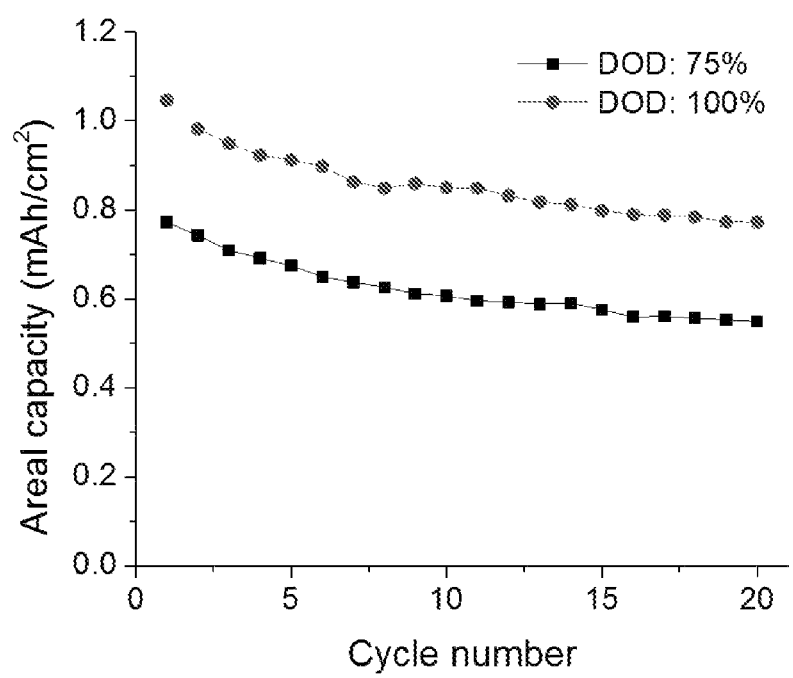
FIG. 37 illustrates capacity retention curves with depth of discharge of 100% (red circle curve, cut-off voltage of 1.60-2.50 V) and ~75% (black square curve, cut-off voltage of 2.25-2.50 V).
Figure 38:
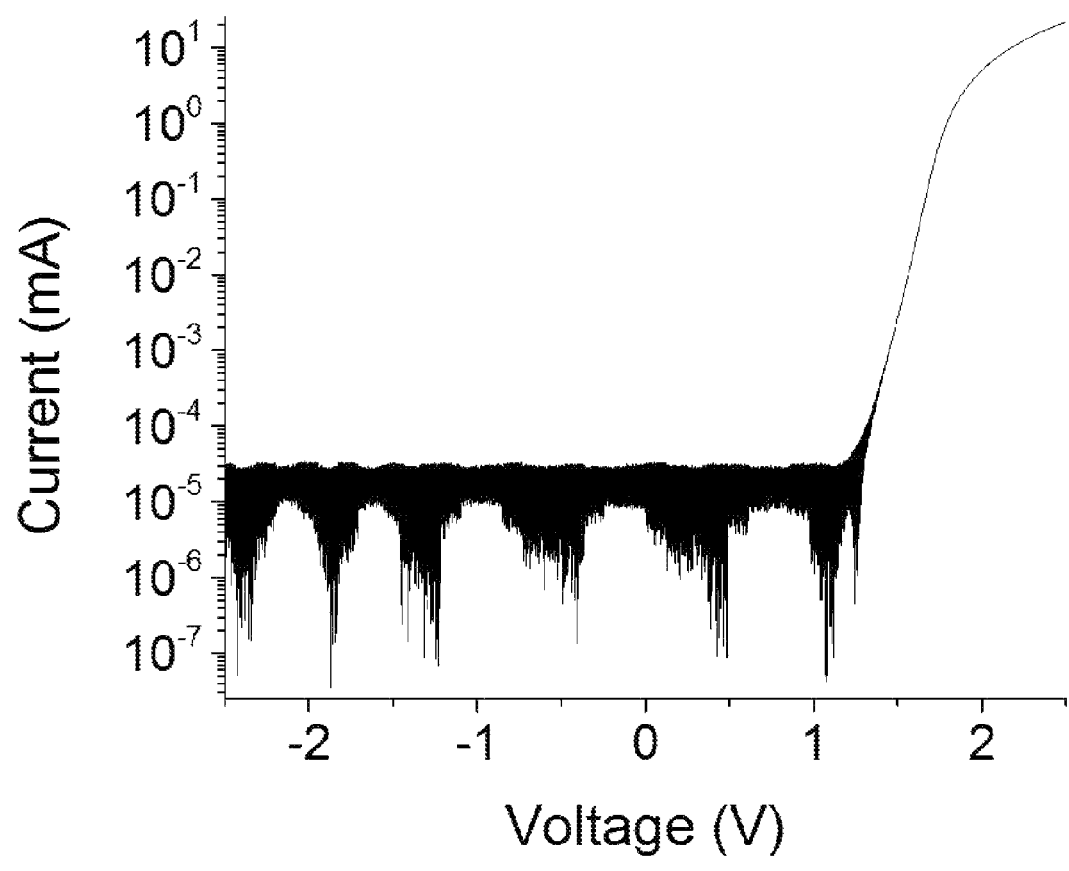
FIG. 38 provides I-V curve of a commercial red light emitting diode, showing its turn on voltage at around 1.7 V.

Electrochemical properties of the battery electrodes without and with 300% uniaxial strain appear in FIG. 23A. The results show two well defined plateaus at around 2.35 V corresponding to potentials of $Co^{3+/4+}$ and $Ti^{4+/3+}$ redox couples. The thickness of the $LiCoO_2$ (specific capacity 145 mAh/g) at each unit is ~120 µm, corresponding to a mass of ~95 mg, and thus areal capacity density of 1.1 mAh/cm² at a charge/discharge rate of C/2. The mass of $Li_4Ti_5O_{12}$ (specific capacity 160 mAh/g) is ~90 mg, which corresponds to 5%-10% more anode capacity than cathode. Slurry disks with thicknesses larger than those described here yield improved areal capacity density, but with reduced rate capability due to the concentration polarization in the disks. The output resistance of the battery is ~70Ω (FIG. 34), and the leakage current is 1-10 μA. The leakage current arises from three main sources: (i) the reverse biased Schottky diode, (ii) internal ohmic self-discharge between the slurry disks at the anode and cathode and (iii) Faradaic effects, including shuttle reactions associated with impurities in the slurry materials, residual oxygen and/or moisture. Experimental results presented below and in FIG. 35 show that use of separators and enhanced packaging schemes can reduce the capacity loss from 161 μA·h to 23 μA·h in 44 hours. FIG. 23B shows the coulombic efficiency (red) and cycling performance (black) of the encapsulated battery. The coulombic efficiency rises from ~60% for the first cycle to over 90% after three cycles. The initial loss can be attributed to the formation cycle, during which a solid-electrolyte-interphase forms, and lithium is consumed in side reactions with impurities in the electrolyte. The gradually degrading capacity retention results rather from the cycle fade (FIG. 36) but more likely from the calendar fade due to some combination of reaction with residual water in the packaging materials, moisture penetration, and electrical discontinuity of slurry particles that detach from the disks (which are not hot-pressed), and can be sometimes observed in the electrolyte gel. Varying the depth of discharge from 100% to 75% did not have a significant effect on the degradation characteristics (FIG. 37). Further increasing the baking temperature and optimizing the composition of the slurries, such as increasing the binder ratio, could reduce the latter behaviors. Improved conditions for device assembly could reduce effects of the former. FIG. 23C shows the output power of the battery, when connected to a resistor (2020Ω), during biaxial stretching and releasing. The slight decrease in output power with strain likely results from increased internal resistances that arise from the significantly increased separations between slurry disks with strains at these large levels. The battery provides sufficient power to operate commercial light emitting diodes (LEDs), with turn on voltages of 1.7 V (FIG. 38), as shown in FIG. 23D. The battery could be stretched for up to 300% (FIG. 23E), folded (FIG. 23F), twisted (FIG. 23G), and compliant when mounted on human skin (FIG. 23H) without noticeable dimming of the LED. Furthermore, FEA demonstrates that the effective modulus (66.8 KPa) of the full composite structure of the battery is only slightly higher than the modulus (60.0 KPa) of substrate materials (Ecoflex). As a result, the battery is not only stretchable but also exceptionally soft and compliant. The modulus is, in fact, lower than that of the human epidermis (140-600 KPa), thereby offering the potential for integration onto the skin and biological tissues, without significant mechanical loading.

Figure 24A:
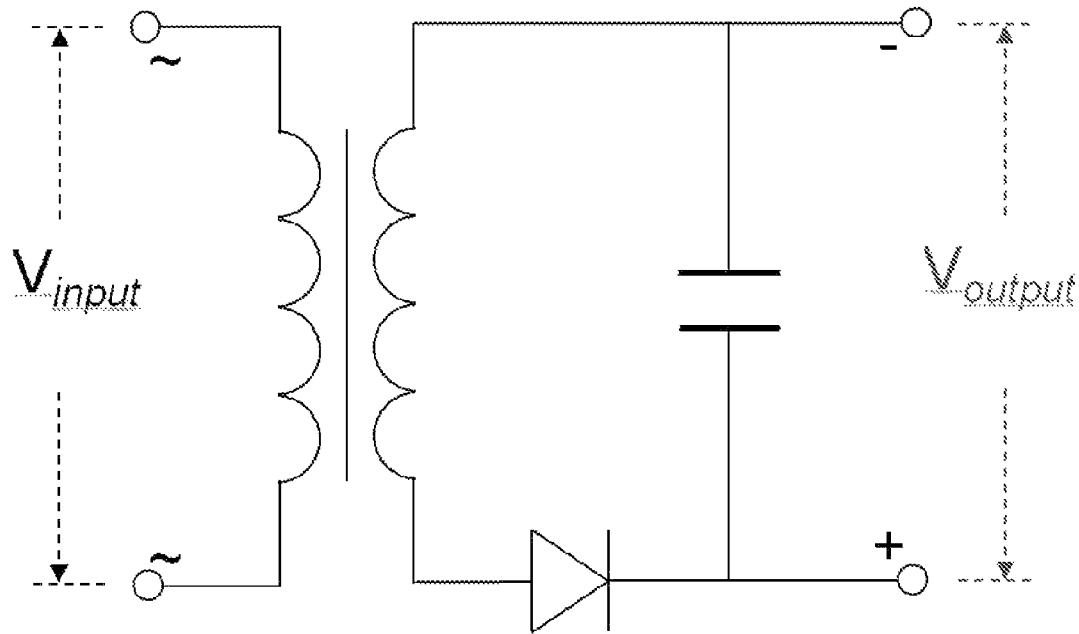
FIGS. 24A-24D provide an overview of a stretchable system for wireless charging.
Figure 24B:
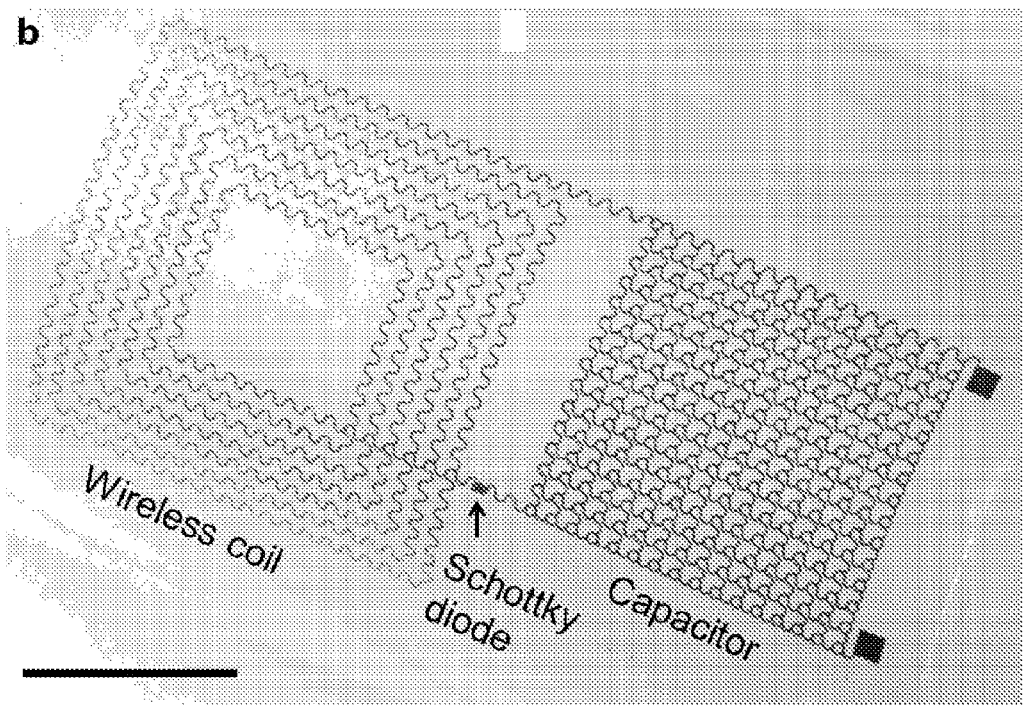
Figure 24C:
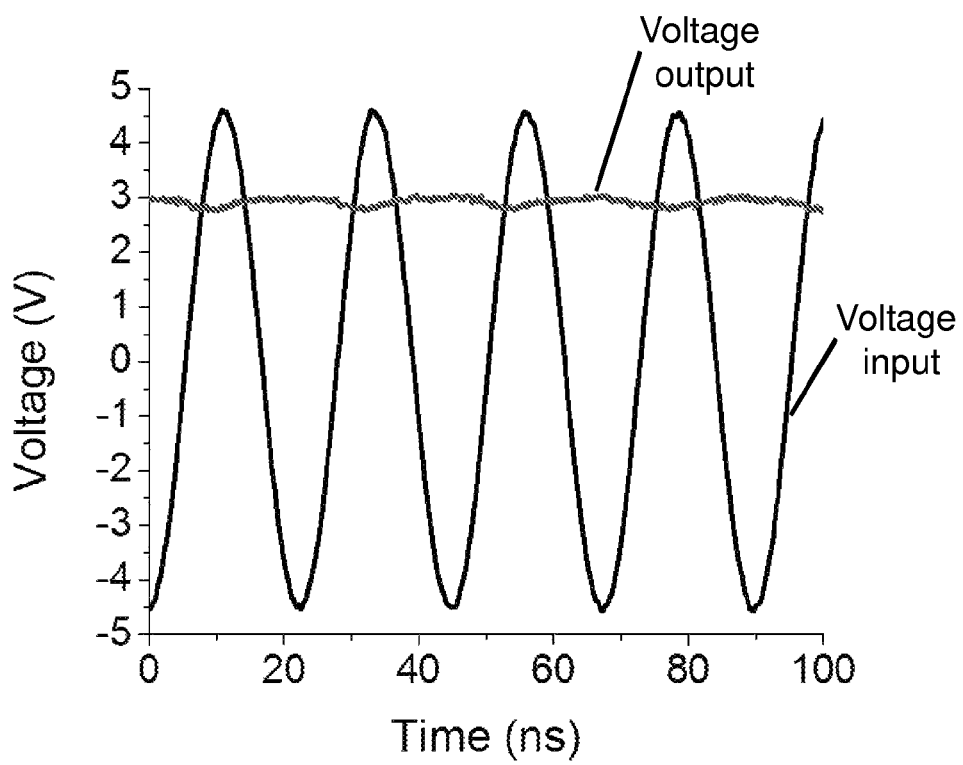
Figure 24D:
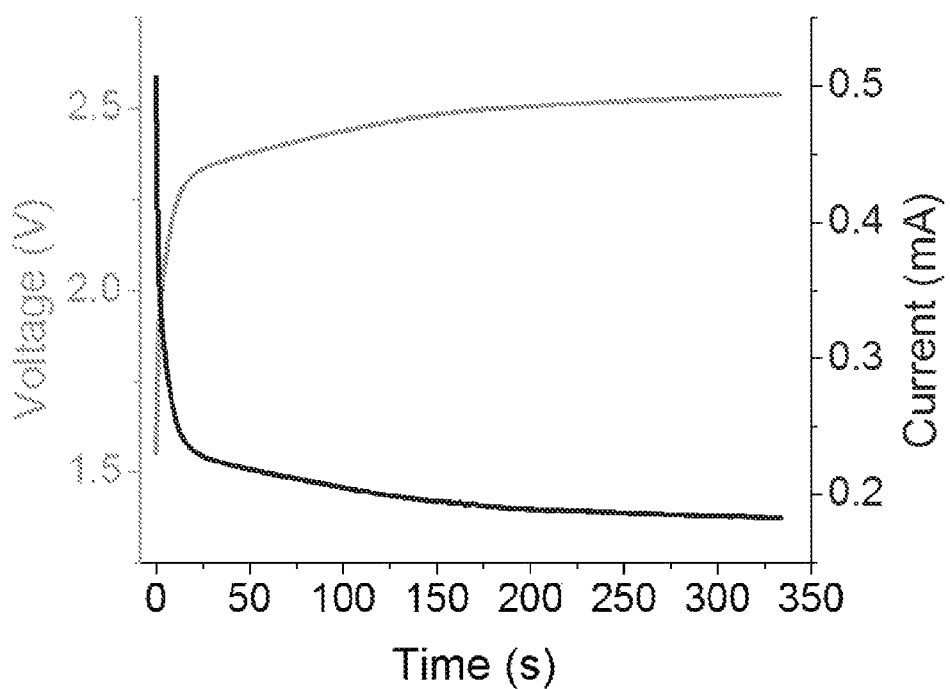
Figures 40A, 40B:
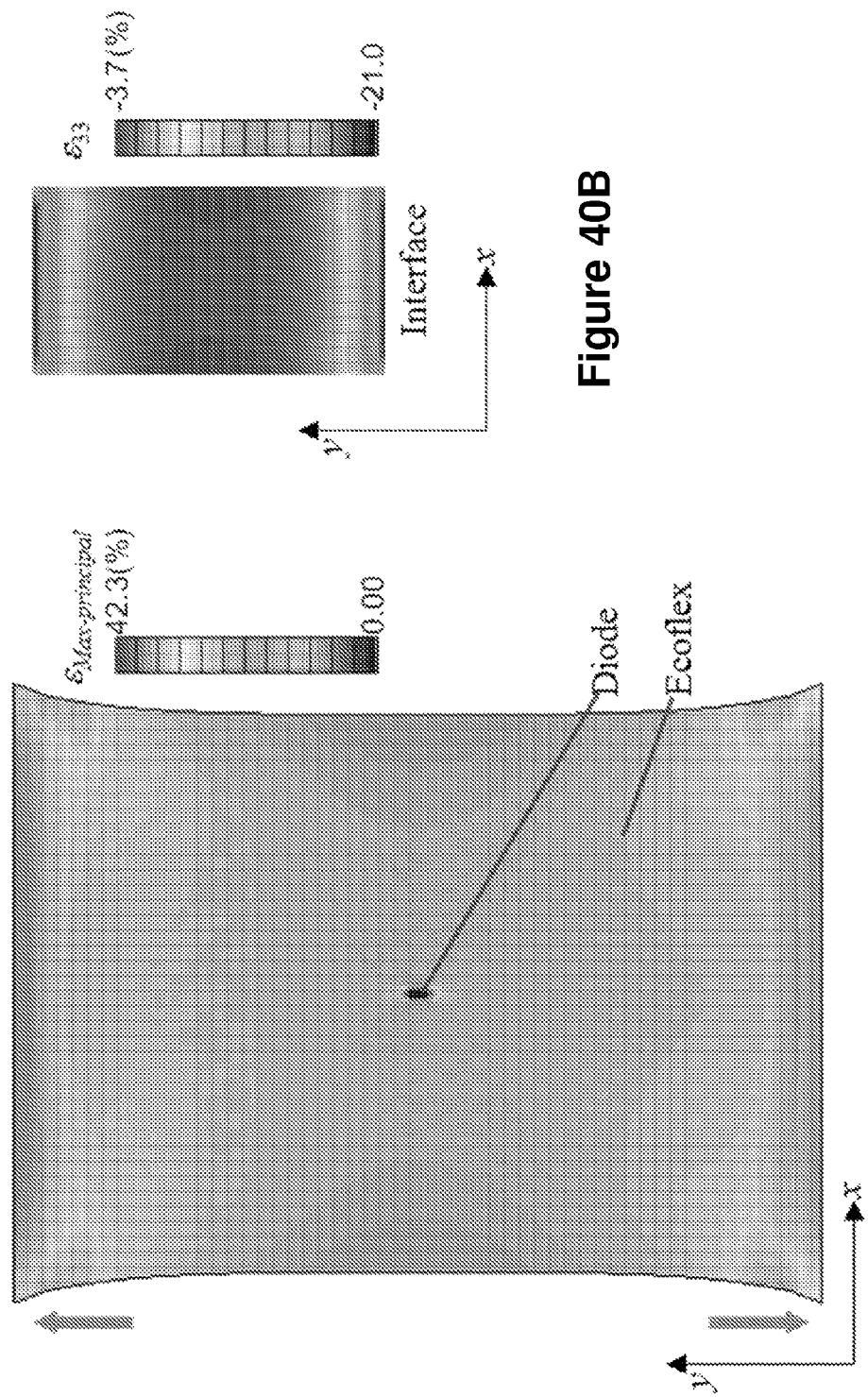
FIG. 40A depicts a calculated distribution of maximum principal strain in the whole structure.
FIG. 40B depicts a calculated distribution of substrate normal strain ($\in_{33}$) at the diode/substrate interface, when the system is stretched by 30% along the vertical direction.
Figure 41:
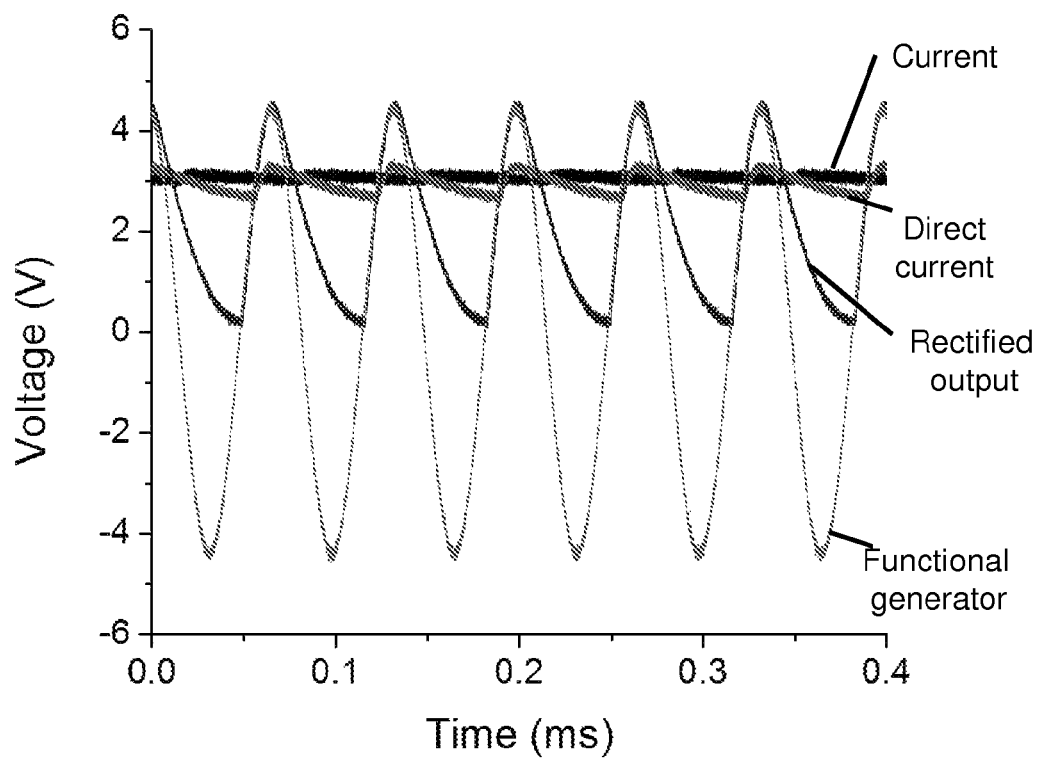
FIG. 41 depicts the input and output electrical characteristics of the wireless charging systems. The Schottky diode rectifies the alternating voltage input from the functional generator (pink curve), to yield a rectified output (blue curve), which oscillates nominally from 0 V to 4.6 V. The parallel 1.7 nF capacitor integrates this oscillation to give a current source with a behavior closer to direct current (red curve). Increasing the capacitance (e.g. 17 nF) further smooths the current (black curve).
Figure 42:
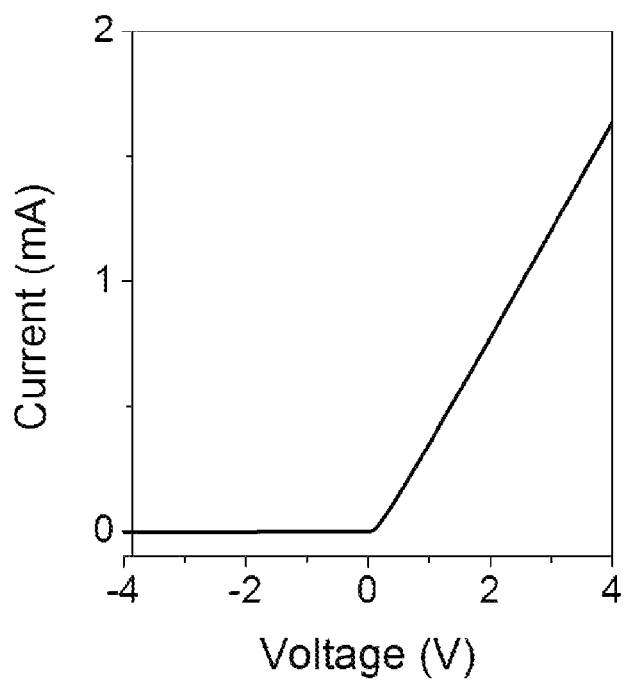
FIG. 42 provides I-V curve of the wireless coil with the rectifying chip, showing its series resistance of about 2.3 KΩ.

Stretchable wireless charging system for the battery. In many practical cases such as embedded devices, the ability to charge the battery without establishing physical connections to external supplies can be valuable. Even in systems where the charging terminals are accessible, such as in skin-mounted devices, there is value in wireless charging, simply because the process of establishing physical contacts can be mechanically destructive to thin, stretchable devices (or to the underlying soft tissue). Approaches that involve physical contact also have the danger of electrical shock to surrounding materials (e.g. the skin itself). The versatility of the materials and designs enable integration of wireless power transmission systems, monolithically with the battery itself. The design and an actual device appear in FIGS. 24A, 24B, respectively. A secondary coil couples the electromagnetic flux from a primary coil, and a Schottky diode provides rectification. The Schottky diode (packaged in epoxy, with a modulus of ~4.0 GPa) has a modulus of more than 4 orders of magnitude larger than that of the substrate (made of Ecoflex, modulus ~60 KPa), but its size (length 0.62 mm, width 0.32 mm, and height 0.31 mm) is only a few percent (~2%) of the overall size (~30 mm×~20 mm) of the wireless system. As a result, the influence on the overall stretchability is still negligible, as demonstrated by finite element simulations shown in FIGS. 39, 40A and 40B. The capacitor smooths oscillations in the output voltages; its small size and thickness enable natural integration into the overall system. Larger capacitors can smooth the oscillations to an even greater extent (FIG. 41). The coil and rectifier add a series resistance of 2.3 KΩ (FIG. 42), which functions as a parallel resistance with the secondary coil, shunting away current from the battery. The resistance of the serpentine secondary coil is 1.92 kΩ/m; a coil with similar overall geometry but without the serpentine shape is calculated to be 1.22 kΩ/m. Improving the efficiency of the charging system can be achieved by increasing the width and thickness of the wires, but at the expense of reduced stretchability and increased modulus. Specific application requirements will define the right tradeoffs. In this case, the output power from the primary coil was 187 mW. With a working distance of 1 mm between the primary and secondary coil, the power received on the secondary coil is 9.2 mW, corresponding to an efficiency of 4.9%. The power coupling efficiency of the wireless charging system depends strongly on the resistance of the serpentine receiver coil. Increasing the thickness to 7 μm and using copper improves the efficiency from 4.9% to 17.2%. At this thickness, the coil retains stretchability to strains of 25%. Data and images are described below. The capacitor has a capacitance of 1.7 nF, in a structure that uses a 1.2 μm thick layer of polyimide as the dielectric, with a layer of thiol molecules on the bottom Au electrodes to enhance adhesion. FIG. 24C shows the input and output of this wireless power transmission device. An input voltage at a frequency of 44.5 MHz matches the self-resonant frequency of the secondary coil, which is dependent on the coil area, number of turns, distance between each turn, and wire resistance. For a peak-to-peak input voltage of 9.1 V (FIG. 24C black curve), the DC output voltage is 3.0 V (FIG. 24C red curve). The charging curves of a small scale battery using the wireless coil appear in FIG. 24D. The battery voltage (FIG. 24D orange curve) rises to 2.5 V in about 6 mins. The charging current in the circuit (FIG. 24D blue curve) decreases from 0.5 mA to below 0.2 mA. We used a partial differential equation to model the charging circuit, and a numerical program to calculate the charging current curve. Simulation of this process agrees well with the experimental data (see below and FIG. 40).

Discussion. The materials and schemes described in this example provide routes to energy storage devices and wireless charging systems with forms and properties that are attractive for powering stretchable electronic and optoelectronic devices. The slurry materials themselves are deployed in ways (a soft lithographic type casting process) that allow natural integration with unusual materials (low modulus silicone rubber sheets, embossed with surface relief). The stretchable interconnects exploit a 'self-similar' design that offers unique, 'spring within a spring' mechanics. The consequence is a level of stretchability that is more than 4× larger than previous reports, even while, at the same time, enabling coverages of active materials as high as 50%. The combination of these two aspects, together with comprehensive and experimentally validated models of the underlying mechanics, leads to a technology, i.e. a stretchable, rechargeable battery, which offers much different characteristics than anything that has been previously possible. As an additional advance, we introduce integrated stretchable, wireless charging systems that offer physical properties similar to those of the batteries.

The slurry chemistries, separator materials, and stretchable, air-impermeable packaging materials can be selected to provide high device performance. The self-similar serpentine interconnect structure possesses a geometry of space filling curve, and a buckling physics of ordered unraveling. This type of interconnect structure has immediate, and general utility, suitable for any class of stretchable technology that combines hard and soft materials. The topology-level interconnect geometry simultaneously provides for large mechanical stretchability and low electrical resistance. Wireless power transfer efficiency can be improved by reducing the coil input resistance, maximizing the mutual inductance between the primary and secondary coils, and increasing the self-resonant frequency of the coils. Regulation circuits may be incorporated to avoid over-charging the battery.

Methods. Fabrication of electrodes and mechanical testing of self-similar interconnects: Sequential spin casting defined a bilayer of poly(methyl methacrylate) (PMMA 495 A2, 3000 rpm for 30 s, baked on a hotplate at 180° C. for 2 mins) and then a layer of polyimide (PI, from poly(pyromellitic dianhydride-co-4,4'-oxydianiline) amic acid solution; 4000 rpm for 30 s, baked on a hotplate at 150° C. for 4 mins and then in a vacuum oven at 10 mT and 250° C. for 1 h) on a silicon wafer. The cathode and anodes consisted of 600 nm thick layers of Al or Cu, respectively, deposited by electron beam evaporation onto the PI. Photolithography (AZ5214E) and etching (Type A aluminum etchant on hotplate at 50° C. for 2 min; Type CE-100 copper etchant at room temperature for 10 s; Transene Company) defined patterns in these metals. After removing the residual photoresist, spin coating formed an additional layer of PI over the entire structure. Next, photolithography (AZ 4620, 2000 rpm for 30 s, baked at 110° C. for 4 mins) and oxygen plasma etching (300 mT, 20 sccm $O_2$, 200 W for 10 mins) patterned the layers of PI in a geometry matched to the metal traces.

Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) through a shadow mask formed backside coatings aligned to the metal disks[33]. Thin (250 µm) silicone substrates (Ecoflex, Smooth-On) were prepared by mixing the two components in a 1:1 weight ratio, spin-casting (300 rpm for 30 s) the resulting material into a petri dish and then partially curing it (30 mins at room temperature). Next, spin-casting (3000 rpm for 30 s) an allyl amide functional perfluorinated ether (DuPont), and then curing it under ultraviolet (UV) light for 30 mins formed a top encapsulation layer. The other side of the Ecoflex substrate was surface-activated under UV light for 5 mins. Laminating the electrode structures onto this surface led to strong bonding, upon contact. The water soluble tape was removed by immersing the substrate in tap water for overnight. As a final step, the electrodes were dipped in 1 mM HCl to remove oxides from the surfaces of the metals.

Mechanical testing of the self-similar interconnects was performed with a customized uniaxial stretcher. To ensure that the interconnects were decoupled from the substrate, each disk was mounted on top of a post (250 mm in height) molded into the silicone substrate. Images and video of the deformed interconnects were collected with a digital single-lens reflex camera.

Patterned Moulding of Slurries and their Integration with Current Collecting Electrodes:

Photolithography (AZ 4620, 7-8 µm thick) and inductively coupled plasma reactive ion etching (ICP RIE) defined arrays of cylindrical wells on the surface of a silicon wafer. The conditions were chosen to yield sloped sidewalls, which are important for effective transfer of the slurries, as described subsequently. Washing with acetone removed the photoresist. A layer of polytetrafluoroethylene (~200 nm) conformally deposited using the ICP RIE tool served as a coating to prevent adhesion. The slurry materials consisted of lithium cobalt oxide or lithium titanium oxide, acetylene black, and polyvinylidene fluoride, mixed in a weight ratio of 8:1:1 in a solvent of N-methyl-2-pyrrolidone (NMP) for the cathode and anode, respectively. The mixture was stirred for overnight, and then mechanically scraped across the etched surface of the silicon wafer. The cylindrical wells, filled with slurry in this manner, were baked on a hotplate at 90° C. for overnight, and then retrieved onto the surface of a piece of water soluble tape. The baking conditions were selected carefully to enable retrieval of the slurry with high yield. Registering the tape to the metal electrodes ensured that the molded slurry aligned to the metal disks. Immersion in tap water for overnight dissolved the tape. Baking the substrates at 170° C. for overnight in a vacuum oven removed the moisture and improved the strength of bonding between the slurry and the metal.

Assembly and Electrochemical Testing of the Battery:

Anisotropic conductive films, hot pressed onto the metal electrodes, served as points for external electrical connection. Application of Sylgard Prime Coat (Dow Corning, Inc.) to the periphery of the substrates prepared them for bonding. A thin silicone spacer layer (500 µm thick) at the periphery prevented direct contact as the two sheets were laminated together. A lateral spatial offset prevented electrical shorting between the active regions. The edges were sealed with an additional application of Ecoflex followed by baking on a hotplate (90° C. for 2 h). The gel electrolyte consisted of a mixture of 100 g lithium perchlorate, 500 ml ethylene carbonate, 500 ml dimethylcarbonate, and 10 g polyethylene oxide (4×106 g/mol), prepared in an argon filled glovebox as a homogenous gel. This material was injected into the battery using a syringe through an edge.

A BioLogic VMP3 electrochemical station with a cutoff voltage of 2.5-1.6 V at room temperature was used to charge and discharge the as-fabricated and stretched battery electrodes, and to evaluate cycling behavior of the full, integrated battery. Areal capacity density was calculated based on the active region. The output power was monitored with the battery connected to a 2020Ω resistor, using an ammeter. Values of current were recorded as a function of strain applied to the battery.

Fabrication and Testing of the Wireless Coil:

A silicon wafer, coated with layers of PMMA and PI using steps described previously, served as a substrate for deposition of Cr (5 nm)/Au (500 nm) by electron beam evaporation. Photolithography (AZ 5214E) and etching (Transene Company) defined patterns in the geometry of the bottom electrode of the capacitor and associated contact lines. Removing the photoresist with acetone, and then immersing the substrate in a 1 mM poly(ethylene glycol) methyl ether thiol solution in isopropanol for 15 mins served to enhance the adhesion and coverage of a second layer of PI spin-cast (4000 rpm 30 s) and cured (on hotplate at 150° C. for 4 mins and then in vacuum oven at 250° C. for 1 h) on the electrodes. This layer of PI served as the dielectric for the capacitor. Photolithography (AZ 4620, 2000 rpm for 30 s, baked at 110° C. for 4 mins) defined a mask for etching vias through the PI layer, as points of connection between the coil and the bottom electrode of the capacitor. After immersion in acetone to remove the photoresist, sputter deposition formed a conformal layer of Cu (600 nm) over the entire surface, including the sidewalls. Photolithography (AZ 5214E) and etching defined the coil and the other top electrode of the capacitor. After removing the resist, a third spin-cast layer of PI formed a coating on the Cu electrodes. An oxygen plasma etching through the three PI layers in a patterned geometry defined the final device layout. Release by immersion in hot acetone partially removed the underlying PMMA, to enable the release of the entire structure onto water soluble tape. Deposition of Ti (5 nm)/$SiO_2$ (50 nm) and lamination onto the UV activated surface of an ecoflex substrate led to strong bonding. After the water soluble tape was removed, a Schottky diode chip (Digikey BAT 62-02LS E6327) was bonded between the coil and the capacitor using silver epoxy. The forward input resistance is ~500Ω, and the rectification ratio is ~1×104 at a bias voltage of ±1 V.

High frequency alternating current signals were generated by a KEITHLEY 3390 50 MHz arbitrary waveform generator. The input and output characterization of the wireless coil were performed using an Agilent infiniium DSO8104A oscilloscope (1 GHz, 4 channels). The wireless charging voltage and current to the battery were monitored using a BioLogic VMP3 electrochemical station.

Supplementary Information.

Fabrication of a stretchable encapsulating layer, consisting of a buckled sheet of Al/PI on a silicone substrate. The first step involved fabrication of a trilayer of PMMA/PI/Al on a silicon substrate, using procedures similar to those employed for the Al battery electrodes. Photolithography with AZ5214E and wet etching the Al defined the lateral dimensions of the PI/Al sheet. Next, oxygen plasma etching (300 mT, 20 sccm $O_2$, 200 W for 5 mins) removed the PI layer in the exposed regions. Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) formed backside coatings. On a separate substrate, 500 μm thick silicone sheets (Ecoflex, Smooth-On) were prepared, then removed and prestrained biaxially to a level of ~30% and then fixed by lamination onto a glass slide. The silicone surface was activated by exposure to UV-induced ozone for 5 mins. Laminating the PI/Al bilayer onto this surface led to strong bonding, upon contact. The water soluble tape was removed by immersing the substrate in tap water for overnight. Peeling the entire assembly away from the glass slide released the prestrain, and led to an expected pattern of buckling. In this configuration, the overall system can be stretched to strains as large as those equal to the prestrain.

Mechanical Analyses of "Island-Bridge" Self-Similar Electrode Structures: FEA.

Figure 25:
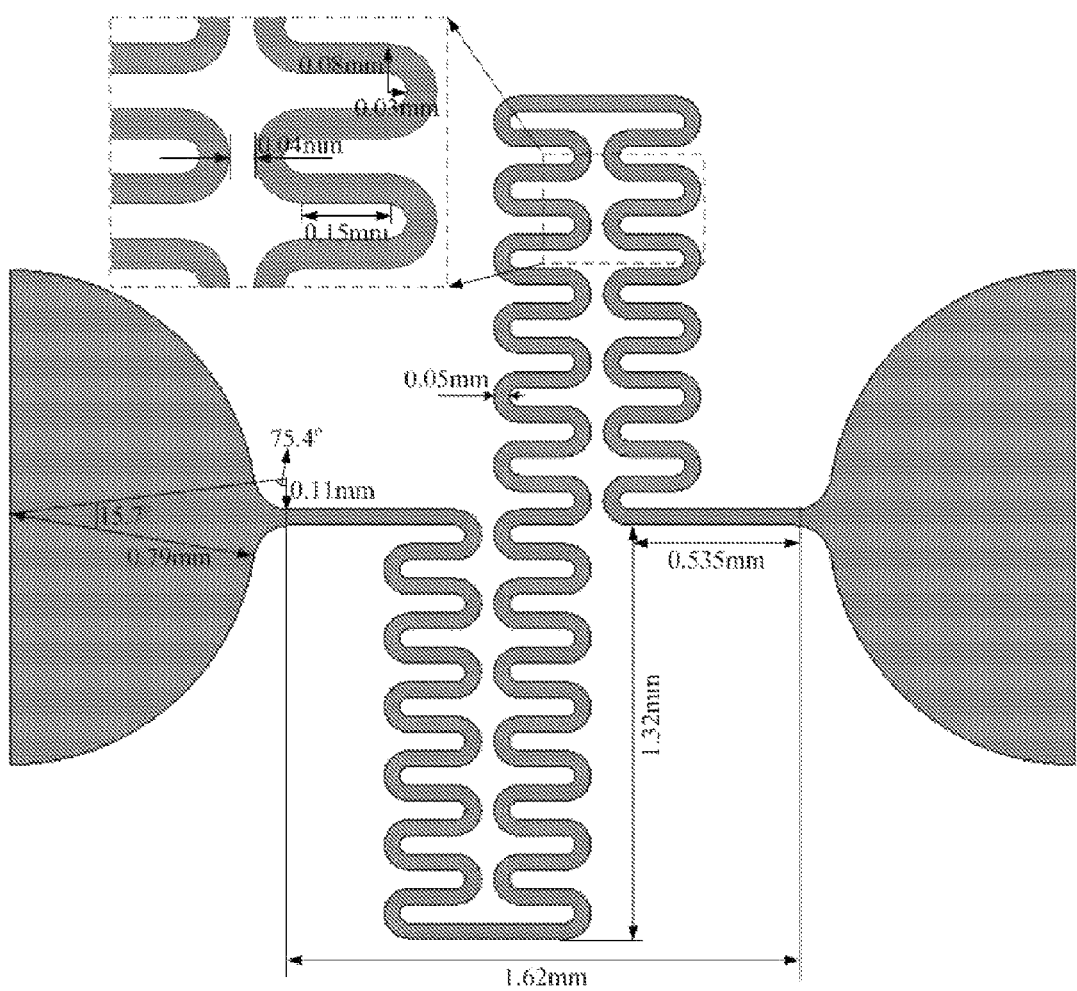
FIG. 25 provides an illustration of the dimensions for the self-similar interconnect (copper layer).

Full three-dimensional (3D) FEA is adopted to analyze the postbuckling behaviors of "island-bridge" self-similar electrode structures under stretching and compression. Due to the structural periodicity of the electrode, a representative unit cell was studied, and its detailed geometry is shown in FIG. 25. The circular island of the electrode is mounted on a post (height 250 μm) molded on the surface of a silicone substrate (ecoflex; thickness 500 μm). The metal interconnect (thickness 0.6 μm), is encased, top and bottom, by a thin layer of polyimide (PI, thickness 1.2 μm for each layer). The elastic modulus (E) and Poisson's ratio (v) are $E_{ecoflex}$=0.06 MPa and $v_{ecoflex}$=0.49 for ecoflex; $E_{Cu}$=119 GPa and $v_{Cu}$=0.34 for copper; $E_{Al}$=70 GPa and $v_{Al}$=0.35 for aluminum; and $E_{PI}$=2.5 GPa and $v_{PI}$=0.34 for PI. Eight-node 3D solid elements and four-node shell elements were used for the ecoflex and self-similar electrode, respectively, and refined meshes were adopted to ensure the accuracy. The evolution of deformed configurations with applied strains are obtained from FEA for both stretching and compression, as shown in FIG. 22 and FIG. 32, respectively. Good agreement between FEA and experiment results can be found. Here, we take the case of copper as a demonstration of the buckling profiles. The results for the aluminium layer are similar. For the comparison of stretchability and reversibility between self-similar and serpentine interconnects (FIG. 31), the key geometrical parameters are kept the same, including the total length ($l_{total}$=16.77 mm), span (L=1.6 mm), amplitude (h=0.4 mm), width (w=30 μm), and thickness (t=3.0 μm). The aluminum interconnect (thickness 0.6 μm) is encased by two thin layers of polyimide (thickness 1.2 μm for each layer). FIG. 31 demonstrates that over the entire range of stretching from 0% to ~800%, the strain level of the self-similar interconnect is always lower than the serpentine one. The stretchability (809%) and reversibility (528%) of the self-similar design, are higher than those ($\in_{stretchability}$=682%, $\in_{reversibility}$=284%) of the simple serpentine design.

Battery leakage current analysis. The leakage current arises from three sources. The first source is current through the reverse biased Schottky diode. This current is ~0.2 μA, and is relatively constant throughout the lifetime of the battery. Schottky diodes with smaller reverse current are available; such devices can reduce this contribution to the leakage.

The second source is the internal ohmic self-discharge current between the slurry disks at the anode and cathode. This contribution arises from finite electronic conductivity of the electrolyte and any parasitic physical contacts between the slurry disks at the cathode and anode. These losses can be dramatically reduced by electrolyte materials with enhanced purity and implementing separators. New experiments reveal the latter effects quantitatively. FIG. 35 shows the voltage decay and leakage current curves for otherwise similar batteries with and without a commercial separator (Celgard). This component reduces the capacity loss from 161 μA·h to 88 μA·h in 44 hours.

The third source is from current produced by Faradaic effects, including shuttle reactions associated with impurities in the slurry materials, residual oxygen and/or moisture. Improving the air-impermeability of the packaging materials can reduce currents that arise from such reactions. New experiments show that sealing the battery in an Al pouch (which can be configured in a wrinkled configuration to allow stretching) reduces the capacity loss from 161 μA·h to 62 μA·h. Combining the separator and the Al pouch packaging, suppresses the capacity loss to 23 μA·h. FIG. 35 summarizes all of these findings.

Discrete Schottky diode stretching behavior analysis. From a practical standpoint, we observe no significant constraints on the overall mechanical properties of the integrated system, due to the comparatively small size of the diode. In particular, although the Schottky diode, which is encapsulated in epoxy which has a modulus of ~4.0 GPa, is effectively more than 4 orders of magnitude larger than that of substrate (made of Ecoflex, with a modulus of ~60 KPa), its dimensions (length 0.62 mm, width 0.32 mm, and height 0.31 mm) represent only a few percent (~2%) of the overall size (~30 mm×~20 mm) of the wireless system. Experimentally, we observe that the system is robust to stretching up to ~30% and beyond.

Figure 39:
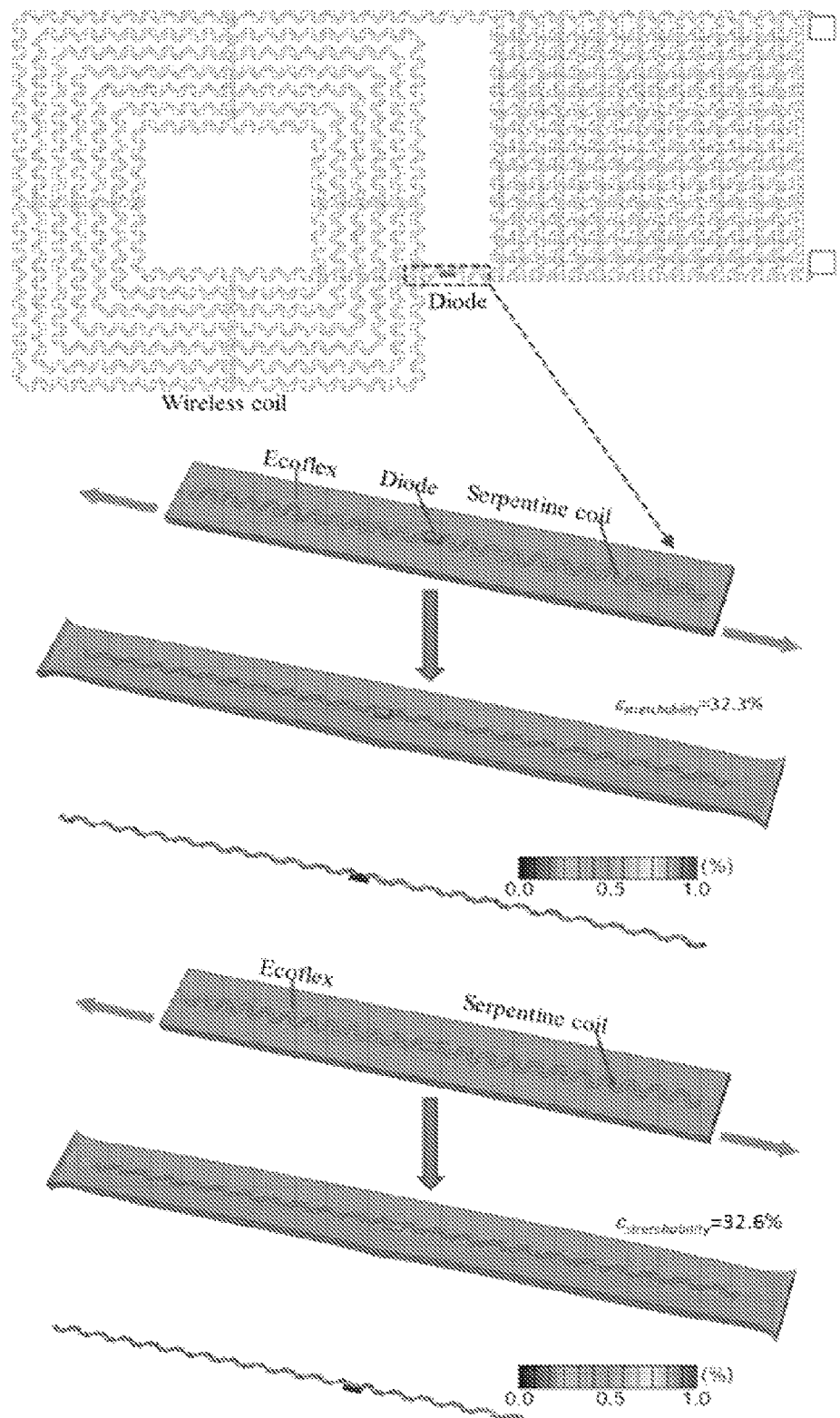
FIG. 39 provides a schematic illustration of the layout of a wireless recharging system (top); calculated deformation and distribution of maximum principal strain under an applied strain of 32.3%, for a representative component of the wireless coil, with both the discrete diode and serpentine interconnect (middle); calculated deformation and distribution of maximum principal strain under an applied strain of 32.6%, for a representative component of the wireless coil, with only the serpentine interconnect (bottom).

To study these effects quantitatively, we carried out full, three dimensional finite element simulations that examine the influence of the diode on the stretchability of the coil in the integrated system, as in FIG. 39 (top panel). Results in the bottom panels of FIG. 39, indicate that: (1) The decrease in stretchability is modest, from 32.6% to 32.3%, when the diode is included and (2) The strain in the diode (i.e. the epoxy) is very small (<0.15%, much smaller than the strain needed to induce fracture), even when the overall system is stretched by 32.3%.

The normal interface strain is also important. FIG. 24A shows the distributions of maximum principal strains in a large Ecoflex substrate with a diode mounted in its center, for stretching to 30%. FIG. 40B illustrates the distribution of the substrate normal strain at the diode/substrate interface. The normal interface strain in this case is negative, corresponding to compressive strain at the interface. This outcome, which is consistent with theoretical predictions based on energy release rates at an interface crack, minimizes the propensity for delamination.

Figure 43A:
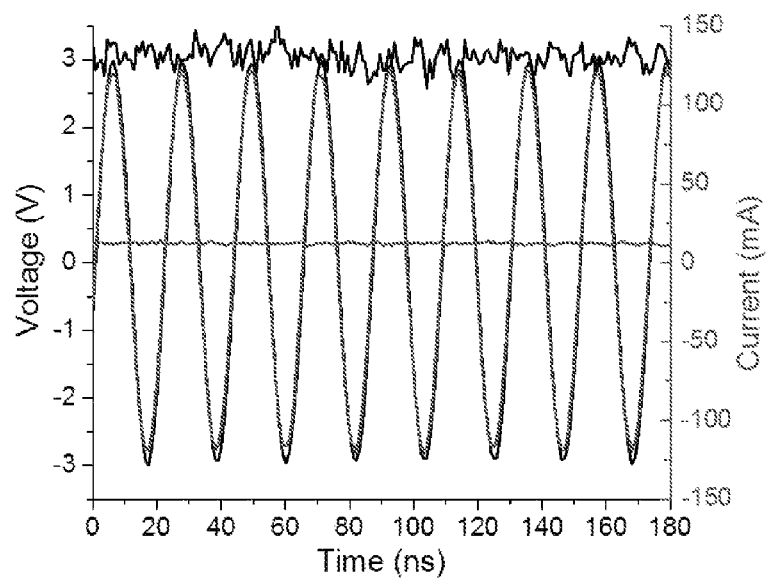
FIG. 43A provides input and output voltages (black) and currents (red) of the wireless coil 18 μm thick copper foil.

Coil resistance effect on the wireless power transfer efficiency. The coil resistance/qualify factor is a critical parameter that dictates the efficiency. In additional experiments to illustrate the effects, we replaced the 600 nm thick gold serpentine coils with otherwise similar ones fabricated with copper at increased thicknesses. The results show that coils formed using a 7 μm thick copper film (Dupont) have total resistances of 185Ω, and generate a received power of 30.8 mW with an input power of 179 mW (at a distance of 1 mm, similar to the previously reported results). The corresponding efficiency is 17.2%, which represents more than a factor of three improvement over the original, gold coils (4.9%). Further reducing the coil resistance to 38Ω by using 18 μm thick copper foil (MTI Corp.) improves the received power to 36.2 mW, and the efficiency to 20.2%. See FIG. 43A.

Figure 43B:
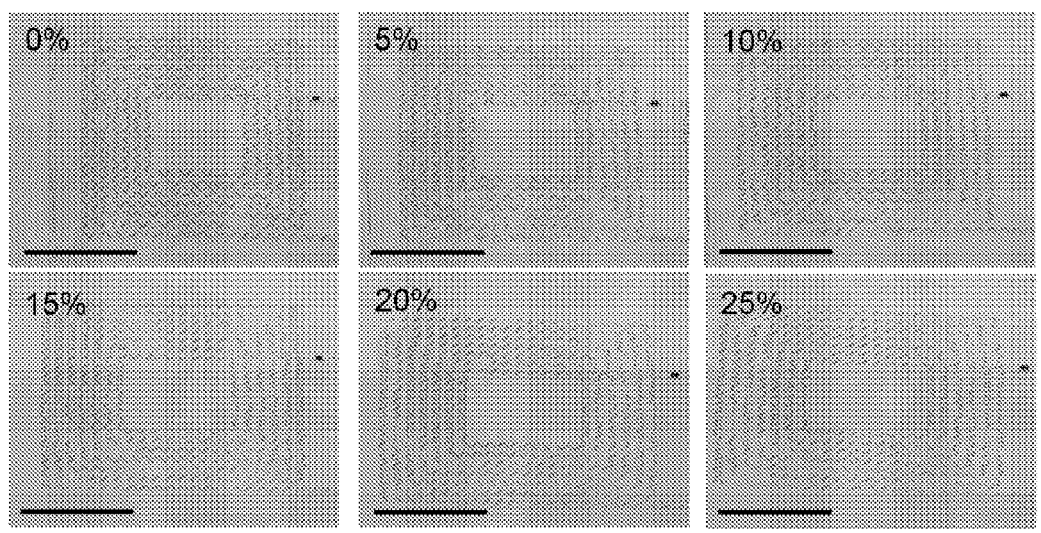
FIG. 43B provides optical micrographs of a 7 μm thick Cu coil at different levels of applied uniaxial strain. The scale bars are all 1 cm.
Figure 43C:
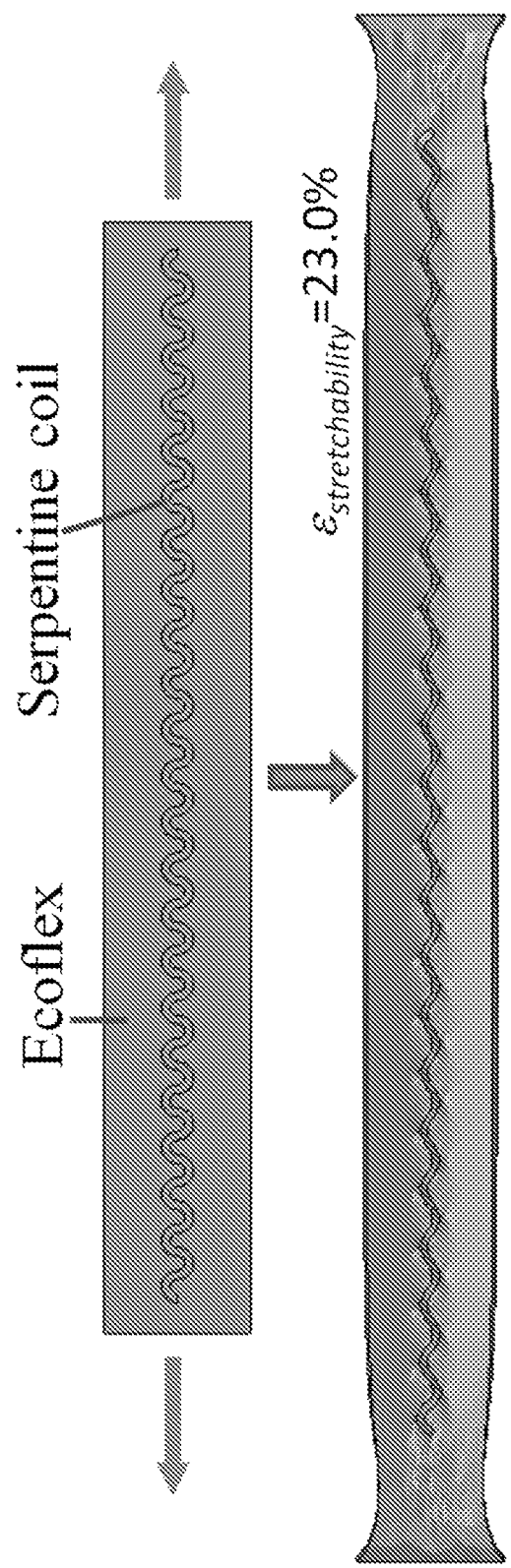
FIG. 43C provides finite element analysis of stretching of a segment of a serpentine coil with a thickness of 7 μm.

These increases in thickness, and therefore power transfer efficiencies, lead to changes in the essential mechanics associated with stretching. In particular, as the thickness increases, the stretchability decreases. The coil with thickness of 7 μm offers a good balance between efficiency and mechanical deformability, with ability to accommodate strains of ~25%. Images at various levels of strain appear in FIG. 43B, which agree well with the finite element analysis results in terms of both the maximum uniaxial strain and the geometry of the coil serpentines (FIG. 43C).

Modeling of the Charging Current in the Wireless Power Transmission Circuit

The charging circuit can be described using the model below:

$$U_0 = U(t) + L\frac{dI(t)}{dt} + I(t)R \quad (1)$$

Here $U_0$ is the charging source of 3 volts voltage. L and R are the associated inductance and the resistance of the circuit. U(t) is the time dependent readout of the voltmeter and I(t) is the time dependent readout of an ammeter.

Figure 44A:
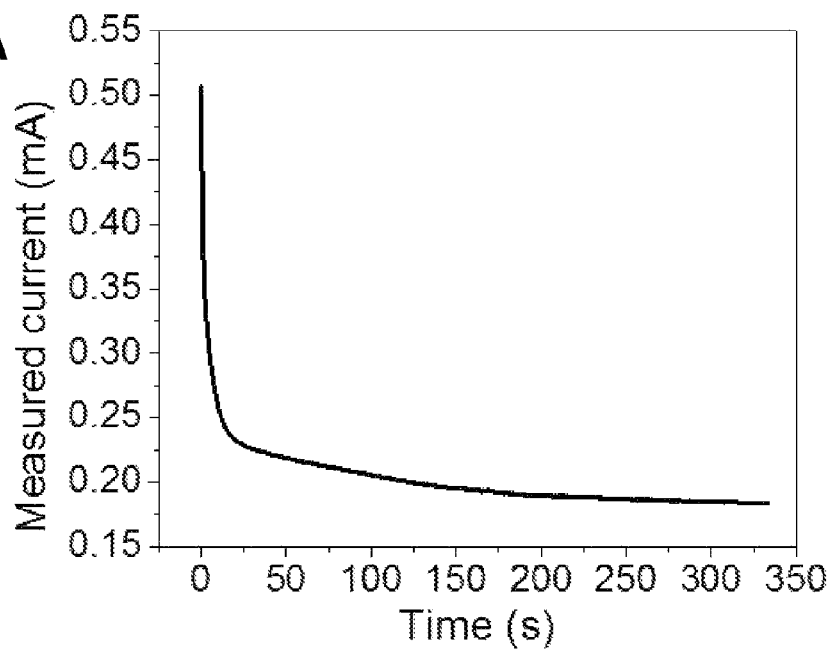
FIGS. 44A and 44B provide a comparison between the measured current change (FIG. 44A) and the simulated result (FIG. 44B) in the wireless coil charging circuit.
Figure 44B:
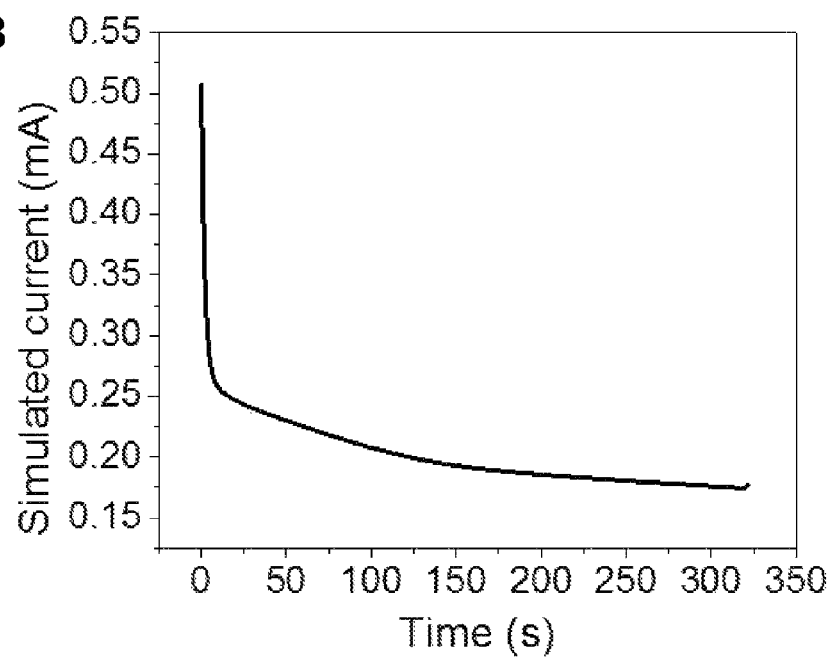

A program has been developed to simulate the I-V curve based on the partial differential equation (1). The simulated time dependent current $I_s(t)$ based on U(t) is compared with measured I(t), and the results are shown in FIGS. 44A and 44B.

The program used to simulate the current:

```
#include<iostream.h>
#include<stdio.h>
#include<stdlib.h>
#include<math.h>
#include<time.h>
#define tim 3500
#define start 265
float curre[tim];
float nihe[tim];
float test[tim];
float voll[tim];
FILE *fp;
int main( )
{
    int i,j,k;
    fp=fopen("Cur.txt","r");
    for(i=0;i<tim;i++)
    {
        fscanf(fp,"%f",&curre[i]);
        curre[i]=-curre[i];
        cout<<curre[i]<<endl;
    }
    fclose(fp);
    fp=fopen("Vol.txt","r");
    for(i=0;i<tim;i++)
    {
        fscanf(fp,"%f",&voll[i]);
        cout<<voll[i]<<endl;
    }
    fclose(fp);
    double coef1;
    double coef2;
    coef2=curre[1]/(voll[1]-voll[0]);
    cout<<coef2<<endl;
    test[0]=curre[0];
    test[start]=curre[start];
    double coef1th;
    double maxh=1000000000;
    double coef2th;
    for(coef2=0;coef2<0.04; coef2=coef2+0.0001)
    {
        cout<<coef2<<endl;
        for(coef1=0.94; coef1<=0.96; coef1=coef1+0.0001)
        {
        // cout<<coef1<<endl;
        for(i=start+1;i<tim;i++)
        {
            test [i]=coef1*test [i-1]+(3-
            (voll [i]+voll[i-1])*0.5)*coef2;
        }
        double poi=0;
        for(i=start;i<tim;i++)
        {
            poi+=(test[i]-curre[i])*(test[i]-curre[i]);
        }
        if(poi<maxh)
        {
            coef1th=coef1;
            coef2th=coef2;
            maxh=poi;
            for(int j=0;j<tim;j++)
            {
                nihe[j]=test[j];
            }
        }
        }
    }
}
```

```
    cout<<coef1th<<endl;
    cout<<coef2th<<endl;
    cout<<maxh<<endl;
    fp=fopen("nihe.txt","w");
    for(i=0;i<tim;i++)
    {
        fprintf(fp, "%f", -nihe[i]);
        fprintf(fp, "\n");
    }
    fclose(fp);
    fp=fopen("canshu.txt","w");
    fprintf(fp, "%f", coef1th);
    fprintf(fp, "\n");
    fprintf(fp, "%f", coef2th);
    fprintf(fp, "\n");
    fclose(fp);
    return(1);
}
```

REFERENCES

Rogers, J. A., Someya, T. & Huang, Y. G. Materials and Mechanics for Stretchable Electronics. *Science* 327, 1603-1607, doi:10.1126/science.1182383 (2010).

Wagner, S. & Bauer, S. Materials for stretchable electronics. *MRS Bull.* 37, 207-217, doi:10.1557/mrs.2012.37 (2012).

Kim, D. H., Ghaffari, R., Lu, N. S. & Rogers, J. A. in *Annual Review of Biomedical Engineering*, Vol 14 Vol. 14 *Annual Review of Biomedical Engineering* (ed M. L. Yarmush) 113-128 (Annual Reviews, 2012).

Tian, B. Z. et al. Macroporous nanowire nanoelectronic scaffolds for synthetic tissues. *Nat. Mater.* 11, 986-994, doi:10.1038/nmat3404 (2012).

Takei, K. et al. Nanowire active-matrix circuitry for low-voltage macroscale artificial skin. *Nat. Mater.* 9, 821-826, doi:10.1038/nmat2835 (2010).

Ramuz, M., Tee, B. C. K., Tok, J. B. H. & Bao, Z. Transparent, Optical, Pressure-Sensitive Artificial Skin for Large-Area Stretchable Electronics. *Advanced Materials* 24, 3223-3227, doi:10.1002/adma.201200523 (2012).

Sekitani, T. et al. A rubberlike stretchable active matrix using elastic conductors. *Science* 321, 1468-1472, doi:10.1126/science.1160309 (2008).

Ahn, B. Y. et al. Omnidirectional Printing of Flexible, Stretchable, and Spanning Silver Microelectrodes. *Science* 323, 1590-1593, doi:10.1126/science.1168375 (2009).

Wu, H. et al. A transparent electrode based on a metal nanotrough network. *Nat. Nanotechnol.* 8, 421-425, doi:10.1038/nnano.2013.84 (2013).

Sekitani, T. et al. Stretchable active-matrix organic light-emitting diode display using printable elastic conductors. *Nat. Mater.* 8, 494-499, doi:10.1038/nmat2459 (2009).

Robinson, A. P., Minev, I., Graz, I. M. & Lacour, S. P. Microstructured Silicone Substrate for Printable and Stretchable Metallic Films. *Langmuir* 27, 4279-4284, doi:10.1021/la103213n (2011).

Gray, D. S., Tien, J. & Chen, C. S. High-Conductivity Elastomeric Electronics. *Advanced Materials* 16, 393-397, doi:10.1002/adma.200306107 (2004).

Brosteaux, D., Axisa, F., Gonzalez, M. & Vanfleteren, J. Design and fabrication of elastic interconnections for stretchable electronic circuits. *IEEE Electron Device Lett.* 28, 552-554, doi:10.1109/led.2007.897887 (2007).

Vanfleteren, J. et al. Printed circuit board technology inspired stretchable circuits. *MRS Bull.* 37, 254-260, doi:10.1557/mrs.2012.48 (2012).

Kim, D. H., Xiao, J. L., Song, J. Z., Huang, Y. G. & Rogers, J. A. Stretchable, Curvilinear Electronics Based on Inorganic Materials. *Advanced Materials* 22, 2108-2124, doi:10.1002/adma.200902927 (2010).

Chen, Z. & Mecholsky, J. J. CONTROL OF STRENGTH AND TOUGHNESS OF CERAMIC-METAL LAMINATES USING INTERFACE DESIGN. *Journal of Materials Research* 8, 2362-2369, doi:10.1557/jmr.1993.2362 (1993).

Connor, M. T., Roy, S., Ezquerra, T. A. & Calleja, F. J. B. Broadband ac conductivity of conductor-polymer composites. *Physical Review B* 57, 2286-2294, doi:10.1103/PhysRevB.57.2286 (1998).

Hajji, P., David, L., Gerard, J. F., Pascault, J. P. & Vigier, G. Synthesis, structure, and morphology of polymer-silica hybrid nanocomposites based on hydroxyethyl methacrylate. *Journal of Polymer Science Part B-Polymer Physics* 37, 3172-3187, doi:10.1002/(sici)1099-0488(19991115)37:22<3172::aid-polb2>3.0.co; 2-r (1999).

Kim, Y. et al. Stretchable nanoparticle conductors with self-organized conductive pathways. *Nature* 500, 59-U77, doi:10.1038/nature12401 (2013).

Zhang, M. Q., Lu, Z. P. & Friedrich, K. On the wear debris of polyetheretherketone: Fractal dimensions in relation to wear mechanisms. *Tribology International* 30, 87-102, doi:10.1016/0301-679x(96)00027-8 (1997).

Goldberger, A. L. & West, B. J. FRACTALS IN PHYSIOLOGY AND MEDICINE. *Yale Journal of Biology and Medicine* 60, 4214 (1987).

Masters, B. R. Fractal analysis of the vascular tree in the human retina. *Annual Review of Biomedical Engineering* 6, 427-452, doi:10.1146/annurev.bioeng.6.040803.140100 (2004).

Kim, D. H. et al. Epidermal Electronics. *Science* 333, 838-843, doi:10.1126/science.1206157 (2011).

Sagan, H. *Space-filling curves*. (Springer-Verlag, 1994).

Chasiotis, I. et al. Strain rate effects on the mechanical behavior of nanocrystalline Au films. *Thin Solid Films* 515, 3183-3189, doi:10.1016/j.tsf.2006.01.033 (2007).

Lu, N. S., Wang, X., Suo, Z. G. & Vlassak, J. Metal films on polymer substrates stretched beyond 50%. *Applied Physics Letters* 91, 3, doi:10.1063/1.2817234 (2007).

Espinosa, H. D., Prorok, B. C. & Peng, B. Plasticity size effects in free-standing submicron polycrystalline FCC films subjected to pure tension. *Journal of the Mechanics and Physics of Solids* 52, 667-689, doi:10.1016/j.jmps.2003.07.001 (2004).

Chasiotis, I. & Knauss, W. G. A new microtensile tester for the study of MEMS materials with the aid of atomic force microscopy. *Experimental Mechanics* 42, 51-57, doi:10.1177/0018512002042001789 (2002).

Jiang, H. et al. Finite deformation mechanics in buckled thin films on compliant supports. *Proceedings of the National Academy of Sciences of the United States of America* 104, 15607-15612, doi:10.1073/pnas.0702927104 (2007).

Song, J. et al. Buckling of a stiff thin film on a compliant substrate in large deformation. *International Journal of Solids and Structures* 45, 3107-3121, doi:10.1016/j.ijsolstr.2008.01.023 (2008).

Sato, K., Yoshioka, T., Ando, T., Shikida, M. & Kawabata, T. Tensile testing of silicon film having different crystallographic orientations carried out on a silicon chip. *Sensors and Actuators a-Physical* 70, 148-152, doi:10.1016/s0924-4247(98)00125-3 (1998).

Jeong, J.-W. et al. Materials and Optimized Designs for Human-Machine Interfaces Via Epidermal Electronics. *Advanced Materials*, doi:10.1002/adma.201301921 (2013).

Yeo, W. H. et al. Multifunctional Epidermal Electronics Printed Directly Onto the Skin. *Advanced Materials* 25, 2773-2778, doi:10.1002/adma.201204426 (2013).

Fairbanks, M. S., McCarthy, D. N., Scott, S. A., Brown, S. A. & Taylor, R. P. Fractal electronic devices: simulation and implementation. *Nanotechnology* 22, doi:10.1088/0957-4484/22/36/365304 (2011).

Golestanirad, L. et al. Analysis of fractal electrodes for efficient neural stimulation. *Frontiers in neuroengineering* 6, 3, doi:10.3389/fneng.2013.00003 (2013).

Taylor, R. Vision of beauty. *Physics World* 24, 22-27 (2011).

Webb, R. C. et al. Ultrathin conformal devices for precise and continuous thermal characterization of human skin. *Nat Mater* 12, 938-944, doi:10.1038/nmat3755 http://www.nature.com/nmat/journal/v12/n10/abs/nmat3755.html#supplementary-information (2013).

Cohen, N. Fractal Antennas: Part 1. *Communications Quarterly*, 7-22 (1995).

Gianvittorio, J. P. & Rahmat-Samii, Y. Fractal antennas: A novel antenna miniaturization technique, and applications. *Ieee Antennas and Propagation Magazine* 44, 20-36, doi:10.1109/74.997888 (2002).

Puente, C., Romeu, J., Pous, R., Ramis, J. & Hijazo, A. Small but long Koch fractal monopole. *Electronics Letters* 34, 9-10, doi:10.1049/el:19980114 (1998).

Pelrine, R., Kornbluh, R., Pei, Q. B. & Joseph, J. High-speed electrically actuated elastomers with strain greater than 100%. *Science* 287, 836-839 (2000).

Wagner, S. et al. Electronic skin: architecture and components. *Physica E Low Dimens Syst Nanostruct* 25, 326-334 (2004).

Khang, D. Y., Jiang, H. Q., Huang, Y. & Rogers, J. A. A stretchable form of single-crystal silicon for high-performance electronics on rubber substrates. *Science* 311, 208-212 (2006).

Sekitani, T. et al. A rubberlike stretchable active matrix using elastic conductors. *Science* 321, 1468-1472 (2008).

Sekitani, T. & Someya, T. Stretchable organic integrated circuits for large-area electronic skin surfaces. *MRS Bulletin* 37, 236-245 (2012).

Suo, Z. G. Mechanics of stretchable electronics and soft machines. *MRS Bulletin* 37, 218-225 (2012).

Yoon, J. et al. Ultrathin silicon solar microcells for semitransparent, mechanically flexible and microconcentrator module designs. *Nature Mater.* 7, 907-915 (2008).

Kim, D. H. et al. Epidermal Electronics. *Science* 333, 838-843 (2011).

Mannsfeld, S. C. B. et al. Highly sensitive flexible pressure sensors with microstructured rubber dielectric layers. *Nature Mater.* 9, 859-864 (2010).

Takei, K. et al. Nanowire active-matrix circuitry for low-voltage macroscale artificial skin. *Nature Mater.* 9, 821-826 (2010).

Someya, T. et al. A large-area, flexible pressure sensor matrix with organic field-effect transistors for artificial skin applications. *Proc. Natl. Acad. Sci. U.S.A.* 101, 9966-9970 (2004).

Kim, D. H. et al. Materials for multifunctional balloon catheters with capabilities in cardiac electrophysiological mapping and ablation therapy. *Nature Mater.* 10, 316-323 (2011).

Ko, H. C. et al. A hemispherical electronic eye camera based on compressible silicon optoelectronics. *Nature* 454, 748-753 (2008).

Nishide, H. & Oyaizu, K. Toward flexible batteries. *Science* 319, 737-738 (2008).

Pushparaj, V. L. et al. Flexible energy storage devices based on nanocomposite paper. *Proc. Natl. Acad. Sci. U.S.A.* 104, 13574-13577 (2007).

Scrosati, B. Nanomaterials—Paper powers battery breakthrough. *Nature Nanotechnol.* 2, 598-599 (2007).

Hu, L. B. et al. Highly conductive paper for energy-storage devices. *Proc. Natl. Acad. Sci. U.S.A.* 106, 21490-21494 (2009).

Hu, L., Wu, H., La Mantia, F., Yang, Y. & Cui, Y. Thin, Flexible Secondary Li-Ion Paper Batteries. *ACS Nano* 4, 5843-5848 (2010).

Yu, C. J., Masarapu, C., Rong, J. P., Wei, B. Q. & Jiang, H. Q. Stretchable Supercapacitors Based on Buckled Single-Walled Carbon Nanotube Macrofilms. *Adv. Mater.* 21, 4793-4797 (2009).

Hu, L. B. et al. Stretchable, Porous, and Conductive Energy Textiles. *Nano Lett.* 10, 708-714 (2010).

Kaltenbrunner, M., Kettlgruber, G., Siket, C., Schwodiauer, R. & Bauer, S. Arrays of Ultracompliant Electrochemical Dry Gel Cells for Stretchable Electronics. *Adv. Mater.* 22, 2065-2067 (2010).

Gaikwad, A. M. et al. Highly Stretchable Alkaline Batteries Based on an Embedded Conductive Fabric. *Adv. Mater.* 24, 5071-5076 (2012).

Tarascon, J. M. & Armand, M. Issues and challenges facing rechargeable lithium batteries. *Nature* 414, 359-367 (2001).

Scrosati, B. & Garche, J. Lithium batteries: Status, prospects and future. *J. Power Sources* 195, 2419-2430 (2010).

Thanawala, S. K. & Chaudhury, M. K. Surface modification of silicone elastomer using perfluorinated ether. *Langmuir* 16, 1256-1260 (2000).

Lee, J. et al. Stretchable GaAs Photovoltaics with Designs That Enable High Areal Coverage. *Adv. Mater.* 23, 986-991 (2011).

Lee, J. et al. Stretchable Semiconductor Technologies with High Areal Coverages and Strain-Limiting Behavior: Demonstration in High-Efficiency Dual-Junction GaInP/GaAs Photovoltaics. *Small* 8, 1851-1856 (2012).

Krieger, K. Extreme mechanics: Buckling down. *Nature* 488, 146-147 (2012).

Yoshima, K., Munakata, H. & Kanamura, K. Fabrication of micro lithium-ion battery with 3D anode and 3D cathode by using polymer wall. *J. Power Sources* 208, 404-408 (2012).

Ferg, E., Gummow, R. J., Dekock, A. & Thackeray, M. M. Spinel Anodes for Lithium-Ion Batteries. *J. Electrochem. Soc.* 141, L147-L150 (1994).

Owen, J. R. Rechargeable lithium batteries. *Chem. Soc. Rev.* 26, 259-267 (1997).

Gowda, S. R. et al. Conformal Coating of Thin Polymer Electrolyte Layer on Nanostructured Electrode Materials for Three-Dimensional Battery Applications. *Nano Lett.* 11, 101-106 (2011).

Sun, Y. G., Choi, W. M., Jiang, H. Q., Huang, Y. G. Y. & Rogers, J. A. Controlled buckling of semiconductor nanoribbons for stretchable electronics. *Nature Nanotechnol.* 1, 201-207 (2006).

Ouyang, M., Yuan, C., Muisener, R. J., Boulares, A. & Koberstein, J. T. Conversion of some siloxane polymers to silicon oxide by UV/ozone photochemical processes. Chem. Mater. 12, 1591-1596 (2000).

Datasheet for BAT 62-02LS E6327 on www.digikey.com.

Example 3

Mechanics of Ultra-Stretchable Self-Similar Serpentine Interconnects

Abstract

Electrical interconnects that adopt self-similar, serpentine layouts offer exceptional levels of stretchability in systems that consist of collections of small, non-stretchable active devices, in the so-called island-bridge design. This Example develops analytical models of flexibility and elastic stretchability for such structures and establishes recursive formulae at different orders of self-similarity. The analytic solutions agree well with finite element analysis (FEA), with both demonstrating that the elastic stretchability more than doubles when the order of the self-similar structure increases by one. Design optimization yields 90% and 50% elastic stretchability for systems with surface filling ratios of 50% and 70% of active devices, respectively.

1. Introduction

Interest in development of electronic and optoelectronic systems that offer elastic response to large strain (>>1%) deformation has grown rapidly in recent years [1-10], due in part to a range of important application possibilities that cannot be addressed with established technologies, such as wearable photovoltaics [11], 'epidermal' health/wellness monitors [8], eyeball-like digital cameras [9,12], and sensitive robotic skins [13-15]. Many of these stretchable devices adopt the island-bridge design [8, 12, 16-18], where the active components are distributed in small, localized regions (i.e. islands) and are joined by narrow, deformable electrical and/or mechanical interconnects (i.e. bridges). Under stretching conditions, the relatively stiff islands effectively isolate the active components (usually brittle materials) from strains that could cause fracture (e.g., <1%); the bridge structures accommodate nearly all of the deformation [17-19]. For many practical devices, the island-bridge design must achieve simultaneously two competing goals, i.e., high surface filling ratio of active devices, and high stretchability of the entire system. Demonstrated design solutions involve either serpentine [1, 8, 17, 20-27] or non-coplanar [12,18] interconnects. These technologies, however, typically give levels of total stretchability that are less than 50%, in systems that do no significantly sacrifice areal coverage. Recently, Xu et al. [19] illustrated an alternative type of interconnect design that exploits self-similar serpentine geometries (shown in FIG. 45a), a type of space-filling curve. This concept enabled lithium-ion batteries with the biaxial stretchability up to ~300%, and areal coverages of active materials as high as ~50%. Comprehensive experimental and numerical investigations indicated that such self-similar serpentine interconnects possess improved levels of stretchability compared to traditional serpentine structures for a given spacing between adjacent islands. The nature of the space-filling geometry in these structures and the mechanisms for their ordered unraveling were found to play important roles.

This Example aims at developing an analytic model to study the flexibility and elastic stretchability (referred to simply as stretchability in the following) of self-similar serpentine interconnects, and to establish the design guidelines for optimizing the stretching limit. Here, we focus on the scenario that the interconnects are not bonded to the supporting substrate such that deformation can occur freely and the interactions with the substrate can be neglected. Such freely suspended interconnects can be fabricated by either of two methods: i) molding surface relief structures on the elastomeric substrate [16, 18, 28], and bonding the islands onto the top of the raised relief; ii) designing the mask of $SiO_2$ deposition to enable selective bonding of the islands onto the substrate [29,30], while leaving the interconnects with a minimum interaction with the substrate. The present study mainly focuses on relative thick interconnects with the thickness comparable to the width, as required for applications that demand low electrical resistance, such as wireless inductive coils [19], and photovoltaic modules [11]. In such cases, the deformation of the interconnects is governed by in-plane bending, rather than buckling, when the system is under stretching. Here, the critical buckling strain is large compared to the stretchability [31], such that buckling is not triggered within the range of acceptable deformations. This mechanics is qualitatively different from that of the types of free-standing, thin serpentine interconnects that have been investigated previously [17,31-33]. For free-standing, thick self-similar interconnects, analytic models of the flexibility and stretchability are established in this study. The models are then extended to arbitrary self-similar orders. The results establish design guidelines for practical applications.

This Example is outlined as follows: Section 2 focuses on the simplest geometric configuration, self-similar rectangular interconnects, to illustrate the mechanics model for analyzing the flexibility and stretchability. The analytic model is extended to generalized self-similar rectangular and serpentine interconnects in Section 3. The stretchability of self-similar interconnects is studied in Section 4. Section 5 presents the optimal design of self-similar serpentine interconnects for stretchable electronics to illustrate its advantage in achieving high system stretchability.

2. Self-Similar Rectangular Interconnects

Figure 45:
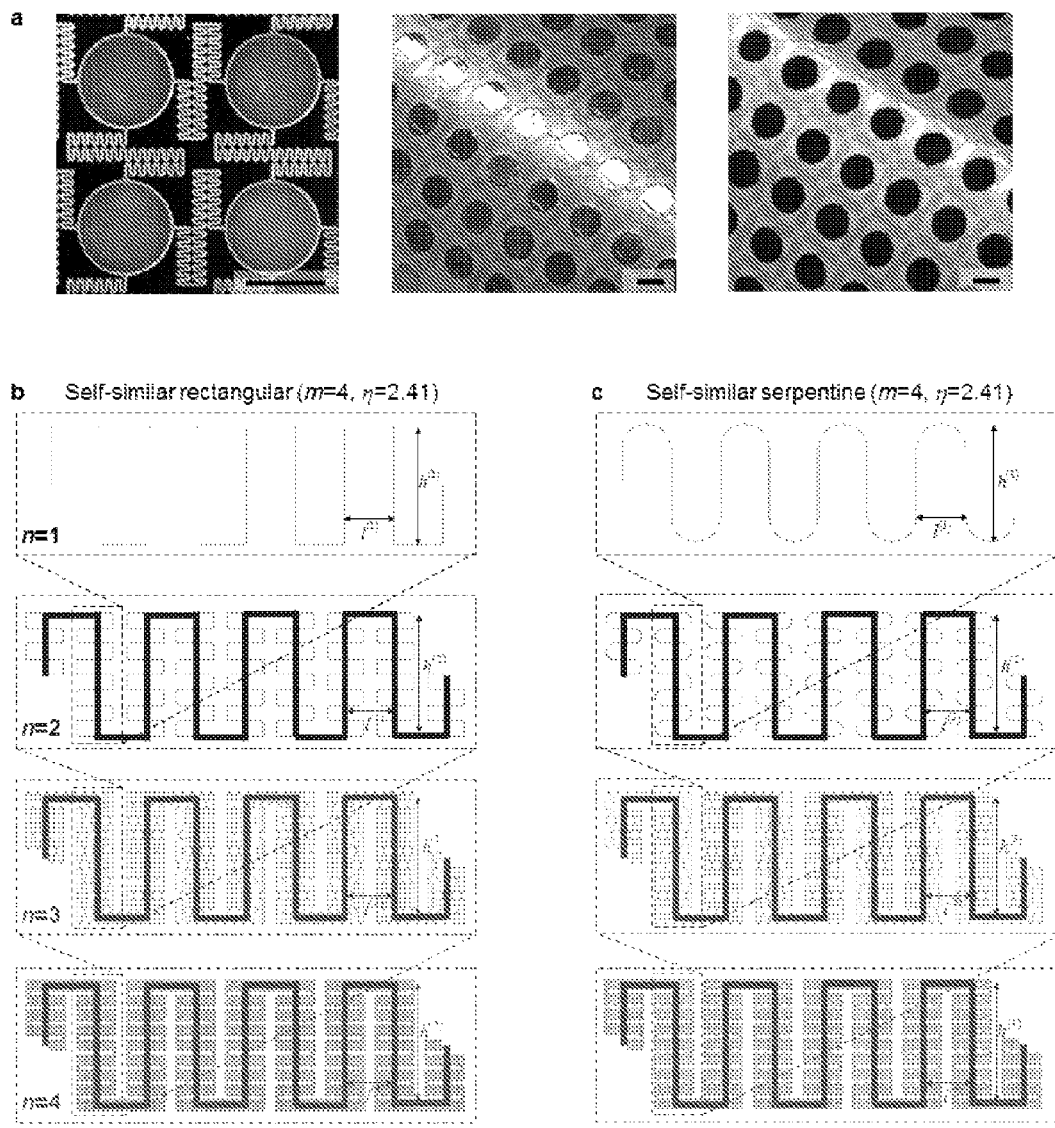
FIG. 45. (a) Optical images of the Al electrode pads and self-similar interconnects on Si wafer (left panel; top down view; ~4 unit cells), after transfer printing on a sheet of silicone (middle panel; oblique view, in a bent geometry), and with moulded slurries of $LiCoO_2$ (right panel; oblique view, in a bent geometry), for a stretchable Li-ion battery; (b) Schematic illustration on the geometric construction of the self-similar rectangular interconnect; (c) Schematic illustration on the geometric construction of the self-similar serpentine interconnect. The scale bars in (a) are 2 mm. (a) is reprinted with permission from Xu et al. [19], Copyright 2013, Nature Publishing Group.

This section focuses on a geometrically simple self-similar interconnect in a rectangular configuration (as shown in FIG. 45b), to illustrate its structure, flexibility and stretchability. The rectangular interconnect is a variant of the traditional serpentine interconnect (top panel of FIG. 45c), and is convenient for constructing self-similar structures because of its simple geometry. To determine the flexibility of self-similar rectangular interconnects, the key is to establish the relation between the flexibility of neighboring orders, i.e., the recursion formula. We first take the $1^{st}$ order self-similar rectangular interconnect as an example to illustrate the model as in Section 2.2, and then generalize the theoretical framework to the $2^{nd}$ order and arbitrary order in Sections 2.3 and 2.4, respectively.

2.1. Geometry

This subsection introduces the geometric construction of self-similar rectangular interconnects. The $1^{st}$ order (original) rectangular interconnect consists of two sets of straight wires that are perpendicular to each other and connected in series, as shown in the black box of FIG. 45b. The $2^{nd}$ order rectangular interconnect, shown in the blue box of FIG. 45b, is created by reducing the scale of the $1^{st}$ order interconnect, rotating the structure by 90°, and then connecting multiple copies of it in a fashion that reproduces the layout of original geometry. The wide blue line in FIG. 45b represents the $2^{nd}$ order geometry that is similar to the $1^{st}$ order rectangular geometry. By implementing the same algorithm, we can generate the $3^{rd}$ and $4^{th}$ order rectangular interconnects, as illustrated in the red and purple boxes of FIG. 45b, where the red and purple lines denote the $3^{rd}$ and $4^{th}$ order geometries, respectively.

For self-similar rectangular interconnects, let m denote the number of unit cell and η the height/spacing aspect ratio at each order. Therefore the lengths of horizontal and vertical lines of the $i^{th}$ order (i=1 . . . n), $l^{(i)}$ and $h^{(i)}$ (FIG. 45b), are related by $$h^{(i)} = \eta l^{(i)}. \tag{1}$$

In addition, the height of $i^{th}$ order geometry equals to the distance between two ends of $(i-1)^{th}$ order geometry, that is $$h^{(i)} = 2ml^{(i-1)} (i=2 \ldots n). \tag{2}$$

Equations (1) and (2) give the length and height at any order in terms of $l^{(n)}$, η and m, as $$l^{(i)} = (\eta/2m)^{n-i} l^{(n)}, h^{(i)} = \eta(\eta/2m)^{n-i} l^{(n)}, (i=1 \ldots n). \tag{3}$$

This indicates that the geometry of an arbitrary self-similar rectangular interconnect is characterized by one base length ($l^{(n)}$) and three non-dimensional parameters, namely the self-similar order (n), the height/spacing ratio (η) and number (m) of unit cell. It should be mentioned that, for n≥3, there is an additional constraint on the height/spacing ratio η because of the following relation, which can be observed from the geometry of $3^{rd}$ order rectangular interconnect shown in FIGS. 45b and 47b (to be discussed), $$l^{(i)} = (2m_h + 1)l^{(i-2)} (i=3 \ldots n), \tag{4}$$

where $m_h$ is the number of full unit cells in the structure represented by the horizontal part of the $i^{th}$ order geometry (i=3 . . . n). Equations (3) and (4) give the constraint on the height/spacing ratio η for n≥3

$$\eta = \frac{2m}{\sqrt{2m_h + 1}} \tag{5}$$

$(i = 3 \ldots n),$ i.e., the height/spacing ratio can only take some discrete values for n≥3. FIG. 45b shows a set of self-similar rectangular interconnects, from n=1 to 4, with m=4 and η=8/√11.

2.2. Flexibility of $1^{st}$ Order Rectangular Interconnects

Figure 46:
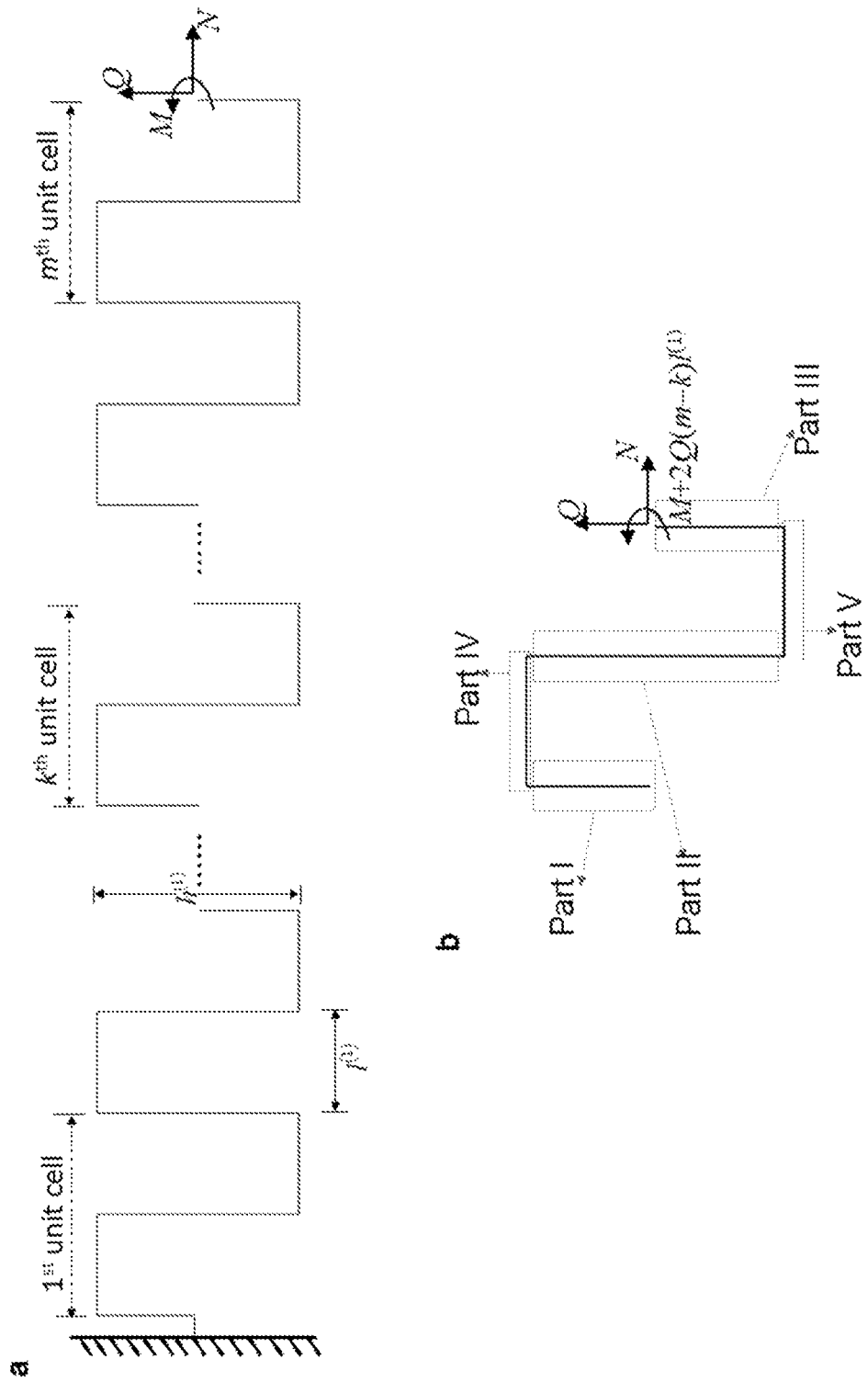
FIG. 46. (a) A freely suspended $1^{st}$ order rectangular interconnect, clamped at the left end, and subject to an axial force N, shear force Q, and bending moment M, at the right end. (b) Exploded view and free body diagram of the $k^{th}$ unit cell of $1^{st}$ order rectangular interconnect.

FIG. 46a shows a schematic illustration of the $1^{st}$ order self-similar rectangular interconnect with m unit cells and height/spacing ratio η. As illustrated in FIG. 46b, a representative unit cell (e.g., the $k^{th}$ unit cell) of the $1^{st}$ order structure is composed of five straight wires (i.e., $0^{th}$ order structure) (Parts I to V). The vertical wires, Parts I and III, have a length of $h^{(1)}/2$, and Part II has a length of $h^{(1)}$. The horizontal wires, Parts IV and V, have a length of $l^{(1)}$.

Consider the $1^{st}$ order rectangular interconnect clamped at the left end, and subject to an axial force N (along the direction between the two ends of the interconnect), a shear force Q (normal to N), and a bending moment M, at the right end, within the plane of interconnect, as shown in FIG. 46a. The width (w) and thickness (t) of the serpentine interconnect are usually much smaller than the length such that the structure can be modeled as a curved beam. Let u and v denote the displacements at the right end, along and normal to the axial direction of the interconnect (parallel to N and to Q), respectively, and θ is the rotation angle (FIG. 46a). They are related to (N, Q, M) via the strain energy $W^{(1)}$ in the interconnect by $$\begin{pmatrix} u \\ v \\ \theta \end{pmatrix} = \begin{bmatrix} \partial W^{(1)}/\partial N \\ \partial W^{(1)}/\partial Q \\ \partial W^{(1)}/\partial M \end{bmatrix} = \begin{bmatrix} T^{(1)}_{11} & T^{(1)}_{12} & T^{(1)}_{13} \\ T^{(1)}_{12} & T^{(1)}_{22} & T^{(1)}_{23} \\ T^{(1)}_{13} & T^{(1)}_{23} & T^{(1)}_{33} \end{bmatrix} \begin{pmatrix} N \\ Q \\ M \end{pmatrix} = T^{(1)} \begin{pmatrix} N \\ Q \\ M \end{pmatrix}, \tag{6}$$

where $W^{(1)} = (N, Q, M)T^{(1)}(N, Q, M)^T/2$ is a quadratic function of N, Q, and M for linear elastic behavior of the interconnect; and $T^{(1)}$ is the symmetric flexibility matrix of the $1^{st}$ order interconnect and is to be determined. The strain energy also equals the sum of strain energy $W^{(0)}$ in all $0^{th}$ order interconnects (Parts I to V), i.e.

$$W^{(1)} = W^{(0)} = \sum_{k=1}^{m} (W_k^I + W_k^{II} + W_k^{III} + W_k^{IV} + W_k^V), \tag{7}$$

where $W_k^I$ to $W_k^V$ represent the strain energy of each component in the $k^{th}$ unit cell. For the $0^{th}$ order structure, i.e. a straight wire with length l and bending stiffness EI, the beam theory gives the flexibility matrix as [34]

$$T^{(0)}(l) = \frac{1}{6EI} \begin{pmatrix} 0 & 0 & 0 \\ 0 & 2l^3 & 3l^2 \\ 0 & 3l^2 & 6l \end{pmatrix}. \tag{8}$$

Here the membrane energy is neglected. The free body diagram of the $k^{th}$ unit cell of the $1^{st}$ order interconnect (FIG. 46b) gives the axial force, shear force and bending moment in each wire, and the strain energy of each $0^{th}$ order interconnect can then be obtained as $$\begin{pmatrix} W_k^I \\ W_k^{II} \\ W_k^{III} \\ W_k^{IV} \\ W_k^V \end{pmatrix} = \frac{1}{2}(N, Q, M) \begin{Bmatrix} D_I T^{(0)}[h^{(1)}/2]D_I^T \\ D_{II} T^{(0)}[h^{(1)}]D_{II}^T \\ D_{III} T^{(0)}[h^{(1)}/2]D_{III}^T \\ D_{IV} T^{(0)}[l^{(1)}]D_{IV}^T \\ D_V T^{(0)}[l^{(1)}]D_V^T \end{Bmatrix} (N, Q, M)^T, \tag{9}$$

where $D_I = \begin{bmatrix} 0 & 1 & -h^{(1)}/2 \\ 1 & 0 & -(2m-2k+2)l^{(1)} \\ 0 & 0 & -1 \end{bmatrix},$ \tag{10}

$D_{II} = \begin{bmatrix} 0 & 1 & -h^{(1)}/2 \\ -1 & 0 & (2m-2k+1)l^{(1)} \\ 0 & 0 & 1 \end{bmatrix},$ $D_{III} = \begin{bmatrix} 0 & 1 & 0 \\ 1 & 0 & -(2m-2k)l^{(1)} \\ 0 & 0 & -1 \end{bmatrix},$ $D_{IV} = \begin{bmatrix} 1 & 0 & h^{(1)}/2 \\ 0 & 1 & (2m-2k+1)l^{(1)} \\ 0 & 0 & 1 \end{bmatrix}, \text{ and}$ $D_V = \begin{bmatrix} 1 & 0 & h^{(1)}/2 \\ 0 & -1 & -(2m-2k)l^{(1)} \\ 0 & 0 & -1 \end{bmatrix}.$ Substitution of Eq. (9) into Eq. (7) gives the recursive formula between the flexibility matrices of $1^{st}$ and $0^{th}$ order interconnects as $$T^{(1)} = \sum_{k=1}^{m} \left\{ \begin{array}{l} D_I T^{(0)}[h^{(1)}/2]D_I^T + D_{II} T^{(0)}[h^{(1)}]D_{II}^T + \\ D_{III} T^{(0)}[h^{(1)}/2]D_{III}^T + D_{IV} T^{(0)}[l^{(1)}]D_{IV}^T + D_V T^{(0)}[l^{(1)}]D_V^T \end{array} \right\}. \quad (11)$$

Substitution of $T^{(0)}$ in Eq. (8) into the above equation gives a simple expression of the flexibility of $1^{st}$ order interconnect in terms of the number of unit cells m, height/spacing ratio $\eta$ and $l^{(1)}$, $$T^{(1)}[m, \eta, l^{(1)}] = \frac{1}{EI} \quad (12)$$

$$\begin{Bmatrix} m\frac{\eta^3 + 3\eta^2}{6}[l^{(1)}]^3 & m\frac{\eta(\eta+2)}{4}[l^{(1)}]^3 & 0 \\ m\frac{\eta(\eta+2)}{4}[l^{(1)}]^3 & \frac{(8m^3+m)\eta + 8m^3}{3}[l^{(1)}]^3 & 2m^2(\eta+1)[l^{(1)}]^2 \\ 0 & 2m^2(\eta+1)[l^{(1)}]^2 & 2m(\eta+1)l^{(1)} \end{Bmatrix}.$$

For the convenience of generalization to higher order (n) structure, the following non-dimensional form of flexibility matrix is adopted $$\begin{bmatrix} u/l^{(i)} \\ v/l^{(i)} \\ \theta \end{bmatrix} = \frac{l^{(i)}}{EI} \bar{T}^{(i)} \begin{bmatrix} Nl^{(i)} \\ Ql^{(i)} \\ M \end{bmatrix}, \quad (13)$$

$$i = 1 \ldots n,$$

where $\bar{T}^{(i)}$ is dimensionless, and $\bar{T}^{(1)}$ is given by $$\bar{T}^{(1)}[m, \eta] = \begin{bmatrix} m\frac{\eta^3 + 3\eta^2}{6} & m\frac{\eta(\eta+2)}{4} & 0 \\ m\frac{\eta(\eta+2)}{4} & \frac{(8m^3+m)\eta + 8m^3}{3} & 2m^2(\eta+1) \\ 0 & 2m^2(\eta+1) & 2m(\eta+1) \end{bmatrix}. \quad (14)$$

For the $0^{th}$ order structure, i.e., a straight wire of length $\lambda$, the non-dimensional flexibility matrix is defined as $(u/\lambda, v/\lambda, \theta)^T = (\lambda/EI)\bar{T}^{(0)}(N\lambda, Q\lambda, M)^T$, where $$\bar{T}^{(0)} = \begin{pmatrix} 0 & 0 & 0 \\ 0 & \frac{1}{3} & \frac{1}{2} \\ 0 & \frac{1}{2} & 1 \end{pmatrix}. \quad (15)$$

2.3. Flexibility of $2^{nd}$ Order Rectangular Interconnect

Figure 47:
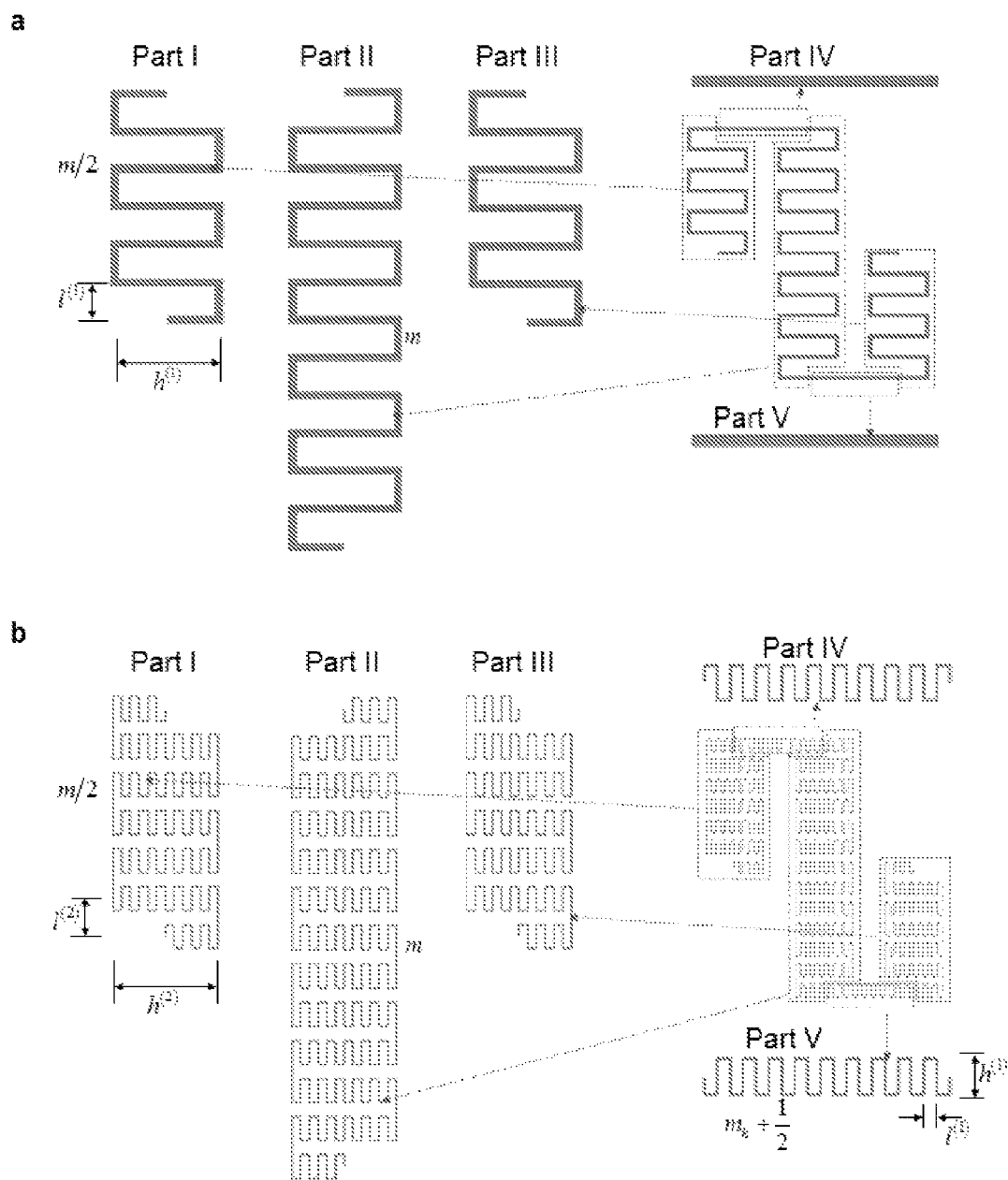
FIG. 47. The exploded view of a representative unit cell for the (a) $2^{nd}$ order and (b) $3^{rd}$ order self-similar rectangular interconnect.

The recursive formula for the flexibility matrix of $2^{nd}$ order interconnect is established in this section. A representative unit cell of the $2^{nd}$ order structure is composed of three $1^{st}$ order structures (Parts I to III), and two straight wires (i.e., $0^{th}$ order structure) (Parts IV and V) with length of $l^{(2)}$, as illustrated in FIG. 47*a*. The $1^{st}$ order structures, Parts I or III, consist of m/2 (m is an even integer) unit cells, and Part II consists of m unit cells.

The strain energy of the $2^{nd}$ order structure can be expressed in terms of the dimensionless flexibility matrix as $$W^{(2)} = \frac{l^{(2)}}{2EI}[Nl^{(2)}, Ql^{(2)}, M]\bar{T}^{(2)}[Nl^{(2)}, Ql^{(2)}, M]^T \quad (16)$$

$$= \frac{l^{(2)}}{2EI}(N, Q, M)\begin{bmatrix} l^{(2)} & 0 & 0 \\ 0 & l^{(2)} & 0 \\ 0 & 0 & 1 \end{bmatrix} \bar{T}^{(2)} \begin{bmatrix} l^{(2)} & 0 & 0 \\ 0 & l^{(2)} & 0 \\ 0 & 0 & 1 \end{bmatrix} (N, Q, M)^T,$$

where $\bar{T}^{(2)}$ is to be determined. The strain energy also equals the sum of strain energy in all $1^{st}$ order (Parts I to III, FIG. 47*a*) and $0^{th}$ order (Parts IV and V, FIG. 47*a*) interconnects, i.e.

$$W^{(2)} = \sum_{k=1}^{m} (W_k^I + W_k^{II} + W_k^{III} + W_k^{IV} + W_k^V), \quad (17)$$

where $$W_k^{II} = \frac{l^{(1)}}{2EI}[Nl^{(1)}, Ql^{(1)}, M]\bar{D}_{II}\bar{T}^{(1)}(m, \eta)\bar{D}_{II}^T[Nl^{(1)}, Ql^{(1)}, M]^T \quad (18)$$

is the strain energy in Part II ($1^{st}$ order structure, m unit cell) with $$\bar{D}_{II} = \begin{bmatrix} 0 & 1 & -m \\ -1 & 0 & (4m - 4k + 2)m\eta^{-1} \\ 0 & 0 & 1 \end{bmatrix}$$

being the normalized $D_{II}$ in Eq. (10) (with $l^{(1)}$ and $h^{(1)}$ replaced by $l^{(2)}$ and $h^{(2)}$, respectively);

$$W_k^{IV} = \frac{l^{(2)}}{2EI}[Nl^{(2)}, Ql^{(2)}, M]\bar{D}_{IV}\bar{T}^{(0)}\bar{D}_{IV}^T[Nl^{(2)}, Ql^{(2)}, M]^T \quad (19)$$

$$W_k^V = \frac{l^{(2)}}{2EI}[Nl^{(2)}, Ql^{(2)}, M]\bar{D}_V\bar{T}^{(0)}\bar{D}_V^T[Nl^{(2)}, Ql^{(2)}, M]^T$$

are the strain energy in Parts IV and V [$0^{th}$ order structure, length $\lambda = l^{(2)}$] with $$\bar{D}_{IV} = \begin{pmatrix} 1 & 0 & \eta/2 \\ 0 & 1 & 2m - 2k + 1 \\ 0 & 0 & 1 \end{pmatrix} \text{ and } \bar{D}_V = \begin{pmatrix} 1 & 0 & \eta/2 \\ 0 & -1 & -2m + 2k \\ 0 & 0 & -1 \end{pmatrix}$$

being the normalized $D_{IV}$ and $D_V$ in Eq. (10) [with $l^{(1)}$ and $h^{(1)}$ replaced by $l^{(2)}$ and $h^{(2)}$, respectively];

$$W_k^I = \frac{l^{(1)}}{2EI}[Nl^{(1)}, Ql^{(1)}, M]\bar{D}_I\bar{T}^{(1)}\left(\frac{m}{2}, \eta\right)\bar{D}_I^T[Nl^{(1)}, Ql^{(1)}, M]^T \quad (20)$$

$$W_k^{III} = \frac{l^{(1)}}{2EI}[Nl^{(1)}, Ql^{(1)}, M]\bar{D}_{III}\bar{T}^{(1)}\left(\frac{m}{2}, \eta\right)\bar{D}_{III}^T[Nl^{(1)}, Ql^{(1)}, M]^T$$

are the strain energy in Parts I and III ($1^{st}$ order structure, m/2 unit cell) with $$\overline{D}_I = \begin{bmatrix} 0 & 1 & -m \\ 1 & 0 & -4(m-k+1)m\eta^{-1} \\ 0 & 0 & -1 \end{bmatrix} \text{ and}$$

$$\overline{D}_{III} = \begin{bmatrix} 0 & 1 & 0 \\ 1 & 0 & -4(m-k)m\eta^{-1} \\ 0 & 0 & -1 \end{bmatrix}$$

being the normalized $D_I$ and $D_{III}$ in Eq. (10) [with $l^{(1)}$ and $h^{(1)}$ replaced by $l^{(2)}$ and $h^{(2)}$, respectively].

Substitution of Eqs. (18)-(20) into Eq. (17) gives the recursive formula for the flexibility matrix of $2^{nd}$ order interconnect as $$\overline{T}^{(2)} = \frac{\eta}{2m} \begin{pmatrix} \frac{\eta}{2m} & 0 & 0 \\ 0 & \frac{\eta}{2m} & 0 \\ 0 & 0 & 1 \end{pmatrix} \tag{21}$$

$$\sum_{k=1}^{m} \begin{Bmatrix} \overline{D}_I [\overline{T}^{(1)}K(m\eta)+K^T(m\eta)\overline{T}^{(1)}]\overline{D}_I^T + \\ \overline{D}_{II}^T \overline{T}^{(1)} \overline{D}_{II}^T + \\ \overline{D}_{III}[\overline{T}^{(1)}K(m\eta)+K^T(m\eta)\overline{T}^{(1)}]\overline{D}_{III}^T \end{Bmatrix} \begin{pmatrix} \frac{\eta}{2m} & 0 & 0 \\ 0 & \frac{\eta}{2m} & 0 \\ 0 & 0 & 1 \end{pmatrix} +$$

$$\sum_{k=1}^{m} [\overline{D}_{IV} \overline{T}^{(0)} \overline{D}_{IV}^T + \overline{D}_V \overline{T}^{(0)} \overline{D}_V^T],$$

where $$K(m\eta) = \frac{1}{4}\begin{pmatrix} 1 & 0 & 0 \\ 0 & 1 & 0 \\ 0 & -m\eta & 1 \end{pmatrix} \tag{22}$$

results from the identity $$\overline{T}^{(1)}\left(\frac{m}{2}, \eta\right) = \overline{T}^{(1)}(m,\eta)K(m\eta) + K^T(m\eta)\overline{T}^{(1)}(m,\eta). \tag{23}$$

Substitution of $\overline{T}^{(0)}$ and $\overline{T}^{(1)}$ in Eqs. (15) and (14) into Eq. (21) gives $\overline{T}^{(2)}$ as $$\overline{T}^{(2)}(m,\eta) = \tag{24}$$

$$\begin{bmatrix} \eta^2 \frac{\eta^2+2m^2(f+2)}{12m} & \frac{m}{4}\eta(f+1) & 0 \\ \frac{m}{4}\eta(f+1) & \frac{\eta^5(\eta+3)+8m^2(f-1)+\frac{64m^4 f}{24m}}{24m} & 2m^2 f \\ 0 & 2m^2 f & 2mf \end{bmatrix},$$

where $f=\eta^2+\eta+1$.

2.4. Flexibility of Higher Order Rectangular Interconnect

For the higher order ($n\geq 3$) rectangular interconnect, a representative unit cell is composed of three (n-1) order structures (Parts I to III), and two (n-2) order structures (Parts IV and V). The (n-1) order structures, Parts I or III, consist of m/2 (m is an even integer) unit cells, and Part II consists of m unit cells. The recursive formula (21) becomes[1]

$$\overline{T}^{(n)} = \frac{\eta}{2m}\begin{pmatrix} \frac{\eta}{2m} & 0 & 0 \\ 0 & \frac{\eta}{2m} & 0 \\ 0 & 0 & 1 \end{pmatrix} \tag{25}$$

$$\sum_{k=1}^{m} \begin{Bmatrix} \overline{D}_I [\overline{T}^{(n-1)}K(m\eta)+K^T(m\eta)\overline{T}^{(n-1)}]\overline{D}_I^T + \\ \overline{D}_{II} \overline{T}^{(n-1)} \overline{D}_{II}^T + \\ \overline{D}_{III}[\overline{T}^{(n-1)}K(m\eta)+K^T(m\eta)\overline{T}^{(n-1)}]\overline{D}_{III}^T \end{Bmatrix}$$

$$\begin{pmatrix} \frac{\eta}{2m} & 0 & 0 \\ 0 & \frac{\eta}{2m} & 0 \\ 0 & 0 & 1 \end{pmatrix} +$$

$$\frac{\eta^2}{4m^2}\sum_{k=1}^{m}[\overline{D}_{IV}^* \overline{T}^{(n-2)} \overline{D}_{IV}^{*T} + \overline{D}_V^* \overline{T}^{(n-2)} \overline{D}_V^{*T}] \text{ for } n\geq 3.$$

where $\overline{D}_{IV}^* = \begin{bmatrix} \frac{\eta^2}{(4m^2)} & 0 & \frac{\eta}{2} \\ 0 & \frac{\eta^2}{(4m^2)} & 2m-2k+1 \\ 0 & 0 & 1 \end{bmatrix}$ and $$\overline{D}_V^* = \begin{bmatrix} \frac{\eta^2}{(4m^2)} & 0 & \frac{\eta}{2} \\ 0 & \frac{-\eta^2}{(4m^2)} & -2m+2k \\ 0 & 0 & -1 \end{bmatrix}.$$

[1]The (n-2)$^{th}$ order structures (e.g., Parts IV and V in FIG. 47b for the case of n=3) have ($m_h$+½) unit cells at the (n-2)$^{th}$ order geometry. However, because the contribution of the (n-2)$^{th}$ order structures to the overall flexibility is much smaller than that of (n-1)$^{th}$ order structures, the dimensionless flexibility of Parts IV and V can be approximated by the self-similar (n-2)$^{th}$ order structures with m unit cells, which, as to be shown by FEA, gives rather good accuracy.

3. Generalized Self-Similar Interconnects

The analytic model for self-similar rectangular interconnects in Section 2 is extended to generalized self-similar rectangular and serpentine interconnects in this section.

3.1. Generalized Self-Similar Rectangular Interconnects

Figure 48:
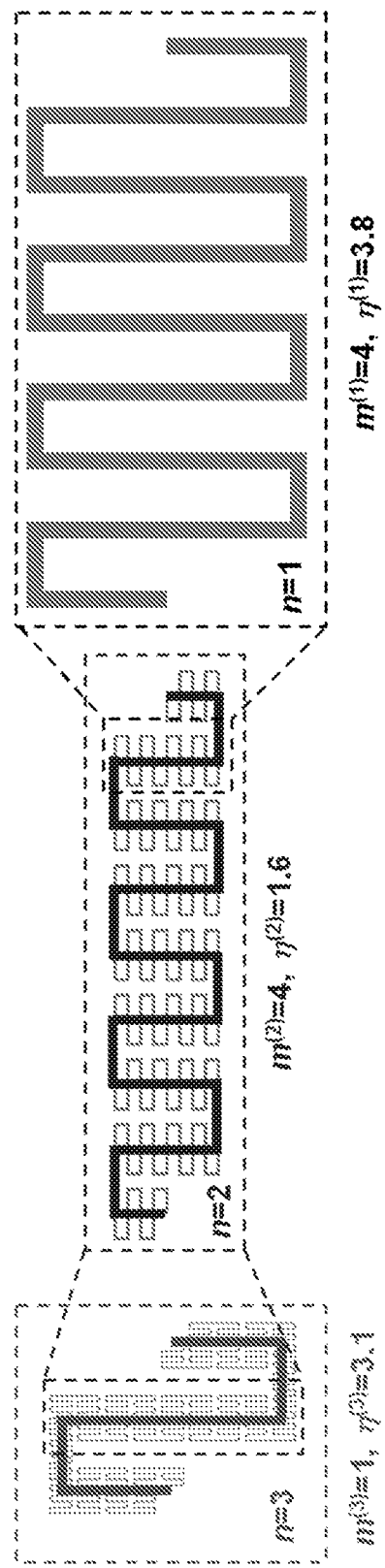
FIG. 48. Schematic illustration on the geometric construction of a $3^{rd}$ order generalized self-similar serpentine interconnect.

The generalized rectangular interconnect still exhibits the rectangular shape (shown in FIG. 48), but does not require the same height/spacing ratio across different orders, nor the number of unit cell. Each order may have its own height/spacing ratio $\eta^{(i)}$ and number of unit cell $m^{(i)}$ (i=1 . . . n), where only $m^{(n)}$ can be an odd number, and $m^{(1)}$ to $m^{(n)}$ must be even numbers. FIG. 48 illustrates a generalized 3$^{rd}$ order self-similar rectangular interconnect. For the n$^{th}$ order generalized self-similar rectangular interconnect, the geometric relations (1)-(3) become $$h^{(i)} = \eta^{(i)} l^{(i)}, \tag{26}$$

$$l^{(i)} = 2m^{(i-1)} l^{(i-1)} \; (i=2 \ldots n), \tag{27}$$

-continued $$l^{(i)} = \left[\prod_{k=1}^{n-i} \frac{\eta^{(n-k+1)}}{2m^{(n-k)}}\right] l^{(n)}, \quad h^{(i)} = \eta^{(i)} \left[\prod_{k=1}^{n-i} \frac{\eta^{(n-k+1)}}{2m^{(n-k)}}\right] l^{(n)}, \quad (28)$$

$$(i = 1 \ldots n-1).$$

The flexibility matrix $T^{(0)}$ in Eq. (15) remains the same, while m and $\eta$ in Eq. (14) for $T^{(1)}$ need to be replaced by $m^{(1)}$ and $\eta^{(1)}$, respectively. The recursive formulae for $T^{(2)}$ in Eq. (21) and $T^{(n)}$ ($n \geq 3$) in Eq. (25) now become $$\overline{T}^{(2)} = \quad (29)$$

$$\frac{\eta^{(2)}}{2m^{(1)}} \begin{bmatrix} \frac{\eta^{(2)}}{2m^{(1)}} & 0 & 0 \\ 0 & \frac{\eta^{(2)}}{2m^{(1)}} & 0 \\ 0 & 0 & 1 \end{bmatrix} m^{(2)} \sum_{k=1}^{m^{(2)}} \left\{ \begin{array}{c} \overline{D}_I^{(2)} \left\{ \overline{T}^{(1)} K[m^{(1)} \eta^{(1)}] + \\ K^T [m^{(1)} \eta^{(1)}] \overline{T}^{(1)} \right\} \overline{D}_I^{(2)T} + \\ \overline{D}_{II}^{(2)} \overline{T}^{(1)} \overline{D}_{II}^{(2)T} + \\ \overline{D}_{III}^{(2)} \left\{ \overline{T}^{(1)} K[m^{(1)} \eta^{(1)}] + \\ K^T [m^{(1)} \eta^{(1)}] \overline{T}^{(1)} \right\} \overline{D}_{III}^{(2)T} \end{array} \right\} +$$

$$\begin{bmatrix} \frac{\eta^{(2)}}{2m^{(1)}} & 0 & 0 \\ 0 & \frac{\eta^{(2)}}{2m^{(1)}} & 0 \\ 0 & 0 & 1 \end{bmatrix} + \sum_{k=1}^{m^{(2)}} [\overline{D}_{IV}^{(2)} \overline{T}^{(0)} \overline{D}_{IV}^{(2)T} + \overline{D}_V^{(2)} \overline{T}^{(0)} \overline{D}_V^{(2)T}],$$

$$\overline{T}^{(n)} = \frac{\eta^{(n)}}{2m^{(n-1)}} \begin{bmatrix} \frac{\eta^{(n)}}{2m^{(n-1)}} & 0 & 0 \\ 0 & \frac{\eta^{(n)}}{2m^{(n-1)}} & 0 \\ 0 & 0 & 1 \end{bmatrix} \quad (30)$$

$$\sum_{k=1}^{m^{(n)}} \left\{ \begin{array}{c} \overline{D}_I^{(n)} \left\{ \overline{T}^{(n-1)} K[m^{(n-1)} \eta^{(n-1)}] + \\ K^T [m^{(n-1)} \eta^{(n-1)}] \overline{T}^{(n-1)} \right\} \overline{D}_I^{(n)T} + \\ \overline{D}_{II}^{(n)} \overline{T}^{(n-1)} \overline{D}_{II}^{(n)T} + \\ \overline{D}_{III}^{(n)} \left\{ \overline{T}^{(n-1)} K[m^{(n-1)} \eta^{(n-1)}] + \\ K^T [m^{(n-1)} \eta^{(n-1)}] \overline{T}^{(n-1)} \right\} \overline{D}_{III}^{(n)T} \end{array} \right\}.$$

$$\begin{bmatrix} \frac{\eta^{(n)}}{2m^{(n-1)}} & 0 & 0 \\ 0 & \frac{\eta^{(n)}}{2m^{(n-1)}} & 0 \\ 0 & 0 & 1 \end{bmatrix} +$$

$$\frac{\eta^{(n)} \eta^{(n-1)}}{4m^{(n-1)} m^{(n-2)}} \sum_{k=1}^{m^{(n)}} \begin{bmatrix} \overline{D}_{IV}^{(n)} \overline{T}^{(n-2)} \overline{D}_{IV}^{(n)*T} + \\ \overline{D}_V^{(n)*} \overline{T}^{(n-2)} \overline{D}_V^{(n)*T} \end{bmatrix}$$

for $n \geq 3$, where $$\overline{D}_I^{(n)} = \begin{Bmatrix} 0 & 1 & -m^{(n-1)} \\ 1 & 0 & -4[m^{(n)} - k + 1][\eta^{(n)}]^{-1} \\ 0 & 0 & -1 \end{Bmatrix},$$

$$\overline{D}_{II}^{(n)} = \begin{Bmatrix} 0 & 1 & -m^{(n-1)} \\ -1 & 0 & [4m^{(n)} - 4k + 2]m^{(n-1)}[\eta^{(n)}]^{-1} \\ 0 & 0 & 1 \end{Bmatrix} \text{ and }$$

$$\overline{D}_{III}^{(n)} = \begin{bmatrix} 0 & 1 & 0 \\ 1 & 0 & -4[m^{(n)} - k]m^{(n-1)}[\eta^{(n)}]^{-1} \\ 0 & 0 & -1 \end{bmatrix} \text{ for } n \geq 2,$$

$$\overline{D}_{IV}^{(2)} = \begin{bmatrix} 1 & 0 & \frac{\eta^{(2)}}{2} \\ 0 & 1 & 2m^{(2)} - 2k + 1 \\ 0 & 0 & 1 \end{bmatrix},$$

$$\overline{D}_V^{(2)} = \begin{bmatrix} 1 & 0 & \frac{\eta^{(2)}}{2} \\ 0 & -1 & -2m^{(2)} + 2k \\ 0 & 0 & -1 \end{bmatrix}, \text{ and}$$

$$\overline{D}_{IV}^{*(n)} = \begin{bmatrix} \frac{\eta^{(n-1)} \eta^{(n)}}{[4m^{(n-2)} m^{(n-1)}]} & 0 & \frac{\eta^{(n)}}{2} \\ 0 & \frac{\eta^{(n-1)} \eta^{(n)}}{[4m^{(n-2)} m^{(n-1)}]} & 2m^{(n)} - 2k + 1 \\ 0 & 0 & 1 \end{bmatrix}$$

and $$\overline{D}_V^{*(n)} = \begin{bmatrix} \frac{\eta^{(n-1)} \eta^{(n)}}{[4m^{(n-2)} m^{(n-1)}]} & 0 & \frac{\eta^{(n)}}{2} \\ 0 & \frac{-\eta^{(n-1)} \eta^{(n)}}{[4m^{(n-2)} m^{(n-1)}]} & -2m^{(n)} + 2k \\ 0 & 0 & -1 \end{bmatrix}$$

for $n \geq 3$.

3.2. Generalized Self-Similar Serpentine Interconnects

FIGS. 45b and 45c show the generalized self-similar serpentine interconnect, which replaces the sharp corners in the rectangular configuration by half circles, as in Xu et al.'s experiments [19]. The $1^{st}$ order serpentine interconnect consists of straight wires [length $h^{(1)} - l^{(1)}$] connected by half circles [diameter $l^{(1)}$], as shown in the black box of FIG. 45c. A representative unit cell of the $2^{nd}$ order serpentine interconnect, as shown in the blue box of FIG. 45c, is composed of two (horizontal) straight wires of length $l^{(2)}$ and three (vertical) $1^{st}$ order serpentine interconnects (two with lengths $h^{(2)}/2$ and one with length of $h^{(2)}$). The flexibility matrix $T^{(0)}$ for straight wires is still given in Eq. (15), and the flexibility matrix $T^{(1)}$ for the $1^{st}$-order serpentine interconnect is obtained as [31]

$$\overline{T}^{(1)} = \frac{m^{(1)}}{24} \quad (31)$$

$$\begin{Bmatrix} 4g^3 + 6\pi g^2 + 24g + 3\pi & 6(g^2 + \pi g + 2) & 0 \\ 6(g^2 + \pi g + 2) & 32[m^{(1)}]^2 (2g + \pi) + 8g + \pi & 48m^{(1)}(g + \pi) \\ 0 & 48m^{(1)}(g + \pi) & 24(2g + \pi) \end{Bmatrix}.$$

where $g = \eta^{(1)} - 1$.

The $2^{nd}$ to $4^{th}$ (and higher) order geometries all exhibit a rectangular geometry (shown in FIG. 45c), which indicates that, strictly speaking, the self-similarity only starts at the $2^{nd}$ order interconnects. Comparison of the self-similar serpentine structure (FIG. 45c) to the rectangular one (FIG. 45b) suggests that only their $1^{st}$ order geometries are different. Therefore, the recursive formulae in Eqs. (29) and (30) still hold for the self-similar serpentine structure.

Substitution of $T^{(0)}$ in Eq. (15) and $T^{(1)}$ in Eq. (14) into Eq. (31) gives $T^{(2)}$ as $$\overline{T}^{(2)}(m,\eta) = \frac{m^{(2)}}{24}\begin{bmatrix} 6[\eta^{(2)}]^2(4-p)+6\left[\frac{\eta^{(2)}}{m^{(1)}}\right]^3 \overline{T}_{22}^{(1)} & 3\eta^{(2)}(p+2) & 0 \\ 3\eta^{(2)}(p+2) & 32[m^{(2)}]^2 p + 4p - 8 + 6\left[\frac{\eta^{(2)}}{m^{(1)}}\right]^3 \overline{T}_{11}^{(1)} & 24m^{(2)}p \\ 0 & 24m^{(2)}p & 24p \end{bmatrix},$$

where $p=\eta^{(2)}[2\eta^{(1)}+\pi-2]+2$.

Figure 49:
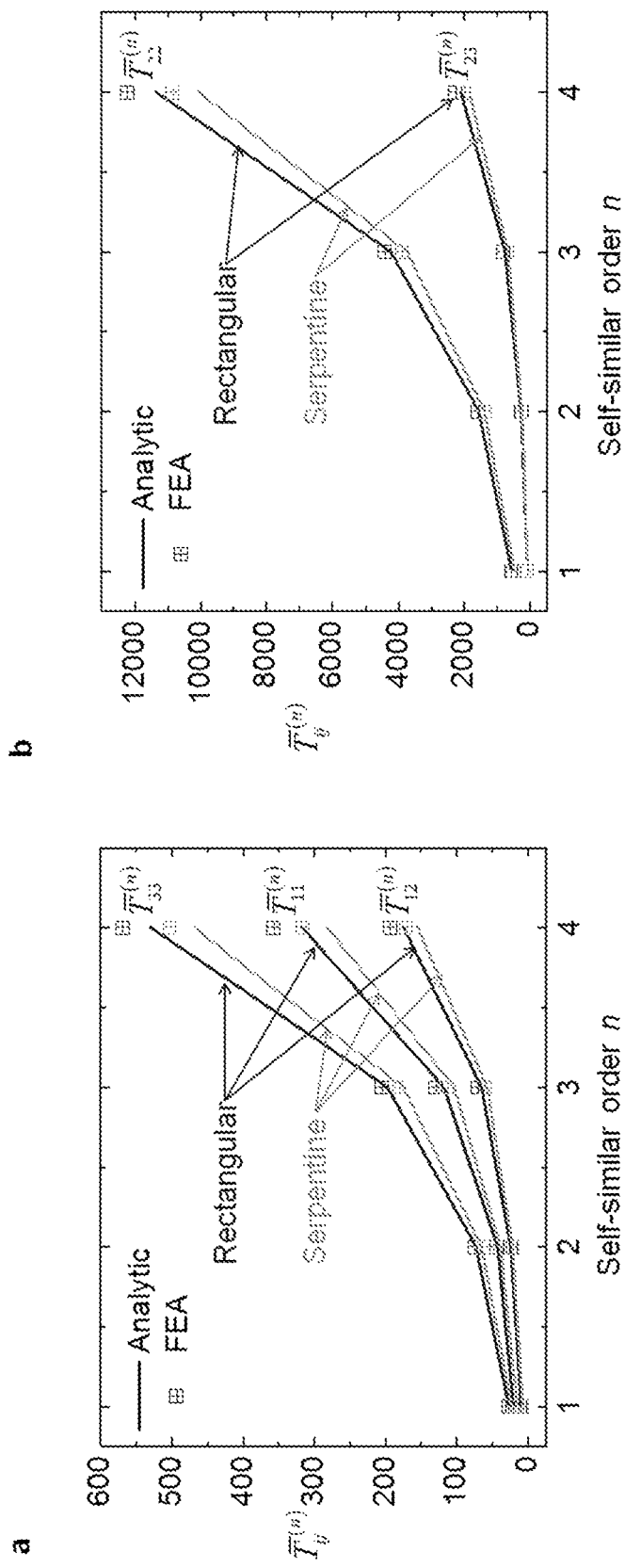
FIG. 49. The effect of self-similar order on the flexibility: The dimensionless flexibility components ($T_{11}^{(n)}$, $T_{112}^{(n)}$ and $T_{33}^{(n)}$) (a) and ($T_{22}^{(n)}$ and $T_{23}^{(n)}$) (b) versus the self-similar order. In the FEA, the width is fixed as $w=0.4l^{(1)}$ for the structures of different orders.

FIGS. 49a and 49b show the components of non-dimensional flexibility versus the order (n) for self-similar rectangular and serpentine interconnects for the height/spacing ratio $\eta=8/\sqrt{11}$ and number of unit cell m=4. The rectangular interconnect is slightly softer than the serpentine one. The analytic results are validated by FEA, which is also shown in FIGS. 49a and 49b, for copper interconnect with the elastic modulus $E_{Cu}=119$ GPa and Poisson's ratio $v_{Cu}=0.34$. The component $\overline{T}_{13}$ is always zero, and is therefore not shown. The other five flexibility components all increase with n, and are more than doubled for each n increasing by 1. For n from 1 to 4, these components increase by more than 17 times, indicating that the higher-order interconnect becomes much softer than the lower-order one.

4. Stretchability

The interconnect usually spans the space between two rigid device islands (e.g., in FIG. 45a), corresponding to clamped boundary conditions at the two ends. For stretching $u_0$ of the self-similar interconnect (with n orders), the boundary conditions are $u=u_0$, $v=0$ and $\theta=0$, and Eq. (13) then gives the reaction forces, N and Q, and bending moment M as $$\begin{Bmatrix} N \\ Q \\ M \end{Bmatrix} = \frac{EI}{[l^{(n)}]^3 \overline{T}_{11}^{(n)} \overline{T}_{22}^{(n)} \overline{T}_{33}^{(n)} - \overline{T}_{11}^{(n)}[\overline{T}_{23}^{(n)}]^2 - \overline{T}_{33}^{(n)}[\overline{T}_{12}^{(n)}]^2} \begin{Bmatrix} \overline{T}_{22}^{(n)} \overline{T}_{33}^{(n)} - [\overline{T}_{23}^{(n)}]^2 \\ \overline{T}_{12}^{(n)} \overline{T}_{33}^{(n)} l^{(n)} \overline{T}_{12}^{(n)} \overline{T}_{23}^{(n)} \end{Bmatrix}$$ (33)

since $\overline{T}_{13}^{(n)}=0$. The maximum strains for the rectangular and serpentine configurations are analyzed separately in Section 4.1 and 4.2. Since no experiment result is available regarding the stretchability of relative thick self-similar rectangular or serpentine interconnects, we only compare the analytic results to the FEA results for validation. The experiment measurement of the stretchability and comparison to analytic results will be considered in our future work.

4.1. Generalized Self-Similar Rectangular Interconnects

Figure 66:
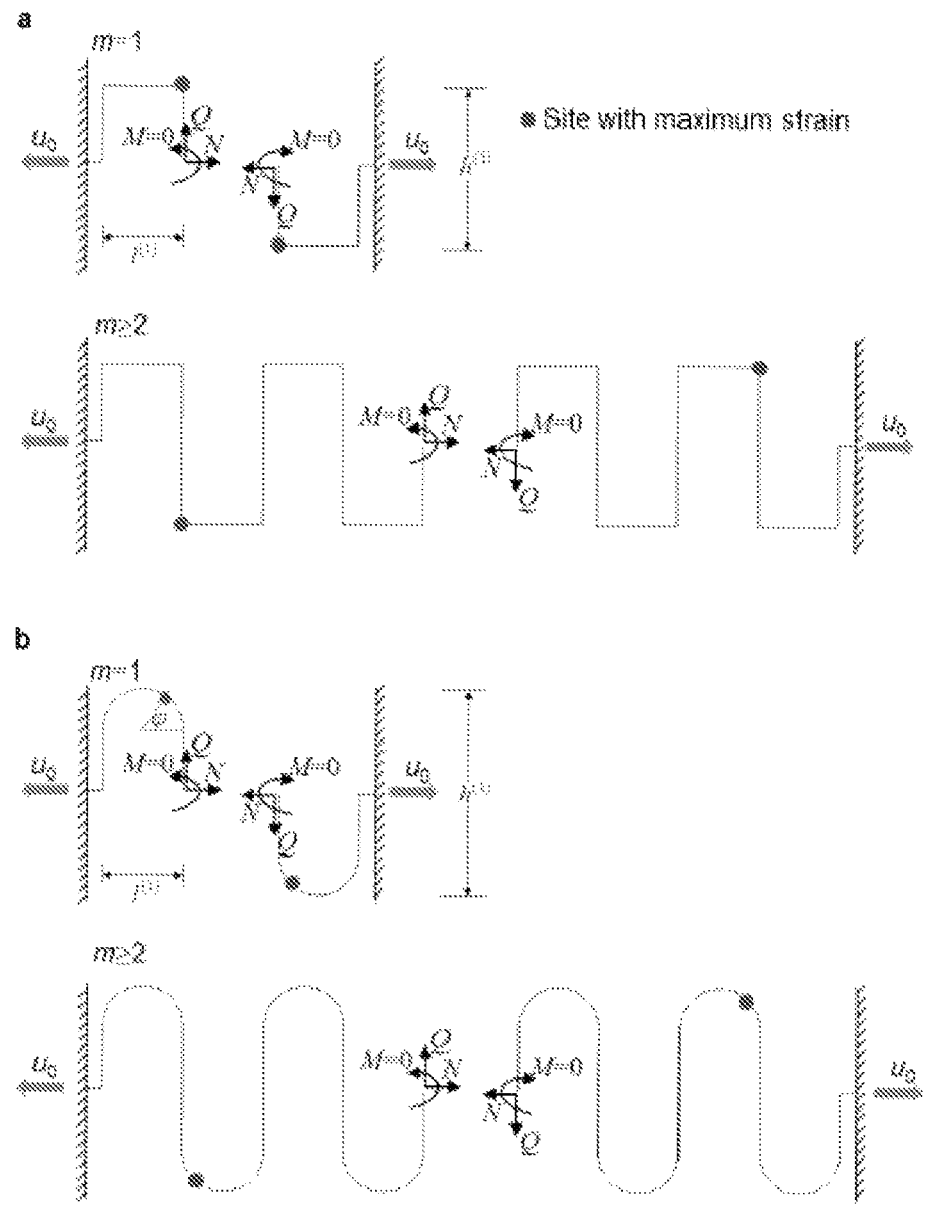
FIG. 66. The free body diagram of the 1st order rectangular (a) and serpentine (b) interconnect, after separating the structure at the center. The interconnects are clamped at two ends, and subjected to a displacement loading. The red sites in the figure schematically illustrate the position of maximum strain.

For the 1$^{st}$ order rectangular interconnect, it can be shown that the maximum strain occurs at the third nearest corners from the loading points, as illustrated in FIG. 66a, which is well supported by FEA results. The maximum strain in the interconnect can be then obtained accurately as $$\varepsilon_{max} = \frac{w[2M+Nh^{(1)}+2Ql^{(1)}]}{4EI}.$$ (34a)

For higher order structures with $n \geq 2$, the maximum strain can be well approximated by $$\varepsilon_{max} \approx \frac{w[2M+Nh^{(n)}+2Ql^{(n)}-Qh^{(n-1)}]}{4EI}$$ (34b)

(for $n \geq 2$).

Based on the yield criterion $\varepsilon_{max}=\varepsilon_{yield}$, where $\varepsilon_{yield}$ is the yield strain of the interconnect material (e.g., 0.3% for copper [35]), the stretchability of the generalized self-similar rectangular interconnect is obtained as $$\varepsilon_{stretchability}^{(1)} = \frac{\varepsilon_{yield} l^{(1)}}{w} \frac{\eta^{(1)}}{12} \frac{16[m^{(1)}]^2[\eta^{(1)}+1][\eta^{(1)}+3]-[\eta^{(1)}+6]^2}{4[m^{(1)}]^2[\eta^{(1)}+1]+3m^{(1)}[\eta^{(1)}+2]-\eta^{(1)}-6},$$ (35a)

$$\varepsilon_{stretchability}^{(n)} = \frac{\varepsilon_{yield} l^{(n)}}{w} \frac{2}{m^{(n)}} \left| \frac{\overline{T}_{11}^{(n)}[\overline{T}_{23}^{(n)}]^2 + \overline{T}_{33}^{(n)}[\overline{T}_{12}^{(n)}]^2 - \overline{T}_{11}^{(n)}\overline{T}_{22}^{(n)}\overline{T}_{33}^{(n)}}{2\overline{T}_{12}^{(n)}[\overline{T}_{33}^{(n)} - \overline{T}_{23}^{(n)}] + \{[\overline{T}_{23}^{(n)}]^2 - \overline{T}_{22}^{(n)}\overline{T}_{33}^{(n)}\}\eta^{(n)} - \frac{\eta^{(n-1)}\eta^{(n)}}{2m^{(n-1)}}\overline{T}_{12}^{(n)}\overline{T}_{33}^{(n)}} \right|$$ (35b)

(for $n \geq 2$).

When the applied strain is smaller than the stretchability, the interconnect undergoes linear, reversible deformations, and no plastic deformation would accumulate, such that the interconnect would not suffer from plastic fatigue under cyclic loadings. Equations (35a) and (35b) show clearly that the stretchability is linearly proportional to $\varepsilon_{yield} l^{(n)}/w$. Therefore, in order to enhance the stretchability, it is better to adopt a metallic material with high yield strength and relative low elastic modulus to give a high yield strain, such as the nano-grained size copper, or transforming metal nanocomposites [36].

4.2. Generalized Self-Similar Serpentine Interconnects

For 1$^{st}$ order serpentine interconnect, as shown in FIG. 66b, the maximum strain always occurs at the nearest or second nearest half circle from the two ends. Let $\phi(0\leq\phi\leq\pi)$ represent the location of this half circle. The bending strain on the circle can be given by $$\varepsilon(\varphi) = \frac{w\{2M+N[h^{(1)}-l^{(1)}]+3Ql^{(1)}+l^{(1)}(N\sin\varphi-Q\cos\varphi)\}}{4EI}.$$ (36)

It reaches the maximum at $\phi=\tan^{-1}(-N/Q)$, and the maximum strain is given by $$\varepsilon_{max} = \frac{w\{2M + N[h^{(1)} - l^{(1)}] + 3Ql^{(1)} + l^{(1)}\sqrt{N^2 + Q^2}\}}{4EI}. \quad (37)$$

The stretchability of 1$^{st}$ order serpentine interconnect is then obtained as [via Eq. (33)]

$$\varepsilon_{stretchability} = \quad (38)$$

$$\frac{2\varepsilon_{yield}l^{(1)}}{m^{(1)}w} \cdot \frac{\overline{T}_{11}^{(1)}\overline{T}_{22}^{(1)}\overline{T}_{33}^{(1)} - \overline{T}_{11}^{(1)}[\overline{T}_{23}^{(1)}]^2 - \overline{T}_{33}^{(1)}[\overline{T}_{12}^{(1)}]^2}{2\overline{T}_{12}^{(1)}\overline{T}_{23}^{(1)} - 3\overline{T}_{12}^{(1)}\overline{T}_{33}^{(1)} + \{\overline{T}_{22}^{(1)}\overline{T}_{33}^{(1)} - [\overline{T}_{23}^{(1)}]^2\}}$$

$$(\eta^{(1)} - 1) + \sqrt{\{\overline{T}_{22}^{(1)}\overline{T}_{33}^{(1)} - [\overline{T}_{23}^{(1)}]^2\}^2 + [\overline{T}_{12}^{(1)}]^2[\overline{T}_{33}^{(1)}]^2}$$

Figure 50:
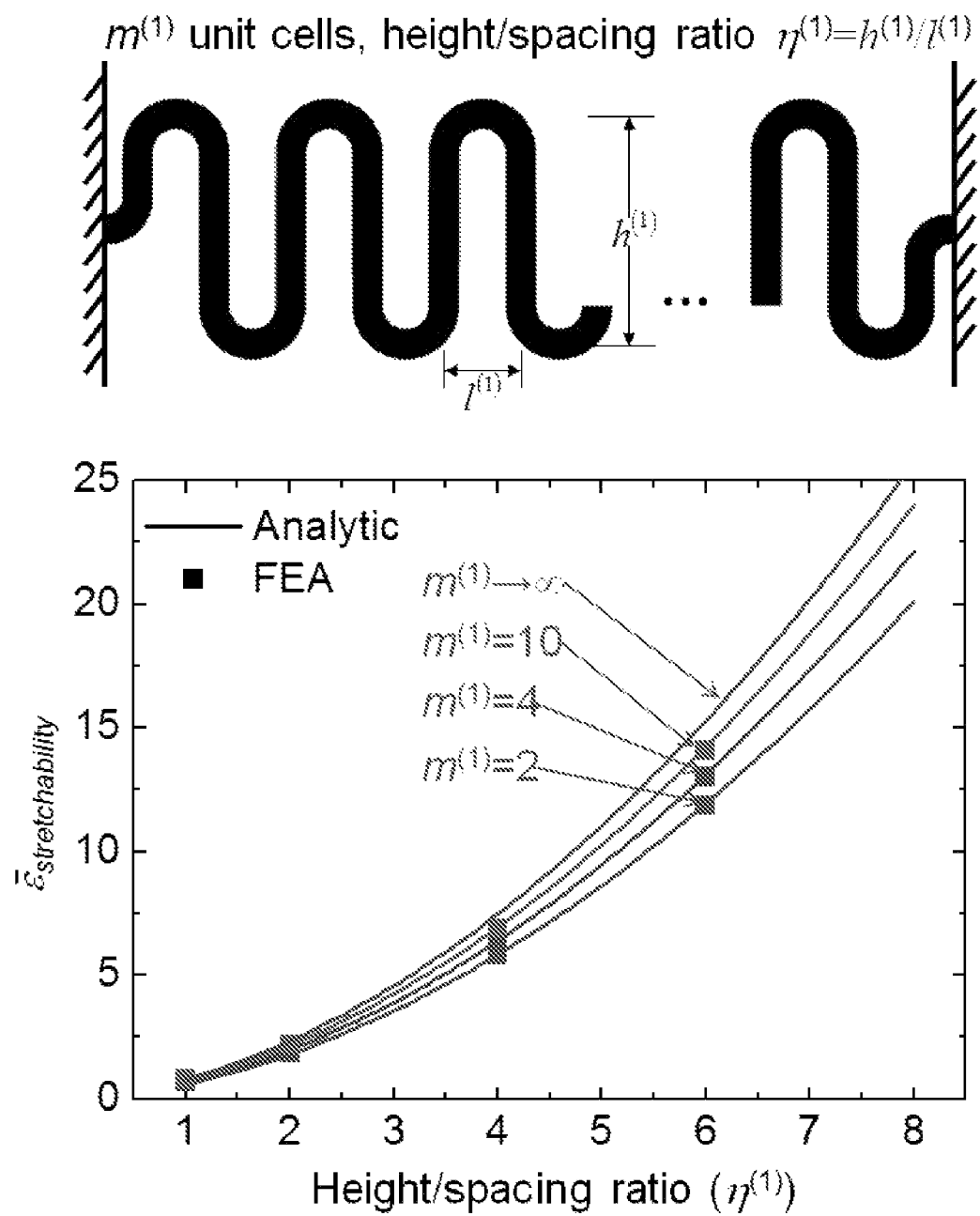
FIG. 50. The dimensionless stretchability versus the height/spacing ratio ($\eta^{(1)}$) for different number ($m^{(1)}$) of unit cells for the $1^{st}$ order serpentine interconnect.

The normalized stretchability $\varepsilon_{stretchability} \cdot w/[\varepsilon_{yield}l^{(1)}]$ depends only on the height/spacing ratio $\eta^{(1)}$ and number of unit cell $m^{(1)}$. It increases with both $\eta^{(1)}$ and $m^{(1)}$, as shown in FIG. 50, and saturates to $$\varepsilon_{stretchability} = \quad (39)$$

$$\frac{\varepsilon_{yield}l^{(1)}}{w} \cdot \frac{4[\eta^{(1)}]^3 + 6(\pi - 2)[\eta^{(1)}]^2 - 12(\pi - 3)\eta^{(1)} + 9\pi - 28}{12\eta^{(1)}}$$

for $m^{(1)} \to \infty$ (also shown in FIG. 50).

Figure 51:
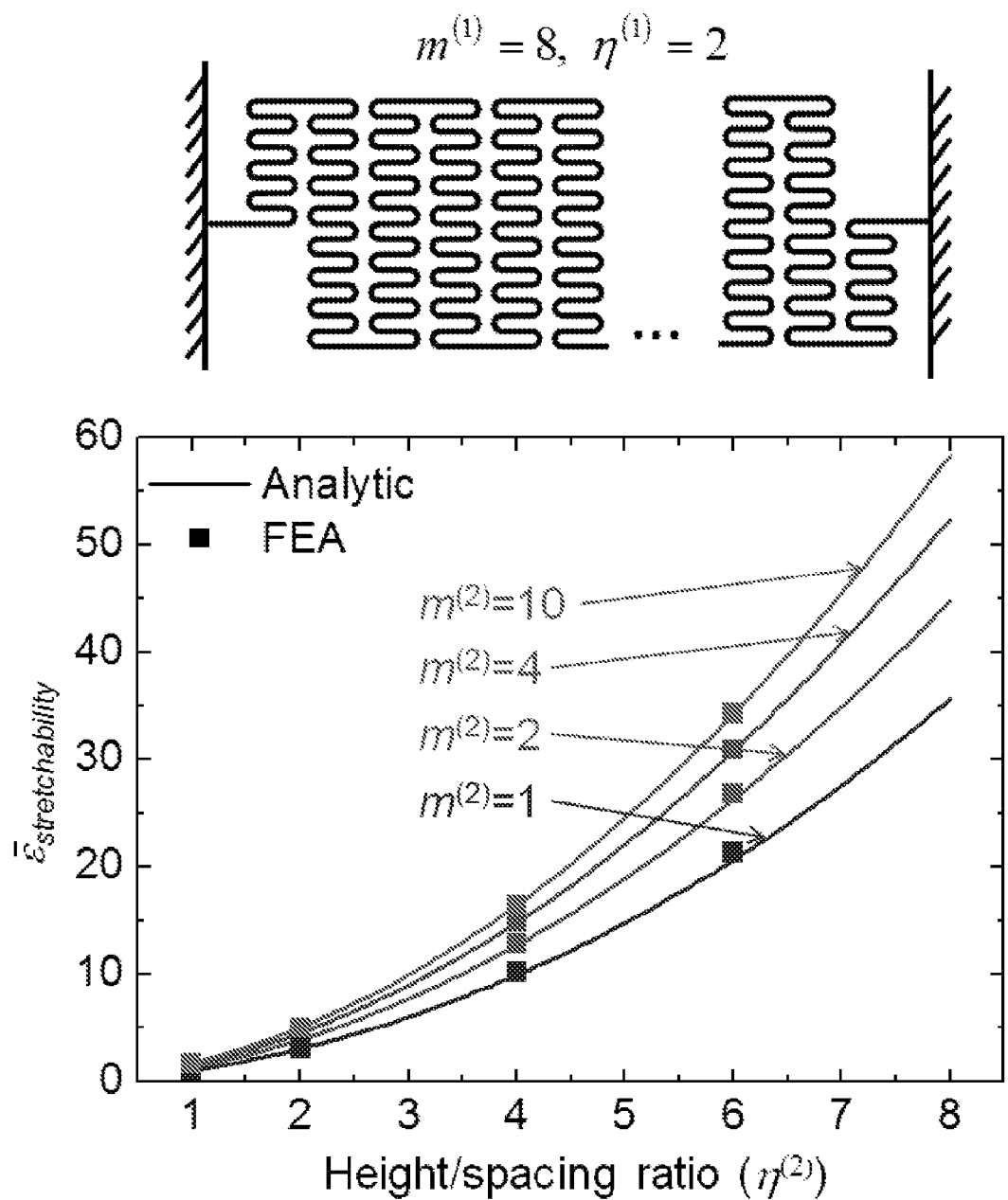
FIG. 51. The dimensionless stretchability of the $2^{nd}$ order serpentine interconnect versus the height/spacing ratio ($\eta^{(2)}$) for different number ($m^{(2)}$) of unit cells, with ($m^{(1)},\eta^{(1)}$)=(8,2).

For higher order (n≥2) serpentine interconnects, Eq. (35b), together with the corresponding flexibility matrix $\overline{T}^{(2)}$ in Eq. (32) and $T^{(n)}$ in Eq. (30) for serpentine interconnects, give an excellent approximation to the stretchability as compared to the FEA shown in FIG. 51.

Figure 52:
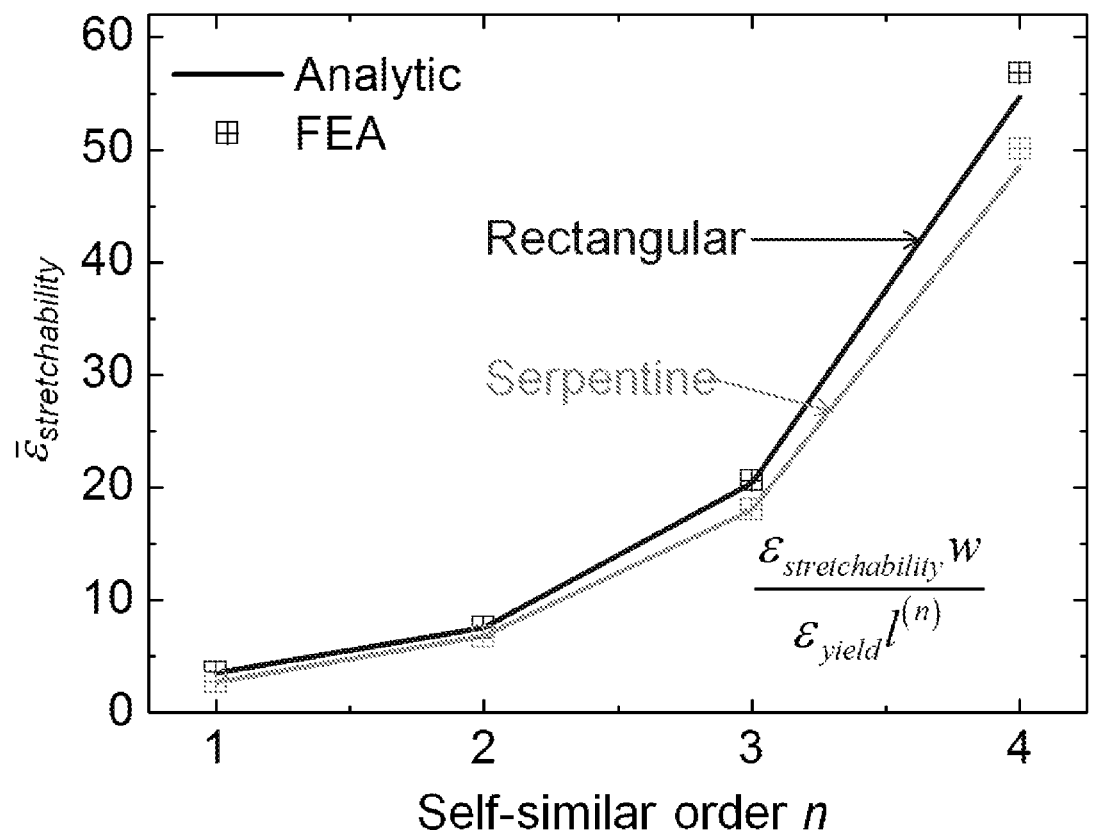
FIG. 52. The dimensionless stretchability as a function of the self-similar order. In the FEA, the width is fixed as $w=0.4l^{(1)}$ for the structures of different orders.

FIG. 52 shows the normalized stretchability, $\varepsilon_{stretchability} w/[\varepsilon_{yield}l^{(n)}]$, versus the order n for self-similar rectangular and serpentine interconnects, where the height/spacing ratio $\eta=8/\sqrt{11}$ and number of unit cell $m=4$ at different orders. The stretchability is more than doubled for each n increasing by 1, indicating the elastic limit of the interconnect can be well improved by adopting higher order self-similar design. FIG. 52 also shows that the analytic model agrees very well with the FEA results.

The analytic models and FEA results above are all for infinitesimal deformation. FIG. 67 shows the effect of finite deformation on stretchability (determined by FEA) is negligible for both 1$^{st}$ and 2$^{nd}$ order serpentine interconnects, with various combinations of geometric parameters. Therefore, the analytic models above give good estimations of the stretchability. In real fabrications, the microscale self-similar serpentine interconnect may have imperfections due to lithography defects especially along the sidewalls of the lines, and such geometric imperfections will increase for decreased pattern size (i.e., metal width and rounding radius) that may occur when increasing the self similar order. These geometric imperfections are not accounted for in the present study.

5. Optimal Design of Self-Similar Serpentine Interconnects for Stretchable Electronics Two competing goals of stretchable electronics [19,37] are 1) high surface filling ratio of active devices, which requires small spacing between the device islands (FIG. 53a); and 2) large stretchability of the system, which demands large spacing between the device islands. Prior approaches based on buckling of straight or conventional serpentine interconnects achieve ~100% stretchability [17, 18, 28, 30]. The stretchability ($\varepsilon_{stretchability}^{system}$) of the system is related to that ($\varepsilon_{stretchability}^{interconnect}$) of the interconnect by $$\varepsilon_{stretchability}^{system} = \varepsilon_{stretchability}^{interconnect}(1-\sqrt{f}), \quad (40)$$

where f denotes the surface filling ratio. For ~50% surface filling ratio of active devices, the ~100% stretchability of the interconnect translates to ~30% stretchability of the system, which is low for some biomedical applications of stretchable electronics (to skin, heart, or elbow). The analytic models in Sections 3 and 4 can guide the design of generalized self-similar interconnect to simultaneously achieve the two competing goals above.

Figure 53:
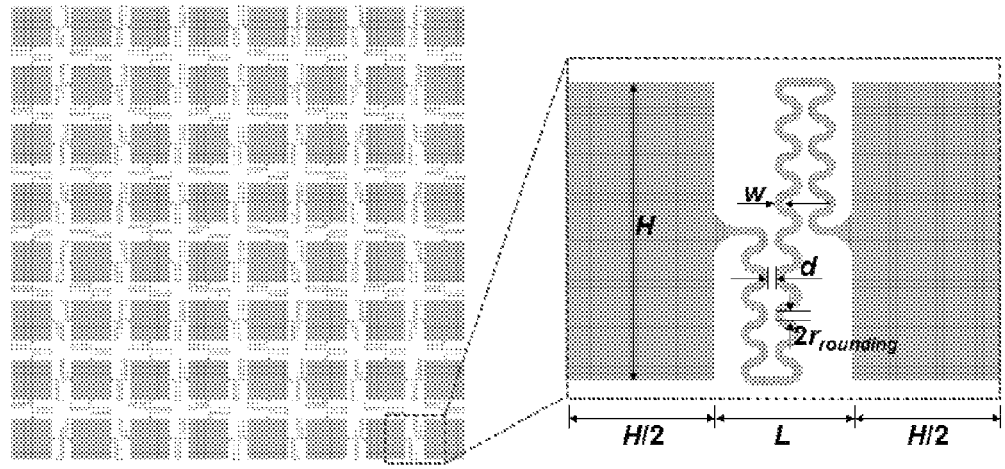
FIG. 53. Design optimization of the $2^{nd}$ order serpentine interconnects for island-bridge structure. (a) Schematic of the island-bridge structure with a 8×8 array, and illustration on the geometric parameters; (b) The maximum stretchability versus the number ($m^{(2)}$) of unit cells (left panel), and the optimized configuration (right panel).
Figure 53:
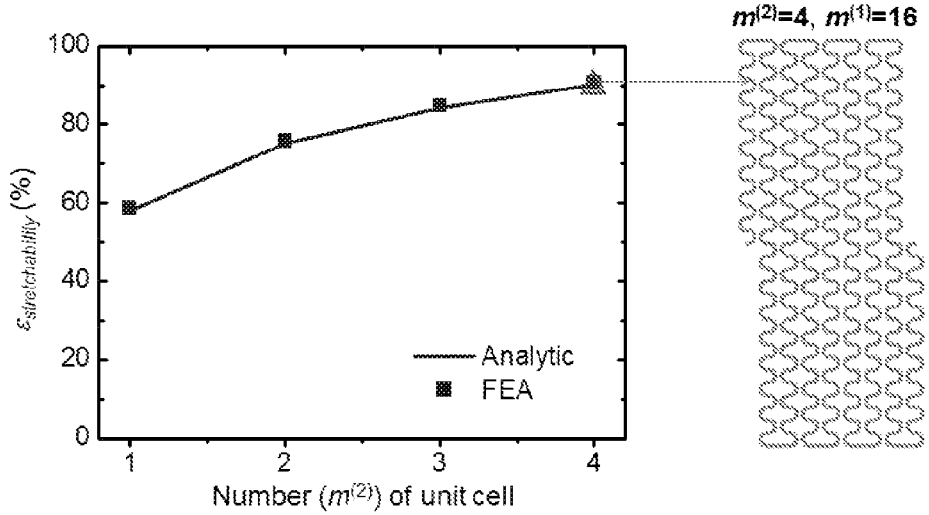

The 2$^{nd}$ order serpentine interconnects is studied to illustrate the design optimization in a square-shaped device island with a representative size H=1 mm and the surface filling ratio of 50% (FIG. 53a). The photolithography technology [38,39] for fabricating the metal interconnect poses some constraints, such as the width w≥10 μm, rounding radius $r_{rounding}$≥10 μm, and the distance between neighboring arcs d≥5 μm (FIG. 53a). Other geometric parameters are optimized to achieve large stretchability. FIG. 53b shows that the stretchability increases with the number of unit cells $m^{(2)}$. The right panel of FIG. 53b show the optimal design, which gives ~308% stretchability of the interconnect, and corresponds to ~90% stretchability of the system, outperforming the previous designs using buckled interconnects [18,28]. Even for a much larger surface filling ratio 70%, Eq. (40) still gives ~50% stretchability of the system.

6. Conclusions

This Example develops the analytic models of flexibility and stretchability for the self-similar interconnects. After the straightforward design optimization, the analytic models, validated by FEA, show that the higher-order self-similar interconnect gives very large stretchability of the system, such as ~90% for 50% surface filling ratio of active devices, or >50% stretchability for 70% surface filling ratio. The analytic models are useful for the development of stretchable electronics that simultaneously demand large areal coverage of active devices, such as stretchable photovoltaics [11] and electronic eye-ball cameras [12]. The concept of self-similar serpentine configuration can be further combined with other strategies of stretchability enhancement, e.g., the control of wrinkling patterns, to give an enhanced level of stretchability for interconnects bonded to the substrate.

REFERENCES

[1] Lacour S P, Jones J, Wagner S, Li T, and Suo Z G. Proc IEEE 2005; 93:1459.
[2] Lacour S P, Wagner S, Huang Z Y, and Suo Z. Appl Phys Lett 2003; 82:2404.
[3] Lacour S P, Wagner S, Narayan R J, Li T, and Suo Z G. J Appl Phys 2006; 100: 014913.
[4] Khang D Y, Jiang H Q, Huang Y, and Rogers J A. Science 2006; 311:208.
[5] Kim D H, Ahn J H, Choi W M, Kim H S, Kim T H, Song J Z, Huang Y G Y, Liu Z J, Lu C, and Rogers J A. Science 2008; 320:507.
[6] Sekitani T, Noguchi Y, Hata K, Fukushima T, Aida T, and Someya T. Science 2008; 321:1468.

[7] Sekitani T, Nakajima H, Maeda H, Fukushima T, Aida T, Hata K, and Someya T. Nat Mater 2009; 8:494.
[8] Kim D H, Lu N S, Ma R, Kim Y S, Kim R H, Wang S D, Wu J, Won S M, Tao H, Islam A, Yu K J, Kim T I, Chowdhury R, Ying M, Xu L Z, Li M, Chung H J, Keum H, McCormick M, Liu P, Zhang Y W, Omenetto F G, Huang Y G, Coleman T, and Rogers J A. Science 2011; 333:838.
[9] Song Y M, Xie Y Z, Malyarchuk V, Xiao J L, Jung I, Choi K J, Liu Z J, Park H, Lu C F, Kim R H, Li R, Crozier K B, Huang Y G, and Rogers J A. Nature 2013; 497:95.
[10] Duan Y Q, Huang Y A, and Yin Z P. Thin Solid Films 2013; 544:152.
[11] Yoon J, Baca A J, Park S I, Elvikis P, Geddes J B, Li L F, Kim R H, Xiao J L, Wang S D, Kim T H, Motala M J, Ahn B Y, Duoss E B, Lewis J A, Nuzzo R G, Ferreira P M, Huang Y G, Rockett A, and Rogers J A. Nat Mater 2008; 7:907.
[12] Ko H C, Stoykovich M P, Song J Z, Malyarchuk V, Choi W M, Yu C J, Geddes J B, Xiao J L, Wang S D, Huang Y G, and Rogers J A. Nature 2008; 454:748.
[13] Wagner S, Lacour S P, Jones J, Hsu P H I, Sturm J C, Li T, and Suo Z G. Physica E 2004; 25:326.
[14] Someya T, Sekitani T, Iba S, Kato Y, Kawaguchi H, and Sakurai T. P Natl Acad Sci USA 2004; 101:9966.
[15] Mannsfeld S C B, Tee B C K, Stoltenberg R M, Chen C, Barman S, Muir B V O, Sokolov A N, Reese C, and Bao Z N. Nat Mater 2010; 9:859.
[16] Saeidpourazar R, Li R, Li Y H, Sangid M D, Lu C F, Huang Y G, Rogers J A, and Ferreira P M. J Microelectromech Syst 2012; 21:1049.
[17] Kim D H, Song J Z, Choi W M, Kim H S, Kim R H, Liu Z J, Huang Y Y, Hwang K C, Zhang Y W, and Rogers J A. P Natl Acad Sci USA 2008; 105:18675.
[18] Lee J, Wu J A, Shi M X, Yoon J, Park S I, Li M, Liu Z J, Huang Y G, and Rogers J A. Adv Mater 2011; 23:986.
[19] Xu S, Zhang Y H, Cho J, Lee J, Huang X, Jia L, Fan J A, Su Y W, Su J, Zhang H G, Cheng H Y, Lu B W, Yu C J, Chuang C, Kim T I, Song T, Shigeta K, Kang S, Dagdeviren C, Petrov I, Braun P V, Huang Y, Paik U, and Rogers J A. Nat Commun 2013; 4:1543.
[20] Kim R H, Tao H, Kim T I, Zhang Y H, Kim S, Panilaitis B, Yang M M, Kim D H, Jung Y H, Kim B H, Li Y H, Huang Y G, Omenetto F G, and Rogers J A. Small 2012; 8:2812.
[21] Jones J, Lacour S P, Wagner S, and Suo Z G. J Vac Sci Technol A 2004; 22:1723.
[22] Gonzalez M, Axisa F, Bossuyt F, Hsu Y Y, Vandevelde B, and Vanfleteren J. Circuit World 2009; 35:22.
[23] Gonzalez M, Axisa F, Bulcke M V, Brosteaux D, Vandevelde B, and Vanfleteren J. Microelectron Reliab 2008; 48:825.
[24] van der Sluis O, Hsu Y Y, Timmermans P H M, Gonzalez M, and Hoefnagels J P M. J Phys D-Appl Phys 2011; 44:034008.
[25] Hsu Y Y, Gonzalez M, Bossuyt F, Axisa F, Vanfleteren J, and De Wolf I. J Mater Res 2009; 24:3573.
[26] Hsu Y Y, Gonzalez M, Bossuyt F, Axisa F, Vanfleteren J, and DeWolf I. J Micromech Microeng 2010; 20:075036.
[27] Hsu Y Y, Gonzalez M, Bossuyt F, Vanfleteren J, and De Wolf I. IEEE T Electron Dev 2011; 58:2680.
[28] Lee J, Wu J, Ryu J H, Liu Z J, Meitl M, Zhang Y W, Huang Y G, and Rogers J A. Small 2012; 8:1851.
[29] Sun Y G, Choi W M, Jiang H Q, Huang Y G Y, and Rogers J A. Nat Nanotechnol 2006; 1:201.
[30] Kim D H, Liu Z J, Kim Y S, Wu J, Song J Z, Kim H S, Huang Y G, Hwang K C, Zhang Y W, and Rogers J A. Small 2009; 5:2841.
[31] Zhang Y H, Xu S, Fu H R, Lee J, Su J, Hwang K C, Rogers J A, and Huang Y. Soft Matter 2013; 9:8062.
[32] Kim D H, Wang S D, Keum H, Ghaffari R, Kim Y S, Tao H, Panilaitis B, Li M, Kang Z, Omenetto F, Huang Y G, and Rogers J A. Small 2012; 8:3263.
[33] Su Y W, Wu J, Fan Z C, Hwang K C, Song J Z, Huang Y G, and Rogers J A. J Mech Phys Solids 2012; 60:487.
[34] Timoshenko S, and Gere J. Theory of Elastic Stability. New York: McGraw-Hill, 1961.
[35] William F R, Leroy D S, and Don H M. Mechanics of Materials. New York: Jon Wiley & Sons, 1999.
[36] Hao S J, Cui L S, Jiang D Q, Han λ D, Ren Y, Jiang J, Liu Y N, Liu Z Y, Mao S C, Wang Y D, Li Y, Ren X B, Ding X D, Wang S, Yu C, Shi X B, Du M S, Yang F, Zheng Y J, Zhang Z, Li X D, Brown D E, and Li J. Science 2013; 339:1191.
[37] Rogers J A, Someya T, and Huang Y G. Science 2010; 327:1603.
[38] Meitl M A, Zhu Z T, Kumar V, Lee K J, Feng X, Huang Y Y, Adesida I, Nuzzo R G, and Rogers J A. Nat Mater 2006; 5:33.
[39] Carlson A, Bowen A M, Huang Y G, Nuzzo R G, and Rogers J A. Adv Mater 2012; 24:5284.

Example 4

A Hierarchical Computational Model for Stretchable Interconnects with Fractal-Inspired Designs Abstract Stretchable electronics that require functional components with high areal coverages, antennas with small sizes and/or electrodes with invisibility under magnetic resonance imaging can benefit from the use of electrical wiring constructs that adopt fractal inspired layouts. Due to the complex and diverse microstructures inherent in high order interconnects/electrodes/antennas with such designs, traditional non-linear postbuckling analyses based on conventional finite element analyses (FEA) can be cumbersome and time-consuming. Here, we introduce a hierarchical computational model (HCM) based on the mechanism of ordered unraveling for postbuckling analysis of fractal inspired interconnects, in designs previously referred to as 'self-similar', under stretching. The model reduces the computational efforts of traditional approaches by many orders of magnitude, but with accurate predictions, as validated by experiments and FEA. As the fractal order increases from 1 to 4, the elastic stretchability can be enhanced by ~200 times, clearly illustrating the advantage of simple concepts in fractal design. These results, and the model in general, can be exploited in the development of optimal designs in wide ranging classes of stretchable electronics systems.

1. Introduction

Recent advances in mechanics and materials for stretchable/flexible electronics (Lacour et al., 2005; Khang et al., 2006; Lacour et al., 2006; Jiang et al., 2007; Jiang et al., 2008; Sekitani et al., 2009; Rogers et al., 2010; Huang et al., 2012; Yang and Lu, 2013; Duan et al., 2014) and optoelectronics (Kim et al., 2010; Lee et al., 2011a; Lipomi et al., 2011; Nelson et al., 2011) demonstrate that systems with high-performance semiconductor functionality can be realized in forms that allow extreme mechanical deformations, e.g., stretching like a rubber band, twisting like a rope, and bending like a sheet of paper. This class of technology creates many application opportunities that cannot be addressed with established technologies, ranging from "epidermal" health/wellness monitors (Kim et al., 2011 b; Kaltenbrunner et al., 2013; Schwartz et al., 2013), to soft surgical instruments (Cotton et al., 2009; Yu et al., 2009; Viventi et al., 2010; Graudejus et al., 2012; Kim et al., 2012b), to eyeball-like digital cameras (Ko et al., 2008; Song et al., 2013), to sensitive robotic skins (Someya et al., 2004; Wagner et al., 2004; Mannsfeld et al., 2010; Lu et al., 2012). Many of these stretchable systems exploit a strategy, sometimes known as the island-bridge design (Kim et al., 2008; Ko et al., 2008; Kim et al., 2009; Kim et al., 2011b; Lee et al., 2011b), in which the active devices reside on non-deformable platforms (i.e. islands) with deformable interconnects (i.e. bridges) in between. These bridges provide stretchability, while the islands undergo negligible deformation (usually <1% strain) to ensure mechanical integrity of the active devices (Kim et al., 2008; Song et al., 2009). The stretchability of a system with a certain filling ratio of islands can be written by $$\text{stretchability of the system} = (1 - \sqrt{\text{fillingratio}}) \ast (\text{stretchability of the interconnect}). \quad (1)$$

Various types of interconnect technologies have been developed, typically involving planar serpentines (Jones et al., 2004; Lacour et al., 2005; Li et al., 2005; Gonzalez et al., 2008; Kim et al., 2008; Hsu et al., 2009; Kim et al., 2011 b; Kim et al., 2012c; Zhang et al., 2013c) or non-coplanar serpentines or straight bridges (Kim et al., 2008; Ko et al., 2008; Lee et al., 2011 b). In many published examples, such interconnects offer total stretchability <50% (defined by onset of cracks) and elastic stretchability <25% (defined by onset of plastic deformation), in systems that do not significantly sacrifice the filling ratio. Many applications, particularly those in optoelectronics (Ko et al., 2008; Kim et al., 2010) and energy storage systems (Lipomi et al., 2011; Xu et al., 2013), also require high filling ratios. Here, advanced interconnects are needed.

Recently, Xu et al. (2013) reported a design based on a type of space-filling curve that incorporates serpentine patterns in simple fractal-inspired layouts (shown in FIG. 54a), to address the aforementioned challenges. The hierarchical structures with fractal inspired layouts have been shown to exist in many biological systems (Gao et al., 2005; Yao and Gao, 2006; Yao and Gao, 2007; Zhang et al., 2011; Li et al., 2012; Zhang et al., 2012; Li et al., 2013), which could enhance or even control the surface adhesions, stiffness and material strengths. This technology, referred to initially as a 'self-similar' design (Xu et al., 2013), enables stretchable lithium-ion batteries with total stretchability and elastic stretchability of ~300% and ~160%, respectively, and a filling ratio of ~33%. The underlying mechanisms responsible for this favorable mechanics were studied by both experiments and finite element analyses (FEA), as shown in FIG. 54b. The results reveal a mechanism of ordered unraveling. Specifically, with the stretching proceeds from 0% to ~150%, the $2^{nd}$ order structure (i.e., the large spring) first unravels via out-of-plane bending and twisting through buckling, during which there is essentially no deformation in the $1^{st}$ order structure (i.e., the small spring) (see top 4 images, FIG. 54b). The unraveling of the $1^{st}$ order structure only starts as the $2^{nd}$ order structure is fully extended, corresponding to an applied strain of ~150%. Additional, large stretchability (~300%) is then achieved when the $1^{st}$ order structure is stretched to nearly its maximum extent (see bottom 3 images, FIG. 54b). Only the active materials are bonded to the soft substrate in this battery design such that the interconnects can deform freely. For some biomedical applications (Kim et al., 2011b; Kim et al., 2012c), the serpentine interconnects are either bonded to or encapsulated in the soft substrate, and the resulting deformation mechanism may be quite different from the free standing interconnects (Zhang et al., 2013b), but such aspects are beyond the scope of the present Example.

The filling ratio of active devices in the island-bridge design shown in FIG. 54a is 33%. The elastic stretchability (~150%) is reduced to 22% and 4.3% for filling ratios of 90% and 98%, respectively. These levels of elastic stretchability fall short of some biomedical applications, such as those in skin-mounted electronics (Kim et al., 2011b; Ying et al., 2012; Webb et al., 2013) and inflatable catheter technology (Kim et al., 2011a; Kim et al., 2012a), in which the strains (e.g., skin, heart, or elbow) may well exceed 20%. The most viable solution is to increase the fractal order, from 2 in FIG. 54a to 3 and 4 in FIG. 55 or even higher. For the fractal order of 4, however, the conventional FEA approach becomes prohibitively time-consuming because of the large number of elements (>1 million) and the highly nonlinear postbuckling analysis. Such a computational approach is impractical for rapid device design and optimization.

Figure 54:
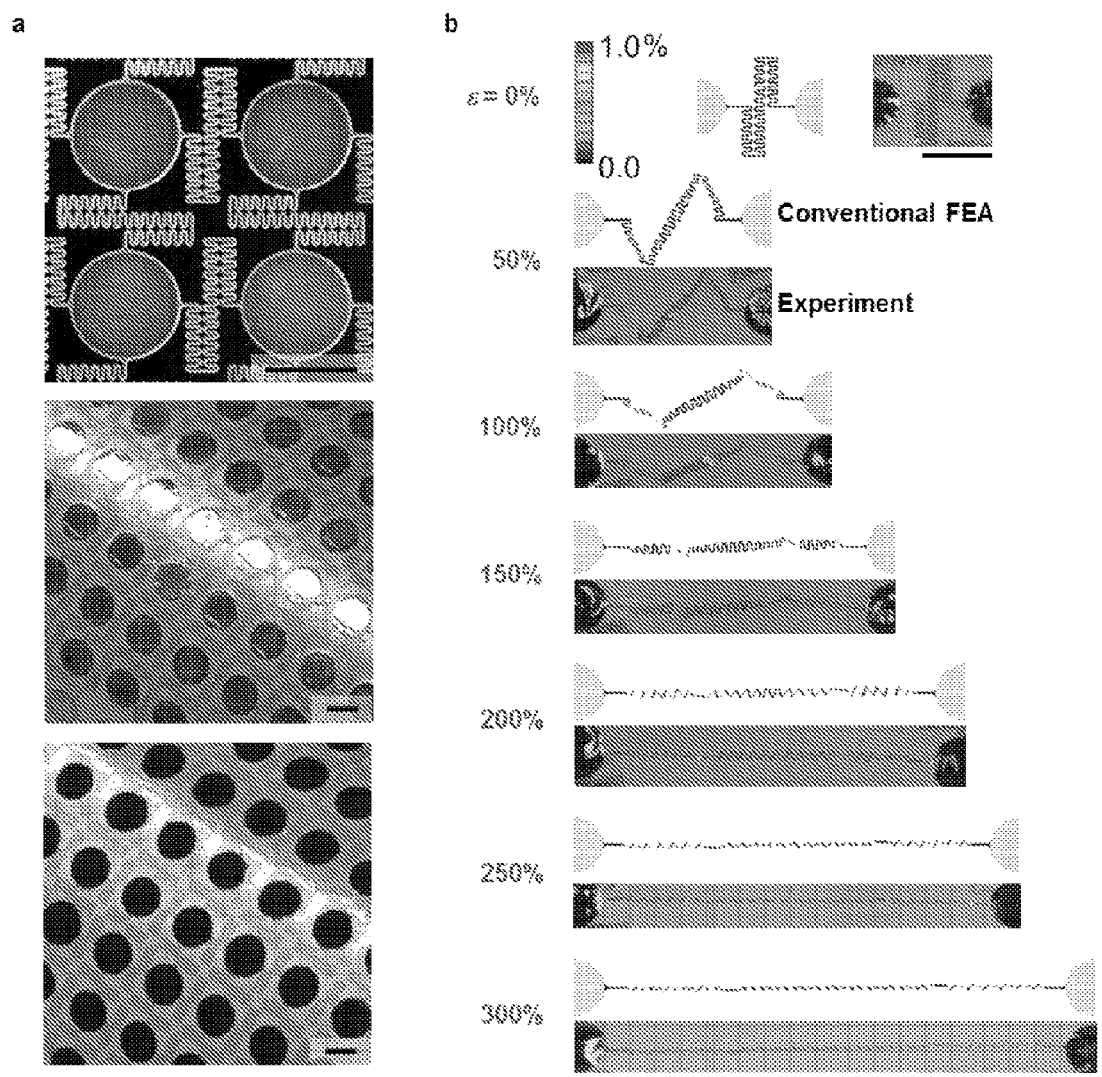
FIG. 54. (a) Optical images of electrode pads and fractal inspired interconnects on a silicon wafer (top panel; top down view; ~4 unit cells), after transfer printing on a sheet of silicone (middle panel; oblique view, in a bent geometry), and with moulded slurries of $LiCoO_2$ (bottom panel; oblique view, in a bent geometry), for a stretchable Li-ion battery; (b) Optical images and corresponding conventional FEA results of symmetric deformation modes, for various levels of applied tensile strain $\in$. The scale bars in (a) and (b) are 2 mm. (a) and (b) are reprinted with permission from Xu et al. (2013), Copyright 2013, Nature Publishing Group.
Figure 56:
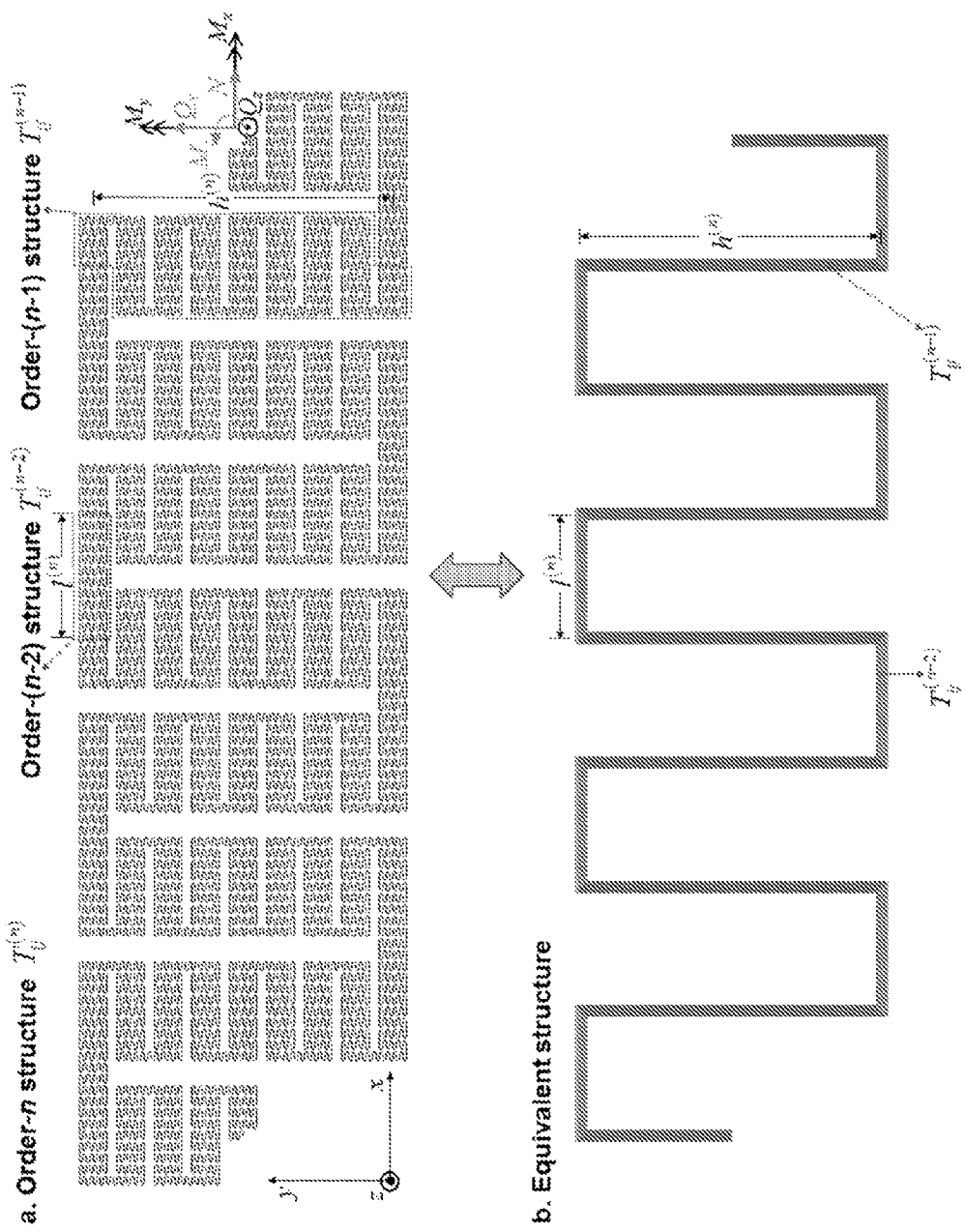
FIG. 56. Schematic illustration of the equivalent structure for a fractal inspired interconnect. (a) An order-n fractal interconnect composed of vertically aligned order-(n−1) interconnects, and horizontally aligned order-(n−2) interconnects; (b) Equivalent structure consisting of only straight beams.

The aim of the present Example is to develop an effective and robust hierarchical computational model (HCM), based on the mechanism of ordered unraveling illustrated in FIG. 54, for postbuckling analysis of serpentine interconnects with fractal inspired layouts (referred to as "fractal interconnects" in the following). For an order-n fractal interconnect under stretching, the lower order structures ($\leq$n-1) initially do not unravel, and are only bent and twisted. As a result, these lower order structures can be modeled as straight beams with effective tension, bending and torsion flexibilities, as illustrated in FIG. 56. Once the highest ($n^{th}$) order structure is fully stretched, unraveling of $(n-1)^{th}$ order structure starts, but the $(n-2)^{th}$ and lower order structures still do not unravel and can be modeled as beams. This process continues until the $1^{st}$ order structure unravels and the total stretchability is finally reached. Such an approach substantially saves computational effort because, at each order, only bending and twisting of straight beams is involved. This simplification enables simulations of high order (up to 4 as we demonstrated herein) fractal interconnects, which would be quite difficult by using the conventional FEA. This set of calculations not only illustrates the significant effect of fractal order on stretchability, but also provides reference for design using high-order fractal interconnects. The Example is outlined as follows. Section 2 determines the equivalent flexibilities for any order (n$\geq$2) of fractal interconnect. Section 3 describes the HCM for ordered unraveling of the postbuckling process. Section 4 applies the HCM to study the effect of fractal order on the elastic stretchability. Generalized fractal interconnects are studied in Section 5, and the results are validated by experiments and conventional FEA.

2. Equivalent Flexibilities of Fractal Interconnects 2.1 Geometry

Figure 55:
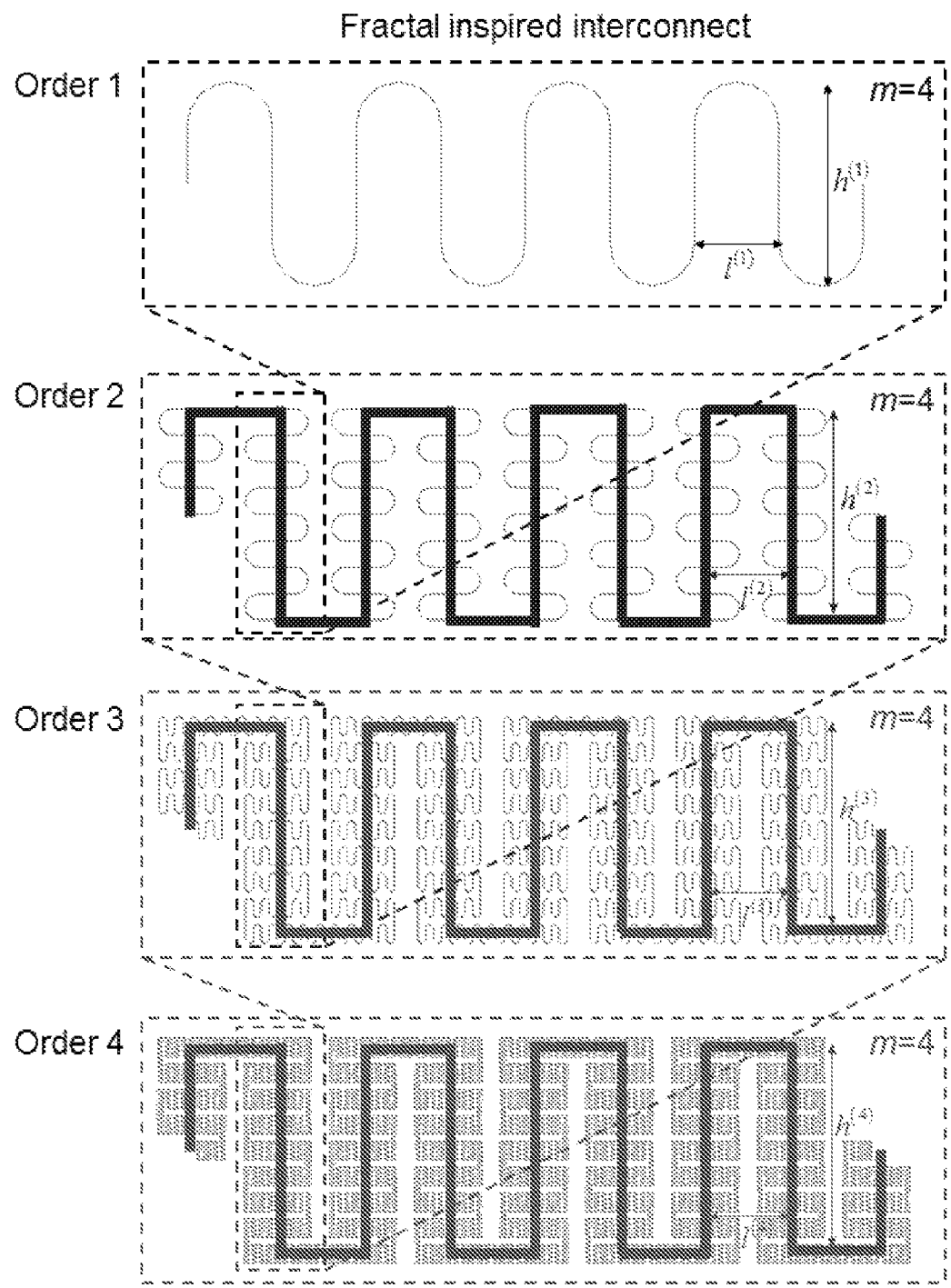
FIG. 55. Schematic illustration of the geometric construction of a fractal inspired interconnect.

The $1^{st}$ order interconnect consists of straight wires and half circles that are connected in series, as shown in the black box of FIG. 55, which has 4 unit cells in this example. The $2^{nd}$ order interconnect, shown in the blue box of FIG. 55, is created by reducing the scale of the $1^{st}$ order interconnects, followed by 90° rotation, and then connecting them in a fashion that reproduces the layout of the original geometry. The wide blue line in FIG. 55 represents the $2^{nd}$ order geometry that is similar to the $1^{st}$ order geometry (except for the rounded part). By implementing the same procedure, we can generate the $3^{rd}$ and $4^{th}$ order interconnects, as illustrated in the red and purple boxes of FIG. 55, where the red and purple lines denote the $3^{rd}$ and $4^{th}$ order geometries, respectively. It is clear that the $2^{nd}$ to $4^{th}$ (and higher) order geometries all exhibit the same rectangular shape, and have the same number of unit cells, which indicates that, strictly speaking, the fractal only starts at the $2^{nd}$ order.

Let $\eta$ denote the height/spacing aspect ratio at each order such that the height $h^{(i)}$ is related to the spacing $l^{(i)}$ of the $i^{th}$ (i=1 ... n) order (FIG. 55) by $h^{(i)} = \eta l^{(i)}$. The height $h^{(i)}$ is also related to the spacing $l^{(i-1)}$ of the neighboring order by the number of unit cells m (FIG. 55) as $h^{(i)} = 2 m l^{(i-1)}$ (i=2 ... n). The spacing and height at any order i are then scaled with the spacing of the highest order $l^{(n)}$ by $$l^{(i)} = \left(\frac{\eta}{2m}\right)^{n-i} l^{(n)}, h^{(i)} = \eta\left(\frac{\eta}{2m}\right)^{n-i} l^{(n)}, \quad (2)$$
$$(i = 1 \ldots n).$$

The result shows that a fractal interconnect is characterized by one base length ($l^{(n)}$) and three non-dimensional parameters, namely the fractal order (n), the height/spacing ratio ($\eta$) and number (m) of unit cell.

2.2. Equivalent Flexibilities

A fractal interconnect can be modeled as a beam if its width (w) and thickness (t) are much smaller than the length. FIG. 56a shows an $n^{th}$ order fractal interconnect clamped at the left end, and subject to forces and bending moments at the right end. The axial force N, in-plane shear force $Q_y$ and bending moment $M_z$ at the right end induce the in-plane deformation represented by the displacements $u_x$ and $u_y$ and rotation $\theta_z$ at the end, while the out-of-plane shear force $Q_z$ and bending moment $M_y$, and torque $M_x$ at the right end generate the out-of-plane displacement $u_z$ and rotations $\theta_x$ and $\theta_y$ at the end. The normalized displacements, rotations, forces, bending moments and torques are related by $$\begin{pmatrix} u_x/l^{(n)} \\ u_y/l^{(n)} \\ \theta_z \end{pmatrix} = T_{in\text{-}plane}^{(n)} \begin{pmatrix} N[l^{(n)}]^2/(EI)_{in\text{-}plane} \\ Q_y[l^{(n)}]^2/(EI)_{in\text{-}plane} \\ M_z l^{(n)}/(EI)_{in\text{-}plane} \end{pmatrix}, \quad (3a)$$

$$\begin{pmatrix} u_z/l^{(n)} \\ \theta_y \\ \theta_x \end{pmatrix} = T_{out\text{-}of\text{-}plane}^{(n)} \begin{pmatrix} Q_z[l^{(n)}]^2/(EI)_{out\text{-}of\text{-}plane} \\ M_y l^{(n)}/(EI)_{out\text{-}of\text{-}plane} \\ M_x l^{(n)}/(EI)_{out\text{-}of\text{-}plane} \end{pmatrix}, \quad (3b)$$

where $(EI)_{in\text{-}plane} = Ew^3 t/12$ and $(EI)_{out\text{-}of\text{-}plane} = Ewt^3/12$ are the in-plane and out-of-plane bending stiffness, respectively, and $T_{in\text{-}plane}^{(n)}$ and $T_{out\text{-}of\text{-}plane}^{(n)}$ are the normalized elastic flexibility matrices that can be obtained analytically (see Appendix). For example, the in-plane flexibility matrix for the $1^{st}$ order fractal interconnect is $$T_{in\text{-}plane}^{(1)}(m, \eta) = \quad (4a)$$

$$\left\{\begin{matrix} \frac{m}{24}\left(4g^3 + 6\pi g^2 + 24g + 3\pi\right) & & Sym \\ \frac{m}{4}(g^2 + \pi g + 2) & \frac{4m^3}{3}(2g + \pi) + \frac{m}{24}(8g + \pi) & \\ 0 & 2m^2(g + \pi) & m(2g + \pi) \end{matrix}\right\},$$

where Sym denotes the symmetric matrix, and $g = \eta - 1$. The out-of-plane flexibility matrix for the $1^{st}$ order fractal interconnect is $$T_{out\text{-}of\text{-}plane}^{(1)}(m, \eta) = \quad (4b)$$

$$\left\{\begin{matrix} \frac{4m^3}{3}k + \frac{m}{48}\begin{bmatrix} 4k(3g^2+8) - \\ 4(1+3v)g^3 - \\ 3(7+v)\pi \end{bmatrix} & & Sym \\ -m^2 k & mk & \\ 0 & 0 & m[k+(1-v)g] \end{matrix}\right\},$$

where v is the Poisson's ratio, and $k = [4(1+v)g + (3+v)\pi]/4$. For the $2^{nd}$ order fractal interconnect, the in-plane flexibility matrix is $$T_{in\text{-}plane}^{(2)}(m, \eta) = \quad (5a)$$

$$\left\{\begin{matrix} \frac{m}{4}\eta^2(4-p) + \frac{\eta^3}{4m^2}T_{in\text{-}plane,22}^{(1)} & & Sym \\ \frac{m}{8}\eta(p+2) & \frac{4m^3}{3}p + \frac{m}{6}(p-2) + \frac{\eta^3}{4m^2}T_{in\text{-}plane,11}^{(1)} & \\ 0 & m^2 p & mp \end{matrix}\right\},$$

where $p = 2\eta^2 + (\pi-2)\eta + 2$, $T_{in\text{-}plane,11}^{(1)}$ and $T_{in\text{-}plane,22}^{(1)}$ are the 11 and 22 components in Eq. (4a), corresponding to the tensile and in-plane shear flexibilities, respectively. The out-of-plane flexibility matrix for the $2^{nd}$ order fractal interconnect is $$T_{out\text{-}of\text{-}plane}^{(2)}(m, \eta) = \quad (4b)$$

$$\left\{\begin{matrix} T_{out\text{-}of\text{-}plane,11}^{(2)} & & Sym \\ -m^2\left(p - \frac{1-v}{4}\pi\eta\right) & m\left(p - \frac{1-v}{4}\pi\eta\right) & \\ 0 & 0 & m\left(\frac{1+v}{2}p + \frac{1-v}{4}\pi\eta\right) \end{matrix}\right\},$$

where $T_{out\text{-}of\text{-}plane,11}^{(2)}$ is given in Appendix. For the higher order (n≥3) fractal interconnects, $T_{in\text{-}plane}^{(n)}$ and $T_{out\text{-}of\text{-}plane}^{(n)}$ are obtained in a recursive formula via the flexibility matrices for the $(n-1)^{th}$ and $(n-2)^{th}$ order (see Appendix).

The flexibilities obtained from Eqs. (4) and (5) and the recursive formula in the Appendix increase with the fractal order. For example, the tensile component $T_{in\text{-}plane,11}^{(n)}$ (m=4, $\eta=8/\sqrt{11}$) increases from 15.4 for n=1, to 40.1 for n=2, and to 105 for n=3, i.e., by a factor of 2.6 for each increase of fractal order. Considering that the length $l^{(n)}$ also increases with n, the corresponding tensile flexibility (without normalization) increases much more rapidly with the fractal order. For $(EI)_{in-plane}=7.44\times10^{-10}$ N·m² and $l^{(1)}=110$ µm as in the experiments (Xu et al., 2013), the tensile flexibility increases from 0.0276 m/N for n=1, to 2.62 m/N for n=2, and to 250 m/N for n=3, i.e., increasing by ~100 times for each order increase. The fact that the flexibilities increase very rapidly with the fractal order will play a critical role in the development of the HCM in Section 3.

3. The Hierarchical Computational Model for Ordered Unraveling of Fractal Interconnects As shown in FIG. 56a for 4 unit cells (m=4), an $n^{th}$ order fractal interconnect is composed of $(n-1)^{th}$ order interconnects oriented along vertical (y) direction, and $(n-2)^{th}$ order interconnects oriented along horizontal (x) direction. Before unraveling of any lower order interconnects, the $(n-1)^{th}$ and $(n-2)^{th}$ order interconnects are modeled as the straight beams (in blue and orange colors, respectively, in FIG. 56b) with the equivalent flexibilities $T^{(n-1)}$ and $T^{(n-2)}$ obtained in Section 2. As shown in the following sections, such an approach gives accurate results, but the computation at each order is very simple since it involves only straight beams.

Figure 57:
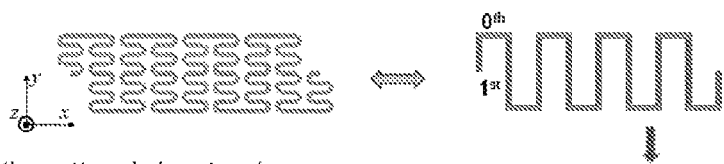
FIG. 57. Illustration of the hierarchal computational model (HCM) for a $2^{nd}$ order fractal interconnect. (a) Stage I—unraveling the $2^{nd}$ order structure, in which the entire interconnect is modeled by an equivalent structure of straight beams; (b) Stage II—unraveling each $1^{st}$ order structure, studied using the original geometry of the structure.
Figure 57:
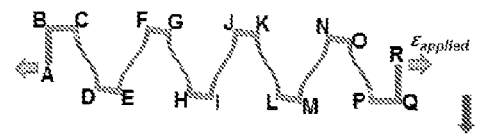
Figure 57:
Figure 57:
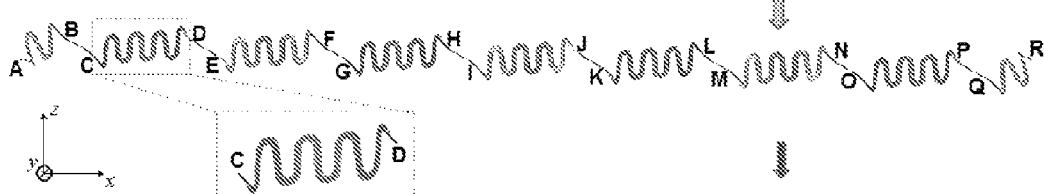
Figure 57:

The $2^{nd}$ order fractal interconnect shown in FIG. 57 is used as an example to illustrate the approach. The postbuckling process can be classified into two stages.

(i) Stage I: Unraveling of the $2^{nd}$ order fractal interconnect as shown in FIG. 57a. The vertical, $1^{st}$ order fractal interconnects are represented by straight beams (blue color in FIG. 57a) with the flexibilities given in Eq. (4). (The horizontal segments, denoted by the brown color in FIG. 57a, are already straight beams.) FEA is used for this equivalent structure of straight beams to determine the overall configuration under stretching. Stage I is complete when the equivalent structure of straight beams is fully unraveled, i.e., the distance between the two ends reaches the total length of all straight beams. The applied strain, $\epsilon_{applied}$, defined by the percentage increase of the distance between the two ends, reaches the critical value ($\epsilon_{cr(I)}^{(2)}$) for a $2^{nd}$ order fractal interconnect at the end of stage I, $$\varepsilon_{cr(I)}^{(2)} = \frac{m(2h^{(2)}+2l^{(2)})}{2\,ml^{(2)}}-1=\eta. \quad (6)$$

The initially vertical $1^{st}$ order fractal interconnects (blue color) become approximately horizontal (FIG. 4a) at the end of stage I. Their deformations are essentially the same due to the periodicity of unit cells such that the analysis in stage II can focus on unraveling of a single $1^{st}$ order fractal interconnect, as discussed in the following.

(ii) Stage II: Unraveling of each $1^{st}$ order fractal interconnect as shown in FIG. 57b. The stretching in stage II is mainly accommodated by the (horizontally aligned) $1^{st}$ order fractal interconnects (blue color in FIG. 57a) because their tensile flexibility is much larger than that of straight beams (brown color). Thereby, the deformation of the straight beams is negligible, and only a single $1^{st}$ order fractal interconnect (e.g., CD in FIG. 57b) is analyzed by FEA (since all $1^{st}$ order interconnects have essentially the same deformation), which substantially reduces the computational cost. The additional stretching in stage II, $\epsilon_{applied}-\epsilon_{cr(I)}^{(2)}$, corresponds to an additional displacement $2\,ml^{(2)}[\epsilon_{applied}-\epsilon_{cr(I)}^{(2)}]$ between the two ends of the $2^{nd}$ order fractal interconnect, which translates to the stretching displacement $l^{(2)}[\epsilon_{applied}-\epsilon_{cr(I)}^{(2)}]$ in the FEA for each $1^{st}$ order fractal interconnect in stage II. Stage II is complete when each $1^{st}$ order interconnect is fully unraveled to reach its length $m[2h^{(1)}+(\pi-2)l^{(1)}]$.

The HCM introduced above is also applicable to higher orders (n≥3) fractal interconnects. For an order-n fractal interconnect, its (initially vertical) order-(n-1) and (horizontal) order-(n-2) interconnects are modeled as straight beams in stage I, followed by unraveling of order-(n-1) fractal interconnects in stage II. All order-(n-2) fractal interconnects, which result from both order-n and order-(n-1) interconnects, start unraveling upon further stretching after stage II. This process repeats for all lower orders until the $1^{st}$-order fractal interconnects unravel.

4. Effect of Fractal Order on the Elastic Stretchability and Pattern of Deformation The HCM in Section 3 makes it possible to study the postbuckling behavior of high order fractal interconnects with multiple unit cells, as shown in FIG. 55 for the $1^{st}$ to $4^{th}$ fractal interconnects with the height/spacing aspect ratio $\eta=8/\sqrt{11}$ and number of unit cell m=4. The copper interconnect has an elastic modulus $E_{Cu}=119$ GPa, Poisson's ratio $\nu_{Cu}=0.34$, and yield strain 0.3% (William et al., 1999) in an elastic-ideally plastic constitutive model (Hill, 1950)]. The results are validated by conventional FEA (without any approximations in the HCM) for the fractal order n≤3 because the analyses of higher order (n≥4) interconnect would be extremely difficult and time-consuming by conventional FEA.

Figure 58:
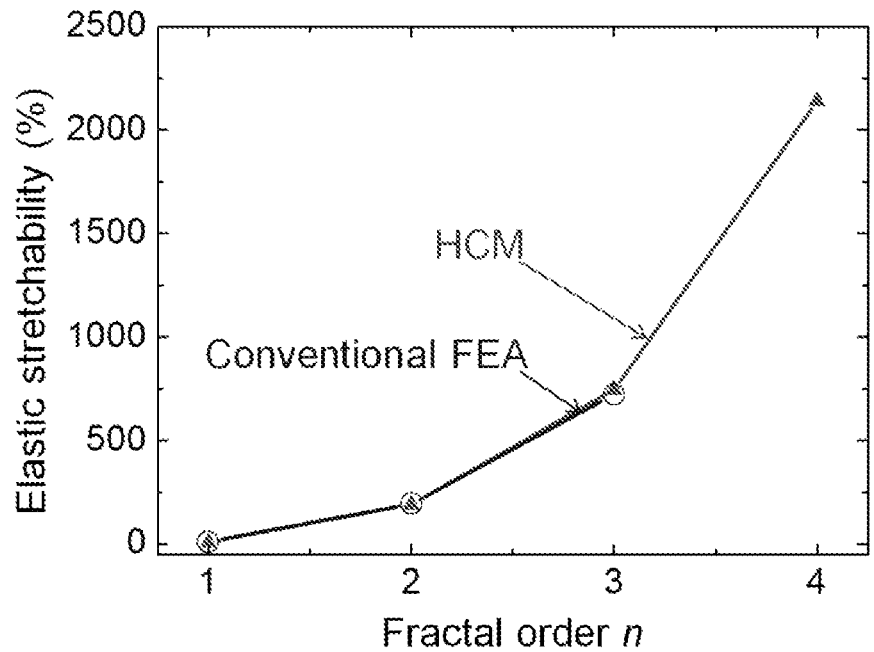
FIG. 58. Elastic stretchability versus the order for fractal interconnects from n=1 to 4, with $(m,\eta)=(4,8/\sqrt{11})$, the thickness/width aspect ratio (t/w=0.03), and the width to spacing ratio ($w/l^{(1)}=0.4$), for structures of different fractal orders.
Figure 59:
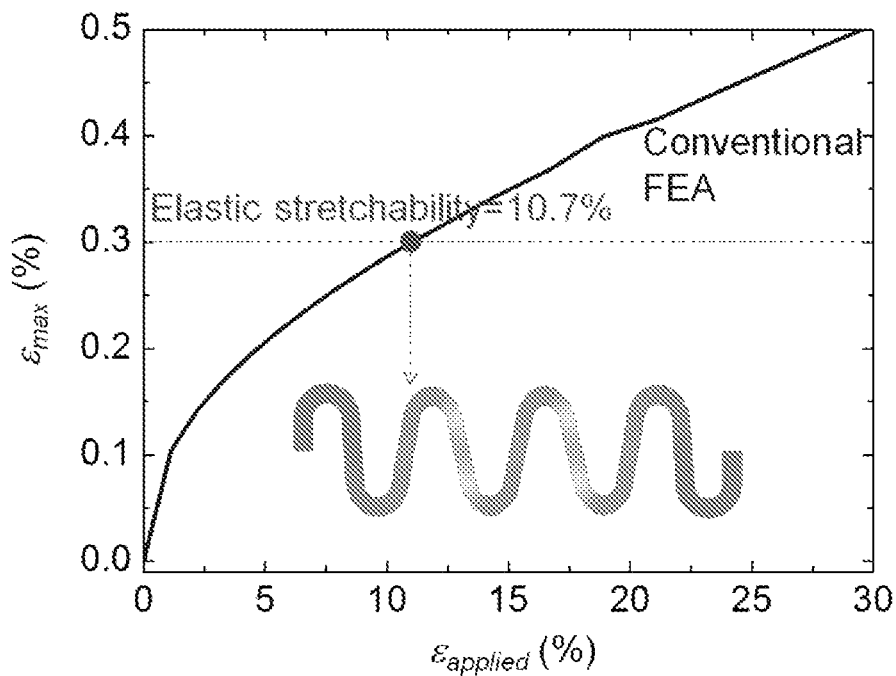
FIG. 59. The maximum principal strain versus the applied strain for a $1^{st}$ order serpentine interconnect with $(m,\eta)=(4, 8/\sqrt{11})$. The inset illustrates the deformed pattern of the serpentine interconnect as the elastic stretchability is reached.
Figure 60:
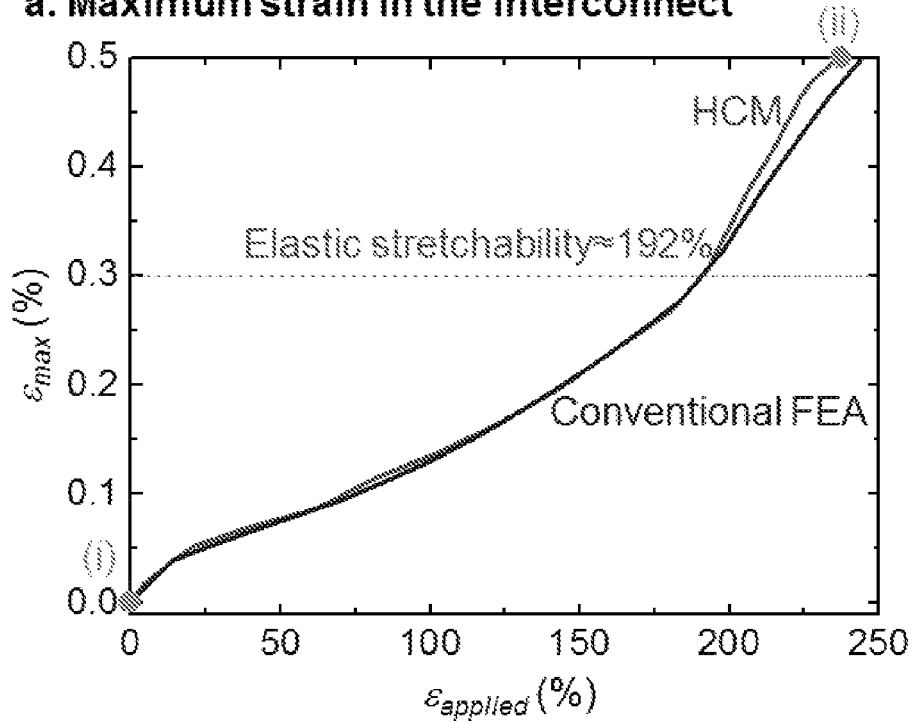
FIG. 60. (a) The maximum principal strain versus the applied strain for a $2^{nd}$ order fractal interconnect with $(m,\eta)=(4,8/\sqrt{11})$; (b) the undeformed and deformed configurations when the $2^{nd}$ order structure is fully unraveled.
Figure 60:
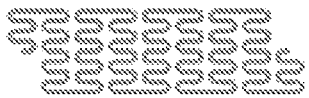
Figure 60:
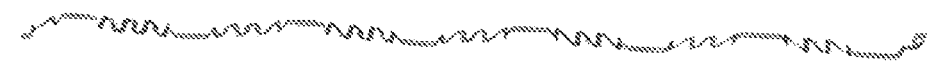
Figure 61:
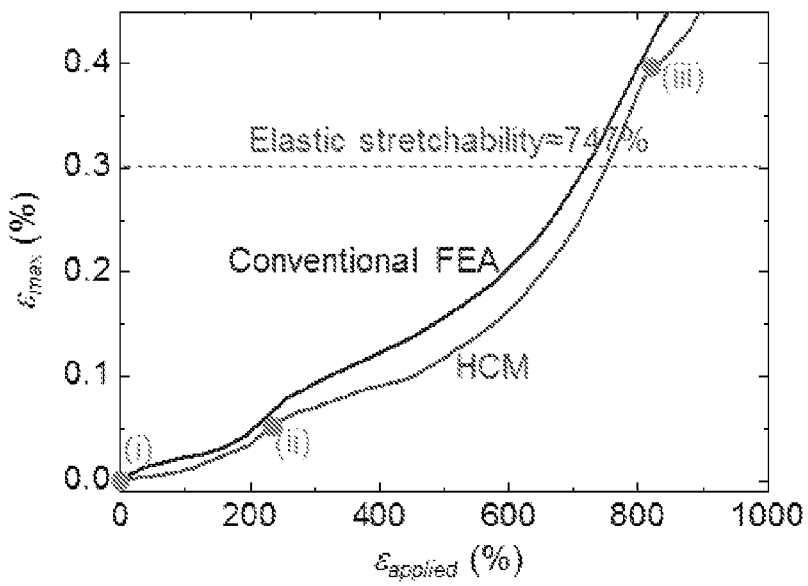
FIG. 61. (a) The maximum principal strain versus the applied strain for a $3^{rd}$ order fractal interconnect with $(m,\eta)=(4,8/\sqrt{11})$; (b) the undeformed and deformed configurations when the $3^{rd}$ and $2^{nd}$ order structures are fully unraveled.
Figure 61:
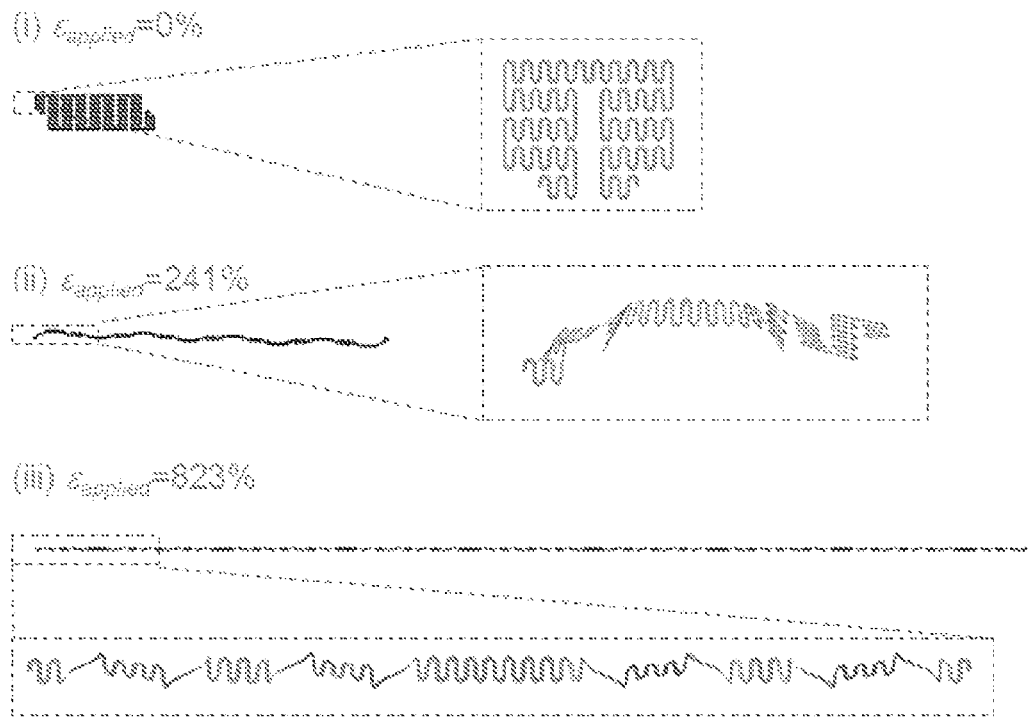
Figure 62:
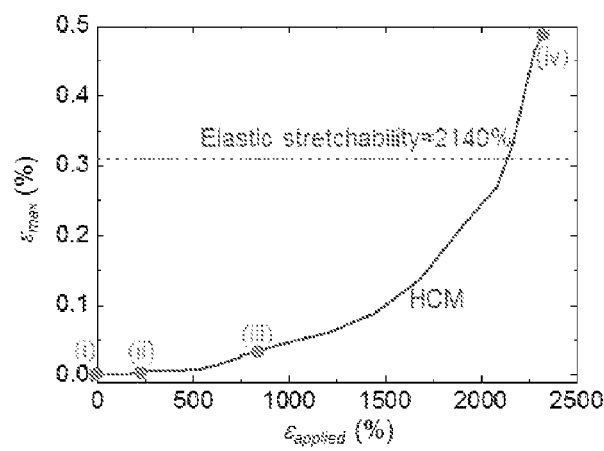
FIG. 62. (a) The maximum principal strain versus the applied strain for a $4^{th}$ order fractal interconnect with $(m,\eta)=(4,8/\sqrt{11})$; (b) the undeformed and deformed configurations when the $4^{th}$, $3^{rd}$ and $2^{nd}$ order structures are fully unraveled.
Figure 62:
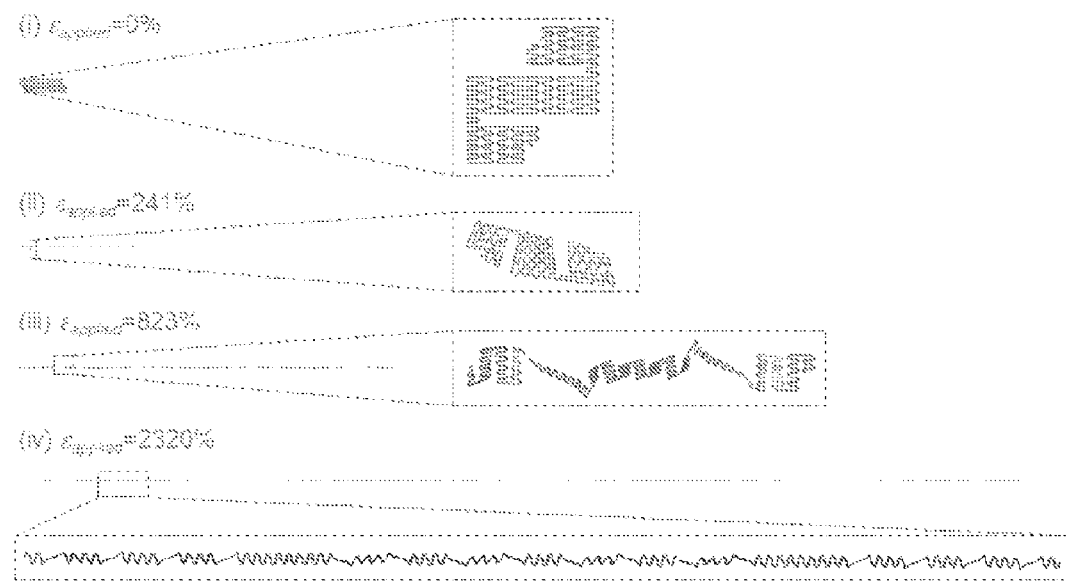

The elastic stretchability is the applied strain when the maximum strain in the interconnect reaches the yield strain (0.3%, William et al. (1999)) of the material. FIG. 58 shows the elastic stretchability versus the order n of fractal interconnects for $\eta=8/\sqrt{11}$ and m=4. The thickness/width aspect ratio in the cross section is t/w=0.03, and the width to spacing ratio is $w/l^{(1)}=0.4$. The results agree very well with conventional FEA for n≤3. For each increase of n by 1, the elastic stretchability increases by >3 times, suggesting that the high-order fractal design can substantially improve the elastic limit. For example, the elastic stretchability increases ~200 times, from ~10.7% for the $1^{st}$ order, to ~2140% for the $4^{th}$ order.

FIGS. 59-62 show the maximum principal strain in the fractal interconnect and the evolution of deformation patterns for the fractal order from 1 to 4, respectively. For the $1^{st}$ order fractal interconnect (FIG. 59), the maximum principal strain increases rapidly with the applied strain, and quickly reaches the yield strain 0.3%, at which the interconnect is still far from complete unraveling and therefore leads to the elastic stretchability of only 10.7%. For the $2^{nd}$ order fractal interconnect (FIG. 60a), the maximum principal strain initially increases slowly when the unraveling starts with the $2^{nd}$ order structure, but then exhibits "strain hardening" near the end of unraveling (of the $2^{nd}$ order structure) (FIG. 60b) for the applied strain in range 150%<$\epsilon_{applied}$<240%. The yield strain 0.3% is reached during the strain hardening, which gives 192% elastic stretchability. For the $3^{rd}$ order of fractal interconnect (FIG. 61a), there are two ranges of strain hardening, 150%<$\epsilon_{applied}$<240% and 500%<$\epsilon_{appl}$<820%, corresponding to the (end of) unraveling of the highest ($3^{rd}$) order and the next order ($2^{nd}$) structures, respectively (FIG. 61b). The yield strain 0.3% is reached during the latter strain hardening (corresponding to the unraveling of $2^{nd}$ order structures), which gives 747% elastic stretchability. As compared to FIG. 61a, the $4^{th}$ order fractal interconnect (FIG. 62a) exhibits an additional range of strain hardening (1500%<$\epsilon_{appl}$<2300%), and its three ranges of strain hardening correspond to the (end of) unraveling of the $4^{th}$, $3^{rd}$ and $2^{nd}$ order structures, respectively (FIG. 62b). The elastic stretchability 2140% is reached during the last strain hardening event (corresponding to the unraveling of $2^{nd}$ order structures). It is clear that the ordered unraveling of fractal interconnects significantly retards the rate of increase of maximum principal strain, and therefore enables large elastic stretchability.

It should be pointed out that this level of interconnect stretchability (2140%) translates to 110% elastic stretchability of the system for ~90% filling ratio of active devices based on Eq. (1), and 22% for 98% filling ratio, which are sufficient for biomedical applications.

5. Generalized Fractal Interconnects

The fractal interconnects discussed above can be generalized such that at each order the interconnect may have its own height/spacing aspect ratios $\eta^{(i)}$ and number of unit cells $m^{(i)}$ (i=1, 2, ..., n). The generalized fractal interconnects may provide simultaneously large elastic stretchability and a relative low electrical resistance, as demonstrated in Xu et al. (2013). For the $n^{th}$ order generalized fractal interconnect, the geometric relation (2) becomes $$l^{(i)} = \left[\prod_{k=1}^{n-i} \frac{\eta^{(n-k+1)}}{2m^{(n-k)}}\right] l^{(n)}, h^{(i)} = \eta^{(i)} \left[\prod_{k=1}^{n-i} \frac{\eta^{(n-k+1)}}{2m^{(n-k)}}\right] l^{(n)}, \quad (7)$$

$(i = 1 \ldots n-1)$.

Figure 63:
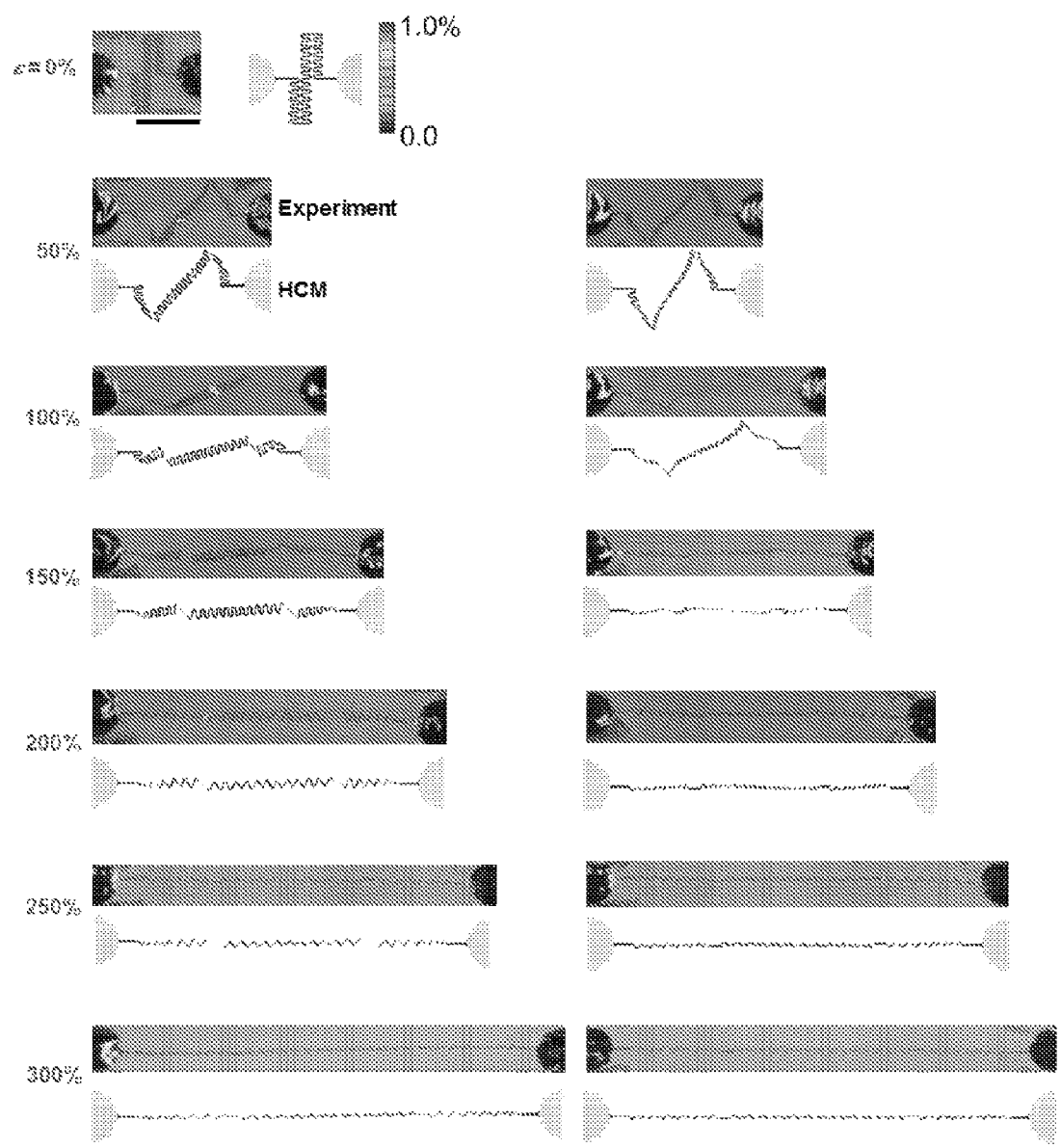
FIG. 63. Symmetric (left panel) and anti-symmetric (right panel) deformation modes from experiments (Xu et al., 2013) and numerical results by the HCM, for various levels of applied tensile strain (0≤∈≤300%). The scale bar is 2 mm.

The HCM introduced in Section 3 can be extended straightforwardly to study the postbuckling of a generalized fractal interconnect. FIG. 63 shows a generalized $2^{nd}$ order fractal interconnect in the experiments (Xu et al., 2013) of stretchable battery. The interconnect, as shown at the top of FIG. 63 ($\epsilon$=0%), is composed of two polyimide (PI) layers (both 1.2 µm in thickness, $E_{PI}$=2.5 GPa and $v_{PI}$=0.34) that sandwich the conducting copper layer (0.6 µm in thickness). The metal trace is connected by two rigid, circular islands, which hardly deform during the stretching of the entire structure.

Figure 64:
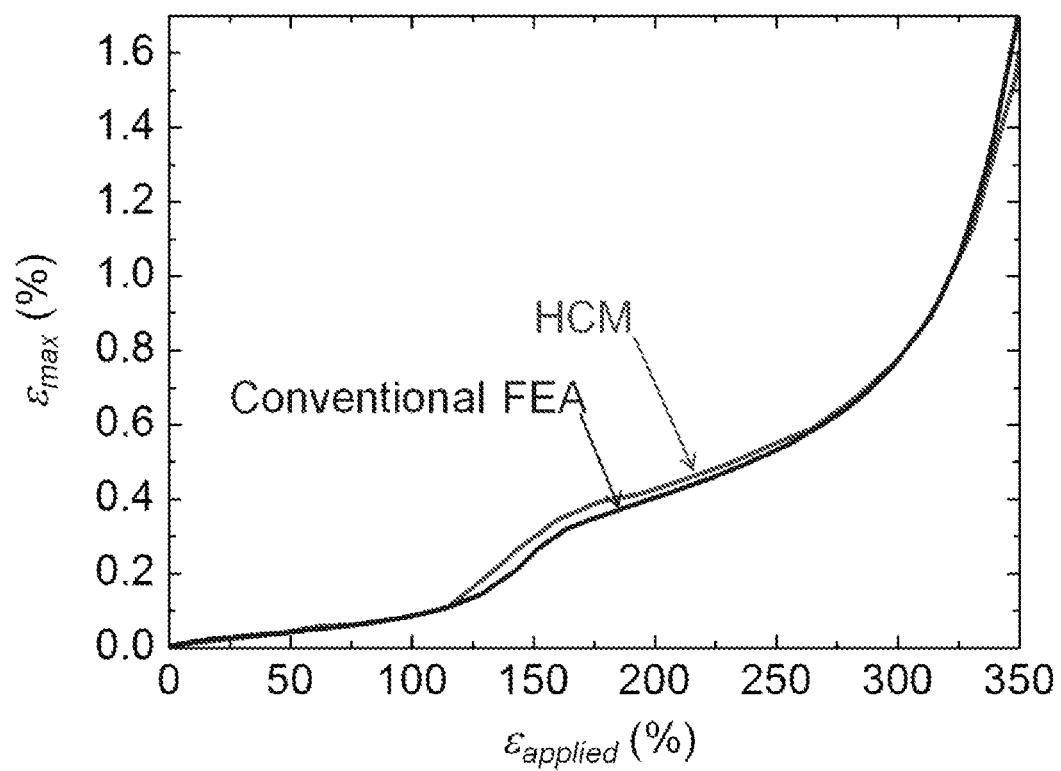
FIG. 64. The maximum principal strain in the metal layer versus the applied strain from conventional FEA and the HCM, for the fractal interconnects adopted in the experiment of Xu et al. (2013).

FIG. 63 compares the optical images from experiments to the results obtained by the HCM on the deformed configurations of the fractal interconnect, for two different buckling modes, i.e., the symmetric and anti-symmetric modes. Good agreement between HCM and experiments are observed over the entire range of stretching (0% to 300%) for both modes. The maximum strain in the metal layer obtained by the HCM agrees well with that obtained by conventional FEA (FIG. 64), but the former is much faster and is applicable to higher fractal orders. The experiments (FIG. 63) and conventional FEA (FIG. 64) clearly validate the HCM.

6. Conclusions and Discussions

A hierarchical computational model for postbuckling analysis of fractal interconnects based on the mechanism of ordered unraveling is developed in this Example. The approach substantially reduces the computational efforts and costs compared to conventional FEA, but with accurate predictions, as validated by both experiments and FEA. The designs provide large enhancements (by ~200 times) in the elastic stretchability, as the fractal order increases from 1 to 4. The HCM is also applicable to many other types of fractal layouts formed without intersection points, such as Peano and Hilbert curves (Sagan, 1994). It is useful for the development of stretchable electronics that simultaneously demand large areal coverage of active devices, such as stretchable photovoltaics (Yoon et al., 2008) and electronic eye-ball cameras (Ko et al., 2008). The concept of fractal interconnects can be further combined with other strategies for stretchability, such as prestraining of soft substrate (Lee et al., 2011 b; Zhang et al., 2013b), to further enhance the stretchability.

Figure 65:
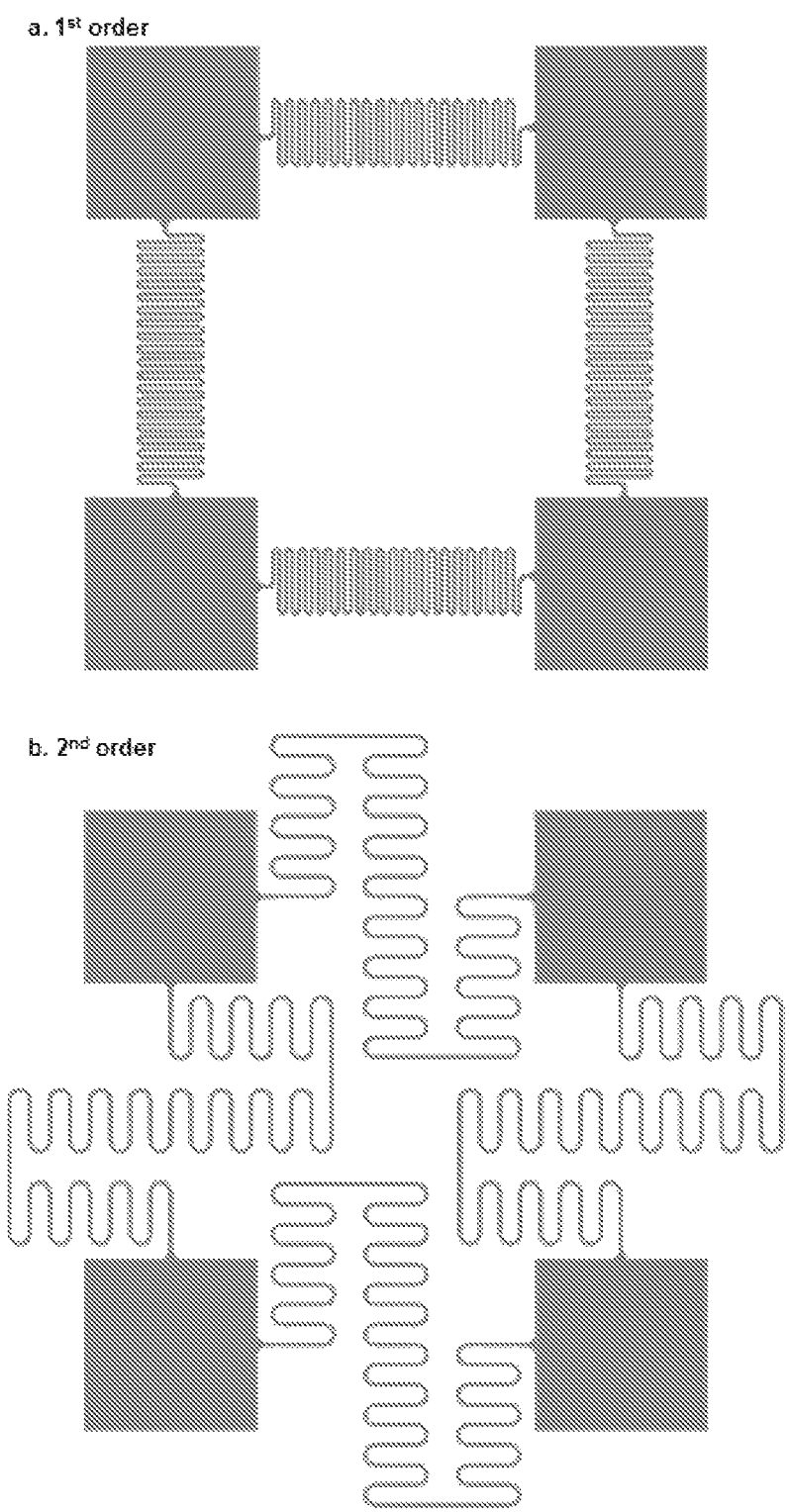
FIG. 65. The $1^{st}$ (a) and $2^{nd}$ (b) order fractal interconnects, with the same total length (16.77 mm) of interconnect, spacing (1.6 mm) between the device islands, height (0.4 mm) of the $1^{st}$ order interconnect, width (w=30 μm), and thickness (t=3.0 μm).

It should be pointed out that processes of ordered unraveling play critical roles in the enhanced elastic stretchability of high-order fractal interconnects, far beyond the simple increase of total length of interconnects with the fractal order. For example, the $1^{st}$ and $2^{nd}$ order fractal interconnects in FIG. 65 have the same total length and cross-section (width and thickness) and the same spacing between the device islands, yet the $2^{nd}$ order interconnect outperforms the $1^{st}$ order one in the elastic-stretchability by nearly a factor of 2 (528% versus 284%) (Xu et al., 2013).

APPENDIX

The Effective Flexibility of an $n^{th}$ Order Fractal Interconnect

For the $1^{st}$ order fractal interconnect clamped at the left end and subject to forces (N, $Q_y$, $Q_z$) and bending moments ($M_x$, $M_y$, $M_z$) at the right end, the strain energy of the entire interconnect can be obtained from summation of the bending energy in all straight and curved parts (Zhang et al., 2013a). The flexibility matrices $T_{in-plane}^{(1)}$ and $T_{out-of-plane}^{(1)}$ of the $1^{st}$ order interconnect can be obtained from the $2^{nd}$ order derivative of the strain energy function with respect to the components of force (or bending moment), as given in Eqs. (4a) and (4b).

The $2^{nd}$ order fractal interconnect is composed of vertically aligned $1^{st}$ order interconnects and horizontally aligned straight beams. Its strain energy is the sum of that in all $1^{st}$ order interconnects and straight beams, whereas the strain energy of $1^{st}$ order interconnect can be obtained using its flexibility matrices, $T_{in-plane}^{(1)}$ and $T_{out-of-plane}^{(1)}$. On the other hand, the strain energy of the $2^{nd}$ order fractal interconnect can be given in terms of the $T_{in-plane}^{(2)}$ and $T_{out-of-plane}^{(2)}$. This energy equivalence leads to the analytical expression of $T_{in-plane}^{(2)}$ and $T_{out-of-plane}^{(2)}$ in Eqs. (5a) and (5b), where the component $T_{out-of-plane,11}^{(2)}$ is given by $$T_{out-of-plane,11}^{(2)} = \quad (A.1)$$

$$\frac{m^3}{3}[4p - (1-v)\pi\eta] + \frac{m}{12}\eta[k(\eta^2 + 2) + (5+v)\eta - 2(1-v)] +$$

$$\frac{\eta^3}{384m}\{8\eta p + [(5+3v)\pi - 16](p - \pi\eta) +$$

$$8[8(1+v) - \pi]\eta + 2(7+5v)\pi - 16(3+4v)\}.$$

An order-n interconnect is composed of vertically aligned order-(n−1) interconnects, and horizontally aligned order-(n−2) order interconnects. Based on the equivalence of strain energy of the order-n interconnect and that from summation of strain energy in all order-(n−1) and order-(n−2) interconnects, $T_{in\text{-}plane}^{(n)}$ and $T_{out\text{-}of\text{-}plane}^{(n)}$ are obtained in the following recursive formula via the flexibility matrices for the $(n-1)^{th}$ and $(n-2)^{th}$ order:

$$T_{in\text{-}plane}^{(n)} = \frac{\eta}{2m}\begin{pmatrix} \frac{\eta}{2m} & 0 & 0 \\ 0 & \frac{\eta}{2m} & 0 \\ 0 & 0 & 1 \end{pmatrix} \quad (A.2a)$$

$$\sum_{k=1}^{m}\{\overline{D}_I[T_{in\text{-}plane}^{(n-1)}K_1(m)+K_1^T(m)T_{in\text{-}plane}^{(n-1)}]\overline{D}_I^T + \overline{D}_{II}T_{in\text{-}plane}^{(n-1)}$$

$$\overline{D}_{II}^T + \overline{D}_{III}[T_{in\text{-}plane}^{(n-1)}K_1(m)+K_1^T(m)T_{in\text{-}plane}^{(n-1)}]\overline{D}_{III}^T\}$$

$$\begin{pmatrix} \frac{\eta}{2m} & 0 & 0 \\ 0 & \frac{\eta}{2m} & 0 \\ 0 & 0 & 1 \end{pmatrix} + \frac{\eta^2}{4m^2}$$

$$\sum_{k=1}^{m}\left[\overline{D}_{IV}^* T_{in\text{-}plane}^{(n-2)} \overline{D}_{IV}^{*T} + \overline{D}_V^* T_{in\text{-}plane}^{(n-2)} \overline{D}_V^{*T}\right]$$

for $n \geq 3$, $$T_{out\text{-}of\text{-}plane,11}^{(n)} = \frac{\eta}{2m}\begin{pmatrix} \frac{\eta}{2m} & 0 & 0 \\ 0 & 1 & 0 \\ 0 & 0 & 1 \end{pmatrix}$$

$$\sum_{k=1}^{m}\{\overline{R}_I[T_{out\text{-}of\text{-}plane}^{(n-1)}K_2(m)+K_2^T(m)T_{out\text{-}of\text{-}plane}^{(n-1)}]\overline{R}_I^T +$$

$$\overline{R}_{II}T_{out\text{-}of\text{-}plane}^{(n-1)}\overline{R}_{II}^T + \overline{R}_{III}[T_{out\text{-}of\text{-}plane}^{(n-1)}K_2(m)+$$

$$K_2^T(m)T_{out\text{-}of\text{-}plane}^{(n-1)}]\overline{R}_{III}^T\}\begin{pmatrix} \frac{\eta}{2m} & 0 & 0 \\ 0 & 1 & 0 \\ 0 & 0 & 1 \end{pmatrix} +$$

$$\frac{\eta^2}{4m^2}\sum_{k=1}^{m}\left[\overline{R}_{IV}^* T_{out\text{-}of\text{-}plane}^{(n-2)} \overline{R}_{IV}^{*T} + \overline{R}_V^* T_{out\text{-}of\text{-}plane}^{(n-2)} \overline{R}_V^{*T}\right]$$

for $n \geq 3$,
where

-continued $$\overline{D}_I = \begin{bmatrix} 0 & 1 & -m \\ 1 & 0 & -4(m-k+1)m\eta^{-1} \\ 0 & 0 & -1 \end{bmatrix}, \quad (A.2b)$$

$$\overline{D}_{II} = \begin{bmatrix} 0 & 1 & -m \\ -1 & 0 & (4m-4k+2)m\eta^{-1} \\ 0 & 0 & 1 \end{bmatrix},$$

$$\overline{D}_{III} = \begin{bmatrix} 0 & 1 & 0 \\ 1 & 0 & -4(m-k)m\eta^{-1} \\ 0 & 0 & 1 \end{bmatrix},$$

$$\overline{D}_{IV}^* = \begin{bmatrix} \eta^2/(4m^2) & 0 & \eta/2 \\ 0 & \eta^2/(4m^2) & 2m-2k+1 \\ 0 & 0 & 1 \end{bmatrix},$$

$$\overline{D}_V^* = \begin{bmatrix} \eta^2/(4m^2) & 0 & \eta/2 \\ 0 & -\eta^2/(4m^2) & -2m+2k \\ 0 & 0 & -1 \end{bmatrix},$$

$$K_1(m) = \frac{1}{4}\begin{pmatrix} 1 & 0 & 0 \\ 0 & 1 & 0 \\ 0 & -m & 1 \end{pmatrix},$$

$$\overline{R}_I = \begin{bmatrix} 1 & m & -4(m-k+1)m\eta^{-1} \\ 0 & 0 & 1 \\ 0 & -1 & 0 \end{bmatrix},$$

$$\overline{R}_{II} = \begin{bmatrix} 1 & m & (4m-4k+2)m\eta^{-1} \\ 0 & 0 & -1 \\ 0 & 1 & 0 \end{bmatrix},$$

$$\overline{R}_{III} = \begin{bmatrix} 1 & 0 & -4(m-k)m\eta^{-1} \\ 0 & 0 & 1 \\ 0 & -1 & 0 \end{bmatrix},$$

$$\overline{R}_{IV}^* = \begin{bmatrix} \eta^2/(4m^2) & -(2m-2k+1) & -\eta^3/(8m^2) \\ 0 & \eta^2/(4m^2) & 0 \\ 0 & 0 & \eta^2/(4m^2) \end{bmatrix},$$

$$\overline{R}_V^* = \begin{bmatrix} \eta^2/(4m^2) & -(2m-2k) & -\eta^3/(8m^2) \\ 0 & \eta^2/(4m^2) & 0 \\ 0 & 0 & -\eta^2/(4m^2) \end{bmatrix},$$

and $$K_2(m) = \frac{1}{4}\begin{pmatrix} 1 & 0 & 0 \\ m & 1 & 0 \\ 0 & 0 & 1 \end{pmatrix}.$$

REFERENCES

Cotton, D. P. J., Graz, I. M., and Lacour, S. P., 2009. A Multifunctional Capacitive Sensor for Stretchable Electronic Skins. *IEEE Sensors Journal* 9, 2008-2009.

Duan, Y. Q., Huang, Y. A., Yin, Z. P., Bu, N. B., and Dong, W. T., 2014. Non-wrinkled, highly stretchable piezoelectric devices by electrohydrodynamic direct-writing. *Nanoscale* In Press, doi: 10.1039/C3NR06007A.

Gao, H. J., Wang, X., Yao, H. M., Gorb, S., and Arzt, E., 2005. Mechanics of hierarchical adhesion structures of geckos. *Mechanics of Materials* 37, 275-285.

Gonzalez, M., Axisa, F., Bulcke, M. V., Brosteaux, D., Vandevelde, B., and Vanfleteren, J., 2008. Design of metal interconnects for stretchable electronic circuits. *Microelectronics Reliability* 48, 825-832.

Graudejus, O., Morrison, B., Goletiani, C., Yu, Z., and Wagner, S., 2012. Encapsulating Elastically Stretchable Neural Interfaces: Yield, Resolution, and Recording/Stimulation of Neural Activity. *Advanced Functional Materials* 22, 640-651.

Hsu, Y. Y., Gonzalez, M., Bossuyt, F., Axisa, F., Vanfleteren, J., and De Wolf, I., 2009. In situ observations on deformation behavior and stretching-induced failure of fine pitch stretchable interconnect. *Journal of Materials Research* 24, 3573-3582.

Huang, Y. A., Wang, X. M., Duan, Y. Q., Bu, N. B., and Yin, Z. P., 2012. Controllable self-organization of colloid microarrays based on finite length effects of electrospun ribbons. *Soft Matter* 8, 8302-8311.

Jiang, H. Q., Khang, D. Y., Fei, H. Y., Kim, H., Huang, Y. G., Xiao, J. L., and Rogers, J. A., 2008. Finite width effect of thin-films buckling on compliant substrate: Experimental and theoretical studies. *Journal of the Mechanics and Physics of Solids* 56, 2585-2598.

Jiang, H. Q., Khang, D. Y., Song, J. Z., Sun, Y. G., Huang, Y. G., and Rogers, J. A., 2007. Finite deformation mechanics in buckled thin films on compliant supports. *Proceedings of the National Academy of Sciences of the United States of America* 104, 15607-15612.

Jones, J., Lacour, S. P., Wagner, S., and Suo, Z. G., 2004. Stretchable wavy metal interconnects. *Journal of Vacuum Science & Technology A* 22, 1723-1725.

Kaltenbrunner, M., Sekitani, T., Reeder, J., Yokota, T., Kuribara, K., Tokuhara, T., Drack, M., Schwodiauer, R., Graz, I., Bauer-Gogonea, S., Bauer, S., and Someya, T., 2013. An ultra-lightweight design for imperceptible plastic electronics. *Nature* 499, 458-463.

Khang, D. Y., Jiang, H. Q., Huang, Y., and Rogers, J. A., 2006. A stretchable form of single-crystal silicon for high-performance electronics on rubber substrates. *Science* 311, 208-212.

Kim, D. H., Ghaffari, R., Lu, N. S., Wang, S. D., Lee, S. P., Keum, H., D'Angelo, R., Klinker, L., Su, Y. W., Lu, C. F., Kim, Y. S., Ameen, A., Li, Y. H., Zhang, Y. H., de Graff, B., Hsu, Y. Y., Liu, Z. J., Ruskin, J., Xu, L. Z., Lu, C., Omenetto, F. G., Huang, Y. G., Mansour, M., Slepian, M. J., and Rogers, J. A., 2012a. Electronic sensor and actuator webs for large-area complex geometry cardiac mapping and therapy. *Proceedings of the National Academy of Sciences of the United States of America* 109, 19910-19915.

Kim, D. H., Liu, Z. J., Kim, Y. S., Wu, J., Song, J. Z., Kim, H. S., Huang, Y. G., Hwang, K. C., Zhang, Y. W., and Rogers, J. A., 2009. Optimized Structural Designs for Stretchable Silicon Integrated Circuits. *Small* 5, 2841-2847.

Kim, D. H., Lu, N. S., Ghaffari, R., Kim, Y. S., Lee, S. P., Xu, L. Z., Wu, J. A., Kim, R. H., Song, J. Z., Liu, Z. J., Viventi, J., de Graff, B., Elolampi, B., Mansour, M., Slepian, M. J., Hwang, S., Moss, J. D., Won, S. M., Huang, Y. G., Litt, B., and Rogers, J. A., 2011a. Materials for multifunctional balloon catheters with capabilities in cardiac electrophysiological mapping and ablation therapy. *Nature Materials* 10, 316-323.

Kim, D. H., Lu, N. S., Ma, R., Kim, Y. S., Kim, R. H., Wang, S. D., Wu, J., Won, S. M., Tao, H., Islam, A., Yu, K. J., Kim, T. I., Chowdhury, R., Ying, M., Xu, L. Z., Li, M., Chung, H. J., Keum, H., McCormick, M., Liu, P., Zhang, Y. W., Omenetto, F. G., Huang, Y. G., Coleman, T., and Rogers, J. A., 2011b. Epidermal Electronics. *Science* 333, 838-843.

Kim, D. H., Song, J. Z., Choi, W. M., Kim, H. S., Kim, R. H., Liu, Z. J., Huang, Y. Y., Hwang, K. C., Zhang, Y. W., and Rogers, J. A., 2008. Materials and noncoplanar mesh designs for integrated circuits with linear elastic responses to extreme mechanical deformations. *Proceedings of the National Academy of Sciences of the United States of America* 105, 18675-18680.

Kim, D. H., Wang, S. D., Keum, H., Ghaffari, R., Kim, Y. S., Tao, H., Panilaitis, B., Li, M., Kang, Z., Omenetto, F., Huang, Y. G., and Rogers, J. A., 2012b. Thin, Flexible Sensors and Actuators as 'Instrumented' Surgical Sutures for Targeted Wound Monitoring and Therapy. *Small* 8, 3263-3268.

Kim, R. H., Kim, D. H., Xiao, J. L., Kim, B. H., Park, S. I., Panilaitis, B., Ghaffari, R., Yao, J. M., Li, M., Liu, Z. J., Malyarchuk, V., Kim, D. G., Le, A. P., Nuzzo, R. G., Kaplan, D. L., Omenetto, F. G., Huang, Y. G., Kang, Z., and Rogers, J. A., 2010. Waterproof AlInGaP optoelectronics on stretchable substrates with applications in biomedicine and robotics. *Nature Materials* 9, 929-937.

Kim, R. H., Tao, H., Kim, T. I., Zhang, Y. H., Kim, S., Panilaitis, B., Yang, M. M., Kim, D. H., Jung, Y. H., Kim, B. H., Li, Y. H., Huang, Y. G., Omenetto, F. G., and Rogers, J. A., 2012c. Materials and Designs for Wirelessly Powered Implantable Light-Emitting Systems. *Small* 8, 2812-2818.

Ko, H. C., Stoykovich, M. P., Song, J. Z., Malyarchuk, V., Choi, W. M., Yu, C. J., Geddes, J. B., Xiao, J. L., Wang, S. D., Huang, Y. G., and Rogers, J. A., 2008. A hemispherical electronic eye camera based on compressible silicon optoelectronics. *Nature* 454, 748-753.

Lacour, S. P., Jones, J., Wagner, S., Li, T., and Suo, Z. G., 2005. Stretchable interconnects for elastic electronic surfaces. *Proceedings of the IEEE* 93, 1459-1467.

Lacour, S. P., Wagner, S., Narayan, R. J., Li, T., and Suo, Z. G., 2006. Stiff subcircuit islands of diamondlike carbon for stretchable electronics. *Journal of Applied Physics* 100, 014913.

Lee, C. H., Kim, Y. J., Hong, Y. J., Jeon, S. R., Bae, S., Hong, B. H., and Yi, G. C., 2011a. Flexible Inorganic Nanostructure Light-Emitting Diodes Fabricated on Graphene Films. *Advanced Materials* 23, 4614-4619.

Lee, J., Wu, J. A., Shi, M. X., Yoon, J., Park, S. I., Li, M., Liu, Z. J., Huang, Y. G., and Rogers, J. A., 2011b. Stretchable GaAs Photovoltaics with Designs That Enable High Areal Coverage. *Advanced Materials* 23, 986-991.

Li, T., Suo, Z. G., Lacour, S. P., and Wagner, S., 2005. Compliant thin film patterns of stiff materials as platforms for stretchable electronics. *Journal of Materials Research* 20, 3274-3277.

Li, Y., Ortiz, C., and Boyce, M. C., 2012. Bioinspired, mechanical, deterministic fractal model for hierarchical suture joints. *Physical Review E* 85, Li, Y., Ortiz, C., and Boyce, M. C., 2013. A generalized mechanical model for suture interfaces of arbitrary geometry. *Journal of the Mechanics and Physics of Solids* 61, 1144-1167.

Lipomi, D. J., Tee, B. C. K., Vosgueritchian, M., and Bao, Z. N., 2011. Stretchable Organic Solar Cells. *Advanced Materials* 23, 1771-1775.

Lu, N. S., Lu, C., Yang, S. X., and Rogers, J., 2012. Highly Sensitive Skin-Mountable Strain Gauges Based Entirely on Elastomers. *Advanced Functional Materials* 22, 4044-4050.

Mannsfeld, S. C. B., Tee, B. C. K., Stoltenberg, R. M., Chen, C., Barman, S., Muir, B. V. O., Sokolov, A. N., Reese, C., and Bao, Z. N., 2010. Highly sensitive flexible pressure sensors with microstructured rubber dielectric layers. *Nature Materials* 9, 859-864.

Nelson, E. C., Dias, N. L., Bassett, K. P., Dunham, S. N., Verma, V., Miyake, M., Wiltzius, P., Rogers, J. A., Coleman, J. J., Li, X. L., and Braun, P. V., 2011. Epitaxial growth of three-dimensionally architected optoelectronic devices. *Nature Materials* 10, 676-681.

Rogers, J. A., Someya, T., and Huang, Y. G., 2010. Materials and Mechanics for Stretchable Electronics. *Science* 327, 1603-1607.

Sagan, H. Space-filling curves. New York: Springer-Verlag, 1994.

Schwartz, G., Tee, B. C. K., Mei, J. G., Appleton, A. L., Kim, D. H., Wang, H. L., and Bao, Z. N., 2013. Flexible polymer transistors with high pressure sensitivity for application in electronic skin and health monitoring. *Nature Communications* 4, 1859.

Sekitani, T., Nakajima, H., Maeda, H., Fukushima, T., Aida, T., Hata, K., and Someya, T., 2009. Stretchable active-matrix organic light-emitting diode display using printable elastic conductors. *Nature Materials* 8, 494-499.

Someya, T., Sekitani, T., Iba, S., Kato, Y., Kawaguchi, H., and Sakurai, T., 2004. A large-area, flexible pressure sensor matrix with organic field-effect transistors for artificial skin applications. *Proceedings of the National Academy of Sciences of the United States of America* 101, 9966-9970.

Song, J., Huang, Y., Xiao, J., Wang, S., Hwang, K. C., Ko, H. C., Kim, D. H., Stoykovich, M. P., and Rogers, J. A., 2009. Mechanics of noncoplanar mesh design for stretchable electronic circuits. *Journal of Applied Physics* 105, 123516.

Song, Y. M., Xie, Y. Z., Malyarchuk, V., Xiao, J. L., Jung, I., Choi, K. J., Liu, Z. J., Park, H., Lu, C. F., Kim, R. H., Li, R., Crozier, K. B., Huang, Y. G., and Rogers, J. A., 2013. Digital cameras with designs inspired by the arthropod eye. *Nature* 497, 95-99.

Viventi, J., Kim, D. H., Moss, J. D., Kim, Y. S., Blanco, J. A., Annetta, N., Hicks, A., Xiao, J. L., Huang, Y. G., Callans, D. J., Rogers, J. A., and Litt, B., 2010. A Conformal, Bio-Interfaced Class of Silicon Electronics for Mapping Cardiac Electrophysiology. *Science Translational Medicine* 2, 24ra22.

Wagner, S., Lacour, S. P., Jones, J., Hsu, P. H. I., Sturm, J. C., Li, T., and Suo, Z. G., 2004. Electronic skin: architecture and components. *Physica E-Low-Dimensional Systems & Nanostructures* 25, 326-334.

Webb, R. C., Bonifas, A. P., Behnaz, A., Zhang, Y. H., Yu, K. J., Cheng, H. Y., Shi, M. X., Bian, Z. G., Liu, Z. J., Kim, Y. S., Yeo, W. H., Park, J. S., Song, J. Z., Li, Y. H., Huang, Y. G., Gorbach, A. M., and Rogers, J. A., 2013. Ultrathin conformal devices for precise and continuous thermal characterization of human skin. *Nature Materials* 12, 938-944.

William, F. R., Leroy, D. S., and Don, H. M. Mechanics of Materials. New York: Jon Wiley & Sons, 1999.

Xu, S., Zhang, Y. H., Cho, J., Lee, J., Huang, X., Jia, L., Fan, J. A., Su, Y. W., Su, J., Zhang, H. G., Cheng, H. Y., Lu, B. W., Yu, C. J., Chuang, C., Kim, T. I., Song, T., Shigeta, K., Kang, S., Dagdeviren, C., Petrov, I., Braun, P. V., Huang, Y., Paik, U., and Rogers, J. A., 2013. Stretchable batteries with self-similar serpentine interconnects and integrated wireless recharging systems. *Nature Communications* 4, 1543.

Yang, S. X., and Lu, N. S., 2013. Gauge Factor and Stretchability of Silicon-on-Polymer Strain Gauges. *Sensors* 13, 8577-8594.

Yao, H., and Gao, H., 2006. Mechanics of robust and releasable adhesion in biology: Bottom-up designed hierarchical structures of gecko. *Journal of the Mechanics and Physics of Solids* 54, 1120-1146.

Yao, H., and Gao, H., 2007. Multi-scale cohesive laws in hierarchical materials. *International Journal of Solids and Structures* 44, 8177-8193.

Ying, M., Bonifas, A. P., Lu, N. S., Su, Y. W., Li, R., Cheng, H. Y., Ameen, A., Huang, Y. G., and Rogers, J. A., 2012. Silicon nanomembranes for fingertip electronics. *Nanotechnology* 23, 344004.

Yoon, J., Baca, A. J., Park, S. I., Elvikis, P., Geddes, J. B., Li, L. F., Kim, R. H., Xiao, J. L., Wang, S. D., Kim, T. H., Motala, M. J., Ahn, B. Y., Duoss, E. B., Lewis, J. A., Nuzzo, R. G., Ferreira, P. M., Huang, Y. G., Rockett, A., and Rogers, J. A., 2008. Ultrathin silicon solar microcells for semitransparent, mechanically flexible and microconcentrator module designs. *Nature Materials* 7, 907-915.

Yu, Z., Graudejus, O., Tsay, C., Lacour, S. P., Wagner, S., and Morrison, B., 2009. Monitoring Hippocampus Electrical Activity In Vitro on an Elastically Deformable Microelectrode Array. *Journal of Neurotrauma* 26, 1135-1145.

Zhang, Y. H., Fu, H. R., Su, Y. W., Xu, S., Cheng, H. Y., Fan, J. A., Hwang, K. C., Rogers, J. A., and Huang, Y., 2013a. Mechanics of ultra-stretchable self-similar serpentine interconnects. *Acta Materialia* 61, 7816-7827.

Zhang, Y. H., Wang, S. D., Li, X. T., Fan, J. A., Xu, S., Song, Y. M., Choi, K. J., Yeo, W. H., Lee, W., Nazaar, S. N., Lu, B. W., Yin, L., Hwang, K. C., Rogers, J. A., and Huang, Y., 2013b. Experimental and Theoretical Studies of Serpentine Microstructures Bonded To Prestrained Elastomers for Stretchable Electronics. *Advanced Functional Materials* In Press, doi: 10.1002/adfm.201302957.

Zhang, Y. H., Xu, S., Fu, H. R., Lee, J., Su, J., Hwang, K. C., Rogers, J. A., and Huang, Y., 2013c. Buckling in serpentine microstructures and applications in elastomer-supported ultra-stretchable electronics with high areal coverage. *Soft Matter* 9, 8062-8070.

Zhang, Z., Zhang, T., Zhang, Y. W., Kim, K.-S., and Gao, H., 2012. Strain-Controlled Switching of Hierarchically Wrinkled Surfaces between Superhydrophobicity and Superhydrophilicity. *Langmuir* 28, 2753-2760.

Zhang, Z., Zhang, Y.-W., and Gao, H., 2011. On optimal hierarchy of load-bearing biological materials. *Proceedings of the Royal Society B-Biological Sciences* 278, 519-525.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Whenever a range is given in the specification, for example, a temperature range, a time range, or a composition or concentration range, all intermediate ranges and subranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. An electronic circuit comprising:
an elastic substrate; and
a stretchable metallic or semiconducting device component supported by said elastic substrate; said stretchable metallic or semiconducting device component comprising a plurality of electrically conductive elements each having a primary unit cell shape, said electrically conductive elements connected in a sequence having a secondary shape providing an overall two-dimensional spatial geometry characterized by a plurality of spatial frequencies; wherein said two-dimensional spatial geometry is characterized by a first spatial frequency having a first length scale corresponding to said primary unit cell shape and a second spatial frequency having a second length scale corresponding to said secondary shape, wherein said first length scale of said first spatial frequency is selected from the range of 100 nm to 1 mm and wherein said second length scale of said second spatial frequency is selected from the range of 1 micron to 10 mm;
wherein said two-dimensional spatial geometry of said stretchable metallic or semiconducting device component allows for accommodation of elastic strain along one or more in-plane or out of plane dimensions, thereby providing stretchability of said electronic circuit.

2. The electronic circuit of claim 1, wherein said two-dimensional spatial geometry allows said stretchable metallic or semiconducting device component to undergo elastic deformation.

3. The electronic circuit of claim 1, wherein said two-dimensional spatial geometry allows said stretchable metallic or semiconducting device component to undergo biaxial deformation, radial deformation or both.

4. The electronic circuit of claim 1, wherein said two-dimensional spatial geometry allows said stretchable metallic or semiconducting device component to undergo in plane deformation, out of plane deformation or both.

5. The electronic circuit of claim 1, wherein said first length scale of said first spatial frequency is at least 2 times smaller than said second length scale of said second spatial frequency.

6. The electronic circuit of claim 1, wherein said first length scale of said first spatial frequency is 2 to 10 times smaller than said second length scale of said second spatial frequency.

7. The electronic circuit of claim 1, wherein said two-dimensional spatial geometry is characterized by more than two spatial frequencies.

8. The electronic circuit of claim 7, wherein said sequence of electrically conductive elements is further characterized by a tertiary shape comprising a repeating series of said electrically conductive elements comprising said secondary shape.

9. The electronic circuit of claim 1, wherein said two-dimensional spatial geometry is characterized by 2 to 5 spatial frequencies.

10. The electronic circuit of claim 1, wherein said two-dimensional spatial geometry is an iterative two-dimensional geometry.

11. The electronic circuit of claim 1, wherein said sequence of electrically conductive elements has a serial configuration or a branched configuration.

12. The electronic circuit of claim 1, wherein said two-dimensional spatial geometry has a deterministic two-dimensional shape or a random two-dimensional shape.

13. The electronic circuit of claim 1, wherein said two-dimensional spatial geometry has a spring-within-a-spring geometry, wherein said spring-within-a-spring geometry comprises a series of primary spring structures each independently having said primary unit cell shape connected to form one or more secondary spring structures having said secondary shape.

14. The electronic circuit of claim 13, wherein said primary spring structures, said secondary spring structures or both comprise a compression spring structure or coiled spring structure.

15. The electronic circuit of claim 1, wherein said two-dimensional spatial geometry is a self-similar two-dimensional geometry.

16. The electronic circuit of claim 15, wherein said self-similar two-dimensional geometry is characterized by said secondary shape being similar to said primary unit cell shape but having a different length scale.

17. The electronic circuit of claim 15, wherein said self-similar two-dimensional geometry is characterized by a length scale of said secondary shape at least 2 times larger than a length scale of said primary unit cell shape.

18. The electronic circuit of claim 15, wherein a length scale of said secondary shape is larger than a length scale of said primary unit cell shape by a factor selected from the range of 2 to 20.

19. The electronic circuit of claim 15, wherein said self-similar two-dimensional geometry is characterized by a first spatial frequency having a first length scale corresponding to said primary unit cell shape, a second spatial frequency having a second length scale corresponding to said secondary shape and a third spatial frequency having a third length scale corresponding to a tertiary shape.

20. The electronic circuit of claim 19, wherein said tertiary shape is similar to said primary unit cell shape and said secondary shape but having a different length scale.

21. The electronic circuit of claim 1, wherein said two-dimensional spatial geometry of said stretchable metallic or semiconducting device component provides a fill factor between first and second device components or provided over an active area of said electronic circuit greater than or equal to 20%.

22. The electronic circuit of claim 1, wherein said two-dimensional spatial geometry of said stretchable metallic or semiconducting device component provides a fill factor between first and second device components or provided over an active area of said electronic circuit selected from the range of 20% to 90%.

23. The electronic circuit of claim 1, wherein said electrically conductive elements of said stretchable metallic or semiconducting device component comprise a continuous structure.

24. The electronic circuit of claim 1, wherein said electrically conductive elements of said stretchable metallic or semiconducting device component comprise a single unitary structure.

25. The electronic circuit of claim 1, wherein said electrically conductive elements of said stretchable metallic or semiconducting device component comprise one or more thin film structures.

26. The electronic circuit of claim 1, wherein said electrically conductive elements of said stretchable metallic or semiconducting device component are:
  i. free standing structures at least partially supported by said elastic substrate;
  ii. tethered structures at least partially connected to said elastic substrate;
  iii. bound structures at least partially bound to said elastic substrate;
  iv. embedded structures at least partially embedded in said elastic substrate or in an embedding layer supported by said substrate; or
  v. structures within a containment structure and in physical contact with a containment fluid or a containment solid.

27. The electronic circuit of claim 1, wherein each of said electrically conductive elements independently has a thickness selected from the range of 10 nm to 1 mm.

28. The electronic circuit of claim 1, wherein each of said electrically conductive elements independently has a thickness less than or equal to 1 micron.

29. The electronic circuit of claim 1, wherein each unit cell shape of said electrically conductive elements is independently characterized by lateral dimensions selected from the range of 100 nm to 10 mm.

30. The electronic circuit of claim 1, wherein said stretchable metallic or semiconducting device component is characterized by a pathlength selected from the range of 0.1 μm to 100 cm.

31. The electronic circuit of claim 1, wherein said stretchable metallic or semiconducting device component provides for electrical connection between two connection points separated by a straight line distance selected from the range of 0.1 μm to 100 cm.

32. The electronic circuit of claim 1, wherein said stretchable metallic or semiconducting device component provides for electrical connection between first and second connection points and independently has a pathlength extending between said first and second connection points at least 2 times larger than the shortest straight line distance between said first and second connection points.

33. The electronic circuit of claim 1, wherein said stretchable metallic or semiconducting device component provides for electrical connection between first and second connection points and independently has a pathlength extending between said first and second connection points 2 to 6 times larger than the shortest straight line distance between said first and second connection points.

34. The electronic circuit of claim 1, wherein said electrically conductive elements comprise a wire, a ribbon or a nanomembrane.

35. The electronic circuit of claim 1, wherein said electrically conductive elements independently comprise a metal, an alloy, a single crystalline inorganic semiconductor or an amorphous inorganic semiconductor.

36. The electronic circuit of claim 1, wherein said primary unit cell shape of said electrically conductive elements comprises a spring, a fold, a loop, a mesh or any combinations of these.

37. The electronic circuit of claim 1, wherein said primary unit cell shape comprises a plurality of spatially offset features selected from the group consisting of opposing segments, adjacent segments or a combination of opposing and adjacent segments.

38. The electronic circuit of claim 37, wherein said spatially offset features of said primary unit cell shape comprise a plurality of convex segments, concave segments, circular segments, ellipsoidal segments, triangular segments, rectangular segments, square segments, or any combination of these.

39. The electronic circuit of claim 38, wherein said convex segments, concave segments, circular segments, ellipsoidal segments, triangular segments, rectangular segments or square segments of said unit cell shape are separated by one or more straight line segments.

40. The electronic circuit of claim 1, wherein said stretchable metallic or semiconducting device component comprises an electrode or an electrode array.

41. The electronic circuit of claim 40, wherein said electrode or said electrode array is a component of a sensor, an actuator, or a radio frequency device.

42. The electronic circuit of claim 40, wherein said electrode or said electrode array provides a fill factor over an active area of said electronic circuit selected from the range of 25% to 90%.

43. The electronic circuit of claim 1, wherein said stretchable metallic or semiconducting device component comprises one or more electrical interconnects.

44. The electronic circuit of claim 43, further comprising one or more rigid island structures, wherein at least a portion of said one or more electrical interconnects is in electrical contact with said one or more rigid island structures.

45. The electronic circuit of claim 44, further comprising a plurality of said stretchable metallic or semiconducting device component in electrical contact with each of said rigid island structures.

46. The electronic circuit of claim 1, wherein said elastic substrate has an average thickness selected from the range of 0.25 μm to 10,000 μm.

47. The electronic circuit of claim 1, wherein said elastic substrate has an average thickness less than or equal to 1000 μm.

48. The electronic circuit of claim 1, wherein said elastic substrate is a prestrained elastic substrate.

49. The electronic circuit of claim 1, wherein said elastic substrate has a Young's modulus selected from the range of 0.5 KPa to 100 GPa.

50. The electronic circuit of claim 1, wherein said elastic substrate has a net bending stiffness selected from the range of $0.1 \times 10^4$ GPa $\mu m^4$ to $1 \times 10^9$ GPa $\mu m^4$.

51. The electronic circuit of claim 1, wherein said elastic substrate comprises a material selected from the group consisting of: a polymer, an inorganic polymer, an organic polymer, a plastic, an elastomer, a biopolymer, a thermoset, a rubber silk and any combination of these.

52. An electrode array comprising:
  a plurality of stretchable metallic or semiconducting device components supported by said elastic substrate, wherein each of said stretchable metallic or semiconducting device components independently comprises a plurality of electrically conductive elements each having a primary unit cell shape, wherein said electrically conductive elements of each stretchable metallic or semiconducting device component are independently connected in a sequence having a secondary shape providing an overall two-dimensional spatial geometry characterized by a plurality of spatial frequencies;
  wherein said plurality of stretchable metallic or semiconducting device components provide a fill factor greater than or equal to 50% for an active area of said electrode array; and wherein said two-dimensional spatial geometries of said stretchable metallic or semiconducting device components allows for accommodation of elastic strain along one or more in-plane or out of plane dimensions, thereby providing stretchability of said electrode array.

53. A stretchable electronic device comprising:
a plurality of rigid island structures supported by an elastic substrate; wherein each of said rigid island structures independently comprises an inorganic semiconductor device or device component;
a plurality of stretchable metallic or semiconducting device components electrically interconnecting at least a portion of said rigid island structures, wherein each of said stretchable metallic or semiconducting device components independently comprises a plurality of electrically conductive elements each having a primary unit cell shape, wherein said electrically conductive elements of each stretchable metallic or semiconducting device component are independently connected in a sequence having a secondary shape providing an overall two-dimensional spatial geometry characterized by a plurality of spatial frequencies; wherein said two-dimensional spatial geometry is characterized by a first spatial frequency having a first length scale corresponding to said primary unit cell shape and a second spatial frequency having a second length scale corresponding to said secondary shape, wherein said first length scale of said first spatial frequency is selected from the range of 100 nm to 1 mm and wherein said second length scale of said second spatial frequency is selected from the range of 1 micron to 10 mm;
wherein said two-dimensional spatial geometries of said stretchable metallic or semiconducting device components allows for accommodation of elastic strain along one or more in-plane or out of plane dimensions, thereby providing stretchability of said stretchable electronic device.

54. An electronic circuit comprising:
an elastic substrate; and
a stretchable metallic or semiconducting device component supported by said elastic substrate; said stretchable metallic or semiconducting device component comprising a plurality of electrically conductive elements each having a primary unit cell shape, said electrically conductive elements connected in a sequence having a secondary shape providing an overall two-dimensional spatial geometry characterized by a plurality of spatial frequencies; wherein said two-dimensional spatial geometry is a self-similar two-dimensional geometry;
wherein said two-dimensional spatial geometry of said stretchable metallic or semiconducting device component allows for accommodation of elastic strain along one or more in-plane or out of plane dimensions, thereby providing stretchability of said electronic circuit.

55. The electronic circuit of claim 54, wherein said self-similar two-dimensional geometry is characterized by said secondary shape being similar to said primary unit cell shape but having a different length scale.

56. The electronic circuit of claim 54, wherein said self-similar two-dimensional geometry is characterized by a length scale of said secondary shape at least 2 times larger than a length scale of said primary unit cell shape.

57. The electronic circuit of claim 54, wherein a length scale of said secondary shape is larger than a length scale of said primary unit cell shape by a factor selected from the range of 2 to 20.

58. The electronic circuit of claim 54, wherein said self-similar two-dimensional geometry is characterized by a first spatial frequency having a first length scale corresponding to said primary unit cell shape, a second spatial frequency having a second length scale corresponding to said secondary shape and a third spatial frequency having a third length scale corresponding to a tertiary shape.

59. The electronic circuit of claim 58, wherein said tertiary shape is similar to said primary unit cell shape and said secondary shape but having a different length scale.

60. An electronic circuit comprising:
an elastic substrate; and
a stretchable metallic or semiconducting device component supported by said elastic substrate; said stretchable metallic or semiconducting device component comprising a plurality of electrically conductive elements each having a primary unit cell shape, said electrically conductive elements connected in a sequence having a secondary shape providing an overall two-dimensional spatial geometry characterized by a plurality of spatial frequencies; wherein said two-dimensional spatial geometry has a spring-within-a-spring geometry, wherein said spring-within-a-spring geometry comprises a series of primary spring structures each independently having said primary unit cell shape connected to form one or more secondary spring structures having said secondary shape;
wherein said two-dimensional spatial geometry of said stretchable metallic or semiconducting device component allows for accommodation of elastic strain along one or more in-plane or out of plane dimensions, thereby providing stretchability of said electronic circuit.

61. The electronic circuit of claim 60, wherein said primary spring structures, said secondary spring structures or both comprise a compression spring structure or coiled spring structure.

* * * * *